(12) United States Patent
Tanaka et al.

(10) Patent No.: US 6,586,329 B1
(45) Date of Patent: Jul. 1, 2003

(54) SEMICONDUCTOR DEVICE AND A METHOD OF MANUFACTURING THEREOF

(75) Inventors: Yoshinori Tanaka, Hyogo (JP); Mitsuya Kinoshita, Hyogo (JP); Shinya Watanabe, Hyogo (JP); Tatsuo Kasaoka, Hyogo (JP); Moriaki Akazawa, Hyogo (JP); Toshiaki Ogawa, Hyogo (JP)

(73) Assignee: Mitsubishi Denki Kabshiki Kaisha, Tokyo (JP)

( * ) Notice: Subject to any disclaimer, the term of this patent is extended or adjusted under 35 U.S.C. 154(b) by 0 days.

(21) Appl. No.: 09/544,997

(22) Filed: Apr. 6, 2000

Related U.S. Application Data

(62) Division of application No. 08/882,300, filed on Jun. 25, 1997, now Pat. No. 6,097,052, which is a continuation of application No. 08/157,249, filed on Nov. 26, 1993, now abandoned.

(30) Foreign Application Priority Data

| Nov. 27, 1992 | (JP) | 4-318572 |
| Jan. 11, 1993 | (JP) | 5-002692 |
| Aug. 31, 1993 | (JP) | 5-240646 |

(51) Int. Cl.$^7$ .................................. H01L 21/311
(52) U.S. Cl. ................ 438/629; 438/637; 438/700
(58) Field of Search .......................... 438/629, 637, 438/639, 640, 667, 668, 672, 675, 700, 701, 713

(56) References Cited

U.S. PATENT DOCUMENTS

| 4,671,849 A | 6/1987 | Chen et al. |
| 4,814,041 A | 3/1989 | Auda |
| 4,985,718 A | 1/1991 | Ishijima |
| 5,434,439 A | 7/1995 | Ajika et al. |
| 5,453,633 A | 9/1995 | Yun |
| 5,478,768 A | 12/1995 | Iwasa |
| 5,561,311 A | 10/1996 | Hamamoto et al. |

FOREIGN PATENT DOCUMENTS

| EP | 010596 | 5/1980 |
| EP | 147322 | 7/1985 |
| EP | 265638 | 5/1988 |
| EP | 0 375 501 | 6/1990 |
| EP | 0 388 796 | 9/1990 |

(List continued on next page.)

OTHER PUBLICATIONS

"Novel Stacked Capacitor Cell for 64MB DRAM", by Wakamiya et al., VL Symposium 1989, pp. 69–70.

(List continued on next page.)

*Primary Examiner*—Roy Potter
(74) *Attorney, Agent, or Firm*—McDermott, Will & Emery

(57) ABSTRACT

A contact hole having an opening diameter smaller than the minimum dimension that can be formed by photolithographic technique is formed. Using an interlayer insulating film 8 formed on a semiconductor substrate as an etching mask, etching is carried out halfway to form an opening 8a. The etching mask is removed, and a TEOS film 10 is formed on the interlayer oxide film 8. The whole surface is then etched anisotropically to form a contact hole 11.

41 Claims, 116 Drawing Sheets

FOREIGN PATENT DOCUMENTS

| | | |
|---|---|---|
| EP | 0 416 809 | 3/1991 |
| EP | 0449000 | 10/1991 |
| EP | 449000 | 10/1991 |
| EP | 450302 | 10/1991 |
| EP | 0 482 519 | 4/1992 |
| JP | 60-160653 | 8/1985 |
| JP | 62-86715 | 4/1987 |
| JP | 62-128168 | 6/1987 |
| JP | 62-286270 | 12/1987 |
| JP | 63-119239 | 5/1988 |
| JP | 63-260134 | 10/1988 |
| JP | 63-275113 | 11/1988 |
| JP | 1-144671 | 6/1989 |
| JP | 1-196122 | 8/1989 |
| JP | 1-243573 | 9/1989 |
| JP | 1-257365 | 10/1989 |
| JP | 3-178129 | 8/1991 |
| JP | 3-231431 | 10/1991 |
| JP | 3296263 | 12/1991 |
| JP | 4-15925 | 1/1992 |
| JP | 4-158569 | 6/1992 |
| JP | 4-216665 | 8/1992 |
| JP | 4216665 | 8/1992 |
| JP | 4-336464 | 11/1992 |
| JP | 5-218211 | 8/1993 |
| JP | 5-343636 | 12/1993 |
| JP | 6-53412 | 2/1994 |
| JP | 62-86715 | 10/1994 |
| JP | 3-4526 | 11/2000 |

OTHER PUBLICATIONS

"3–Dimensional Stacked Capacitor Cell for 16M and 64M DRAM", by T. Ema et al., IEDM 88, pp. 592–595.

"2nd Generation 16Mbit DRAM" by Koshimaru et al., NEC Technical Report, vol. 46, No. 2, 1993, pp. 90–93.

"An Optically Delineated 4.2 $\mu m^2$ Self–Aligned Isolated–Plate Stacked–Capacitor DRAM Cell", by Kimura et al., IEEE Transactions on Electron Devices, vol. 35, No. 10, Oct. 1988, pp. 1591–1595.

SEMICONDUCTOR DEVICE AND A METHOD OF MANUFACTURING THEREOF

BACKGROUND OF THE INVENTION

This application is a div of Ser. No. 08/882,300 filed Jun. 25, 1997 U.S. Pat. No. 6,097,052, which is a con of Ser. No. 08/157,249 filed Nov. 26, 1993 abn.

1. Field of the Invention

The present invention relates to a semiconductor device and a method of manufacturing thereof, and more particularly, to a method of manufacturing a semiconductor device including an insulating layer with a contact hole.

2. Description of the Background Art

The demand of semiconductor devices is rapidly increasing in accordance with the significant spread of information equipment such as computers. Semiconductor devices having a large functional storage capacity and that is capable of operating at high speed are required. In response, technical development is in progress regarding increase in integration density, high speed response and reliability.

A semiconductor device having a multilayer structure where elements and interconnections are formed in a plurality of layers via interlayer insulating films is developed as means for increasing integration density of a semiconductor device. In such a semiconductor device having a multilayer structure, a small contact hole must be formed in the interlayer insulating film to obtain electrical contact between different layers. It has become necessary to form this contact hole in a small dimension and in high accuracy in a narrow space between adjacent elements to comply with the increased scale of integration of semiconductor devices.

The process of forming a contact hole of a memory cell array portion of a DRAM (Dynamic Random Access Memory) will be described hereinafter as an example of forming a conventional contact hole.

A DRAM will first be hereinafter.

FIG. 161 is a block diagram showing a structure of a general DRAM. Referring to FIG. 161, a DRAM 1350 includes a memory cell array 1351, a row and column address buffer 1352, a row decoder 1353, a column decoder 1354, a sense refresh amplifier 1355, a data-in buffer 1356, a data-out buffer 1357, and a clock generator 1358.

Memory cell array 1351 serves to store data signals of information. Row and column address buffer 1352 serves to receive an externally supplied address signal to select a memory cell forming a unitary storage circuit. Row decoder 1353 and column decoder 1354 serve to specify a memory cell by decoding an address signal. Sense refresh amplifier 1355 amplifies the signal stored in a specified memory cell to read out the same. Data-in buffer 1356 and data-out buffer 1357 serve to input or output data. Clock generator 1358 serves to generate a clock signal.

On a semiconductor chip of a DRAM of the above-described structure, memory cell array 1351 occupies a large area. Memory cell array 1351 has a plurality of memory cells arranged in a matrix for storing unitary storage information.

A memory cell forming memory cell array 1351 will be described hereinafter.

FIG. 162 is an equivalent circuit diagram of 4 bits of memory cells forming memory cell array 1351. Referring to FIG. 162, a memory cell includes one MOS transistor 1310 and one capacitor 1320 connected thereto. Transistor 1310 has its gate electrically connected to a word line 1307. Transistor 1310 has its source or drain electrically connected to a bit line 1317. The other of the source/drain of transistor 1310 is connected to capacitor 1320. This memory cell is a 1-transistor 1-capacitor type memory cell. A memory cell having such a structure facilitates increase of the integration density of a memory cell array due to its simple structure, and is widely used in DRAMs of large capacity.

Next, a conventional contact hole and a method of manufacturing thereof will be described hereinafter.

FIG. 163 is a plan view of a memory cell portion of a DRAM. Referring to FIG. 163, word lines (gate electrodes) 203a and 203b are arranged with a predetermined distance therebetween. A bit line 205 extends in a direction crossing word lines 203a and 203b. An element formation region 207 is formed to overlie bit line 205 and word lines 203a and 203b in an oblique manner. A storage node 209 forming the lower electrode of the capacitor is provided in element formation region 207. Storage node 209 is in direct contact with the semiconductor substrate (not shown) via a contact hole 211. Bit line 205 is in direct contact with the semiconductor substrate (not shown) via a contact hole 213.

FIG. 164 is a sectional view of the memory cell portion shown in FIG. 163 cut in the direction indicated by arrow A. Field oxide films 215 are spaced apart on semiconductor substrate 201. The main surface of silicon substrate 201 between field oxide films 215 is the element formation region 207. Impurity regions 217a, 217b, and 217c spaced apart are formed in element formation region 207. Gate electrodes 203a and 203b are formed above the main surface of silicon substrate 201. A gate oxide film 219a is formed between gate electrode 203a and silicon substrate 201. A gate oxide film 219b is formed between gate electrode 203b and silicon substrate 201.

An insulating film 221 is formed to cover gate electrodes 203a and 203b. A TEOS (tetraethyl orthosilicate) film 223 is formed on silicon substrate 201 to cover insulating film 221. TEOS film 223 has a through hole 213 formed to expose impurity region 217b. A bit line 205 is formed on TEOS film 223. Bit line 205 is electrically connected to impurity region 217b via contact hole 213.

A method of manufacturing the structure shown in FIG. 163 will be described hereinafter. Referring to FIG. 165, field oxide film 215 for element isolation is formed at a predetermined area on the main surface of silicon substrate 201 using the LOCOS (Local Oxidation of Silicon) method. By forming a thin oxide film and then a polycrystalline silicon film on the main surface of silicon substrate 201 followed by a patterning process, gate electrodes 203a and 203b, and gate oxide films 219a and 219b are formed. Using gate electrodes 203a and 203b and field oxide film 215 as a mask, ions are implanted into silicon substrate 201 to form impurity regions 217a–217c of relatively low concentration. Insulating film 221 is formed to cover gate electrodes 203a and 203b. By carrying out ion implantation using insulating film 221 as a mask, impurity regions 217a, 217b, and 217c of relatively high concentration are formed. As a result, impurity regions 217a, 217b, and 217c having a LDD structure are obtained.

As shown in FIG. 166, TEOS film 223 is formed all over the main surface of silicon substrate 201. A stepped portion is generated reflecting the underlying configuration at the surface 223a of TEOS film 223. If a bit line is formed thereabove, it may be disconnected due to the generated stepped portion. A planarization process which will be described hereinafter is carried out to prevent such a problem.

Referring to FIG. 167, a SOG (Spin-On Glass) film 225 is formed on TEOS film 223. SOG film 225 has a low viscosity. Therefore, the surface 223a of SOG film 225 is planarized.

Referring to FIG. 168, the layer of SOG film 225 and TEOS film 223 is etched back, so that the surface 223a of TEOS film 223 is planarized.

Referring to FIG. 169, a resist 227 is formed on TEOS film 223. Resist 227 is exposed and developed to form an opening 227a in resist 227.

Referring to FIG. 170, TEOS film 223 is selectively removed by etching using resist 227 as a mask to form a contact hole 213 reaching to impurity region 217b. Then, resist 227 is removed. As shown in FIG. 164, bit line 205 is formed on TEOS film 223.

Next, a structure and a manufacturing method of a memory cell in a DRAM to which a conventional contact hole and a manufacturing method thereof is applied will be described hereinafter as conventional first, second and third semiconductor memory devices.

FIG. 171 is a sectional view of a first conventional semiconductor memory device having a stacked capacitor. Referring to FIG. 171, a memory cell includes one transfer gate transistor 1010 and one capacitor 1420.

Transfer gate transistor 1010 includes a pair of source/drain diffusion regions 1009, a gate oxide film 1005, and a gate electrode 1007. The pair of source/drain diffusion regions 1009 are formed with a distance therebetween in a region isolated by an isolation oxide film 1003 in a silicon substrate 1001. Source/drain diffusion region 1009 has a LDD (Lightly Doped Drain) structure of a double layer including an impurity region 1009a of a relatively low concentration and an impurity region 1009b of a relatively high concentration. A gate electrode (word line) 1007 is formed on the region sandwiched by the pair of source/drain diffusion regions 1009 with gate oxide film 1005 thereunder. An insulating film 1011 of silicon oxide ($SiO_2$) is formed on the surface of gate electrode 1007. A sidewall 1013 is formed to cover the sidewalls of gate electrode 1007 and insulating film 1011.

A thin silicon oxide film 1015 is formed all over the surface of silicon substrate 1001 so as to cover transfer gate transistor 1010. A contact hole 1015a is formed in this thin silicon oxide film 1015. A partial surface of either the source or drain diffusion region 1009 is exposed in contact hole 1015a. A buried bit line 1017 is formed to contact source/drain diffusion region 1009 via contact hole 1015a. An interlayer insulating film 1019 of a thickness of approximately 8000 Å is formed all over the surface of silicon substrate 1001 so as to cover buried bit line 1017. A silicon nitride film ($Si_3N_4$) 1021 of a thickness of approximately 100 Å is formed on the surface of interlayer insulating film 1019. A contact hole 1435 is formed to penetrate the three layers of silicon nitride film 1021, interlayer insulating film 1019, and silicon oxide film 1015. A partial surface of the other source/drain diffusion region 1009 is exposed in contact hole 1435. A capacitor 1420 is formed to be in electrical contact with source/drain diffusion region 1009 via contact hole 1435.

Capacitor 1420 includes a lower electrode layer (storage node) 1423, a capacitor dielectric film 1425, and an upper electrode layer (cell plate) 1427. Lower electrode layer 1423 is formed of polycrystalline silicon. Lower electrode layer 1423 is formed on the surface of silicon nitride film 1021 to contact source/drain diffusion region 1009 via contact hole 1435. Capacitor dielectric film 1425 is formed to cover the surface of lower electrode layer 1423. Upper electrode 1427 of polycrystalline silicon (poly-Si) is formed to cover the surface of lower electrode layer 1423 with capacitor dielectric film 1425 therebetween. Insulating film 1429 is formed to cover capacitor 1420.

A method of manufacturing the first conventional semiconductor memory device shown in FIG. 171 will be described hereinafter.

FIGS. 172–184 are sectional views of the first conventional semiconductor memory device showing the sequential manufacturing steps thereof.

Referring to FIG. 172, an isolation oxide film 1003 is formed on a silicon substrate 1001. A silicon oxide film 1005 which becomes a gate oxide film is formed all over the surface of silicon substrate 1001 by thermal oxidation and the like. A polycrystalline silicon film 1007 and then a silicon oxide film 1011 is formed all over the surface of silicon substrate 1001 by a CVD method (Chemical Vapor Deposition). A photoresist is applied all over the surface of silicon oxide film 1011 to be patterned to a predetermined configuration by exposure to result in a resist pattern 1433a. Using resist pattern 1443a as a mask, silicon oxide film 1011 and then polycrystalline silicon film 1007 are sequentially etched away.

Referring to FIG. 173, a gate electrode 1007 of polycrystalline silicon is formed in a desired configuration by this etching process. Using gate electrode 1007, insulating film 1011, and isolation oxide film 1003 as a mask, ions are implanted into the surface of silicon substrate 1001. By this ion implantation, an impurity region 1009a of relatively low concentration is formed on the surface of silicon substrate 1001 below the lower region of gate electrode 1007.

Referring to FIG. 174, a silicon oxide film 1013 substantially uniform in thickness is formed all over the surface of silicon substrate 1001 to cover gate electrode 1007 and insulating film 1011. Then, anisotropic etching is applied to silicon oxide film 1013.

Referring to FIG. 175, a sidewall 1013 is formed to cover the sidewalls of gate electrode 1007 and insulating film 1011 by this anisotropic etching process. Then, ions are implanted into the surface of silicon substrate 1001 using gate electrode 1007, insulating film 1011, sidewall 1013 and isolation oxide film 1003 as a mask. By this ion implantation, an impurity region 1009b of a relatively high concentration is formed on silicon substrate 1001 in contact with impurity region 1009a of a relatively low concentration. Thus, a source/drain diffusion region 1009 of a LDD structure is formed by these impurity regions 1009a and 1009b of relatively low and high concentration, respectively. This pair of source/drain diffusion regions 1009, gate oxide film 1005, and gate electrode 1007 form transfer gate transistor 1010.

Referring to FIG. 176, a thin silicon oxide film 1015 is formed all over the surface of silicon substrate 1001 so as to cover transfer gate transistor 1010. A photoresist is applied all over the surface of silicon oxide film 1015 to be subjected to an exposure process of patterning to a desired configuration. .This results in resist pattern 1433b. Using resist pattern 1433b as a mask, silicon oxide film 1015 is etched.

Referring to FIG. 177, a contact hole 1015a is formed by this etching step in silicon oxide film 1015 to expose the surface of one of the pair of source/drain diffusion regions 1009. A polycrystalline silicon film 1017 is formed on the surface of silicon oxide film 1015 to come into contact with source/drain diffusion region 1009 via contact hole 1015a. A silicon oxide film 1019a is formed on the surface of polycrystalline silicon film 1017.

Referring to FIG. 178, silicon oxide film 1019a and then polycrystalline silicon film 1017 are etched by photolithography, RIE (Reactive Ion Etching) or the like. By this etching process, a buried bit line 1017 electrically in contact with source/drain region 1009 is formed via contact hole 1015a.

Referring to FIG. 179, a silicon oxide film 1019b is formed all over silicon substrate 1001 by CVD. A resist film 1019c having its surface planarized is formed on the surface of silicon oxide film 1019b. This resist film 1019c may be formed by applying a SOG (Spin On Glass) film. Then, resist film 1019c and silicon oxide film 1019b are etched back to a level indicated by the broken line in FIG. 179.

Referring to FIG. 180, an interlayer insulating film 1019 having its surface substantially planarized is obtained by this etchback process. A silicon nitride film 1021 of approximately 100 Å in thickness is formed on the surface of interlayer insulating film 1019.

Referring to FIG. 181, a photoresist is applied all over the surface of silicon nitride film 1021 to be subjected to an exposure process to be patterned to a desired configuration. As a result, a resist pattern 1433c is formed. Using resist pattern 1433c as a mask, silicon nitride film 1021, interlayer insulating film 1019, and silicon oxide film 1015 are etched anisotropically in a sequential manner. As a result, a contact hole 1435 exposing the surface of either the source or drain diffusion region is formed. Then, resist pattern 1433c is removed.

Referring to FIG. 182, a polycrystalline silicon film 1423 is formed on the surface of silicon nitride film 1021 to come in contact with source/drain diffusion region 1009 via contact hole 1435.

Referring to FIG. 183, polycrystalline silicon film 1423 is patterned to a desired configuration by photolithography, RIE or the like, whereby a lower electrode layer 1423 electrically connected to source/drain diffusion region 1009 is formed.

Referring to FIG. 184, a capacitor dielectric film 1425 is formed so as to cover the surface of lower electrode layer 1423. An upper electrode layer 1427 of polycrystalline silicon is formed to cover lower electrode layer 1423 with capacitor dielectric film 1425 therebetween. Lower electrode layer 1423, capacitor dielectric film 1425, and upper electrode layer 1427 form capacitor 1420. An insulating film 1429 is formed to cover capacitor 1420.

A second conventional semiconductor memory device will be described hereinafter.

FIG. 185 is a sectional view of a second conventional semiconductor memory device. Referring to FIG. 185, the structure of the second conventional semiconductor memory device differs from the first conventional semiconductor memory device in the structure of its capacitor.

Capacitor 1420 of the second conventional semiconductor memory device includes a lower electrode layer 1423, a capacitor dielectric film 1425, and an upper electrode layer 1427. Lower electrode layer 1423 is formed of polycrystalline silicon. Lower electrode layer 1423 includes an extending region 1423a and a cylindrical portion 1423b. Extending portion 1423a is formed on the surface of silicon nitride film 1021 to come in contact with source/drain diffusion region 1009 via a contact hole 1435 piercing silicon nitride film 1021, interlayer insulating film 1019 and silicon oxide film 1015 and reaching to the surface of source/drain diffusion region 1009. Cylindrical portion 1423b is formed to grow upwards perpendicular to the surface of silicon substrate 1001 and having its bottom in contact with the outer peripheral portion of extending portion 1423a. A capacitor dielectric film 1425 is formed to cover the surface of lower electrode layer 1423. An upper electrode layer 1427 of polycrystalline silicon is formed to cover the source of lower electrode layer 1423 with capacitor dielectric film 1425 therebetween.

The structures of the elements other than capacitor 1420 of the second conventional semiconductor memory device are substantially similar to those of the first conventional semiconductor memory device, and their description will not be repeated.

The manufacturing method of the second conventional semiconductor memory device having the above-described cylindrical type stacked capacitor will be described hereinafter.

FIGS. 186–191 are sectional views of the second conventional semiconductor memory device showing the manufacturing steps thereof. The process preceding the step shown in FIG. 186 of the second conventional semiconductor memory device is similar to the manufacturing steps of the first conventional semi-conductor memory device, and their description will not be repeated.

Referring to FIG. 187, an insulating film 1431 is formed all over the surface of polycrystalline silicon film 1423a. Insulating film 1431 is patterned to a desired configuration by photolithography, RIE or the like. Using this patterned insulating film 1431 as a mask, polycrystalline silicon film 1423a is etched. As a result, an extending portion 1423a electrically connected to the source/drain diffusion region 1009 via contact hole 1435 is formed.

Referring to FIG. 188, a polycrystalline silicon film 1423b is formed all over silicon substrate 1001 so as to cover the remaining insulating film 1431 and extending portion 1423a. Polycrystalline silicon film 1423b is subjected to anisotropic etching until the surface of silicon nitride film 1021 is exposed.

Referring to FIG. 189, a sidewall spacer-like cylindrical portion 1423b is formed by this anisotropic etching process to cover the sidewall of insulating film 1431. Cylindrical portion 1423b has its bottom end in contact with the outer periphery of extending portion 1423a.

Then, insulating film 1431 filling the inside region of cylindrical portion 1423b is removed by etching. At this etching process, silicon nitride film 1021 serves to protect the surface of interlayer insulating film 1019.

Referring to FIG. 190, an lower electrode layer 1423 of extending portion 1423a and silicon portion 1423b is formed by this etching process.

Referring to FIG. 191, a capacitor dielectric film 1425 is formed to cover the surface of lower electrode layer 1423. An upper electrode layer 1427 of polycrystalline silicon is formed to cover the surface of lower electrode layer 1423 with capacitor dielectric film 1425 therebetween. Thus, a capacitor 1420 including lower electrode layer 1423, capacitor dielectric film 1425, and upper electrode layer 1427 is formed. Then, an insulating film 1429 is formed to cover capacitor 1420 to result in the structure shown in FIG. 185.

Such a cylindrical stacked type capacitor is disclosed in, for example, Japanese Patent Laying-Open No. 62-286270, Japanese Patent Laying-Open No.1-257365, and "VL Symposium" 1989, pp. 69 and 70.

A third conventional semiconductor memory device having a fin type stacked capacitor will be described hereinafter.

FIG. 192 is a sectional view of the third conventional semiconductor memory device. Referring to FIG. 192, a memory cell is formed in a region isolated by an isolation oxide film 1503 on a silicon substrate 1501. This memory cell includes a transfer gate transistor 1510 and a capacitor 1520.

Transfer gate transistor 1510 includes a pair of source/drain diffusion regions 1509, a gate oxide film 1505, and a gate electrode 1507. The pair of source/drain diffusion regions 1509 are formed on the surface of silicon substrate 1501 with a predetermined distance therebetween. A gate electrode (word line) 1507 is formed on a region sandwiched by the pair of source/drain diffusion regions 1509 with a gate oxide film 1505 thereunder. An interconnection layer 1507 serving as a word line is formed on the surface of isolation oxide film 1503.

An insulating film 1511 is formed all over the surface of silicon substrate 1501 so as to cover transfer gate transistor 1510 and interconnection layer 1507. A contact hole 1511a is formed in insulating film 1511. A partial surface of one of the source/drain diffusion regions 1509 is exposed in contact hole 1511a. A buried bit line 1513 is formed on the surface of insulating film 1511 to come in contact with source/drain diffusion region 1509 via contact hole 1511a.

A silicon nitride film (SiN) 1515 is formed to cover buried bit line 1513. A contact hole 1535 is formed to penetrate the two layers of silicon nitride film 1515 and insulating film 1511. A partial surface of the other of the source/drain diffusion regions 1509 is exposed in contact hole 1535. A capacitor 1520 is formed via contact hole 1535 to come in electrical contact with source/drain diffusion region 1509.

Capacitor 1520 includes a lower electrode layer 1521, a capacitor dielectric film 1523, and an upper electrode layer 1525. Lower electrode layer 1521 includes a first portion 1521a and a second portion 1521b of polycrystalline silicon. Lower electrode layer 1521 has a fin structure. More specifically, the first and second portions 1521a and 1521b formed above silicon nitride film 1515 have a layered structure with a predetermined distance therebetween. The second portion 1521b contacts the first portion 1521a and also source/drain diffusion region 1509 via contact hole 1531. The first and second portions 1521a and 1521b have a configuration according to the surface configuration of the underlying silicon nitride film 1515. A capacitor dielectric film 1523 is formed to cover the surface of lower electrode layer 1521. Upper electrode layer 1525 is formed to cover the surface of lower electrode layer 1521 with capacitor dielectric film 1523 therebetween.

A method of manufacturing the third conventional semiconductor memory device will be described hereinafter.

FIGS. 193–198 are sectional views of the third conventional semiconductor memory device showing the manufacturing steps thereof. Referring to FIG. 193, an isolation oxide film 1503 is formed on the surface of a silicon substrate 1501. A thin silicon oxide film 1505 which becomes a gate oxide film is formed all over the surface of silicon substrate 1501. A gate electrode (word line) 1507 patterned to a predetermined shape is formed on the surface of silicon oxide film 1505. By ion implantation using gate electrode 1507 and isolation oxide film 1503 as a mask, source/drain diffusion region 1509 is formed on the surface of silicon substrate 1501 so as to sandwich the lower region of gate electrode 1507. Thus, transistor 1510 is formed.

Referring to FIG. 194, an insulating film 1511 is formed to cover gate electrode 1507. A contact hole 511a exposing a partial surface of one of the source/drain diffusion regions 1509 is formed penetrating the two layers of insulating film 1511 and silicon oxide film 1505. A buried bit line 1513 is formed on the surface of insulating film 1511 to contact source/drain diffusion region 1509 via contact hole 1511a.

Referring to FIG. 195, a silicon nitride film 1515 is formed all over the surface of silicon substrate 1501 to cover-buried bit line 1513. A silicon oxide film 1531, a first polycrystalline silicon film 1521a, and a silicon oxide film 1533 substantially uniform in thickness are sequentially formed on the surface of silicon nitride film 1515. Then, a contact hole 1535 exposing the surface of the other source/drain diffusion region 1509 is formed by photolithography and RIE, penetrating silicon-oxide film 1533, first polycrystalline silicon film 1521a, silicon oxide film 1531, silicon nitride film 1515, insulating film 1511 and silicon oxide film 1505.

Referring to FIG. 196, a second polycrystalline silicon film 1521b is formed all over the surface of silicon oxide film 1533 to come in contact with source/drain diffusion region 1509 via contact hole 1535. Second polycrystalline silicon film 1521b, silicon oxide film 1533, and then first polycrystalline silicon film 1521a are etched away sequentially by photolithography, RIE, and the like. By this etching process, first and second portions 1521a and 1521b implementing lower electrode layer 1521 are formed from the first and second polycrystalline silicon films 1521a and 1521b. Lower electrode layer 1521 is formed to be in electrical contact with source/drain diffusion region 1509 via contact hole 1535. Then, by a fluoric (HF) acid agent process, silicon oxide films 1531 and 1533 are removed to result in the structure shown in FIG. 197.

Referring to FIG. 198, a capacitor dielectric film 1523 is formed to cover the surface of lower electrode layer 1521. An upper electrode layer 1525 is formed to cover lower electrode layer 1521 with capacitor dielectric film 1523 therebetween. Thus, a capacitor 1520 is formed by lower electrode layer 1521, capacitor dielectric film 1523, and upper electrode layer 1525.

Such a fin type stacked capacitor is disclosed in IEDM 88, pp. 592–595 by T. Ema et al.

A conventional contact hole and a method of manufacturing thereof have the problems set forth in the following.

To comply with increase in the integration density of a DRAM, miniaturization is also required in the memory cell portion. More specifically, a memory cell having a pitch of 1.3 $\mu$m between word lines (gate electrodes) 203a and 203b is now considered, as shown in FIG. 199. In such a memory cell having a pitch of 1.3 $\mu$m, the distance between word lines 203a and 203b will be 0.8 $\mu$m if the width of word line 203a is 0.5 $\mu$m. The minimum size of opening 227a in resist 227 (refer to FIG. 169) is 0.5 $\mu$m from the current limitation of photolithographic technique. Under such a limitation, the distance between contact hole 213 and word line 203a or 203b is 0.15 $\mu$m. This means that the distance of 0.15 $\mu$m between contact hole 213 and word line 203a or 203b becomes the overlay margin between bit line 205 and word line 203a or 203b.

The overlay accuracy of photolithography is currently approximately 0.18 $\mu$m in the level of mass production. This means that contact hole 213 may be formed overlying word line 203a or 203b under the current overlay accuracy. In such a case, shorting will occur between bit line 205 and word line 203a or 203b.

FIG. 200 and FIGS. 201–203 are a plan view and sectional views, respectively, for describing the problems encountered in forming a memory cell of a 1.3 $\mu$m pitch. As shown in FIG. 200, there is a possibility of opening 227a in resist 227 (refer to FIG. 169) being shifted 0.13 $\mu$m horizontally from the center of alignment taking into consideration the current overlay accuracy of photolithography, resulting in opening 227a and word line 203a partially overlapping with each other.

FIG. 201 is a sectional view of FIG. 200 taken along line B. By etching anisotropically TEOS film 223 using resist 227 as a mask under the state of FIG. 201, the side of word line (gate electrode) 203a will be exposed as shown in FIG. 202. If bit line 205 is formed after removal of resist 227, shorting occurs between bit line 205 and word line 203a as shown in FIG. 203. That is to say, there was problem of shorting between a bit line and a word line in a conventional contact hole and a method of manufacturing thereof.

A method of providing a contact hole having an opening diameter smaller than the minimum dimension that can be formed by photolithography is disclosed in Japanese Patent Laying-Open No. 62-86715. This technique will be described with reference to FIGS. 204–207. Referring to FIG. 204, an impurity region 233 is formed on the main surface of a semiconductor substrate 231. An interlayer insulating film 235 is formed on semiconductor substrate 231 to cover impurity region 233. A resist 237 is formed on interlayer insulating film 235. The opening diameter of an opening 237a of resist 237 is of the minimum dimension that can be formed by the current photolithography technique. Interlayer insulating film 235 is selectively etched using resist 237 as a mask, whereby this etching process is stopped just before reaching to impurity region 233. Thus, a first hole 239 is formed in interlayer insulating film 235.

Referring to FIG. 205, resist 237 is removed and a polycrystalline silicon film 241 is formed all over.

Referring to FIG. 206, overall etching is carried out on polycrystalline silicon film 241 to form a sidewall layer 241a of polycrystalline silicon at the sidewall of first hole 239. Then, a resist 245 is formed all over. Interlayer insulating film 235 is selectively etched using resist 245 and sidewall layer 241a as a mask to form a second hole (contact hole) 243 exposing impurity region 233. Because sidewall layer 241a is used as a mask, the opening diameter of contact hole 243 is smaller than the minimum dimension that can be formed by photolithography.

Referring to FIG. 207, the surface of sidewall layer 241a is oxidized to form an oxide film 247. Then, an aluminum film 249 is formed all over the surface. Aluminum film 249 is electrically connected to impurity region 233 via contact hole 243.

The above-described technique has problems set forth in the following. There is a possibility of an uneven surface of the polycrystalline silicon film due to grain boundary. FIG. 208 shows the case where polycrystalline silicon film 241 is formed on interlayer insulating film 235. There is a convex portion 241b due to crystalline grain boundary in polycrystalline silicon film 241. An overall etching of polycrystalline silicon film 241 with convex portion 241b generated at the sidewall of first hole 239 will result in the configuration shown in FIG. 209.

Referring to FIG. 209, the dotted line inside sidewall layer 241a of the right side indicates the surface of sidewall layer 241a when there is no convex portion 241b. The dimension of the opening defined by the right sidewall layer 241a and the left sidewall layer 241a are indicated by $L_1$ and $L_2$. $L_1$ and $L_2$ indicate the cases where convex portion 241b is not present or present, respectively, in polycrystalline silicon film 241. It can be appreciated that the dimension of the opening defined by the right sidewall layer 241a and the left sidewall layer 241a varies depending on the unevenness of the surface of polycrystalline silicon film 241. This means that the opening diameter of the contact hole formed using this as a mask will not be constant. Therefore, a contact hole cannot be manufactured with superior controllability of the opening diameter.

The above-described first, second and third conventional semiconductor memory devices have problems set forth in the following.

When the integration density of a DRAM is to be increased, reduction in the size of a memory cell is inevitable. In accordance with reduction of the memory cell size, the pitch between word lines is also reduced. Those having a dimension $L_O$ of 0.6 μm between word lines (gate electrodes) 1007 shown in FIG. 171 are now under study. The opening diameter $L_c$ of a contact hole 1435 is limited to 0.4 μm from the standpoint of the photolithography technique. (It is to be noted that this condition is based on a design rule differing from that of the above-described problems of a conventional contact hole and a manufacturing method thereof.) Under such circumstances, the dimension $L_D$ between contact hole 1435 and word line 1007 is 0.1 μm. This means that the dimension $L_D$ of 0.1 μm between word line 1007 and contact hole 1435 is the overlay margin of a mask at the time of formation of a contact hole 1435.

However, the overlay accuracy of a mask by photolithography is approximately 0.18 μm under mass production. Therefore, there is a possibility of lower electrode layer 1423 and word line 1007 coming into contact with each other under the condition of the above-described overlay margin. This problem will be described in details hereinafter.

FIGS. 210–212 are sectional views of a structure where a lower electrode layer and a word line are formed in contact with each other, showing the manufacturing steps thereof. Referring to FIG. 210, first a resist pattern 1433c is formed on silicon nitride film 1021 in forming a contact hole in interlayer insulating film 1019 reaching source/drain diffusion region 1009. During this formation step, the center of a hole pattern 1434 of resist pattern 1433c (the chain dotted line Q—Q) may be offset within the range of 0.18 μm leftwards or rightwards from the alignment center (the chain dotted line P—P) to result in the offset of $L_E$. An offset of $L_E$ exceeding the overlay margin of 0.1 μm will result in the structure shown in FIG. 211. More specifically, when silicon nitride film 1021, interlayer insulating film 1019, silicon oxide film 1015 are etched anisotropically using resist pattern 1433 having an offset $L_E$ exceeding 0.1 μm, the side face of word line 1007 will be exposed from the sidewall of contact hole 1435a. If resist pattern 1433c is then removed to form capacitor 1420 under such a state, shorting will occur between lower electrode layer 1423 and word line 1007 as shown in FIG. 212.

Thus, there is a problem that shorting will occur between one electrode of the capacitor and a word line when the memory cell size is reduced in response to increasing the integration density of a DRAM.

In general, the capacitance of a capacitor is proportional to the opposing area of the electrodes, and is inversely proportional to the thickness of the capacitor dielectric film. Therefore, it is desired to increase the opposing area between electrodes in a capacitor from the standpoint of increasing the capacitor capacitance. In contrast, the memory cell size must be reduced if the integration density is to be increased in a DRAM. In response to reduction of the memory cell size, the planar occupying area of a capacitor is accordingly reduced.

Referring to FIG. 171 showing the capacitor structure of the first conventional semiconductor memory device, the surface region of lower electrode layer 1423 opposing upper electrode layer 1427 has a relatively planarized surface. Lower electrode layer 1423 has a configuration that extends horizontally. Therefore, the surface area of lower electrode layer 1423 is reduced substantially in proportion to the reduction of the planar occupying area, resulting in reduction of the opposing area of electrodes in a capacitor. This means that the charge amount stored in a capacitor (the charge amount stored in a 1-bit memory cell) is reduced. If the charge amount stored in a memory cell of 1 bit becomes lower then a predetermined value, the operation of the DRAM as a storage region becomes unsteady to degrade its reliability.

Referring to FIG. 185 showing the capacitor structure of the second conventional semiconductor memory device, lower electrode layer 1423 has a cylindrical portion 1423b extending upwards perpendicular to the surface of the semiconductor substrate. The surface area of cylindrical portion 1423b shows almost no reduction even when the planar occupying area is reduced. This means that the capacitance of the capacitor can be ensured by controlling the height of cylindrical portion 1423b even when the size of the memory cell is reduced in accordance with increase in integration density. However, if the height of the cylindrical portion 1423b is increased, the stepped difference between the memory cell region and the peripheral circuit region will be increased. Therefore, the pattern formation of an interconnection layer extending over two regions is degraded due to restriction of the depth of focus of an exposure apparatus. This means that the height of a cylindrical portion 1423b is limited, resulting in limitation of the capacitance of a capacitor 1420. In the case of further increasing the integration density, the charge amount stored in a memory cell of 1 bit will become lower than a predetermined value, whereby the DRAM serving as a storage region will show unsteady operation, as in the case of the above-described cylindrical capacitor structure.

Thus, there was a problem that reliability is deteriorated when the size of a memory cell is reduced in response to increase in integration density with unsteady operation of the DRAM.

The problem of the third conventional semiconductor memory device will be described hereinafter.

Referring to FIG. 195, a first polycrystalline silicon film 1521a which becomes a portion of the lower electrode layer is formed on the surface of silicon oxide film 1531. There is a stepped portion at the surface of silicon oxide film 1531 reflecting the stepped portion of the underlying layer. Therefore, when first polycrystalline silicon film 1521a is subjected to anisotropic etching as shown in FIG. 196, residue of silicon oxide film 1521a remains along the sidewall portion at the stepped portion of the surface of silicon oxide film 1531, resulting in the structure shown in FIGS. 213A and 213B.

FIG. 213A is a plan view schematically showing the structure where residue is left at the stepped portion at the surface of silicon oxide film 1531. FIG. 213B is a sectional view taken along line R—R of FIG. 213A. Referring to FIGS. 213A and 213B, the etching residues 1522a and 1522b of polycrystalline silicon film 1521a are seen along the sidewall of the stepped portion of silicon oxide film 1531. It is to be noted that residue 1522a forms a contact with capacitor 1020.

Then, a fluoric acid process is carried out to etch away silicon oxide films 1531 and 1533. Because this etching is carried out in an isotropical manner, silicon oxide film 1531 underlying residues 1522a and 1522b are completely removed. This complete removal of silicon oxide film 1531 will cause residue 1522b to be detached from the silicon substrate. However, residue 1522a remains in a state bridging capacitor 1020 even when the underlying layer is removed. Thus, a plurality of capacitors 1020 will be left in an electrically connected manner due to residue 1522a. There is also the possibility of residue 1522b detached from the semiconductor substrate and floating in the fluoric acid agent to be reattached to the semiconductor substrate to form electrical connection between the plurality of capacitors. If a plurality of capacitors 1020 are left in an electrically connected manner, the storing and erasing operation of data by charge storage of a capacitor can not be selectively carried out between memory cells.

SUMMARY OF THE INVENTION

An object of the present invention is to provide a semiconductor device having a contact hole of an opening diameter smaller than the minimum dimension that can be formed by photolithography technique, and a manufacturing method thereof.

Another object of the present invention is to provide a semiconductor device having a contact hole formed with superior control of the opening diameter, and a method of manufacturing thereof.

A further object of the present invention is to provide a semiconductor memory device that can have shorting between one electrode of a capacitor and a word line prevented even if the memory cell size is reduced according to increase in integration density, and a method of manufacturing thereof.

Still another object of the present invention is to provide a semiconductor memory device that has stable operation of a DRAM to improve reliability even when the memory cell size is reduced according to increase in integration density, and a method of manufacturing thereof.

A still further object of the present invention is to provide a semiconductor memory device that has shorting between capacitors prevented for reliable selective recording and erasing operation of data between each memory cell.

According to an aspect of the present invention, a method of manufacturing a semiconductor device includes the steps of: forming a first film on a semiconductor substrate, forming on the first film an etching mask having an opening exposing a partial surface of the first film, forming a first hole having a sidewall and a bottom wall of the first film by selectively etching the first film using the etching mask, removing the etching mask, forming a second hole having a sidewall and a bottom wall of the second film and a diameter smaller than that of the first hole by forming a second film of a material having an under-etching characteristic identical to that of the first film on the first film including the sidewall and the bottom of the first hole, and forming a third hole having a sidewall matching the sidewall of the second hole by etching anisotropically the first and second films.

According to a preferable aspect of manufacturing a semiconductor device of the present invention, anisotropic etching of the first and second films are carried out using gas having CO gas added to CF type gas.

In the method of manufacturing a semiconductor device according to the one aspect of the present invention, the first film is selectively etched using the etching mask. By this etching, the first hole having a sidewall and a bottom wall of the first film is formed. By forming on the first film including the sidewall and the bottom wall of the first hole a second film of a material having an under-etching characteristic equal to that of the first film, a second hole having a sidewall and a bottom wall of the second film and a diameter smaller than that of the first hole is formed. By etching anisotropically the first and second films, a third hole having a sidewall matching the sidewall of the second hole can be formed. Because the sidewall of the third hole matches the sidewall of the second hole, the diameter of the third hole becomes smaller than that of the first hole. Therefore, when the diameter of the first hole is that of the minimum dimension that can be formed by photolithography, the diameter of the third hole becomes smaller than that of the minimum dimension that can be formed by photolithography. Also, the upper layer portion of the sidewall of the third hole has a smooth inclination because an etching mask is not used in forming the third hole.

According to another aspect of the present invention, a method of manufacturing a semiconductor device includes the steps of: forming a first film on a semiconductor substrate, forming on the first film an etching mask having an opening exposing a partial surface of the first film, forming a first hole having a sidewall and a bottom wall of the first film and a diameter reduced towards the semiconductor substrate by etching the first film selectively and anisotropically using the etching mask, removing the etching mask, and forming a second hole having a sidewall matching the sidewall of the first hole by etching anisotropically the first film.

In a method of manufacturing a semiconductor device according to the another aspect of the present invention, a first film is etched selectively using an etching mask. By this etching, a first hole having a sidewall and a bottom wall of the first film and a diameter that becomes smaller towards the semiconductor substrate is formed. More specifically, this etching results in tapering of the sidewall of the hole. Therefore, when the diameter of the opening in the etching mask is set to the minimum dimension that can be formed by photolithography, the diameter of the lower end portion of the first hole can be made smaller than the minimum dimension that can be formed by photolithography. Following the formation of the first hole, the etching mask is removed. Then, by etching anisotropically the first film, a second hole having a sidewall matching the sidewall of the first hole is formed. Because the diameter of the lower portion of the first hole can be made smaller than the minimum dimension that can be formed by photolithography, the diameter of the second hole can also be made smaller than the minimum dimension that can be formed by photolithography. Also, the upper portion of the sidewall of the second hole can take a smooth inclination because an etching mask is not used in the formation of the second hole.

The etching mask is removed after formation of the first hole to avoid the possibility of the etching inhibited due to the lower end portion of the first hole being filled with the material of the etching mask as a result of reduction in the diameter of the first hole.

According to a preferable aspect of manufacturing a semiconductor device of the present invention, anisotropic etching for forming the second hole is carried out using gas in which CO gas is added to CF type gas.

According to a further aspect of the present invention, a method of manufacturing a semiconductor device includes the steps of: forming an insulating film in contact with the main surface of a semiconductor substrate, forming a first film on the insulating film of a material different from the under-etching characteristics of the insulating film, forming on the first film a second film of a material different from the under-etching characteristic of the first film, forming a first hole having a sidewall of the second film by selectively etching the second film to expose the surface of the first film, forming on the second film including the sidewall of the first hole a third film of a material different from the under-etching characteristic of the second film, forming a sidewall layer at the sidewall of the first hole by etching anisotropically the third film, forming a second hole exposing the surface of the insulating film and having a diameter smaller than that of the first hole by etching anisotropically the first film using the second film and the sidewall layer as a mask, and forming in the insulating film a third hole communicating with the second hole and reaching the main surface of the semiconductor substrate by etching anisotropically the insulating film using the first film as a mask.

According to a preferable method of manufacturing a semiconductor device of the present invention, the first film is selected from the group consisting of polycrystalline silicon, silicide, and refractory metal.

The semiconductor device of the present invention includes a semiconductor substrate having a main surface, a conductive region formed at the main surface of the semiconductor substrate, an insulating film formed on the conductive region and having a hole reaching to the conductive region, and an interconnection film formed on the insulating film and connected to the conductive region via the hole, wherein the hole formed in the insulating film has an opening diameter smaller than the minimum dimension that can be formed by photolithographic technique, and the interconnection film has a portion extending in the direction along the upper face of the insulating film. This extending portion has at least two layers extending in that direction.

In a method of manufacturing a semiconductor device according to the further aspect of the present invention, a second hole is formed in the first film using the sidewall layer formed on the sidewall of the first hole and the second film as a mask, followed by the etching of the insulating film anisotropically using the first film as a mask. Therefore, the third hole can easily be formed in self-alignment that is smaller by the width of the sidewall layer than the minimum dimension that can be formed by photolithography. Thus, a hole can be formed in a smaller space by the same design rule, and the overlay margin can be increased in patterning by photolithography.

According to an aspect of a semiconductor device of the present invention formed by the above-described manufacturing method, the hole formed in the insulating film has an opening diameter smaller than the minimum dimension that can be formed by photolithographic technique. Therefore, even when a hole is provided between interconnection layers provided on the same layer with a predetermined distance therebetween, the overlay margin between the hole and the interconnection layer is increased by the reduced dimension of the opening diameter. Therefore, the pitch between the interconnection layers can be reduced to improve the integration density.

According to still another aspect of the present invention, a method of manufacturing a semiconductor device, in addition to the step of forming the third hole, includes the steps of: forming a resist on the first film so as to fill the third hole with the resist after formation of the third holes exposing the first film by etching the resist and leaving the resist in the third hole, removing the second film by etching using the resist filled in the third hole as a mask, and removing the resist.

In a method of manufacturing a semiconductor device according to the still another aspect of the present invention, the first film is removed by etching using the resist filled in the third hole as a mask. Therefore, the stepped portion can be reduced in the film formed on the insulating film at a subsequent process. Because the third hole is filled with a resist, an underlying interconnection layer if present below the third hole will not be damaged.

According to a still further aspect of the present invention, a method of manufacturing a semiconductor device includes the steps of, after the formation of the third hole, forming a conductive film on the first film so that the third hole is filled with the conductive film, exposing the insulating film by etching the conductive film and the first film leaving the conductive film in the third hole, and forming an interconnection film on the insulating film and connected to the conductive film filled in the third hole.

In a method of manufacturing a semiconductor device according to the still further aspect of the present invention, the first film is removed by etching using the conductive film in the third hole as a mask. Therefore, the stepped portion can be reduced in the film formed on the insulating film at a subsequent process. Also, an underlying interconnection layer if present beneath the third hole will not be damaged because the third hole is filled with a conductive film.

In a method of manufacturing a semiconductor device, according to yet a further aspect of the present invention, the first film is of a conductive member and includes the steps of, after the step of forming the third hole, forming a conductive film on the first film so as to fill the third hole with the conductive film, exposing the first film by etching the conductive film and leaving the conductive film in the third hole so as to be in contact with the first film, and forming an interconnection film by patterning the exposed first film.

In a method of manufacturing a semiconductor device according to the yet further aspect of the present invention, the conductive film is etched leaving the conductive film in the third-hole to expose the first film. The first film is the interconnection film. Because the first film itself becomes an interconnection film, a stepped portion can be reduced in the film formed on the insulating film at a subsequent process. Also, an underlying lower layer interconnection if present beneath the third hole will not be damaged by etching because the third hole is filled with a conductive film.

According to yet another aspect of the present invention, a method of manufacturing the semiconductor device, after formation of the third hole, includes the steps of forming an amorphous silicon film on the first film so as to fill the third hole with the amorphous silicon film, applying thermal oxidation to the amorphous silicon film, so that the amorphous silicon film on the first film becomes a silicon oxide film and the amorphous silicon film in the third hole becomes a polycrystalline silicon film, removing the silicon oxide film and then the first film by etching using the polycrystalline silicon film in the third hole as a mask, and forming an interconnection film on the insulation film and connected to the polycrystalline silicon film filled in the third hole.

In a method of manufacturing a semiconductor device according to the yet another aspect of the present invention, first the silicon oxide film, and then the first film are removed by etching using the polycrystalline silicon film in the third hole as a mask. Therefore, the stepped portion can be reduced in the film formed on the insulating film at a subsequent process. Also, an underlying interconnection layer if present beneath the third hole will not be damaged by etching because the third hole is filled with the polycrystalline silicon film.

A method of manufacturing a DRAM according to the present invention includes the steps of: forming a MOS transistor on the main surface of a semiconductor substrate having a pair of impurity regions implementing the source/drain region, forming an insulating film on the main surface of the semiconductor substrate to cover the MOS transistor, forming on the insulating film a first film of a material having an under-etching characteristic different from that of the insulating film, forming on the first film a second film having a first hole above the impurity regions and of a material having an under-etching characteristic different from that of the first film, forming on the second film including a sidewall of the first hole a third film of a material having an under-etching characteristic identical to that of the second film, forming a sidewall layer at the sidewall of the first hole by etching anisotropically the third film, forming a second hole exposing the surface of the insulating film and having a diameter smaller than that of the first hole by etching anisotropically the first film using the second film and the sidewall layer as a mask, forming a third hole in the insulating film communicating with the second hole and exposing the impurity region by etching anisotropically the insulating film using the first film as a mask and removing the second film and the sidewall layer, forming a storage node on the insulating film connected to the impurity region via the third hole, forming a capacitor dielectric film on the storage node, and forming a cell plate on the capacitor dielectric film.

According to a preferable aspect of a method of manufacturing a semiconductor memory device of the present invention, the first film is formed of a conductive member, and the step of forming a storage node includes the steps of forming a conductive film on the first film and connected to the impurity region via the second and third holes, and forming a storage node of a layered structure of a first film and a conductive film by patterning the first film and the conductive film.

According to another preferable aspect of a semiconductor memory device according to the present invention, the storage node includes a first portion and a second portion, wherein the first portion extends over the upper surface of the insulating film so as to surround the circumference of the hole, and the second portion extends in contact with the upper face of the first portion and is connected to the impurity region via the hole.

According to one aspect of the present invention, a second film having a first hole is formed on a first film. The first hole is formed by photolithography or the like. Therefore, the diameter of the first hole cannot be made smaller than the minimum dimension can that be formed by photolithography. However, by forming a sidewall layer at the sidewall of the first hole, the diameter of the hole can be made smaller than the minimum dimension allowed by photolithography by the width of the sidewall layer. By applying an etching process using the second film and the sidewall layer of such a hole diameter as a mask, second and third holes can be formed in self-alignment in the first film and the insulating layer. The second and third holes can be formed having a diameter smaller than the minimum dimension that can be formed by photolithography. Therefore, under the same design rule, an opening can be formed in a smaller space, and the overlay margin can be increased in the patterning of photolithography.

According to a preferable aspect of a semiconductor memory device of the present invention formed by the above manufacturing method, the hole formed in the insulating film has an opening diameter greater than the minimum dimension that can be formed by photolithography. Therefore, the overlay margin between word lines are increased by the reduced dimension of the opening diameter even if a hole is formed between word lines. Thus, the pitch between word lines can be reduced to improve the integration density of memory cells and the like.

According to another preferable aspect of manufacturing a semiconductor memory device of the present invention, the step of forming a storage node includes the steps of forming a resist on the first film so that the third hole is filled with the resist, etching the resist leaving the resist in the third hole to expose the first film, etching away the first film using the resist in the third hole as a mask, removing the resist, and forming a storage node on the insulating film and connected to the impurity region via the third hole.

According to a preferable aspect of manufacturing a semiconductor memory device of the present invention, the first film is removed by etching using the resist in the third hole as a mask. Therefore, a stepped portion in the film formed on the insulating film at a subsequent step can be reduced. Furthermore, the impurity region at the bottom of the third hole is not damaged by the etching step of the first film since the third hole is filled with a resist.

According to another preferable aspect of manufacturing a semiconductor memory device of the present invention, the step of forming a storage node includes the steps of forming a conductive film so as to fill the third hole and on the first film to provide contact with the impurity region via the third hole, and etching the conductive film and the first film leaving the conductive film formed in the third hole, and forming a storage node on the insulating film in contact with the conductive film formed in the third hole.

According to a further preferable aspect of manufacturing a semiconductor memory device of the present invention, the first film is removed by etching using the conductive film in the third hole as a mask. Therefore, the stepped portion in the film formed on the insulating film at a subsequent step can be reduced. Because the third hole is filled with a conductive film, the impurity region at the bottom of the third hole will not be damaged by the etching process of the first film.

According to still another preferable aspect of manufacturing a semiconductor memory device of the present invention, the first film is formed of a conductive member, and the step of forming a storage node includes the steps of forming a conductive film so as to fill the third hole and on the first film to be connected to the impurity region via the third hole, etching the conductive film leaving the conductive film in the third hole to expose the first film, and patterning the first film to form a storage node.

According to another preferable aspect of manufacturing a semiconductor memory device of the present invention, the conductive film is removed by etching to expose the surface of the first film, leaving the conductive film only in the third hole. The first film serves as the interconnection film. Therefore, a stepped portion in a film formed on the insulating film at a subsequent step can be reduced. Because the third hole is filled with a conductive film, the impurity region at the bottom of the third hole will not be damaged by the etching process of the conductive film.

According to another preferable aspect of manufacturing a semiconductor memory device of the present invention, the step of forming a storage node includes the steps of forming an amorphous silicon film filling the third hole and on the first film to be connected to the impurity region via the third hole, thermal oxidizing the amorphous silicon film to change the amorphous silicon film on the first film to a silicon oxide film and the amorphous silicon film in the third hole to a polycrystalline silicon film, etching the silicon oxide film and then the first film using the polycrystalline silicon film in the third hole as a mask, and forming a storage node in contact with the polycrystalline silicon film in the third hole on the insulating film.

According to another preferable aspect of manufacturing a semiconductor memory device of the present invention, the silicon oxide film, and then the first film are removed by etching using the polycrystalline silicon film in the third hole as a mask. Therefore, a stepped portion in a film formed on the insulating film at a subsequent step can be reduced. Because the third hole is filled with a polycrystalline silicon film, the impurity region at the bottom of the third hole will not be damaged by the above-described etching step.

According to another aspect of manufacturing a semiconductor memory device of the present invention, the manufacturing step includes the steps of: forming a MOS transistor at the main surface of a semiconductor substrate having a pair of impurity regions which become the source/drain region; forming an insulating film on the main surface of the semiconductor substrate so as to cover the MOS transistor; forming a first conductive film of a material having an under-etching characteristic different from that of the insulating film, and then a first covering film of a material having an under-etching characteristic different from that of the first conductive film as stacked layers, followed by forming a first hole in the first conductive film and the first covering film; forming a second conductive film on the sidewall of the first hole and on the first covering film and of a material having an under-etching characteristic different from that of the first covering film; forming a sidewall layer on the sidewall of the first hole in contact with the first conductive film by etching anisotropically the second conductive film; etching anisotropically the insulating film using the sidewall layer as a mask to expose the impurity region in the insulating film to form a second hole having a diameter smaller than that of the first hole, and removing the covering film; forming a third conductive film so as to be in contact with the surface of the first conductive film and the sidewall layer, and connected to the impurity region via the second hole; forming a capacitor dielectric film so as to cover the surface of the storage node having the first conductive film, the sidewall layer, and the third conductive film, and forming a cell plate on the capacitor dielectric film.

According to a preferable aspect of manufacturing a semiconductor memory device of the present invention, the sidewall layer is formed of amorphous silicon.

According to another preferable aspect of a semiconductor memory device of the present invention, the storage node includes a first portion, a second portion, and the third portion, wherein the first portion is formed at a first level of height on the surface of the insulating film so as to surround the circumference of the hole. The second portion is formed at a second level of height lower than the first level of height on the upper face of the insulating film in contact with the lower end of the first portion and surrounding the first portion. The third portion extends in contact with the upper faces of the first and second portions, and is connected to the impurity region via the hole.

According to another aspect of manufacturing a semiconductor memory device of the present invention, the first hole is formed in the first conductive film and the first covering film. The first hole is formed by a photolithographic step. Therefore, the opening diameter of the first hole cannot be made smaller than the minimum dimension that can be formed by photolithographic technique. However, by forming a sidewall layer on the sidewall of the first hole, the opening diameter can be made smaller by the width of the sidewall layer than the minimum dimension allowed by photolithography. By applying an etching process using the first conductive film and the sidewall layer having such an opening diameter as a mask, the second hole can be formed in self-alignment in the insulating film. The second hole can be formed having an opening diameter smaller than the minimum dimension that can be formed by photolithographic technique. Therefore, an opening can be formed in a smaller area under the same design rule, and the overlay margin in patterning by photolithographic technique can be increased.

According to another preferable aspect of a semiconductor memory device of the present invention formed by the above-described manufacturing method, the first portion of the lower electrode layer is formed in the inside portion of the second portion, and is upwards perpendicular to the main surface of the semiconductor substrate and higher than the surface of the second portion. More specifically, the lower electrode layer has a portion protruding upwards vertically in the inside portion. Therefore, the surface area of the lower electrode layer is increased by the portion protruding vertically upwards in comparison with a conventional capacitor formed of a relatively planar configuration. Therefore, the electrode opposing area between the upper electrode layer and the lower electrode layer can be increased to improve the capacitance. Even if the planar area of the capacitor is reduced, there is hardly no reduction in the surface area of the upward protruding portion. This means that the capacitance of a capacitor can be increased and ensured by controlling the surface area of the portion protruding upwards and vertically in the event of increasing the integration density.

Furthermore, even in a general cylindrical type capacitor, this protruding portion of the inside portion is applied, so that the surface area is increased by the portion extending upwards and vertically in the inside region. Thus, the electrode opposing area of a capacitor can be increased and ensured within a range of a limited level of height.

Because the capacitance of a capacitor can be increased or ensured, unstable operation or reduction in reliability of the operation of a DRAM associated with increase in integration density can be prevented.

According to another aspect of a method of manufacturing a semiconductor memory device of the present invention, the manufacturing method includes the steps of: forming a MOS transistor having a pair of impurity region serving as source/drain regions at the main surface of a semiconductor substrate; forming a first insulating film at the main surface of the semiconductor substrate so as to cover the MOS transistor and having a planarized upper surface; forming a first conductive film on the upper surface of the first insulating film with a second insulating film of a predetermined thickness therebetween; forming a second conductive film on the first conductive film with a third insulating film having a predetermined thickness therebetween; forming a first covering film having a hole above the impurity region on the second conductive film; forming a second covering film on the sidewall of the first hole and on the first covering film; forming a sidewall layer on the sidewall of the first hole by etching anisotropically the second covering film; etching anisotropically the second conductive film with the first covering film and the sidewall layer as a mask to expose the surface of the third insulating film and forming a second hole having a diameter smaller than that of the first hole; etching anisotropically the third insulating film, the first conductive film, the second insulating film, and then the first insulating film to form a third hole communicating with the second hole and exposing the impurity region, and removing the first covering film and sidewall layer; forming a third conductive layer so as to be in contact with the upper surface of the second conductive film and the first conductive film, and connected to the impurity region via the second and third holes; patterning the first, second and third conductive films to form a storage node; removing the second and third insulating films; forming a capacitor dielectric film so as to cover the surface of storage node; and forming a cell plate on the capacitor dielectric film.

According to another preferable aspect of a semiconductor memory device of the present invention, the insulating film has a planarized surface, and the storage node has a first portion, a second portion, and a third portion. The first portion extends in the direction along the upper surface of the insulating film with a predetermined distance from the upper surface thereof. The second portion extends in a direction along the upper surface of the insulating film above the first portion with a predetermined distance thereto. The third portion extends in contact with the upper face of the second portion, contacts the first portion, and is connected to the impurity region via the hole.

According to another aspect of a method of manufacturing a semiconductor memory device of the present invention, a first covering film having a first hole is formed on a second conductive film. The first hole is formed by photolithography, for example. Therefore, the opening diameter of the first hole cannot be made smaller than the minimum dimension that can be formed by photolithography. However, by forming a sidewall layer at the sidewall of the first hole, the opening diameter thereof can be made smaller by the width of the sidewall layer than the minimum dimension that can be formed by photolithography. By applying etching using the first covering film having such opening diameter and a sidewall layer as a mask, a second hole can be formed in self-alignment. The second hole can be formed having an opening diameter smaller than the minimum dimension that can be formed by photolithography. Thus, under the same design rule, a hole can be formed in a smaller space, and the overlay margin can be increased in patterning by photolithographic technique.

The first conductive film is formed on the first insulating film having a planarized surface with a second insulating film of a predetermined thickness therebetween. Therefore, there is no stepped portion in the layer underlying the first conductive film. Therefore, residue of the first conductive film will not remain at the sidewall of a stepped portion of the underlying layer in the step of forming a lower electrode layer by selectively etching away the first, second and third conductive films. Therefore, lower electrode layers will not be connected to each other by residues between a plurality of capacitors. Therefore, selective data storing and erasing can be carried out reliably between each memory cell.

According to a further aspect of a method of manufacturing a semiconductor memory device including a MOS transistor having a pair of impurity regions which become the source/drain regions, and a capacitor having a storage node, wherein the impurity region and the storage node are electrically connected via a first hole formed in an insulating film covering the MOS transistor, the manufacturing method includes the steps of forming on the insulating film a first film having a second hole above the impurity region, forming a second film all over the inside wall of the second hole and the surface of the first film, etching anisotropically the second film to form a sidewall layer on the sidewall of the second hole, etching anisotropically the insulating film with the first film and the sidewall layer as a mask to expose partially a surface of the impurity region and forming in the insulating film a first hole having a diameter smaller than that of the second hole.

According to an aspect of the present invention, a semiconductor memory device includes a semiconductor substrate having a main surface, a MOS transistor having a pair of impurity regions which become the source/drain regions on the main surface of the semiconductor substrate, an insulating film covering the MOS transistor and having a hole reaching the impurity region, a storage node formed on the insulating film so as to be connected to the impurity region via the hole, a capacitor dielectric covering the storage node, and a cell plate formed on the capacitor dielectric film. The hole formed in the insulating film has an opening diameter smaller than the minimum dimension that can be formed by photolithographic technique. The storage node has a portion extending along the direction on the surface of the insulating film. The extending portion extends in this direction stacked by at least two layers.

According to a preferable aspect of a semiconductor memory device of the present invention, the cell plate extends within the region of the hole, and is opposed to the storage node in the region of the hole with a capacitor dielectric film therebetween.

According to a method of manufacturing a semiconductor memory device summarizing the 3 above-described aspects of the present invention, a first film having a second hole is formed on an insulating film. This second hole is formed by a process of photolithography, for example. Therefore, the opening diameter of the second hole cannot be made smaller than the minimum dimension that can be formed by photolithography. However, by forming a sidewall layer at the sidewall of the first hole, the opening diameter thereof can be made smaller than the minimum dimension that can be formed by photolithography by the widths of the sidewall layer. By carrying out an etching step using the first film having this opening diameter and the sidewall layer as a mask, a first hole can be formed in the insulating film by self-alignment. The first hole can be formed with an opening diameter smaller than the minimum dimension that can be formed by photolithography. Therefore, in the same design rule, the opening can be formed in a smaller space, and the overlay margin is increased in patterning by photolithographic technique.

According to an aspect of a semiconductor memory device of the present invention formed by the above-described manufacturing method, the hole formed in the insulating film has an opening diameter smaller than the minimum dimension that can be formed by photolithography. Therefore, even when a hole is formed between word lines, the overlay margin between the hole and word line is increased by the distance of the reduced dimension of the opening diameter. Therefore, the pitch between word lines can be reduced to improve the integration density of a memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings.

(Embodiment 1–3)

First, formation of a contact hole according to the present invention will be described as a method of manufacturing a semiconductor device according to first, second and third embodiments of the present invention.

First Embodiment

FIGS. 1–11 are sectional views of a semiconductor device for describing the manufacturing method of a first embodiment of the present invention. The first embodiment is an application to a memory cell of a DRAM.

Figure 1:
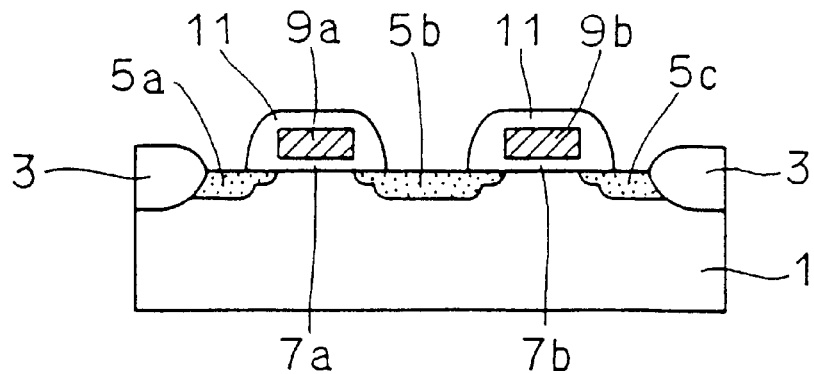
FIGS. 1–11 are sectional views of a semiconductor device according to a first embodiment of the present invention for describing the manufacturing steps thereof.
Figure 163:
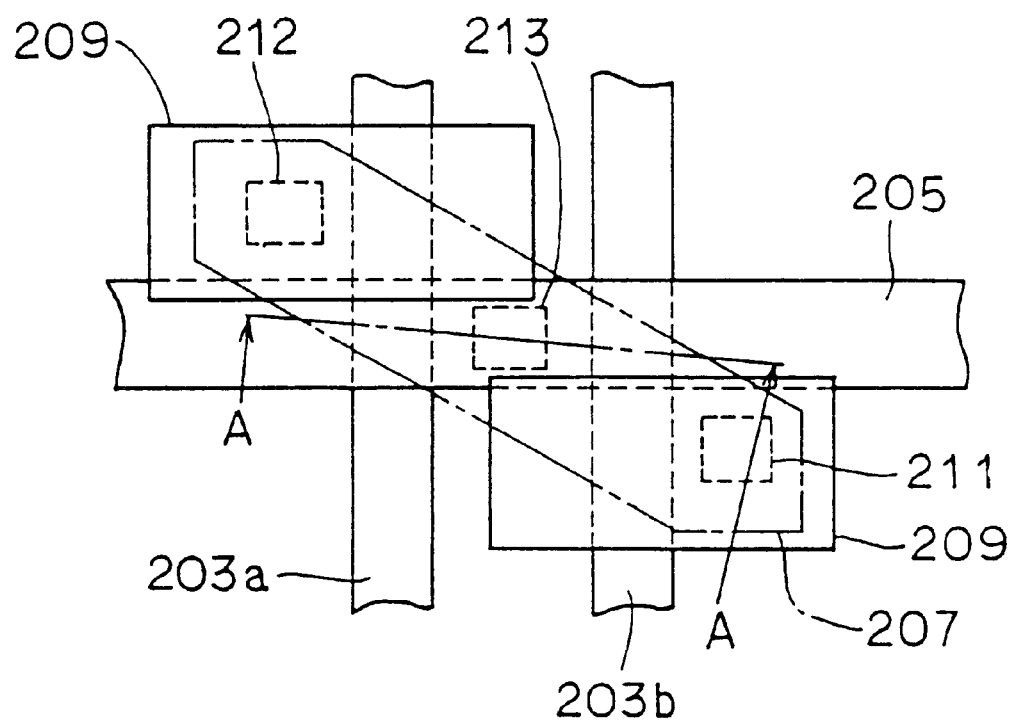
FIG. 163 is a plan layout diagram showing a DRAM having a conventional stacked type capacitor.
Figure 164:
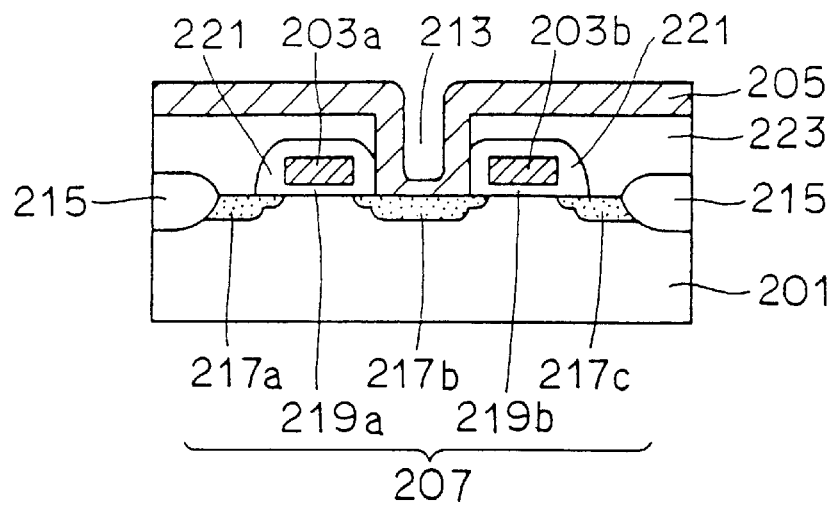
FIG. 164 is a sectional view of the DRAM of FIG. 163 taken along line A—A.
Figure 165:
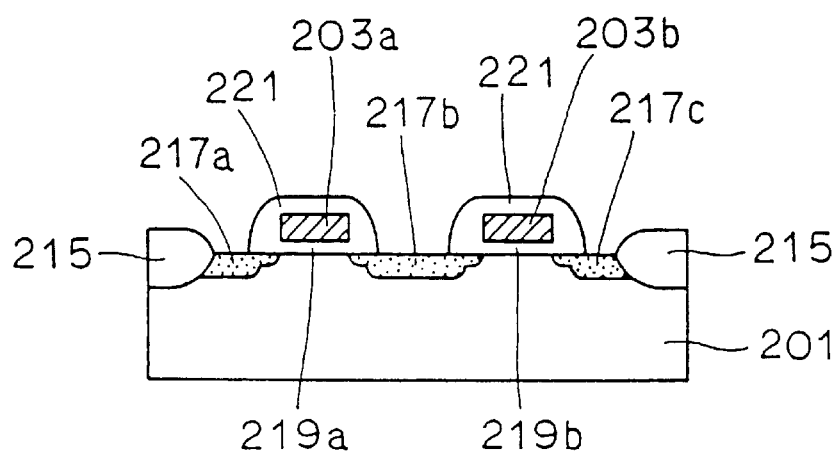
FIGS. 165–170 are sectional views of the DRAM of FIG. 163 taken along line A—A for describing the manufacturing steps thereof in order.
Figure 166:
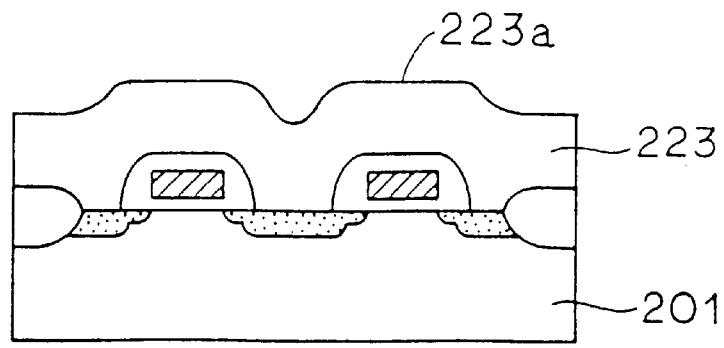
Figure 167:
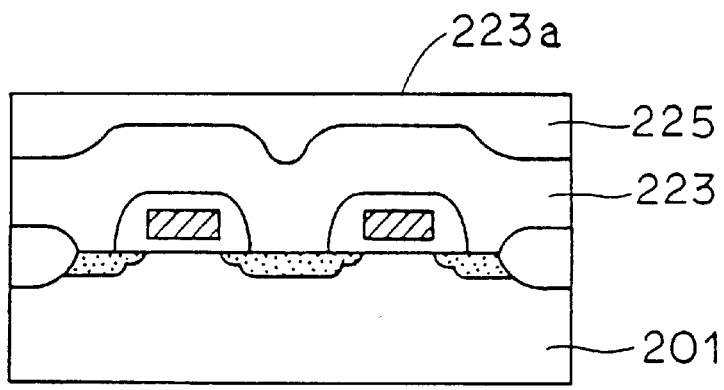
Figure 168:
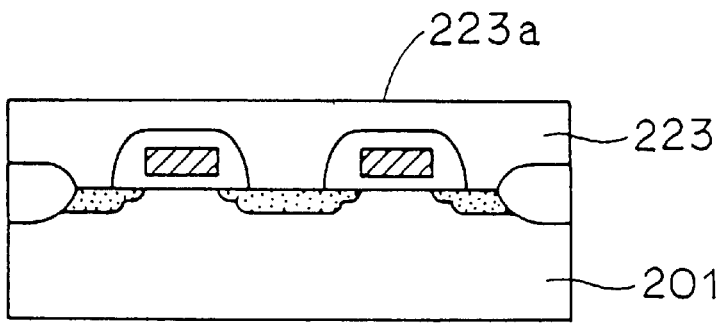
Figure 169:
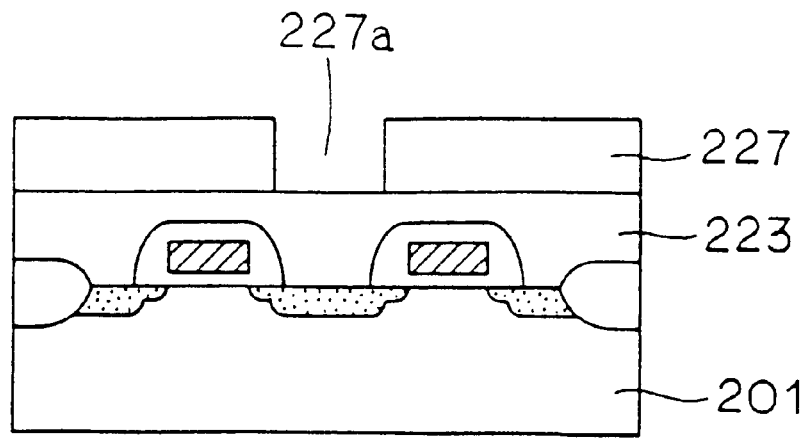
Figure 170:
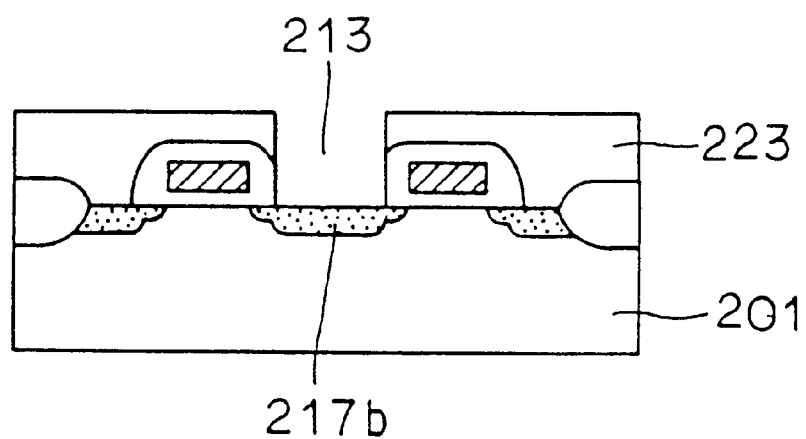
Figure 171:
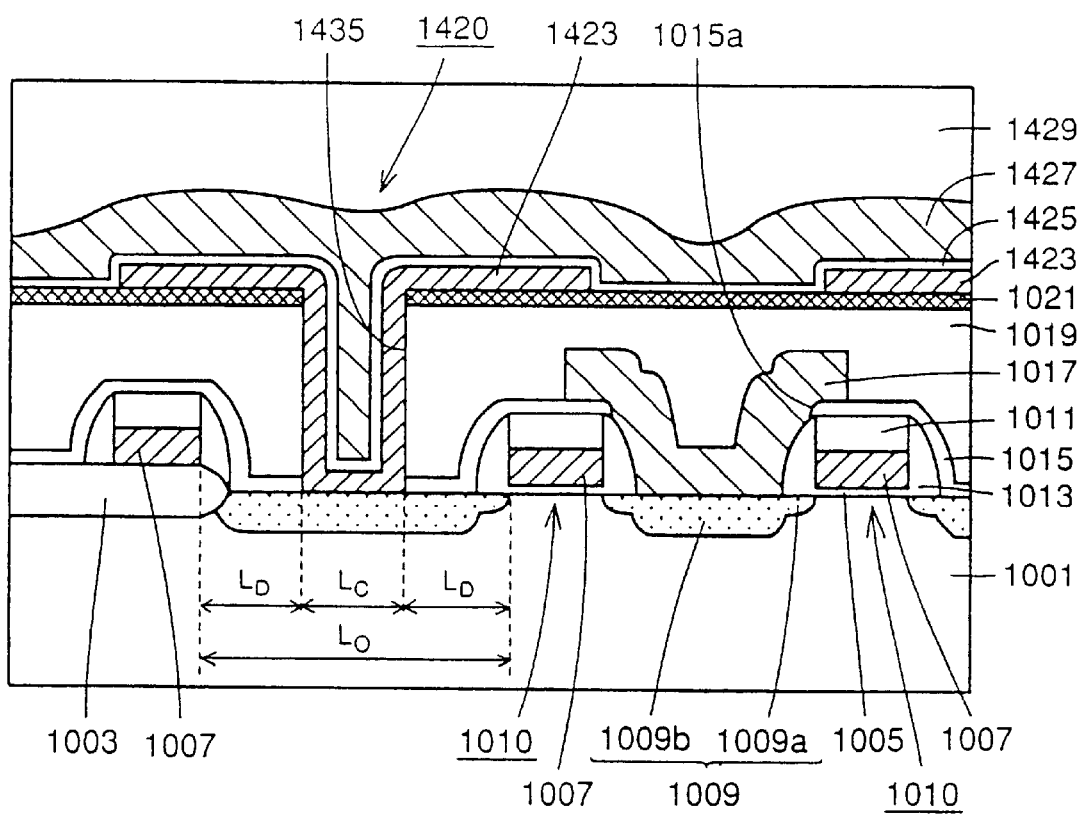
FIG. 171 is a sectional view schematically showing the structure of a first conventional semiconductor memory device.
Figure 172:
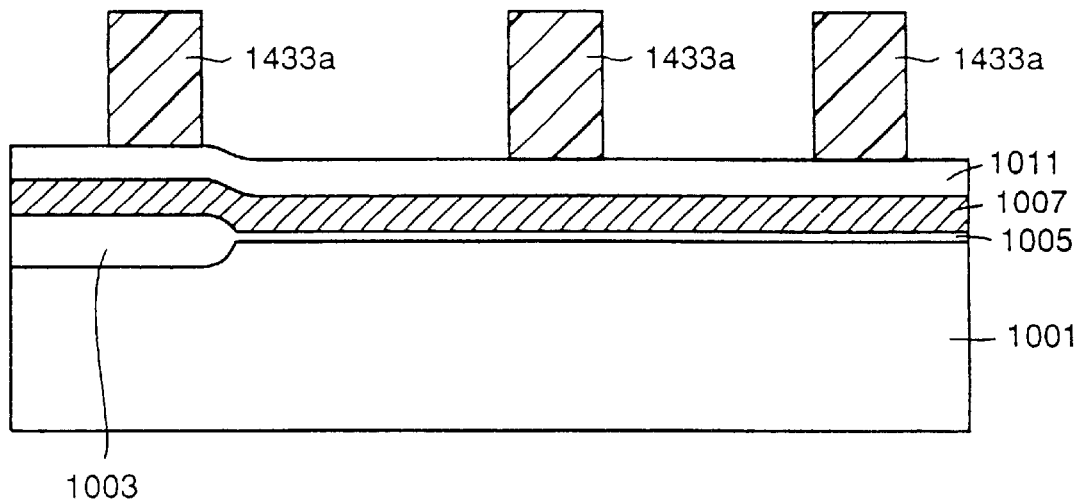
FIGS. 172–184 are sectional views of the first conventional semiconductor memory device for describing the manufacturing steps thereof.
Figure 173:
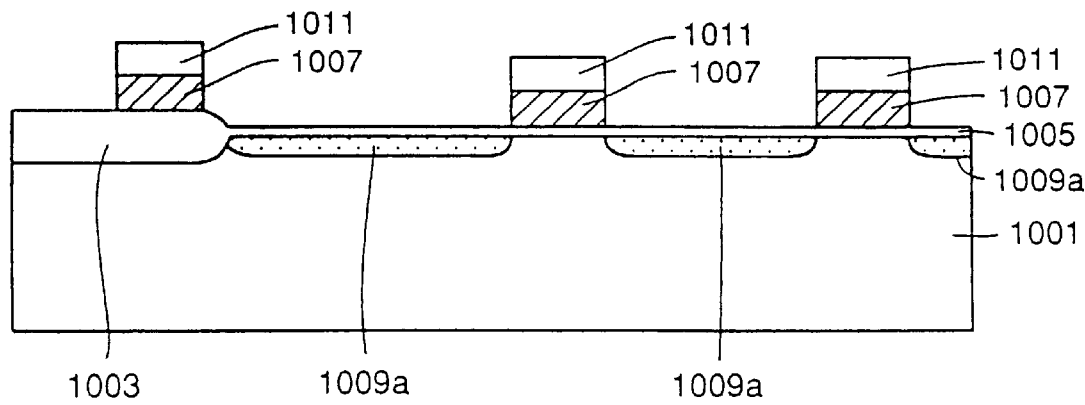
Figure 174:
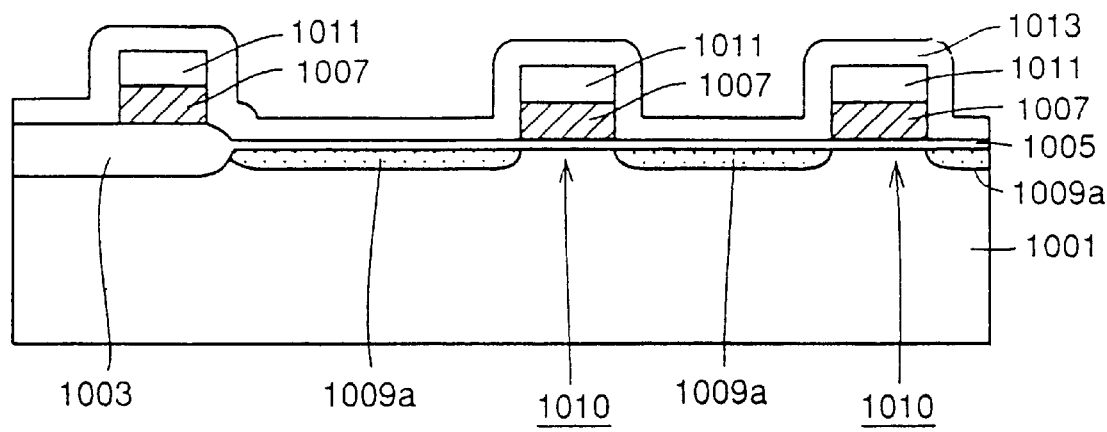
Figure 175:
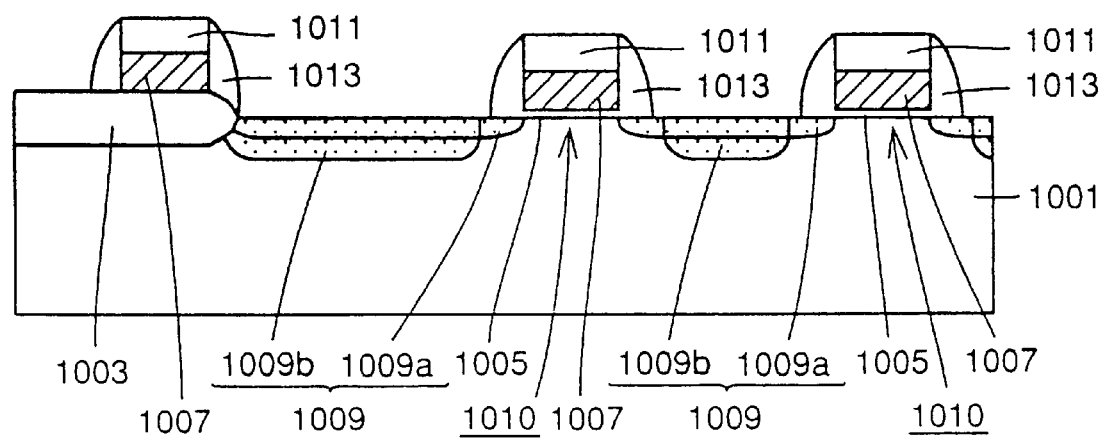
Figure 176:
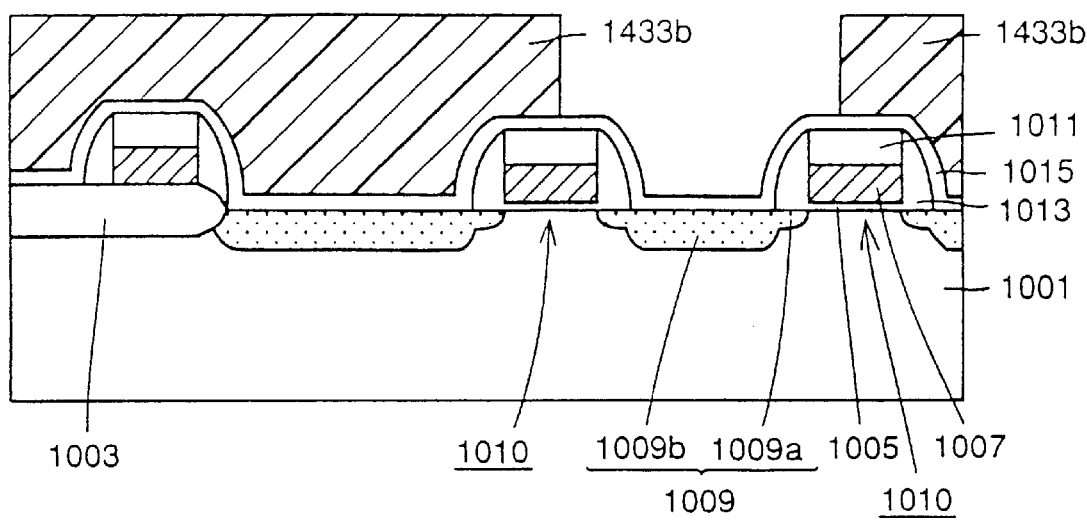
Figure 177:
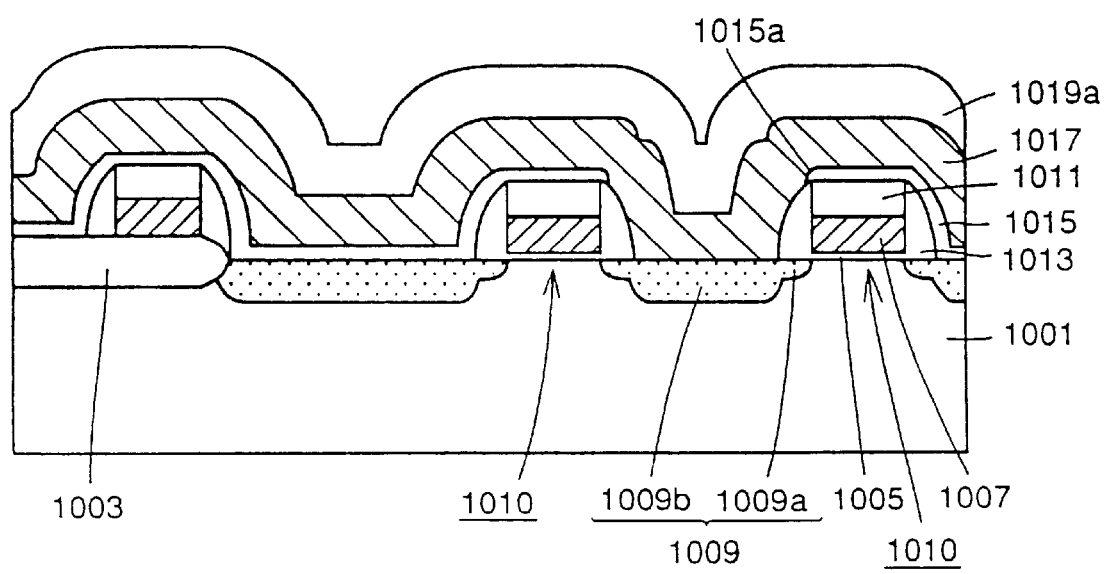

The structure of FIG. 1 is identical to that shown in FIG. 163 and their description will not be repeated.

Figure 2:
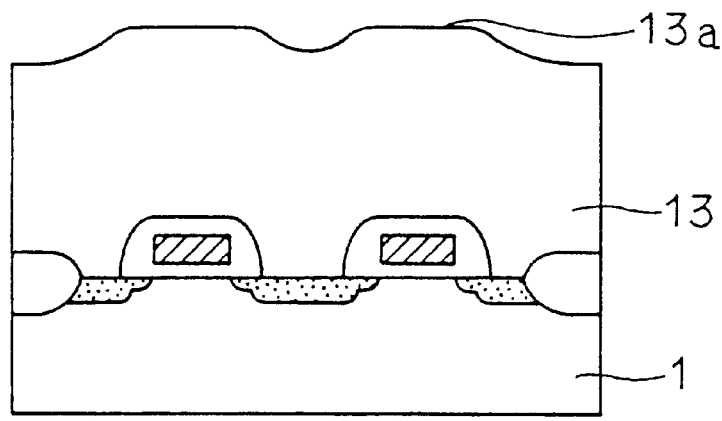

Referring to FIG. 2, a TEOS film 13 is formed all over the main surface of a semiconductor substrate 1. A stepped portion is generated at the surface 13a of TEOS film 13 reflecting the underlying configuration.

Figure 3:
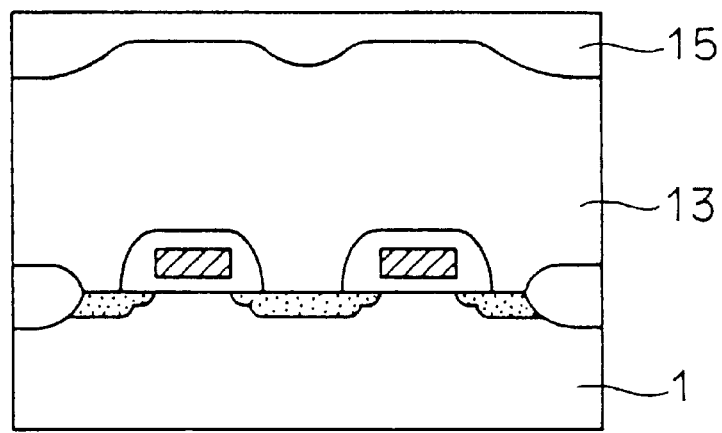

To reduce this stepped portion; a SOG film 15 is formed on TEOS film 13, as shown in FIG. 3.

Figure 4:
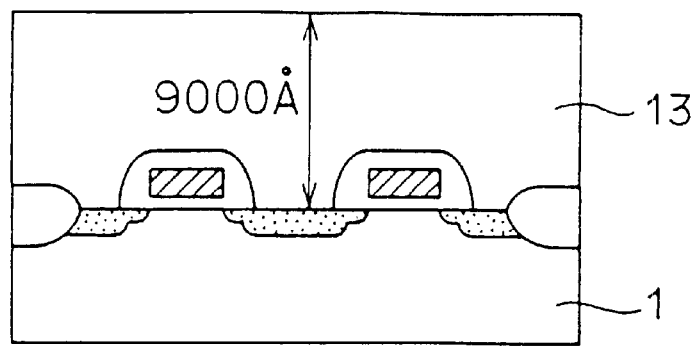

Referring to FIG. 4, TEOS film 13 and SOG film 15 are etched back. Therefore, the surface of TEOS film 13 is planarized to result in interlayer insulating film 13.

Interlayer insulating film 13 has a thickness of approximately 9000 Å.

Figure 5:
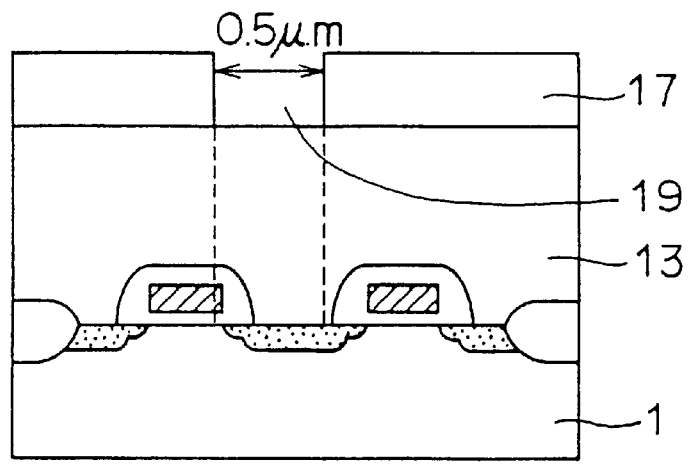

Referring to FIG. 5, a resist 17 is formed on interlayer insulating film 13 in a predetermined area including an opening 19 having an opening diameter of 0.5 μm which is the limiting dimension of photolithography.

Figure 6:
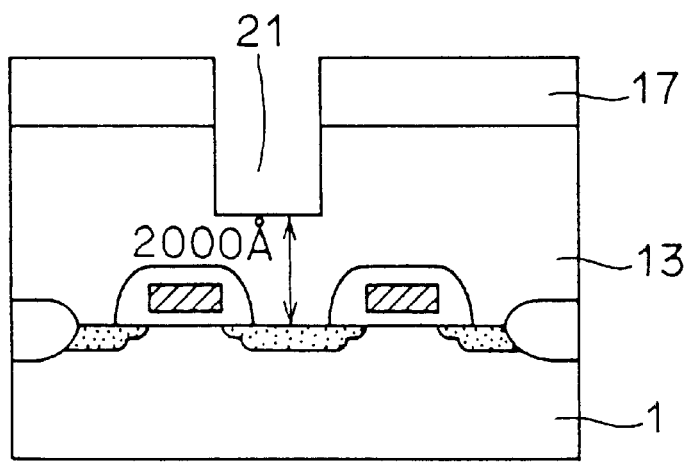
Figure 7:
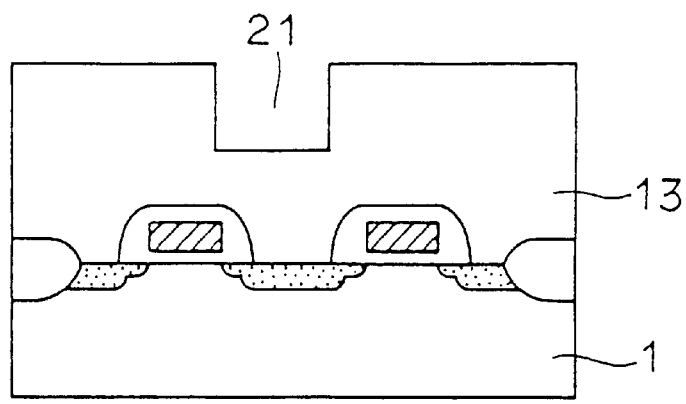

Referring to FIG. 6, interlayer insulating film 13 is anisotropically etched halfway using resist 17 as a mask. More specifically, interlayer insulating film 13 is anisotropically etched until the thickness is approximately 2000 Å. This anisotropic etching is carried out by dry etching using plasma of CF type gas ($CHF_3/CF_4/Ar$). As a result, a first hole 21 is formed having a predetermined depth in interlayer insulating film 13 and an opening diameter of 0.5 μm. Then, resist 17 is removed as shown in FIG. 7.

Figure 8:
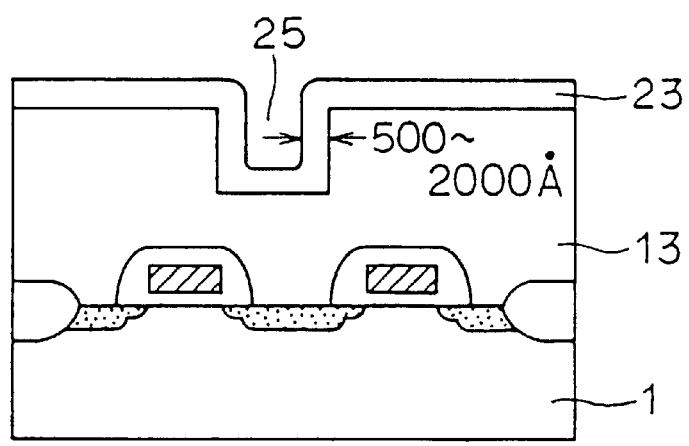

Referring to FIG. 8, a TEOS film 23 having a thickness of approximately 500–2000 Å is formed on interlayer insulating film 13. Thus, a second hole 25 is formed having a diameter smaller than that of the first hole 21.

Figure 9:
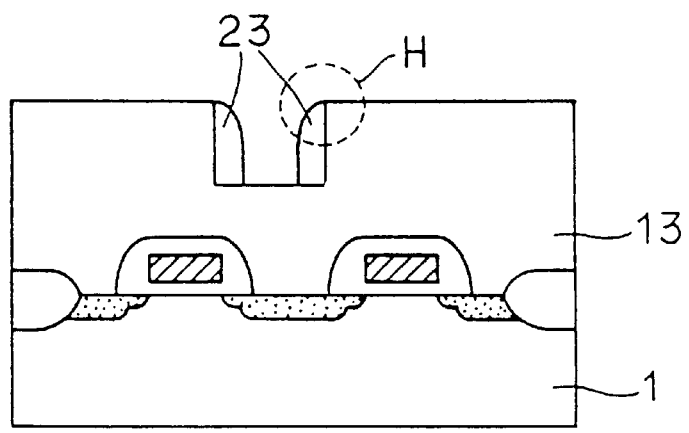

Referring to FIG. 9, interlayer insulating film 13 and TEOS film 23 are anisotropically etched all over using CF type gas ($CHF_3/CF_4/Ar$).

Figure 10:
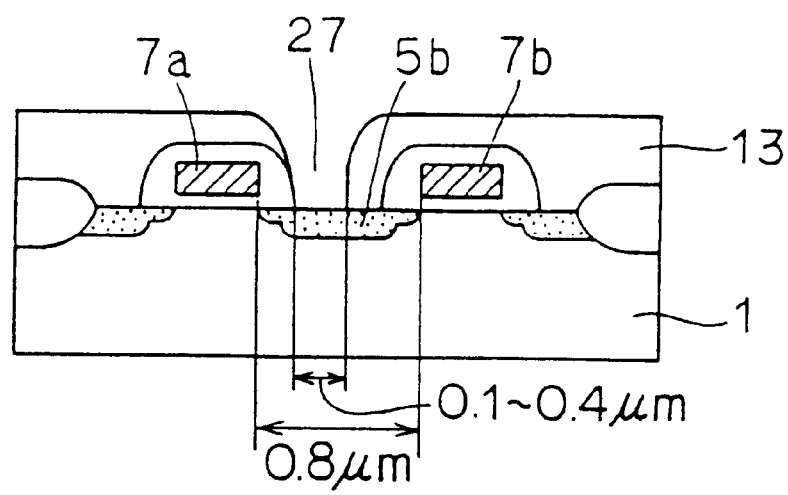

By continuing this overall anisotropic etching, contact hole 27 can be formed in self-alignment in which the lower opening diameter is 0.1–0.4 μm as shown in FIG. 10. The etch rate of the corner portion H (refer to FIG. 9) is higher than that of other portions in this overall etching. Therefore, contact hole 27 will have a configuration that is increased in opening diameter in the upward direction.

Figure 11:
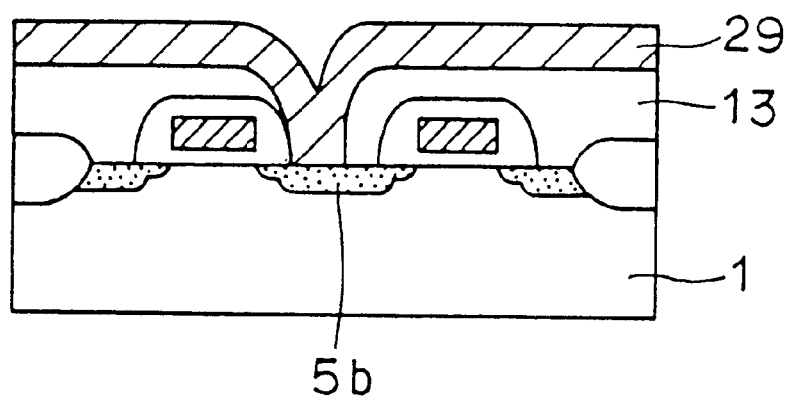

As shown in FIG. 11, a bit line 29 is formed to provide electrical connection with impurity region 5b in contact hole 27, and extending on the surface of interlayer insulating film 13.

Thus, a contact hole 27 can easily be formed having a opening diameter (for example 0.3 μm) that is further smaller than the opening diameter of a contact hole of minimum dimension (0.5 μm) that can be formed by photolithography. Therefore, an overlay margin of 0.25 μm at the left side and at the right side can be obtained when the distance between gate electrodes 7a and 7b is 0.8 μm. This is a great improvement in comparison with the overlay margin of 0.15 μm at the left side and the right side of a contact hole having a conventional opening diameter of 0.5 μm. Also, because this value of 0.25 μm is greater than 0.18 μm which is the limit of an overlay accuracy by photolithography, the conventional shorting problem between bit line 29 and gate electrode 7a or 7b will not occur even if the deviation is at the maximum value of 0.18 μm.

Furthermore, because the contact hole 27 formed according to the present embodiment has its opening diameter increased in the upward direction, the coverage of bit line 29 can be improved in the case where bit line 29 is formed in contact hole 27.

When a contact hole 27 having an opening diameter smaller than the minimum dimension of photolithography is formed according to the present embodiment, a rise in the contact resistance between bit line 29 and impurity region 5b may be suspected. However, this increase in contact resistance is not so great even if a contact hole 27 of a small opening diameter is formed because the contact resistance between bit line 29 and impurity region 5b greatly depends upon the impurity concentration of impurity region 5b rather than the opening diameter of the contact portion of contact hole 27.

Figure 12:
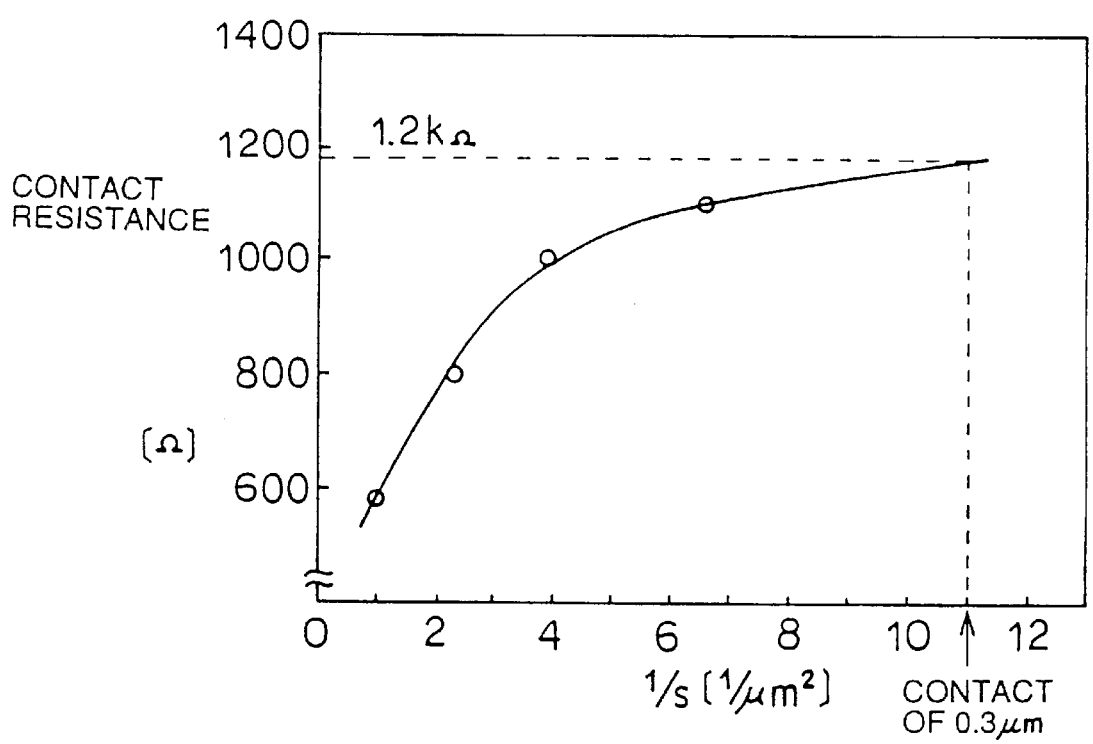
FIG. 12 is a characteristics diagram showing the relationship between the opening dimension of a contract hole and contact resistance.

FIG. 12 is a characteristic diagram showing the relationship between a reciprocal of the aperture area of he contact hole and contact resistance. Referring to FIG. 12, the contact resistance may be below 10 kΩ according to the characteristics of a DRAM if the data read out time between storage node/bit line in a DRAM is 1 ns. Referring to FIG. 12 from such a standpoint, the contact resistance is approximately 1.2 kΩ in a contact hole of 0.3 μm□. Therefore, there is no problem if the opening diameter of contact hole 27 is reduced to approximately 0.3 μm according to the characteristics of a DRAM.

Next, the manufacturing method of the present embodiment will be described for manufacturing the semiconductor device with peripheral circuitry.

FIGS. 13–16 are sectional views of a semiconductor device with peripheral circuitry for describing the first embodiment of a manufacturing method of the present invention. The first embodiment is described in the case where the thickness of interlayer insulating film 13 formed in the memory cell portion is thicker than the interlayer insulating film 13b formed at the peripheral circuitry.

Figure 13:
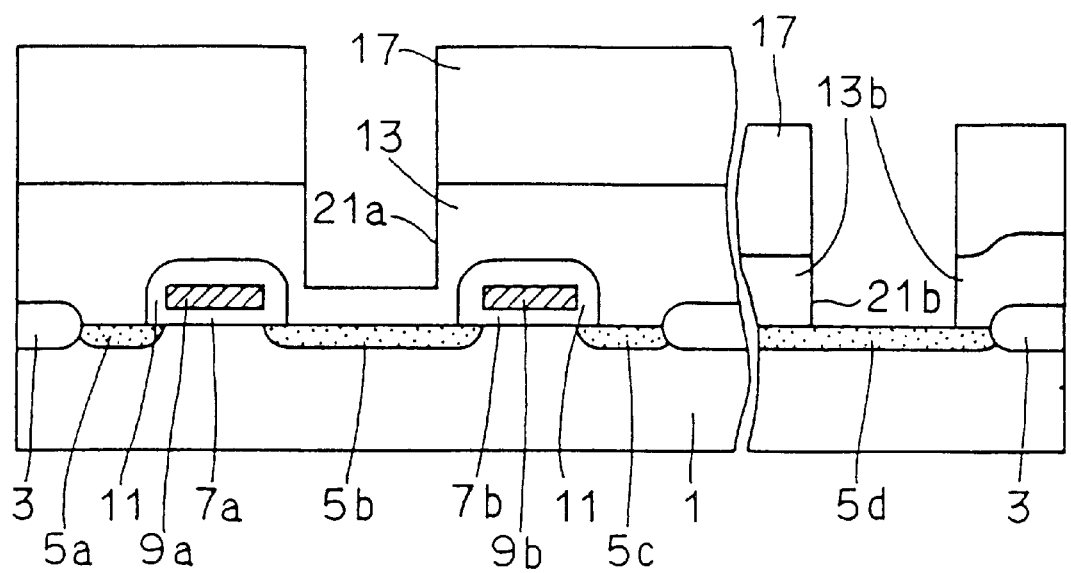
FIGS. 13–16 are sectional views of a semiconductor device according to the first embodiment of the present invention for describing a manufacturing method thereof with peripheral circuitry.

Referring to FIG. 13, a first hole 21a is formed in interlayer insulating film 13 by a process similar to that of the manufacturing process described with reference to FIGS. 1–6. When first hole 21b is formed in the peripheral circuit portion simultaneous to the information of first hole 21a, first hole 21b will become a penetrating hole since interlayer insulating film 13b is thin in the peripheral circuit portion.

Figure 14:
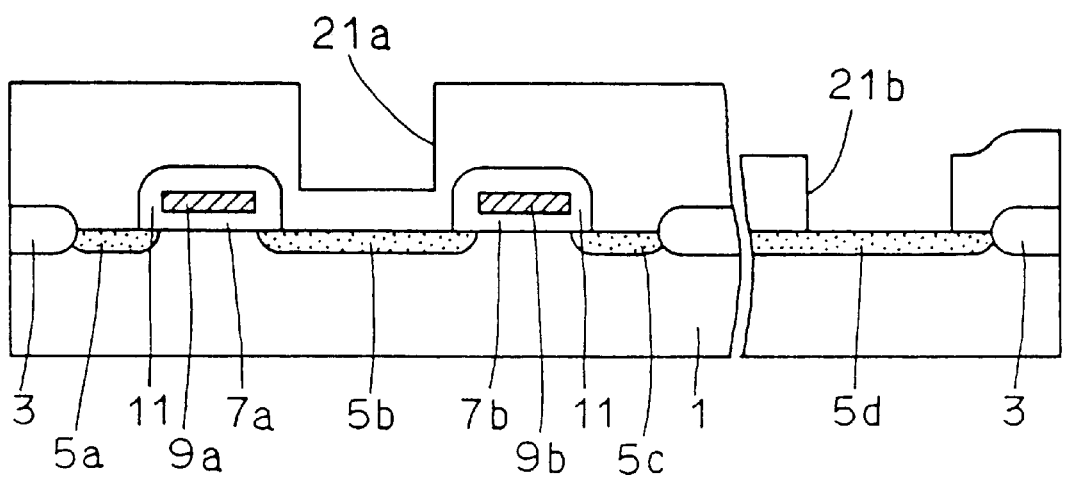

Then, resist 17 is removed as shown in FIG. 14. Carbon supplied from resist 17 is deposited on silicon substrate 1 (impurity region 5d). Thus, the selectivity between silicon substrate 1 and interlayer insulating film 13b is increased. Therefore, the overetched amount of silicon substrate 1 (impurity region 5d) is low even if first hole 21b is penetrated.

Figure 15:
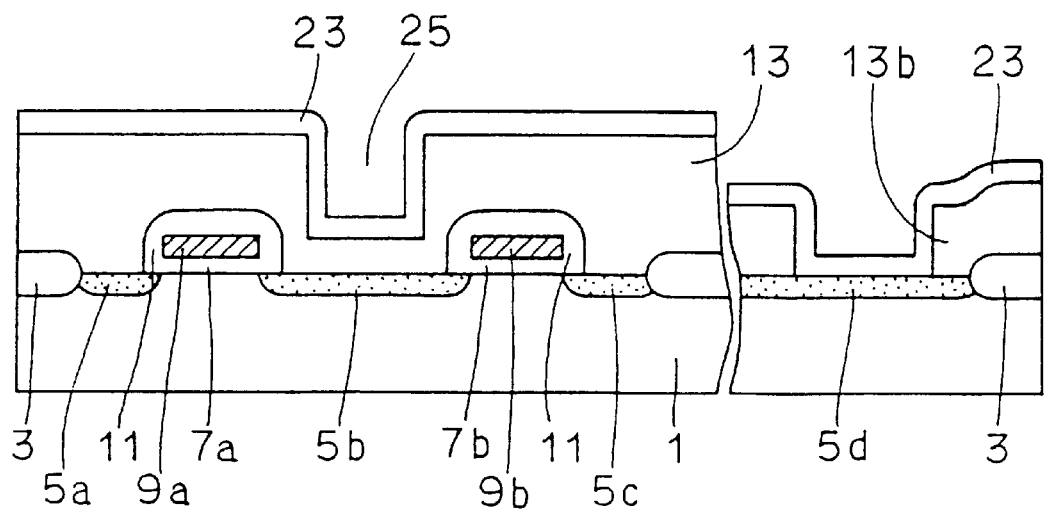

Referring to FIG. 15, a TEOS film ($SiO_2$ film) 23 is formed all over.

Figure 16:
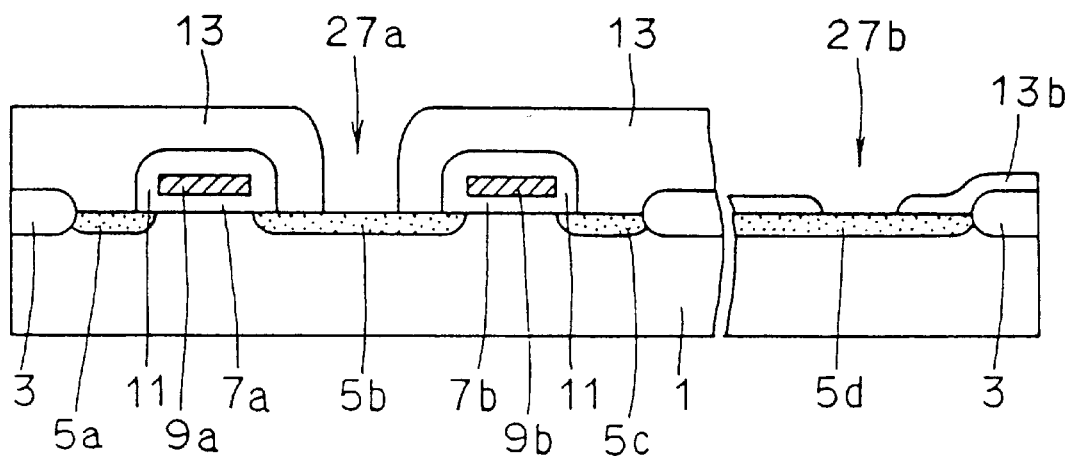

Referring to FIG. 16, a contact hole 27a in the memory cell portion and a contact hole 27b in the peripheral circuit portion are formed by etching anisotropically interlayer insulating films 13 and 13b and TEOS film 23 all over.

A CF type gas including CO (CHF$_3$/CF$_4$/Ar/CO gas) is used in this anisotropic etching. Dry etching using CF type gas having CO added has a high selectivity to semiconductor substrate (silicon substrate) 1 in comparison with dry etching by a CF type gas not having CO added.

Here, selectivity is (the etching rate of SiO$_2$)/(the etching rate of silicon substrate). More specifically, the selectivity is 15–20 and approximately 4–6 under a CF type dry etching having CO added and not having CO added, respectively.

A high selectivity with respect to semiconductor substrate 1 provides the advantage of efficiently preventing excessive etching of the surface of semiconductor substrate 1 at the time of forming contact hole 27b in the peripheral circuit portion. In forming contact hole 27b in the peripheral circuit at the time of forming contact hole 27a in the memory cell portion, the overetching time period of the surface of semiconductor substrate 1 exposed by contact hole 27b will be increased because the interlayer insulating film 13b is thin in the peripheral circuit potion. If dry etching by a CF type gas having CO added and exhibiting high selectivity is carried out, the surface of semiconductor substrate 1 can be prevented from being etched excessively due to overetching of semiconductor substrate 1.

The mechanism of dry etching using plasma of a CF type gas and dry etching characteristics by a CF type gas having CO added will be described hereinafter.

Figure 19:
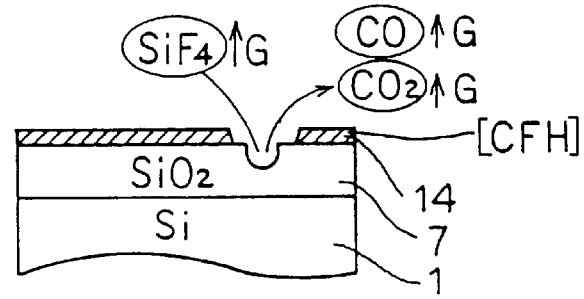
Figure 20:
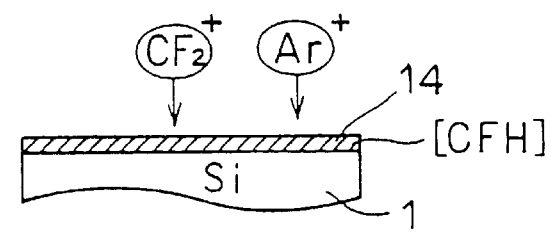
Figure 21:
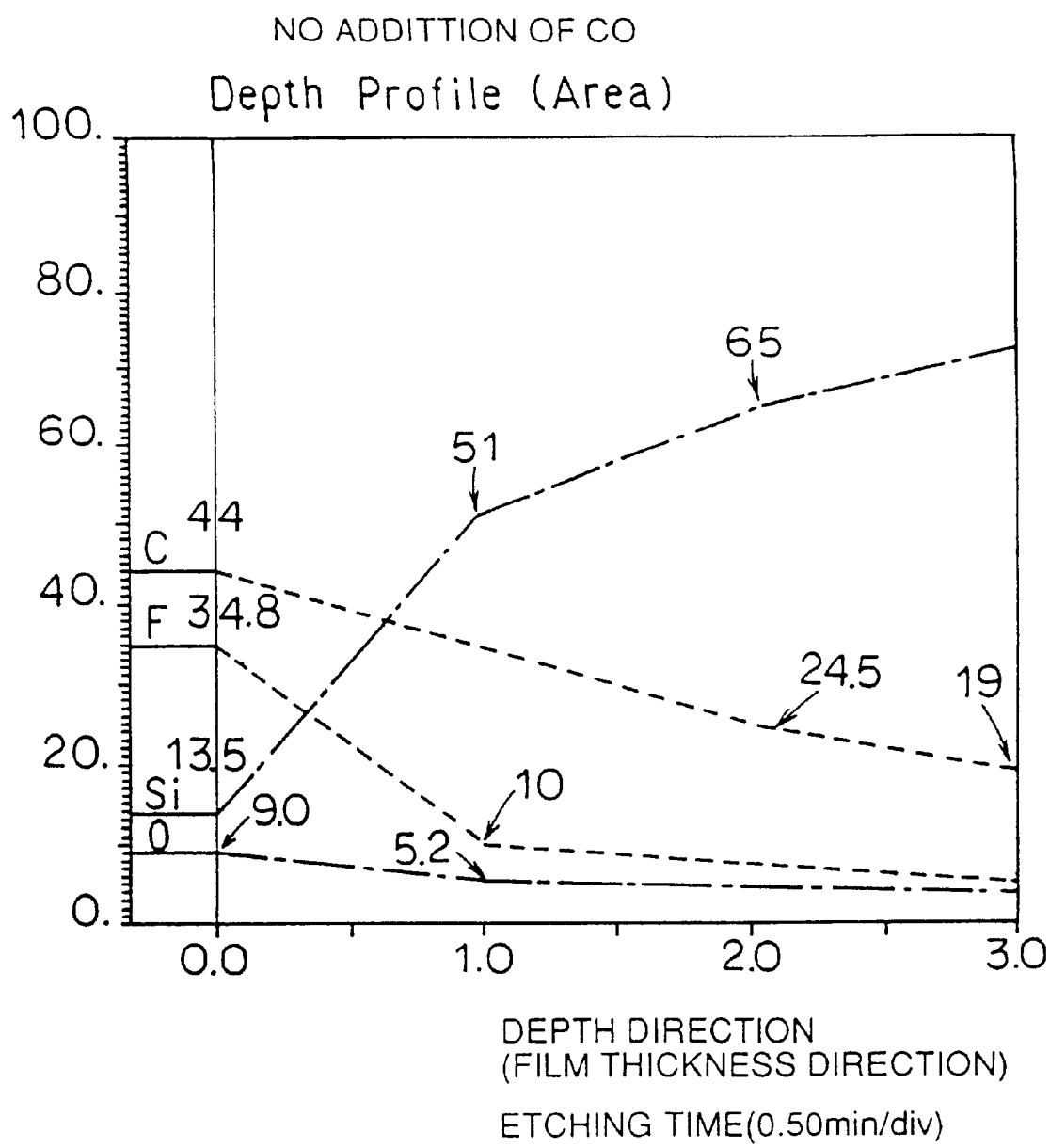
FIG. 21 is a characteristics diagram showing a composition ratio with respect to the depth (film thickness) direction where a doped polysilicon film is etched anisotropically using an etching process without the addition of CO.
Figure 22:
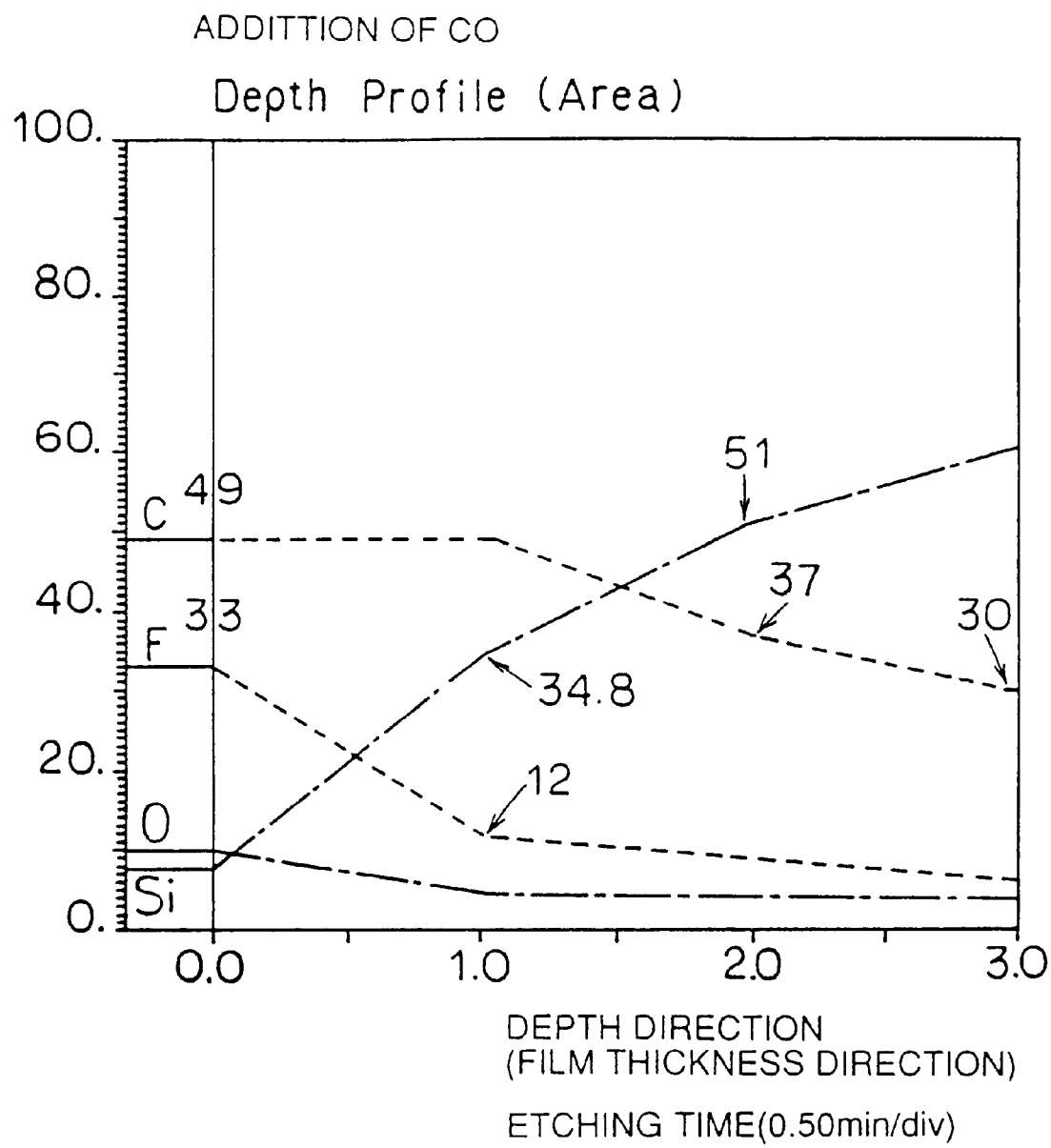
FIG. 22 is a characteristics diagram showing a composition ratio with respect to the depth (film thickness) direction where a doped polysilicon film is etched anisotropically using an etching process with the addition of Co.

FIGS. 17–20 are sectional views for describing the process of dry etching using a CF type gas (CHF$_3$/CF$_4$/Ar gas). FIGS. 21 and 22 are characteristic diagrams showing the characteristics of CF type dry etching having CO added and having CO not added, respectively.

Figure 17:
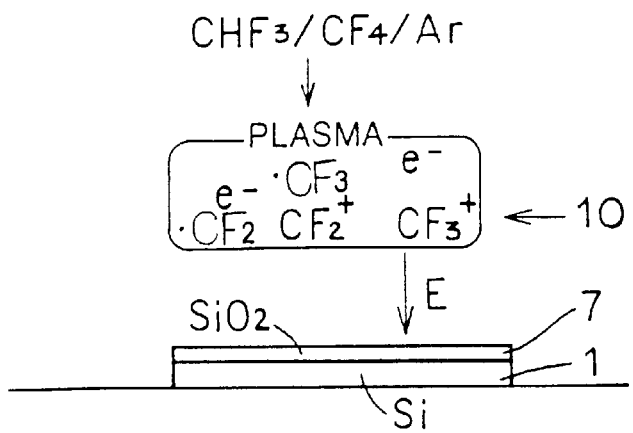
FIGS. 17–20 are sectional views of a semiconductor device for describing the process of dry etching using plasma of CF type gas.

First, CF type dry etching not having CO added will be described with reference to FIGS. 17–20. As shown in FIG. 17, the etching gas in plasma 10 becomes various ions or radicals. E in FIG. 17 indicates the electric field. Positive ions are accelerated towards the semiconductor wafer formed of a silicon substrate 1 and a silicon oxide film 7 thereupon by this electric field E.

The radicals move freely without being accelerated by the electric filed since they are electrically neutral. However, radicals are also adsorbed at the surface of silicon oxide film 7 since the flow of etching gas is conveyed downwards due to evacuation and the like.

Figure 18:
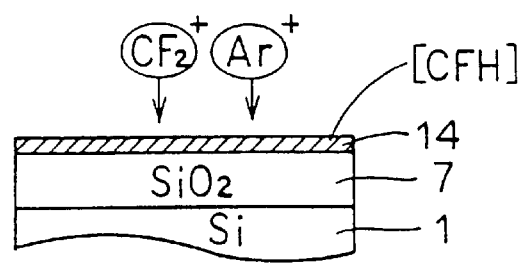

Referring to FIG. 18, the radicals on silicon oxide film 7 react to form an organic polymer film 14 of [CFH] type. Under such a state, positive ions (CF$_2^+$, Ar$^+$) accelerated by electric field E are injected towards organic polymer film 14, resulting in provision of kinetic energy to organic polymer film 14. The C of organic polymer film 14 reacts with 0 of silicon oxide film (SiO$_2$ film) 7.

Referring to FIG. 19, CO or CO$_2$ is released into the ambient. After release of O from SiO$_2$ film 7, Si of SiO$_2$ film 7 reacts with F of organic polymer film 14 to result in the formation of SiF$_4$, whereby SiO$_2$ film 7 is etched. Thus, etching of SiO$_2$ film 7 is carried out as shown in FIG. 20. There is no O in silicon substrate 1. Therefore, C in organic polymer film 14 does not react, and organic polymer film 14 remains left on silicon substrate 1. Organic polymer film 14 covers the surface of the silicon substrate 1 to suppressed the etching reaction of silicon substrate 1. By a dry etching process using a CF type gas, SiO$_2$ film 7 can be dry etched with a predetermined selectivity to silicon substrate 1.

Referring to FIGS. 21 and 22, the characteristics between an etching process using a CF type gas having CO added (CHF$_3$/CF$_4$/Ar/CO) and an etching process using a CF type gas not having CO added (CHF$_3$/CF$_4$/Ar) are compared.

FIG. 21 is a characteristic diagram analyzing the composition ratio of C, F, Si, and O with the thickness direction (depth direction) of a doped polysilicon film by ESCA (Electron Spectroscopy for Chemical Analysis) in the case where a doped polysilicon film is etched by an etching process without CO added. FIG. 22 is a characteristic diagram corresponding to FIG. 21 with an etching process having CO added. C is greatly detected in a considerable range of depth in the CO-added etching process in comparison with the CO-not-added etching process. This means that a C film is more easily formed by the CO-added etching process in comparison with the CO-not-added etching process, whereby etching of a doped polysilicon film (silicon substrate) can be suppressed. In other words, the CO-added etching process has a high selectivity to a silicon substrate in comparison with that of the CO-not-added etching process. It can be appreciated that the CO-added etching process has a high selectivity to a silicon substrate from actual experimental results.

Second Embodiment

Figure 23:
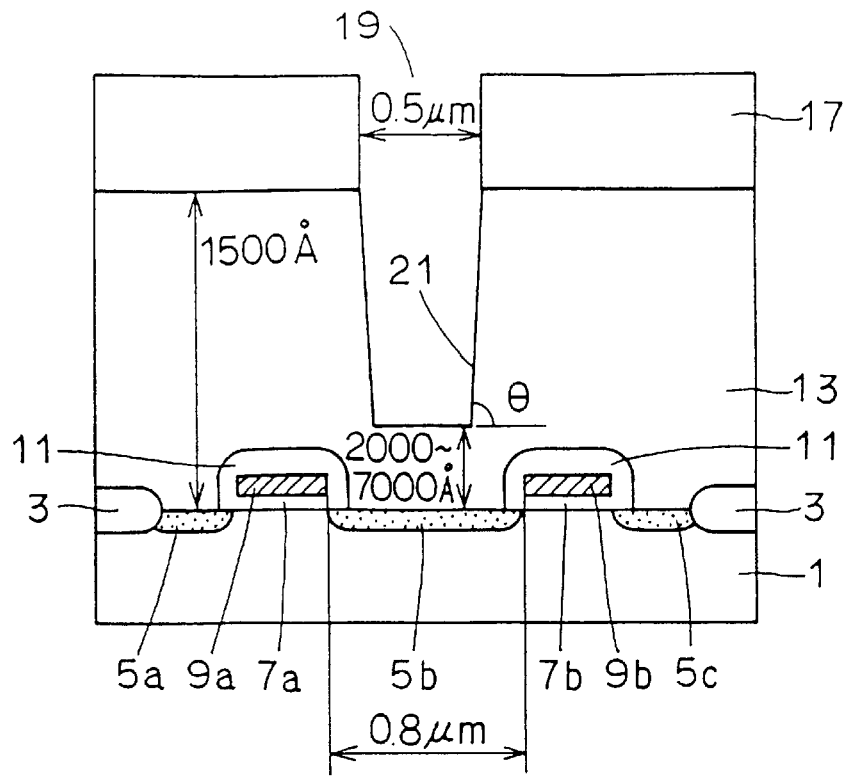
FIGS. 23–25 are sectional views of a semiconductor device according to a second embodiment of the present invention for describing the manufacturing steps in order.
Figure 24:
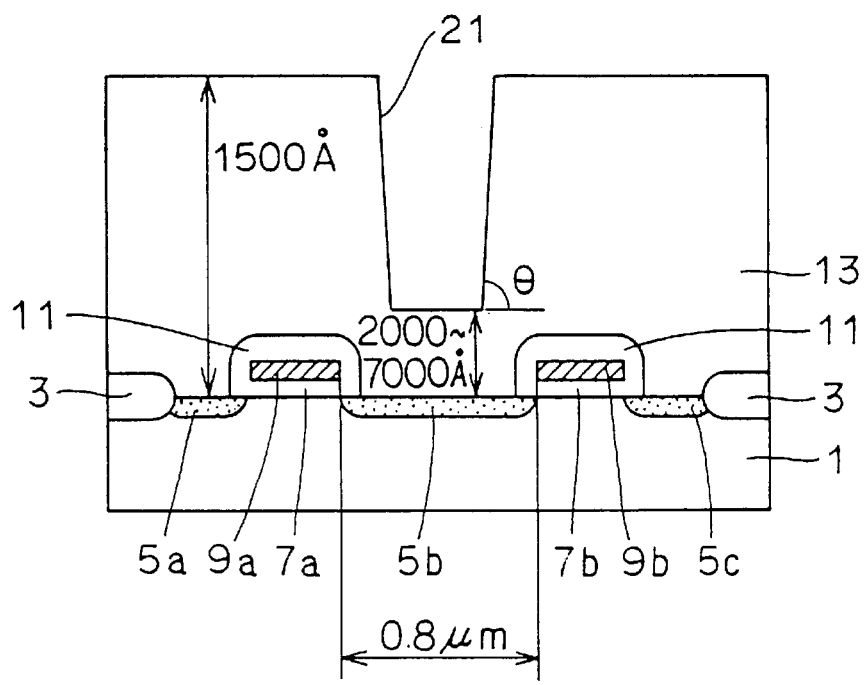
Figure 25:
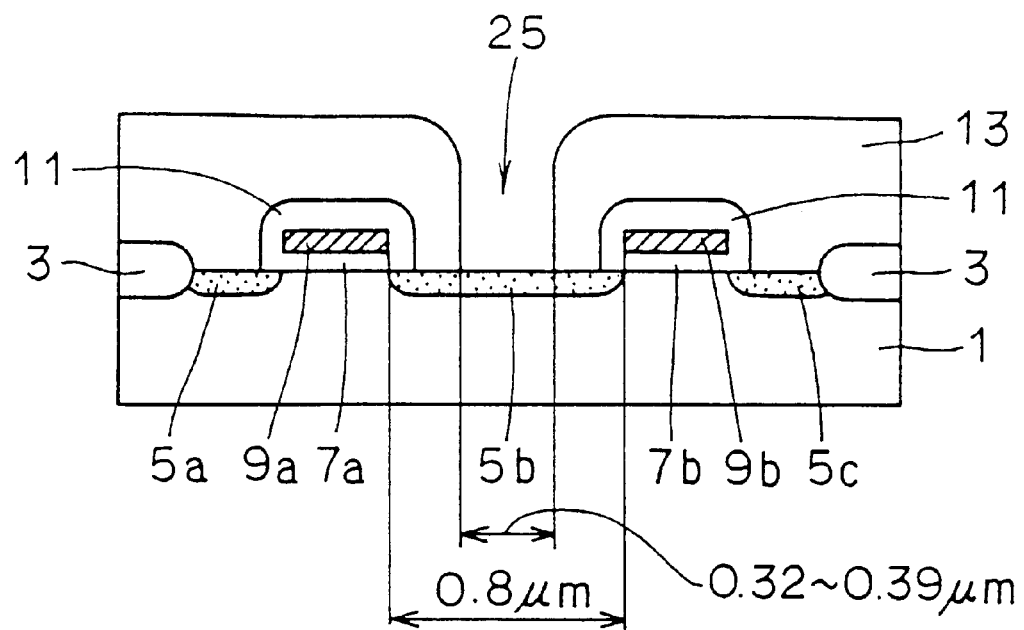

FIGS. 23–25 are sectional views of a semiconductor device for describing a second embodiment of the manufacturing method of the present invention. The second embodiment is an application to a memory cell portion of a DRAM as in the first embodiment. The components identical to those of the first embodiment have the same reference characters denoted.

As shown in FIG. 23, an interlayer insulating film 13 of 15000 Å in thickness is etched anisotropically by dry etching utilizing plasma of a CF type gas (CHF$_3$/CF$_4$/Ar) with resist 17 as a mask to form a first hole 21. This etching process is ceased when the distance between the bottom of first hole 21 and impurity region 5b becomes 2000–7000 Å.

In the second embodiment, anisotropic etching is carried out to obtain a tapered sidewall of first hole 21. A tapered sidewall of first hole 21 can be realized by controlling etching parameters such as the amount of etching gas and the ambient pressure. For example, the flow ratio of CHF$_3$ is set to be greater than the etching condition where taper is not formed ($\theta=90°$). In the present embodiment, $\theta=86°$.

Referring to FIG. 24, resist 17 is removed.

Then, referring to FIG. 25, interlayer insulating film 13 is etched anisotropically (etched back) using CF type gas (CHF$_3$/CF$_4$/Ar). Thus, a second hole (contact hole) 25 is formed in self-alignment where the lower opening diameter is approximately 0.32–0.39 μm.

In the steps shown in FIGS. 23–25, it is logically possible to obtain a contact hole of 0.3 μm if anisotropic etching is carried out for interlayer insulating film 13 until the substrate is reached while controlling the inclining angle of first hole 21 without removing resist 17. However, if interlayer insulating film 13 is to be completely etched anisotropically using resist 17 as a mask, there is a disadvantage of a defective opening due to the etching process suppressed as a result of the amount of carbon increased that is provided from resist 17 to the surface to be etched. Therefore, an overall anisotropic etching is carried out after removal of resist 17 as shown in FIGS. 24 and 25 in the present embodiment.

As in the first embodiment, a contact hole having an opening diameter smaller than the minimum dimension (0.5 μm) of the limit obtained by photolithography can be formed according to the manufacturing method of the present second embodiment. Contact hole 25 is formed in a configuration having its opening diameter increased in the upward direction. Therefore, the coverage of a bit line (not shown) formed in contact hole 25 can be improved as in the first embodiment.

Next, the manufacturing method of the present embodiment will be described for manufacturing a semiconductor device with peripheral circuitry.

Figure 26:
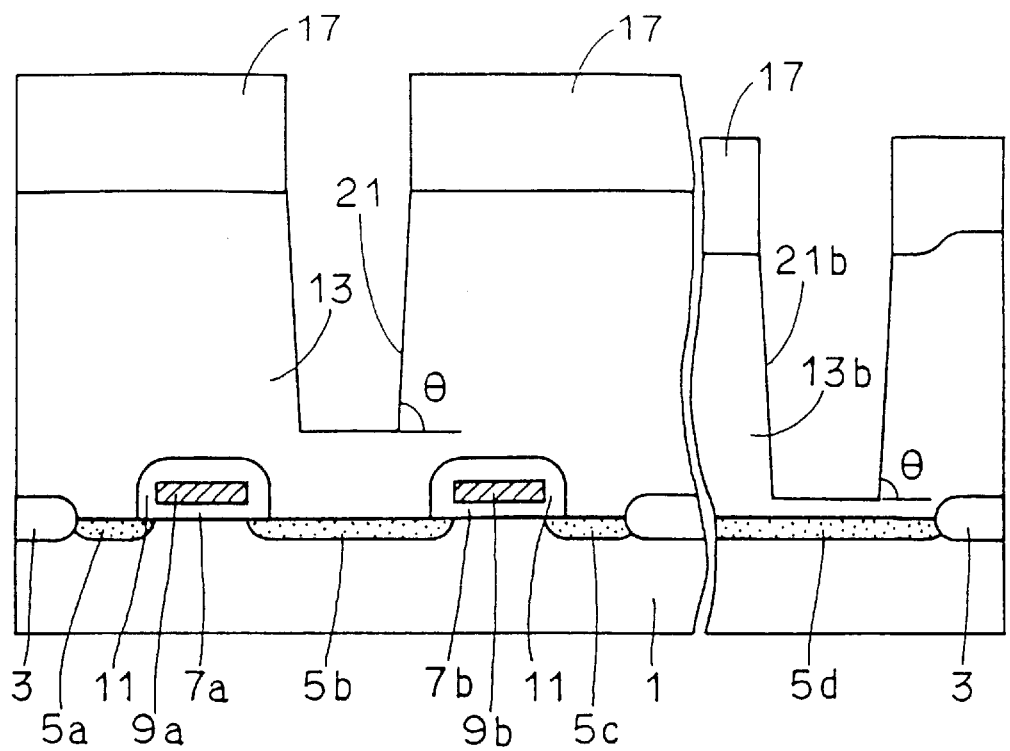
FIGS. 26–28 are sectional views of a semiconductor device according to the second embodiment of the present invention for describing the manufacturing steps thereof in order.
Figure 27:
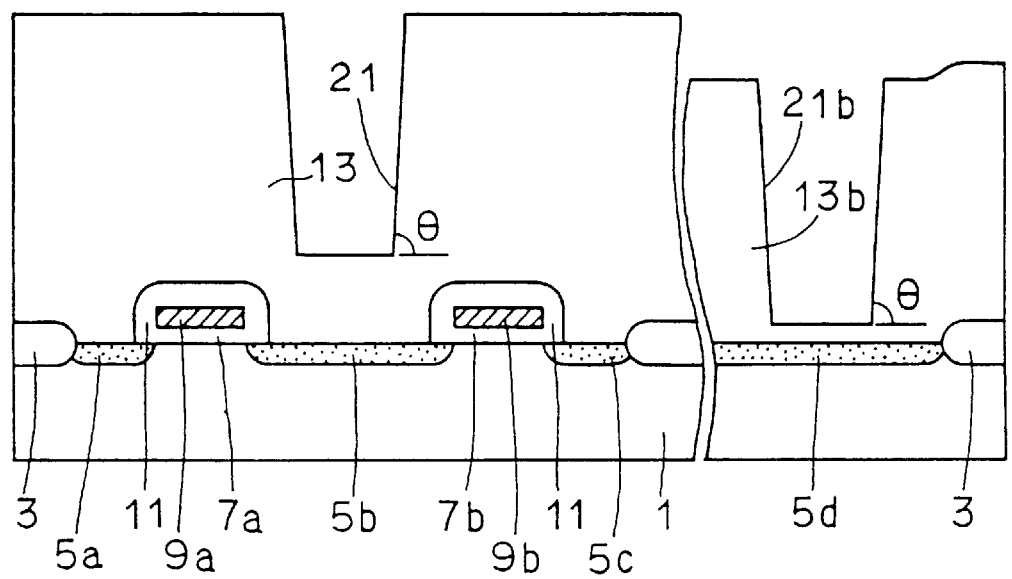
Figure 28:
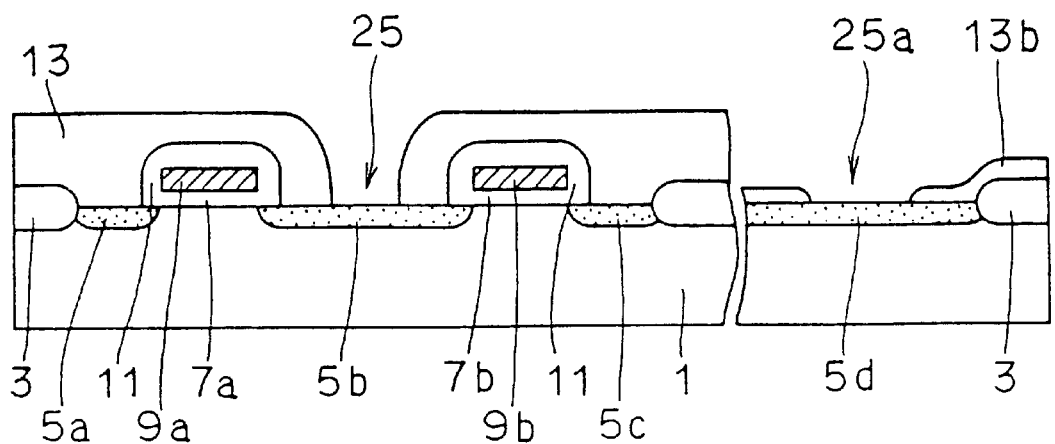

FIGS. 26–28 are sectional views of a semiconductor device with peripheral circuitry for describing the second embodiment of the manufacturing method of the present invention. This embodiment describes the case where the thickness of interlayer insulating films 13 and 13b differ between the memory cell portion and the peripheral circuit portion.

The process for the memory cell portion preceding the step shown in FIG. 26 is similar to that of the manufacturing process shown in FIG. 23. Referring to FIG. 26, a first hole 21b is formed in the peripheral circuit portion simultaneous to the formation of a first hole 21 in the memory cell portion. Because the thickness of interlayer insulating film 13b is great, first hole 21b is not a through hole. Removal of resist 17 results in the state shown in FIG. 27.

Referring to FIG. 28, interlayer insulating films 13 and 13b are anisotropically etched by a CF type etching gas having CO added. This anisotropic etching process using gas including CO has a high selectivity of 15–20 for interlayer insulating films (silicon oxide film) 13 and 13b with respect to semiconductor substrate (silicon substrate) 1, as described above. Therefore, excessive etching of the surface of the silicon substrate 1 can be prevented efficiently even if the overetching time of the surface of silicon substrate 1 is increased in forming a contact hole 25a in a thin interlayer insulating film 13b.

Contact holes 25 and 25a according to the fourth embodiment both have a opening diameter smaller than the minimum opening diameter dimension (0.5 μm) of a contact hole that can be formed by photolithography. Furthermore, because contact holes 25 and 25a are formed having an opening diameter increased in the upward direction, superior coverage can be obtained when an interconnection layer is formed in contact holes 25 and 25a.

Third Embodiment

FIGS. 29–34 are sectional views of a semiconductor device for describing a third embodiment of the manufacturing method of the present invention.

Figure 29:
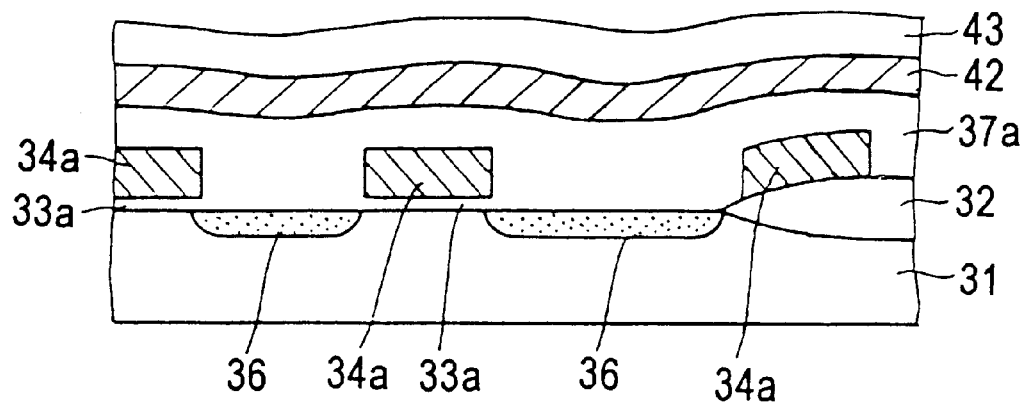
FIGS. 29–36 are sectional views of a semiconductor device according to a third embodiment of the present invention for describing the manufacturing steps thereof in order.

Referring to FIG. 29, an isolation oxide film 32 is formed using LOCOS method at a predetermined region on the main surface of a semiconductor substrate 31. A gate electrode 34a of polycrystalline silicon is formed at a predetermined region on the main surface of semiconductor substrate 31 surrounded by field oxide film 32 with a gate oxide film 33a thereunder. By carrying out ion implantation using gate electrode 34 as a mask, impurity region 36 which becomes the source/drain region is formed. Then, an interlayer insulating film 37a covering the entire surface and having a surface of a planarized oxide film is formed. A polysilicon silicon layer 42 of a predetermined thickness is formed at the surface of. interlayer insulating film 37a by CVD. Then, a silicon oxide film 43 of a predetermined thickness is formed on polycrystalline silicon layer 42 by CVD. Interlayer insulating film 37, polycrystalline silicon film 42 and silicon oxide film 43 of the third embodiment ,form the first film, the second film, and the third film, respectively, of the present invention.

Figure 30:
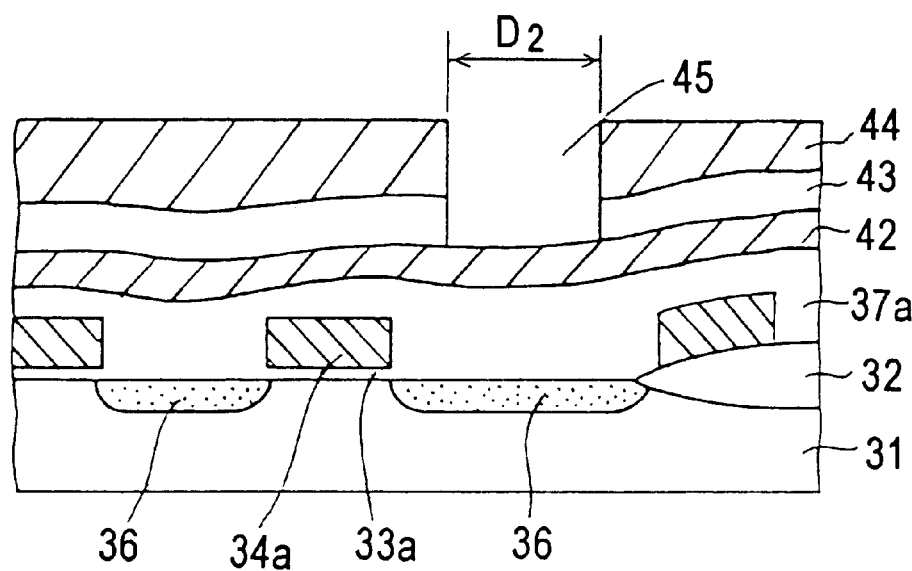

Referring to FIG. 30, a resist film 44 is formed at a predetermined region on silicon oxide film 43 by photolithography. Then by etching anisotropically silicon oxide film 43 using resist film 44 as a mask, a first hole 45 of an opening diameter $D_2$ is formed, followed by removal of resist film 44.

Figure 31:
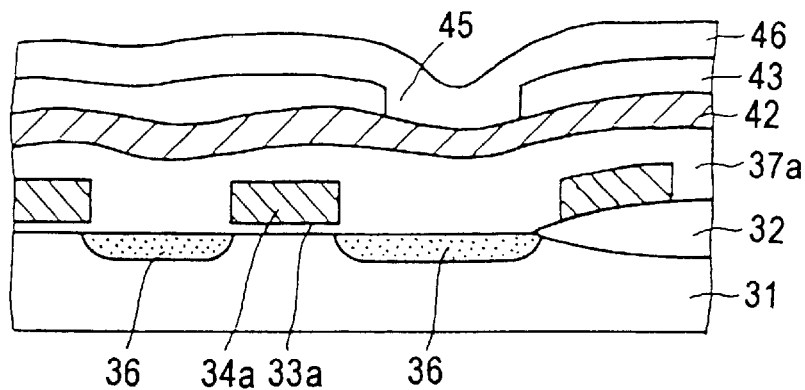

Referring to FIG. 31, a silicon oxide film 46 of a predetermined thickness which is the fourth film of the present invention is formed on the surface of silicon oxide film 43 including the inner circumferential sidewall of first hole 45 by CVD.

Figure 32:
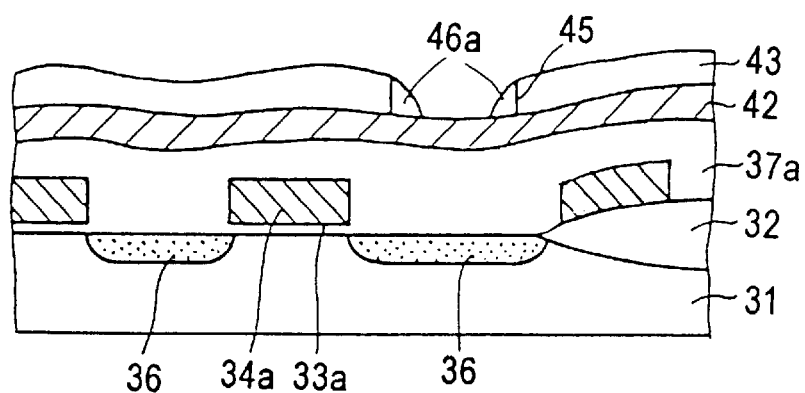

By etching anisotropically silicon oxide film 46 all over, a sidewall spacer-like frame 46a is formed at the inner circumferential sidewall of first hole 45 as shown in FIG. 32.

Figure 33:
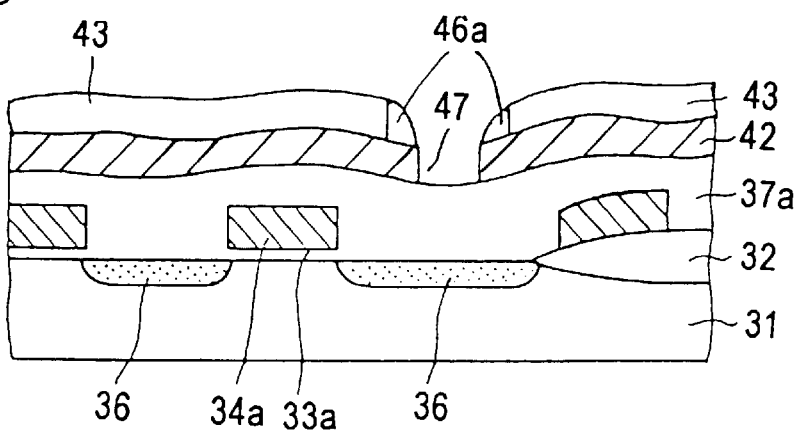

Referring to FIG. 33, a polycrystalline silicon film 42 is etched anisotropically using silicon oxide film 43 and sidewall spacer-like frame 46a as a mask. As a result, a second hole 47 is formed in polycrystalline silicon film 42.

Figure 34:
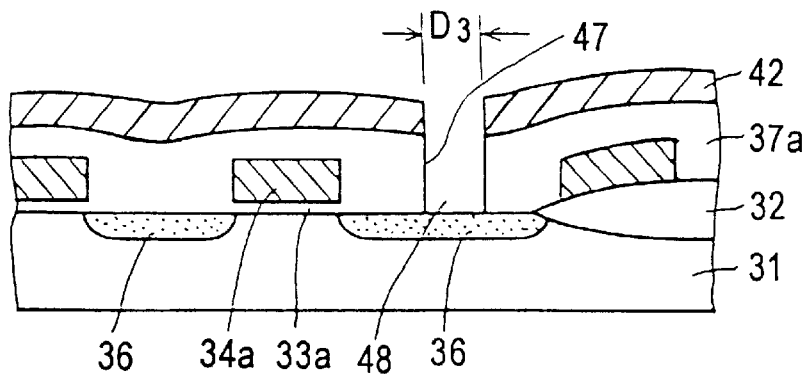

Referring to FIG. 34, interlayer insulating film 37a is etched anisotropically using as a mask polycrystalline silicon film 42 having a second hole 47 formed. As a result, a contact hole 48 reaching to the surface of impurity region 36 is formed. Silicon oxide films 43 and frame 46a are removed simultaneously by this etching.

Opening diameter $D_3$ of contact hole 48 is smaller than opening diameter $D_2$ of first hole 45 (refer to FIG. 30) formed in silicon oxide film 43 by two times the width of a sidewall spacer-like frame 46a. Thus, when opening diameter $D_2$ of first hole 45 is formed to the minimum dimension that can be formed defined by the design rule, contact hole 48 can be formed having a diameter smaller than the minimum dimension.

When a conductive layer electrically connected with impurity region 36 via contact hole 47 is to be formed, the following steps are required.

Figure 35:
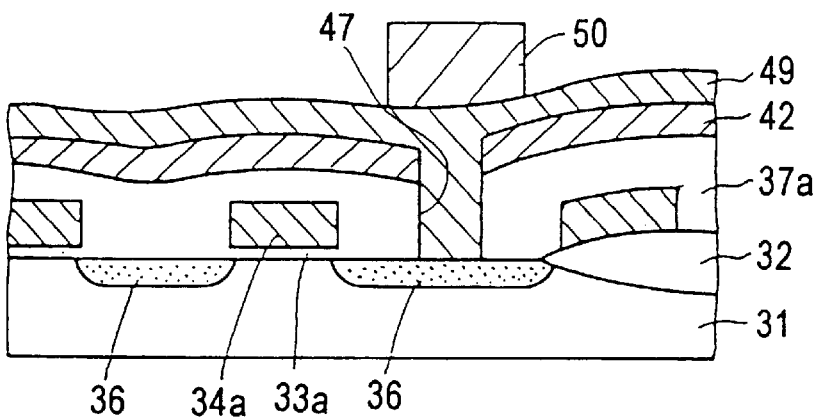

Referring to FIG. 35, a conductive film 49 of polycrystalline silicon having impurities such as phosphorus doped is formed. A resist film 50 having a predetermined pattern is formed at the surface of conductive film 49 by photolithography. Conductive film 49 and polycrystalline silicon film 42 are etched anisotropically using resist film 50 as a mask.

Figure 36:
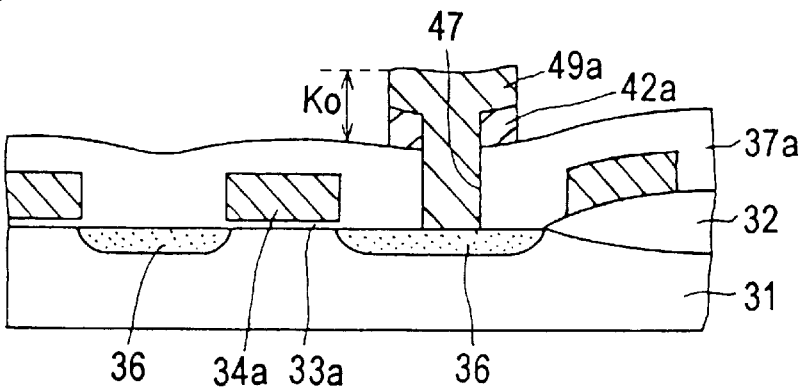

As a result, conductive interconnection film 49a and polycrystalline silicon film 42a having a predetermined pattern shown in FIG. 36 are formed.

In the present embodiment, a sidewall spacer-like frame 46a is formed at the inner circumferential sidewall in first hole 45 of silicon oxide film 43, so that it is possible to form in self-alignment a contact hole 48 having an opening diameter smaller than that of the first hole 45 formed at the minimum dimension defined by the design rule.

Figure 208:
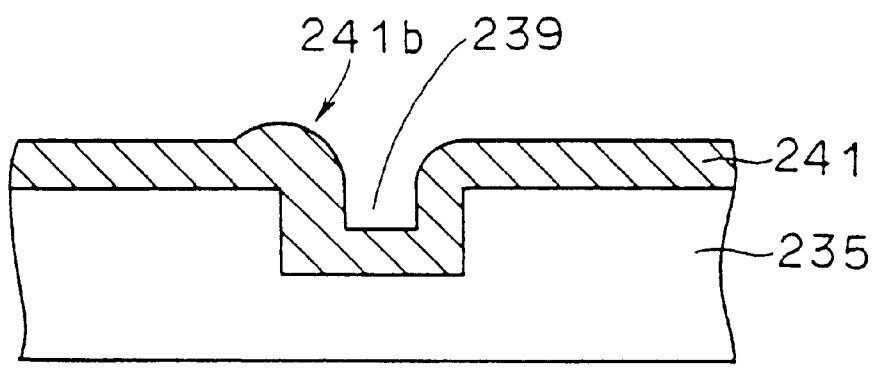
FIGS. 208–209 are sectional structural diagrams for describing technical problems of the structure disclosed in the Japanese Patent Laid-Open Application.
Figure 209:
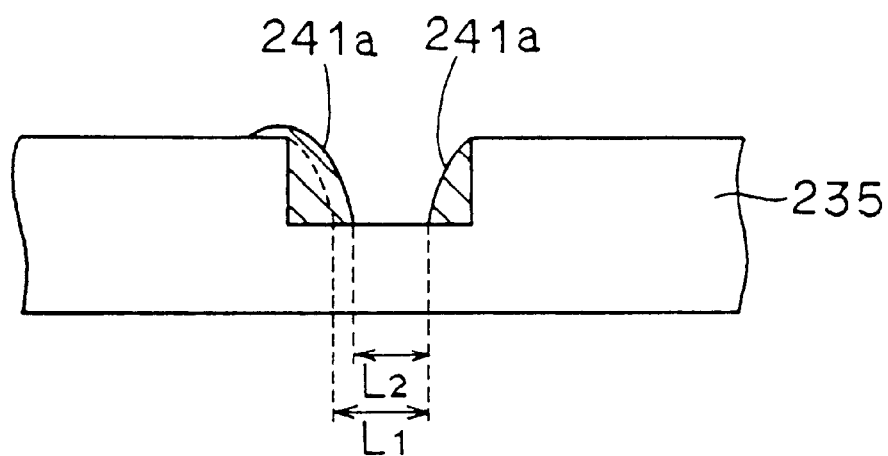
Figure 210:
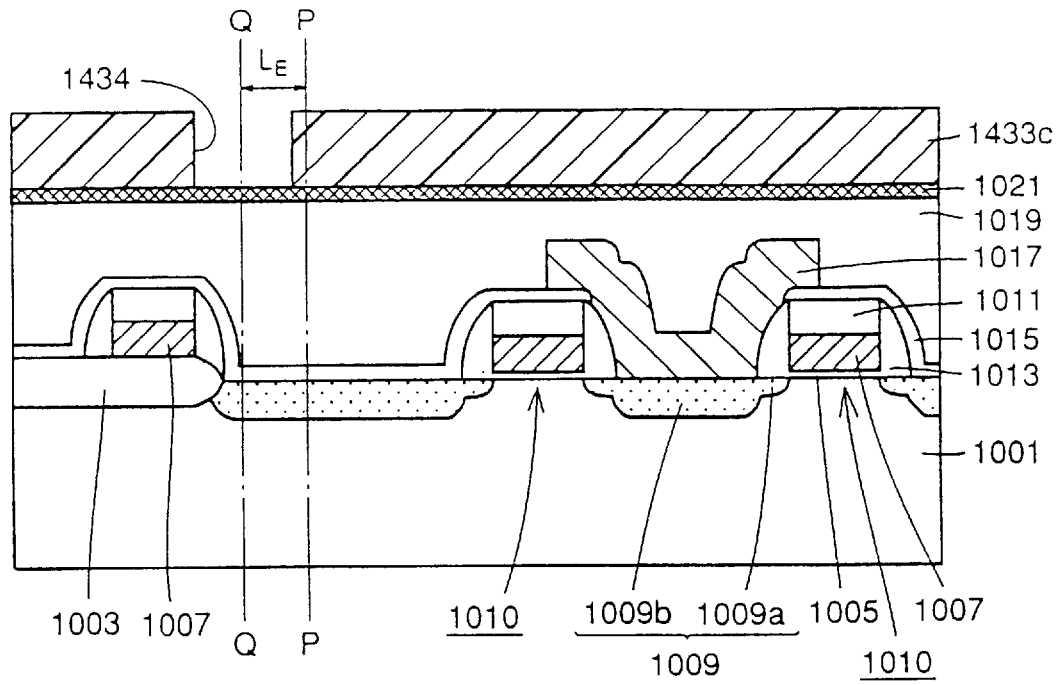
FIGS. 210–212 are sectional views of a semiconductor device for describing the formation of a lower electrode layer of a capacitor in contact with a word line.
Figure 211:
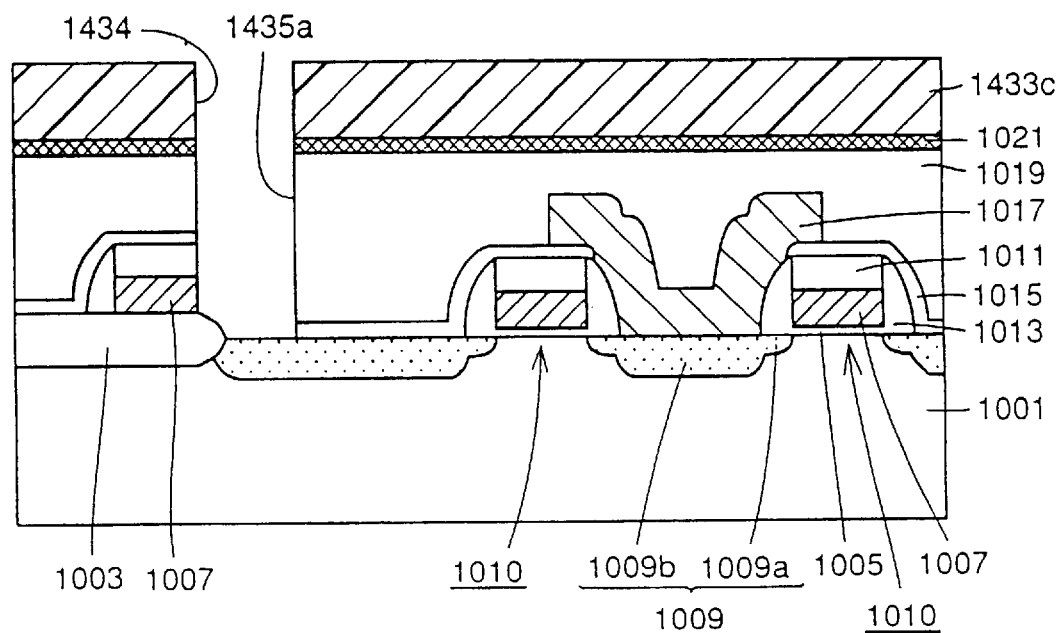
Figure 212:
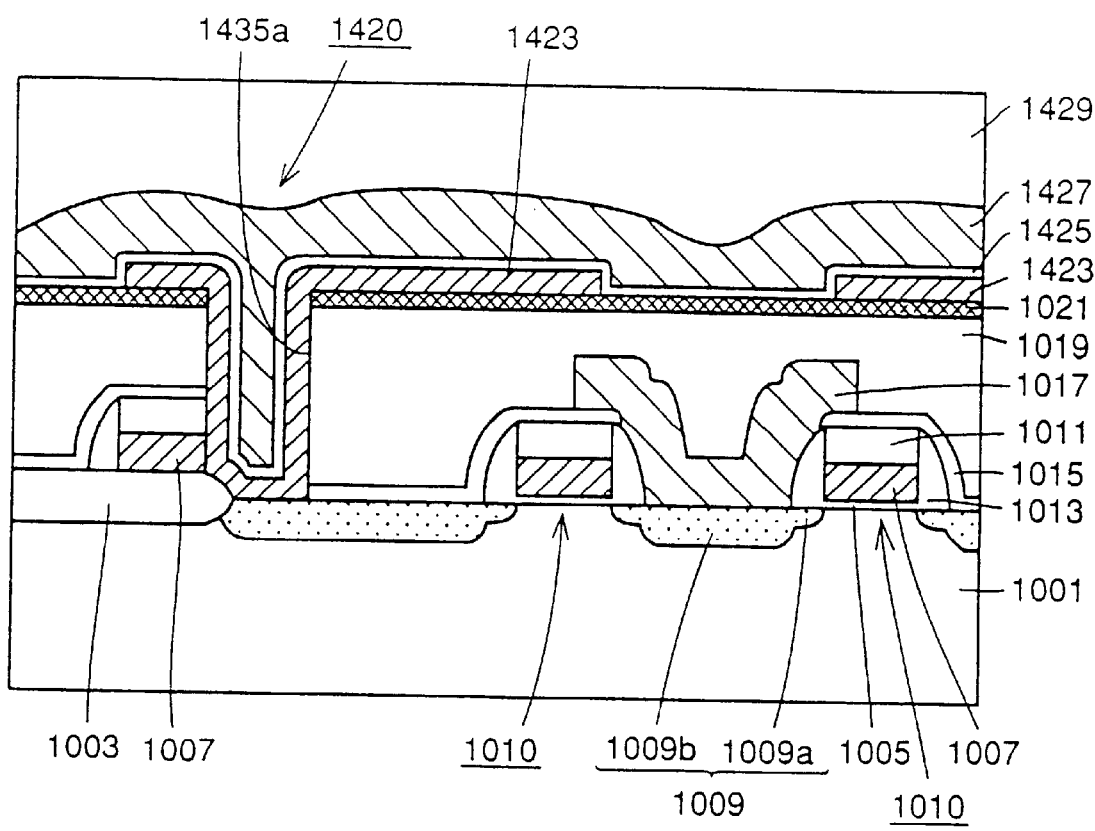
Figure 213A:
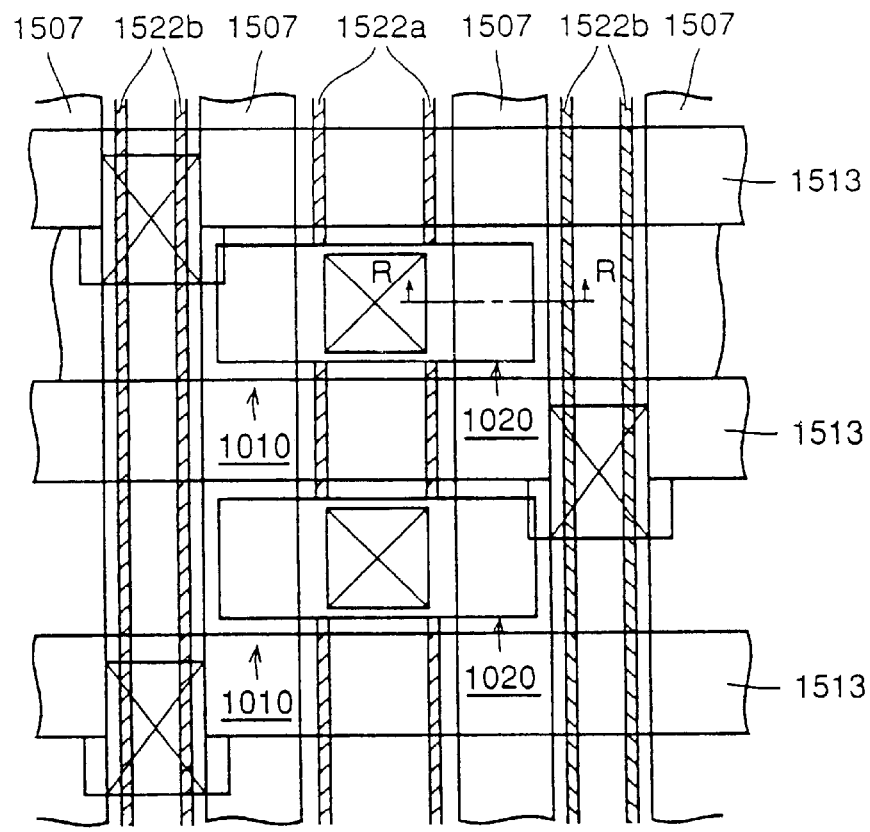
FIG. 213A is a plan view showing the state where residue remains.
Figure 213B:
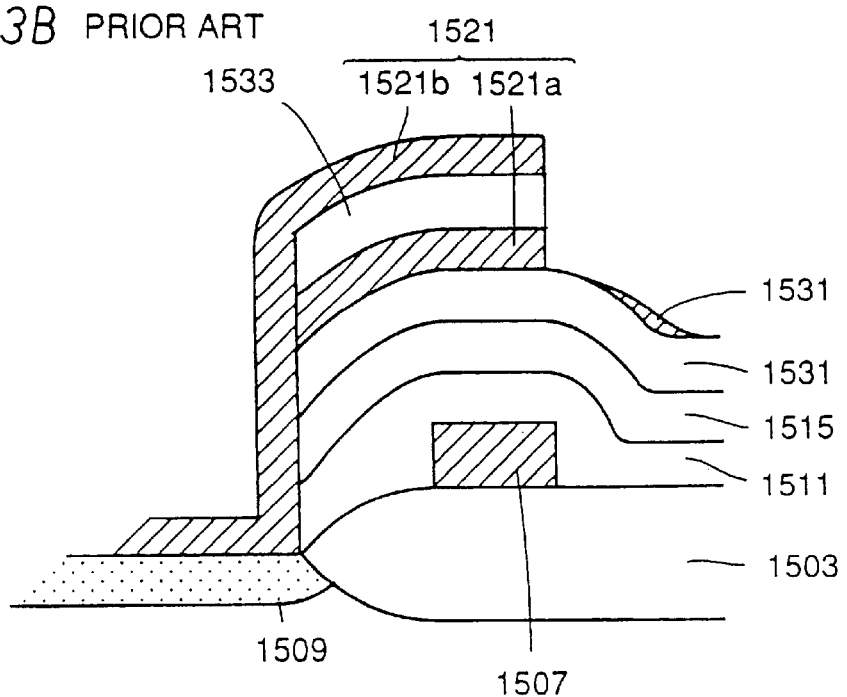
FIG. 213B is a sectional view taken along line R—R of FIG. 213A.

Sidewall layer 46a includes a silicon oxide film. There is no grain boundary since the silicon oxide film does not have a polycrystalline structure. Therefore, the problems described with reference to FIGS. 208 and 209 are not generated if frame 46a is formed of a silicon oxide film.

The dimension of the opening diameter of a contact hole will not be affected even if a convex portion is generated due to grain boundary at the surface of polycrystalline silicon layer 42, as will be described in the following.

Figure 37:
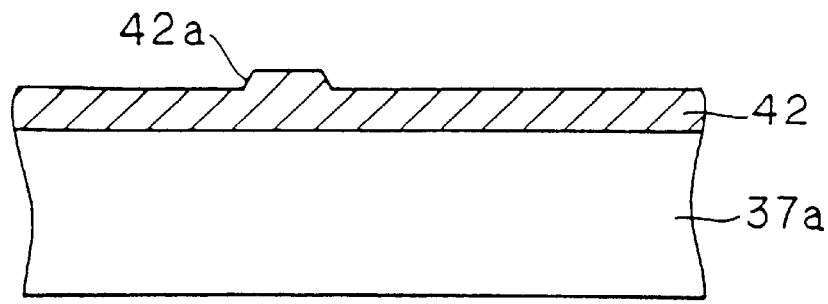
FIGS. 37–39 are sectional views of a semiconductor memory device for describing formation of a polycrystalline silicon mask applying the third embodiment of the present invention when there is a convex portion at the surface of a polycrystalline silicon film.
Figure 38:
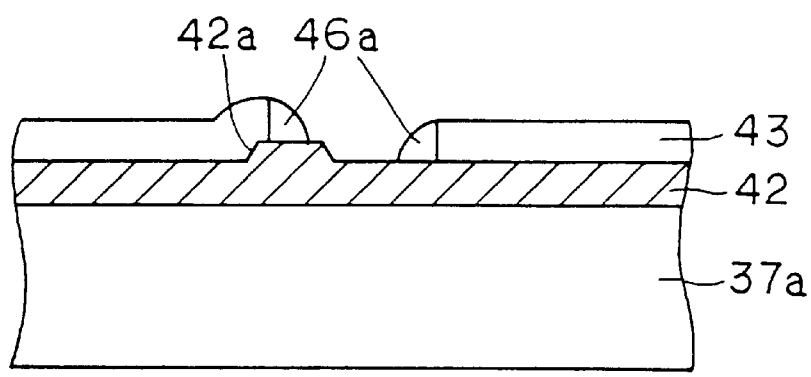
Figure 39:
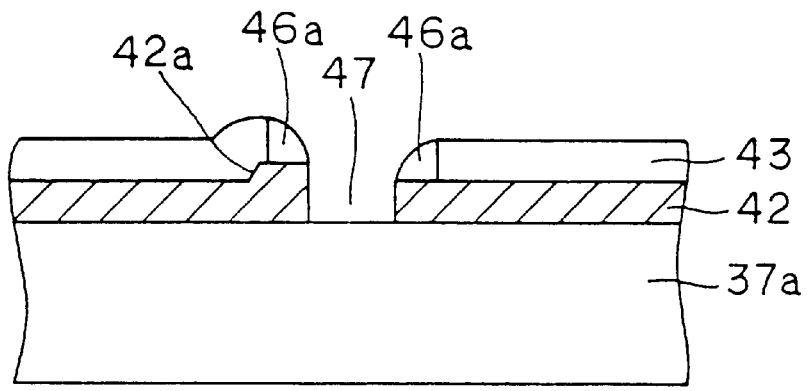

FIGS. 37–39 are sectional views of a semiconductor device for describing the manufacturing steps thereof according to a third embodiment of the present invention with superior control of the formation of a contact hole.

Referring to FIG. 37, a convex portion 42a due to grain boundary is generated at the surface of polycrystalline silicon layer 42.

Referring to FIG. 38, a silicon oxide film 43 and a frame 46a which is sidewall layer are formed on polycrystalline silicon layer 42 according to the manufacturing method of a semiconductor device of the present invention. Frame 46a is formed on convex portion 42a.

Referring to FIG. 39, polycrystalline silicon layer 42 is selectively etched using silicon oxide film 43 and sidewall layer 46a to form a second hole 47. It is appreciated that there is no influence to the opening diameter of second hole 47 even if there is a convex portion 42a in polycrystalline silicon layer 42. Therefore, a contact hole can be formed in control without affecting the opening diameter even when a convex portion 42 is generated.

Although contact hole 47 is formed using polycrystalline silicon layer 42 as a mask in the processing steps of FIGS. 33 and 34 in the present embodiment, the material of the mask is not limited to polycrystalline silicon. More specifically, amorphous silicon (a-Si), TiN, silicide such as $TiSi_2$, and $WSi_2$, refractory metal such as Ti, W, and Mo, or a layered film thereof may be used instead of polycrystalline silicon.

The conductive film 49 formed in the step of FIG. 35 is not limited to polycrystalline silicon, and may be a conductive material of the above-described material.

The present invention is not limited to a silicon oxide film used for the frame 46a of a sidewall configuration formed in the processing steps of FIGS. 31 and 32 of the present embodiment. More specifically, TiN, silicide such as $TiSi_2$, and $WSi_2$, refractory metal such as Ti, W, and Mo, amorphous silicon (a-Si), or a layered film thereof may be used as the material of frame 46a instead of a silicon oxide film. A frame 46a of the above mentioned silicide or high refractory metal can be formed by, for example, CVD.

(Embodiments 4–10)

The memory cell structure of a DRAM manufactured using the manufacturing method of the present embodiment will be described as a semiconductor memory device of fourth–tenth embodiments of the present invention.

Fourth Embodiment

FIGS. 40–58 are sectional views of a semiconductor device for describing a fourth embodiment of a manufacturing method of the present invention. In the present embodiment, the formation of a contact hole in the formation process of a DRAM memory cell having a stacked type capacitor will be described.

Figure 40:
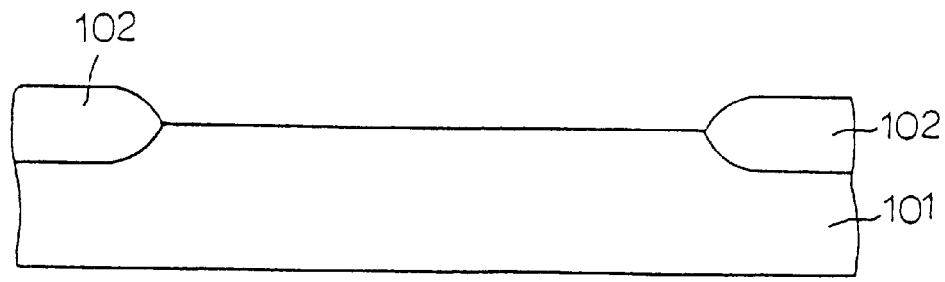
FIGS. 40–58 are sectional views of a semiconductor memory device according to a fourth embodiment of the present invention for describing the manufacturing steps thereof in order.

Referring to FIG. 40, an element isolation region 102 is formed at a predetermined region on the surface of a semiconductor substrate 101 by LOCOS.

Figure 41:
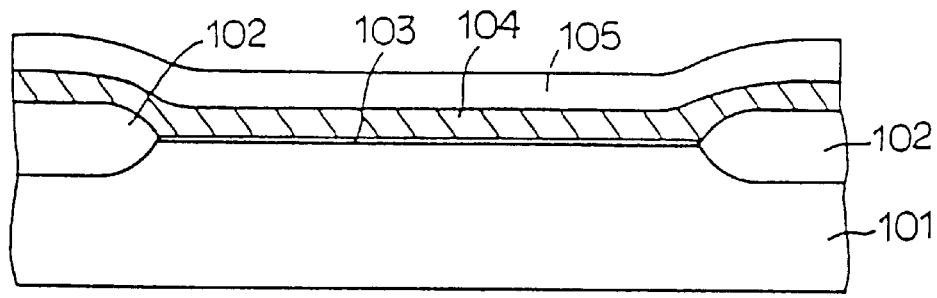

Referring to FIG. 41, the surface of semiconductor substrate 101 is subjected to thermal oxidation, whereby an oxide film 103 is formed at the surface of semiconductor substrate 101 surrounded by isolation oxide film 102. A polycrystalline silicon 104 having phosphorus doped using reduced pressure CVD is formed on the surface of oxide film 103, followed by the formation of an oxide film 105.

Figure 42:
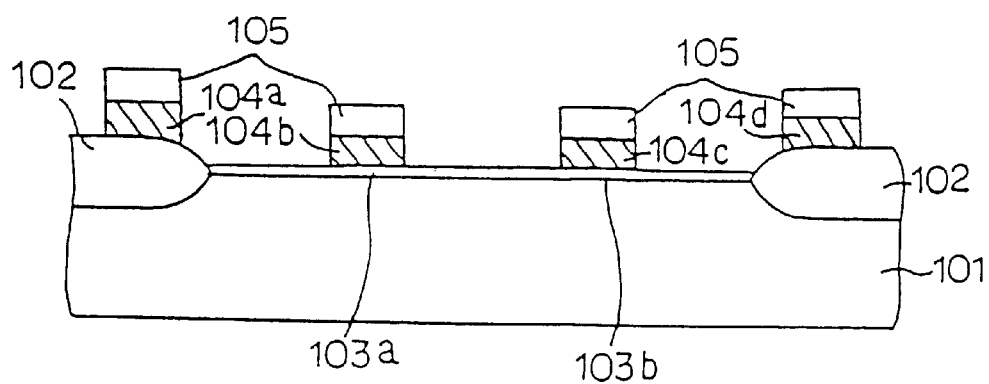

Referring to FIG. 42, gate electrodes 104a, 104b, 104c, and 104d are formed by patterning oxide film 105 and polycrystalline silicon film 104 (refer to FIG. 41) by photolithography and etching techniques. Gate insulating films 103a and 103b are interposed between the surface of semiconductor substrate 101 and gate electrodes 104b and 104c.

Figure 43:
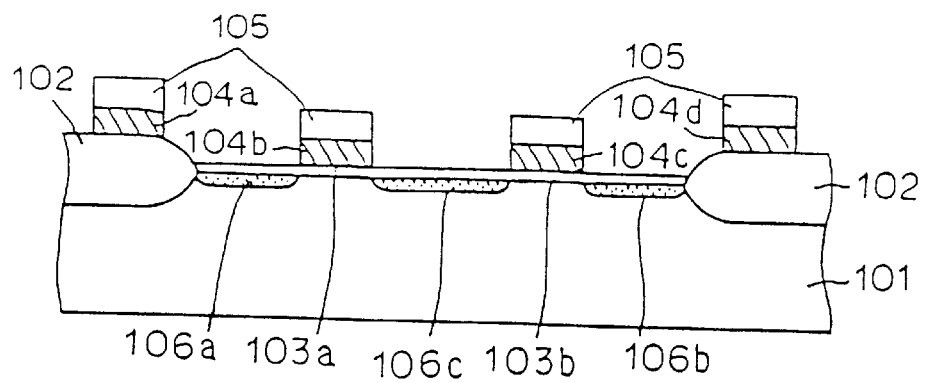

Referring to FIG. 43, impurity regions 106a, 106b and 106c of relatively low concentration are formed by implanting impurities to the surface of semiconductor substrate 101 using gate electrodes 104b and 104c and isolation oxide film 102 as a mask.

Figure 44:
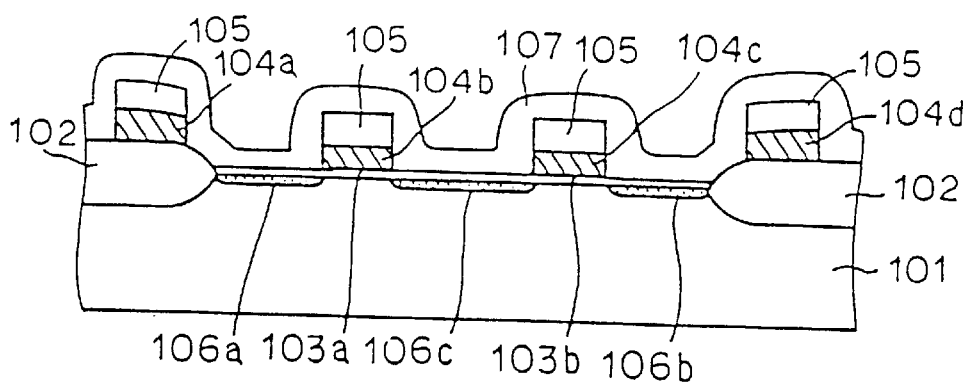

Referring to FIG. 44, an insulating film 107 of an oxide film is formed all over semiconductor substrate 101 by low pressure CVD. Insulating film 107 is selectively removed by etching anisotropically the entire surface of insulating film 107.

Figure 45:
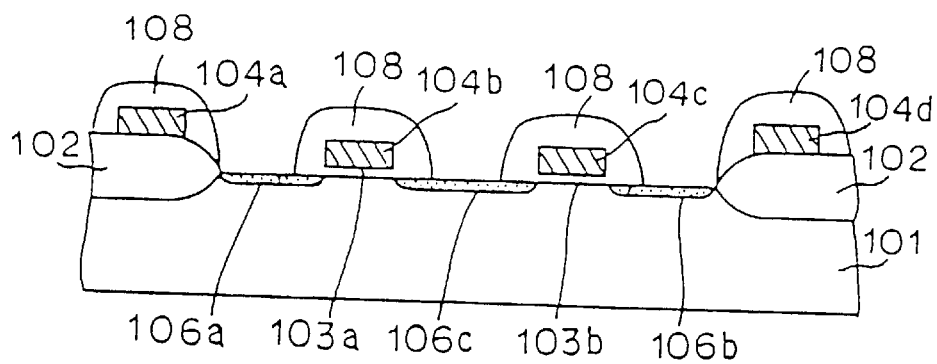

Thus, an insulating film 108 is formed above gate electrodes 104a–104d and the sidewall portion, as shown in FIG. 45.

Figure 46:
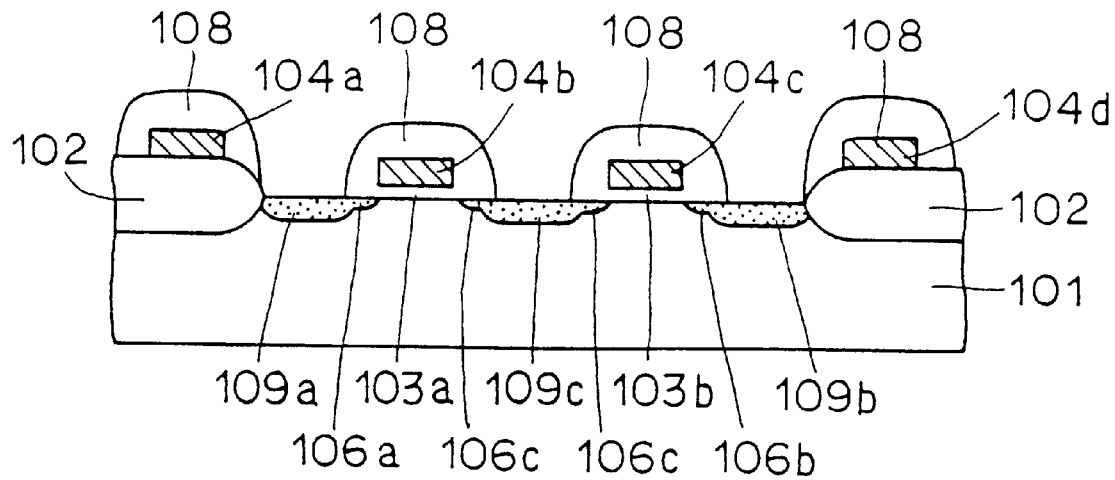

Referring to FIG. 46, impurity regions 109a, 109b and 109c of relatively high concentration are formed by implanting ions of impurities into the surface of semiconductor substrate 101 using gate electrodes 104b and 104c and the covering insulating film 108 as a mask. Thus, a transistor of the so-called LDD (Lightly Doped Drain) structure is formed.

Figure 47:
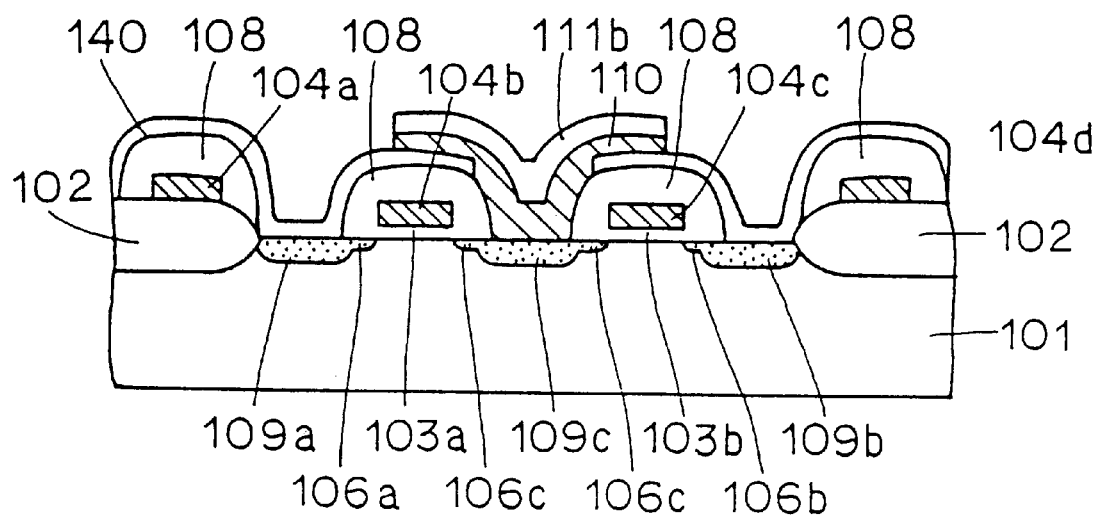

Referring to FIG. 47, a silicon oxide film 140 is formed over the entire surface of semiconductor substrate 101, followed by the formation of an opening portion at a predetermined region. Then, a polycrystalline silicon film 110 of a predetermined thickness and having impurities doped is formed at the entire surface. An oxide film 111b is formed on that polycrystalline silicon film. An oxide film 111b of a predetermined pattern is formed by patterning the oxide film using photolithography and etching techniques. By carrying out etching using oxide film 111b as mask, a conductive film 110 is formed electrically connected to impurity region 109c.

Figure 48:
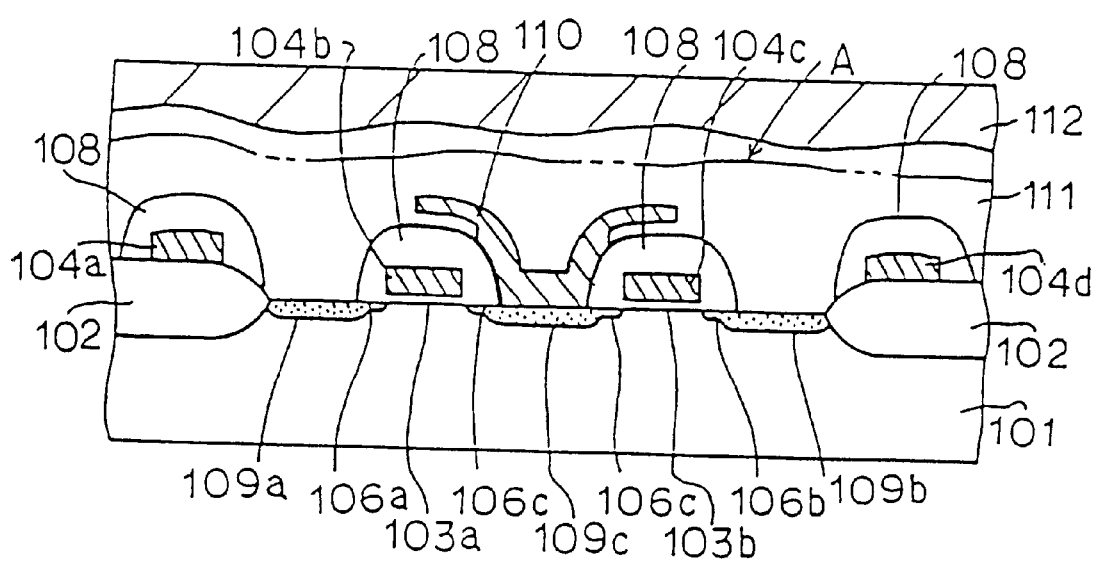

Referring to FIG. 48, an oxide film 111 is formed all over the surface of semiconductor substrate 101 by low pressure CVD. An insulating film 112 having its surface planarized is formed on oxide film 111. Insulating film 112 may be formed by applying a SOG film. Then, insulating film 112 and oxide film 111 are etched back to the chain line with two dots.

Figure 49:
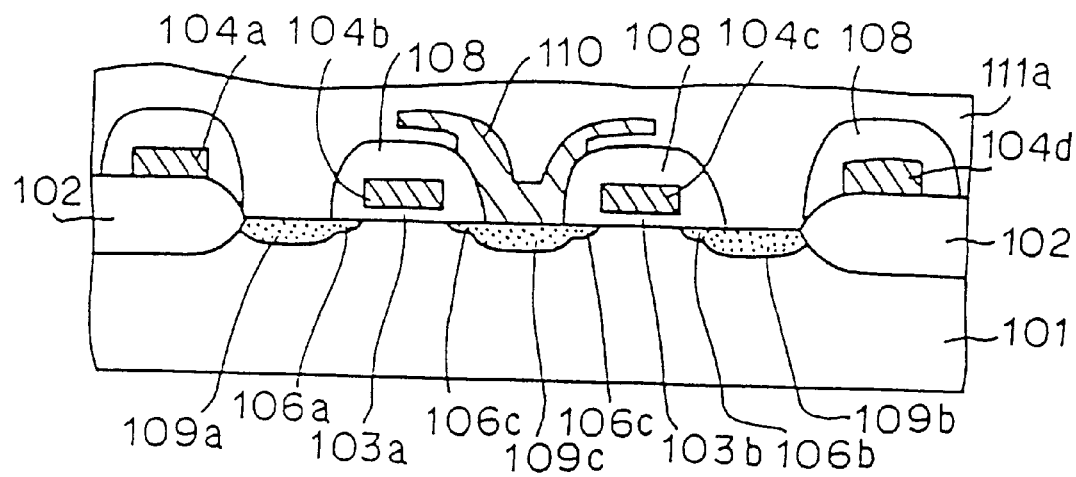

Thus, an interlayer insulating film 111a having its surface substantially planarized is formed as shown in FIG. 49. Interlayer insulating film 111a is the first film of the present invention.

Figure 50:
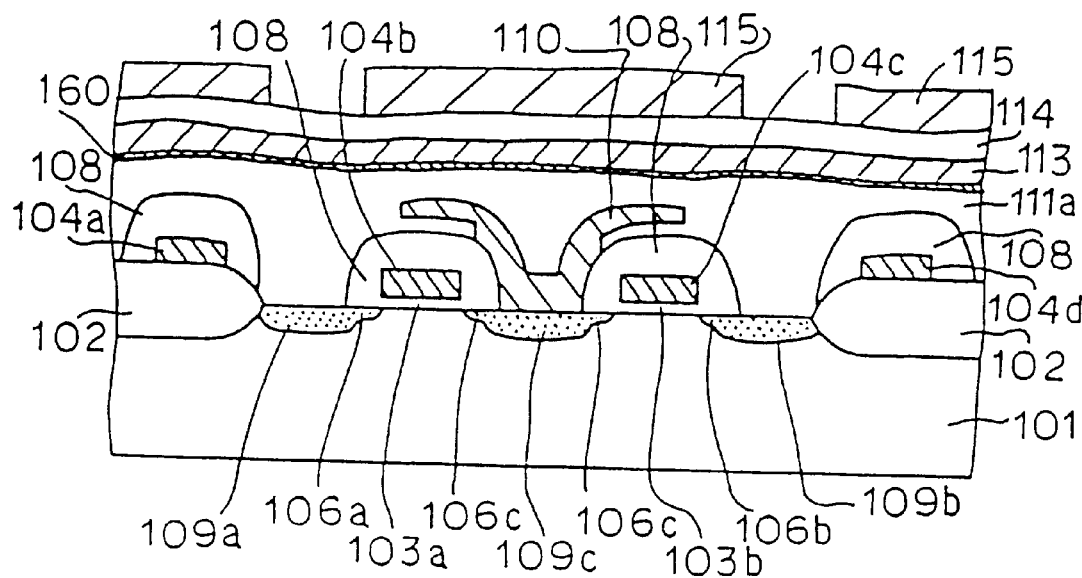

Referring to FIG. 50, a nitride film 160 is formed at the surface of interlayer insulating film 111a. A polycrystalline silicon film 113 of a predetermined thickness is formed on nitride film 160 as the second film of the present invention, followed by the formation of an oxide film 114 as the third film of the present invention. A resist film 115 of a predetermined pattern is formed on oxide film 114 by photolithography. Oxide film 114 is etched anisotropically using resist film 115 as a mask.

Figure 51:
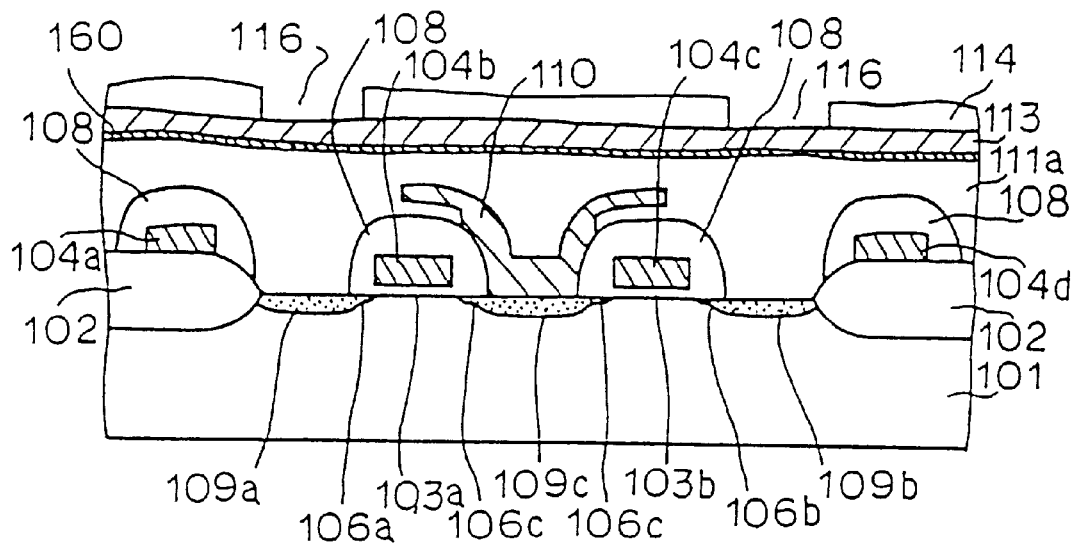

Thus, a first hole 116 reaching to the surface of polycrystalline silicon film 113 is formed as shown in FIG. 51. Then, resist 115 is removed.

Figure 52:
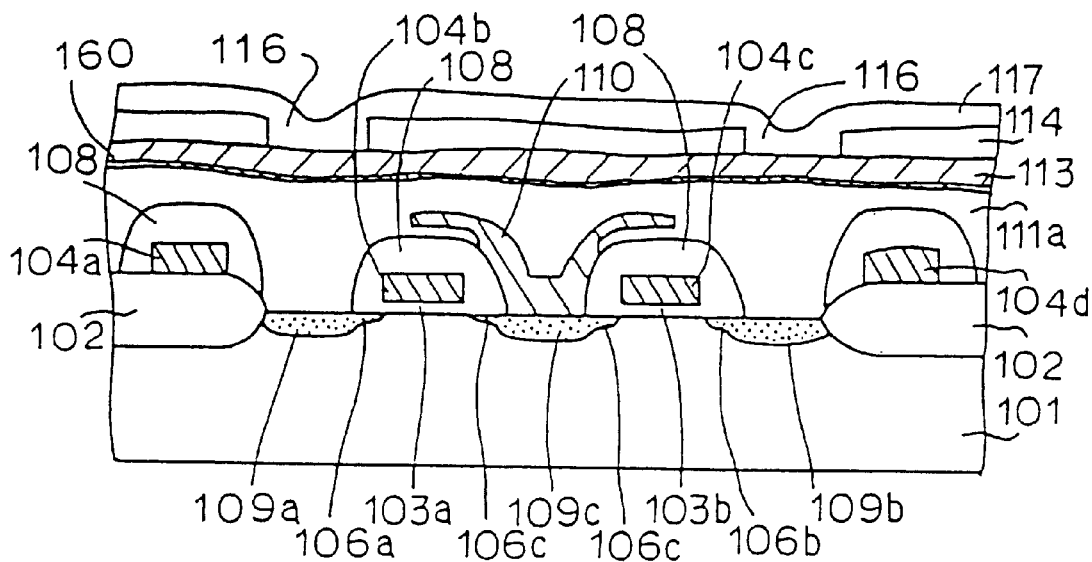

Referring to FIG. 52, a silicon oxide film 117 of a predetermined thickness is formed as the fourth film of the present invention all over the surface of silicon oxide film 114 including the inner circumferential sidewall of first hole 116. Then, oxide film 117 is etched anisotropically.

Figure 53:
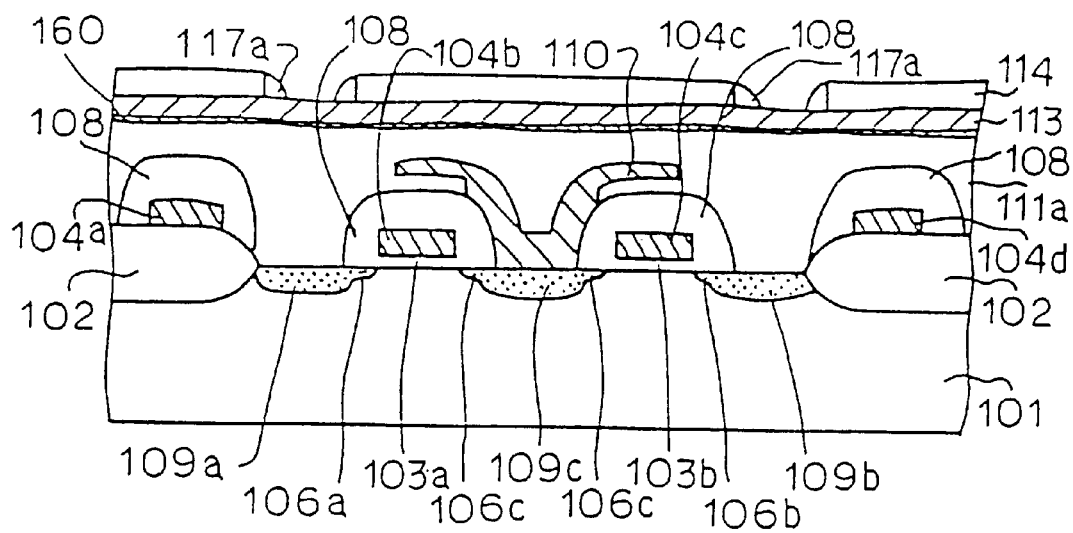

Referring to FIG. 53, a sidewall spacer-like frame 117a is formed at the inner circumferential sidewall of first hole 116 by this etching.

Figure 54:
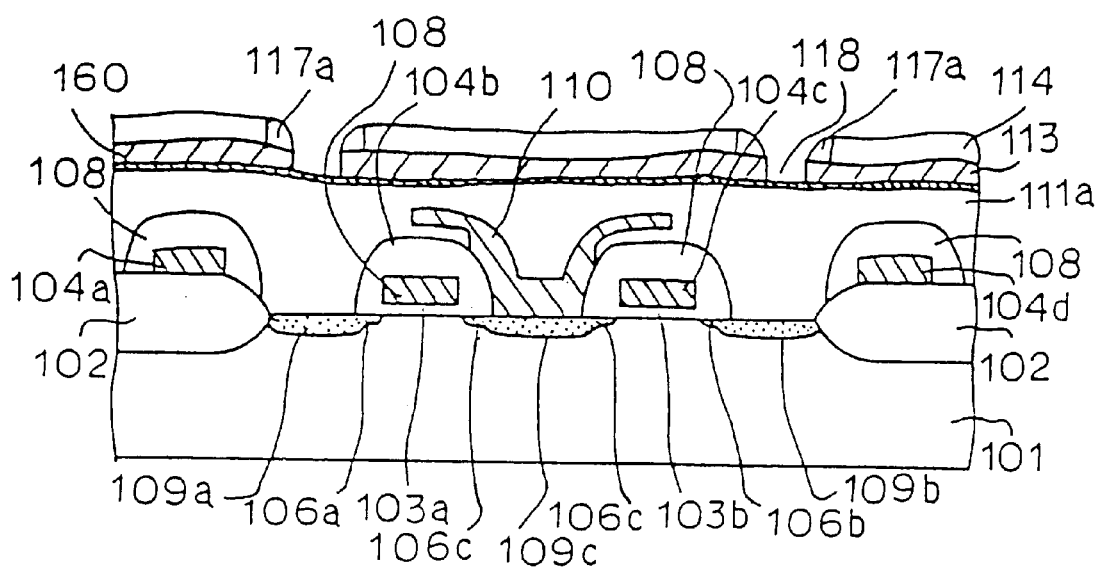

Referring to FIG. 54, polycrystalline silicon film 113 is etched anisotropically using silicon oxide film 114 and frame 117a as a mask to form a second opening 118 reaching to the surface of nitride film 160.

Figure 55:
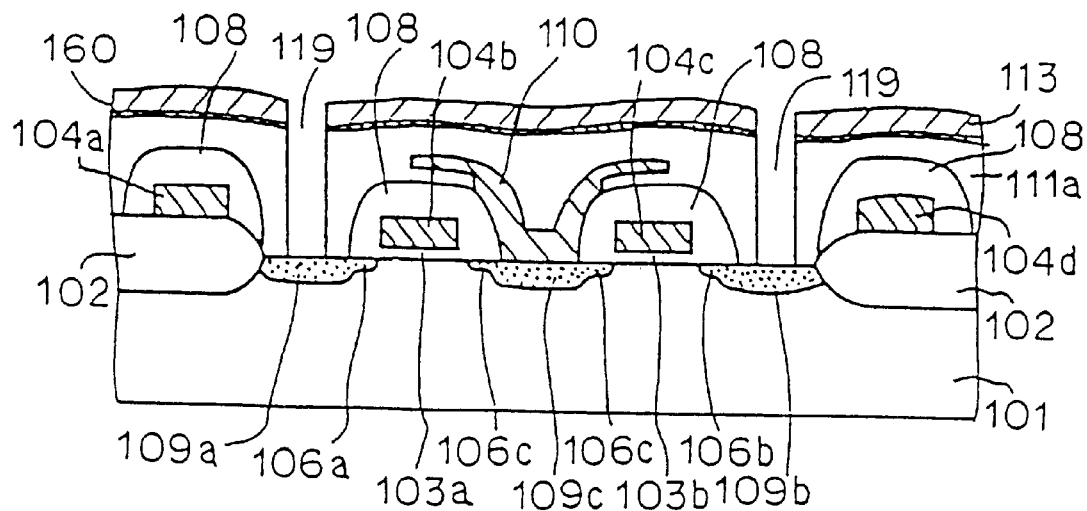

Referring to FIG. 55, a contact hole 119 reaching to the surface of impurity regions 109a and 109b is formed by etching anisotropically interlayer insulating film 111a using polycrystalline silicon film 113 as a mask.

Figure 56:
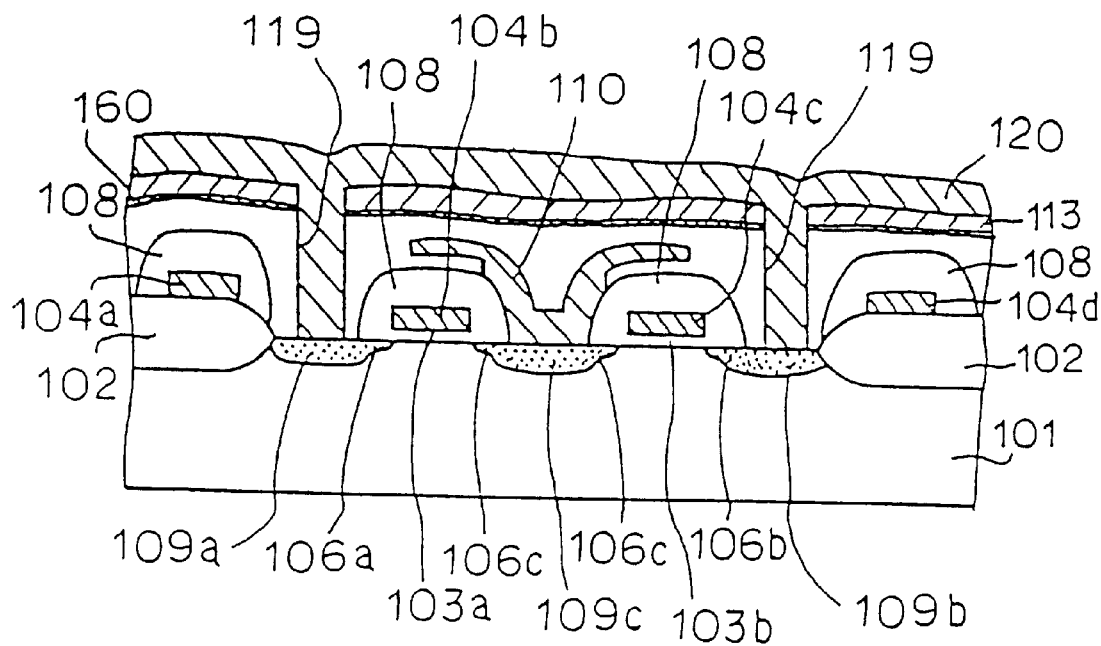
Figure 57:
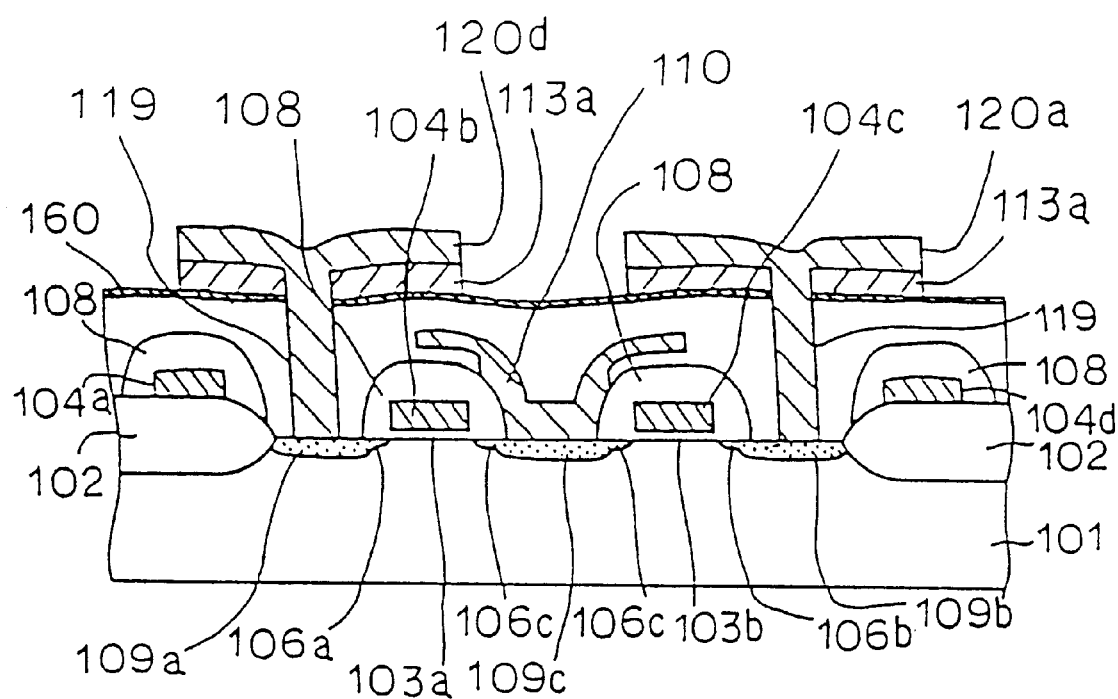

Referring to FIG. 56, a conductive layer 120 of polycrystalline silicon having impurities doped is formed to fill the interior of contact hole 119 and to cover the surface of polycrystalline silicon film 113. Conductive layer 120 and polycrystalline silicon film 113 are patterned by photolithography and etching techniques. As a result, patterned capacitor lower electrode 120*a* and polycrystalline silicon layer 113*a* are formed as shown in FIG. 57.

Figure 58:
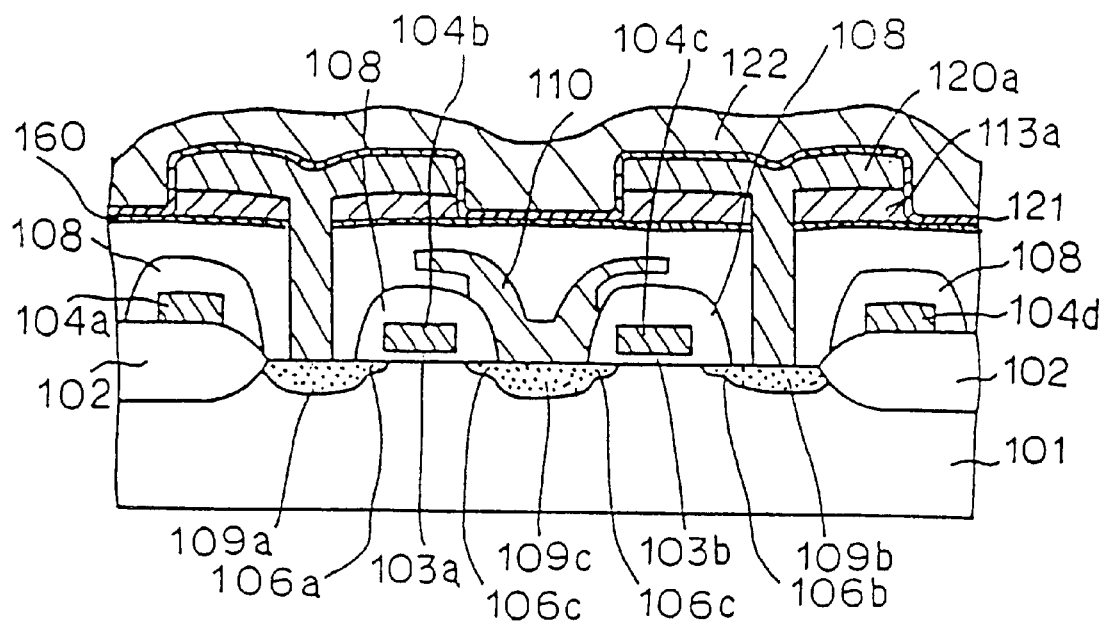
Figure 59:
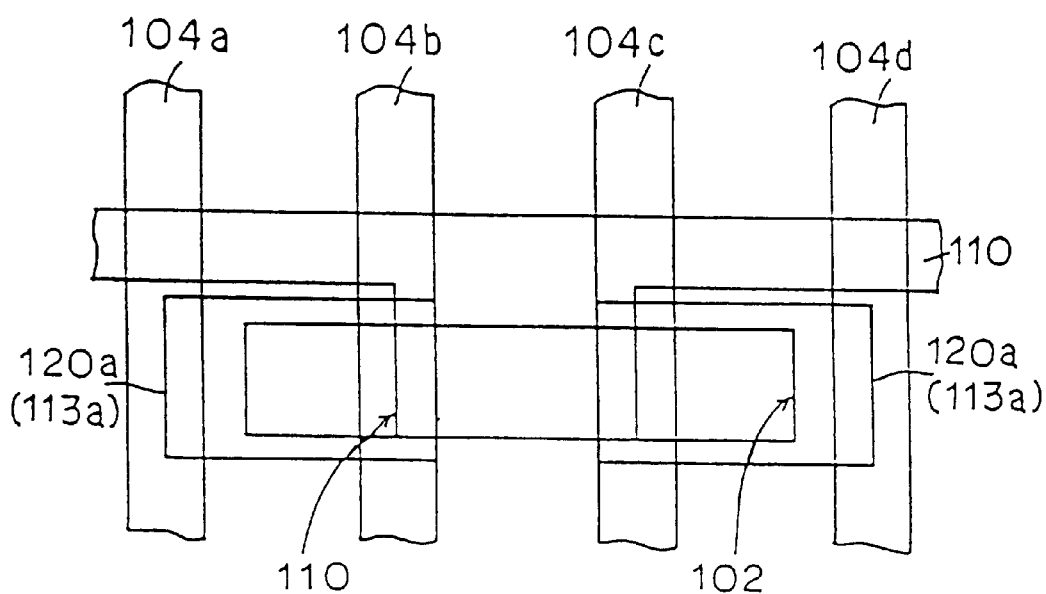
FIG. 59 is a plan layout diagram of a DRAM having the structure shown in FIG. 58.

Referring to FIG. 58, by applying a thermal treatment in an oxygen ambient after formation of a nitride film using low pressure CVD at the entire surface of semiconductor substrate 101, the nitride film is partially oxidized to form a capacitor dielectric film 121. Then, a conductive film 122 of a polycrystalline silicon having phosphorus doped is formed all over by low pressure CVD. Then, a capacitor upper electrode 122 is formed by removing conductive film 122 excluding those in predetermined regions. FIG. 59 is a plan layout diagram of the structure of FIG. 58.

According to the present embodiment, by forming first hole 116 of silicon oxide film 114 with the minimum dimension that can be formed by the design rule, a contact hole 119 can be formed in self-alignment having an opening diameter smaller than that of first hole 116. Therefore, even if the distance between adjacent gate electrodes 104*a*, 104*b*, 104*c* and 104*d* is reduced due to the increased scale of integration of a DRAM, sufficient margin can be ensured for error in the alignment accuracy of photolithography. Therefore, a contact hole 119 can easily be formed for electrical connection between the surface of impurity regions 109*a* and 109*b* serving as source/drain regions and lower electrode 120*a* of the capacitor.

In contrast to the structure of the present embodiment where conductive layer 120 forming the lower electrode layer fills contact hole 119, a structure may be implemented where the lower electrode layer is opposed to the upper electrode layer within contact hole 119. Such a structure will be described as the fifth embodiment of the present invention.

Fifth Embodiment

Figure 60:
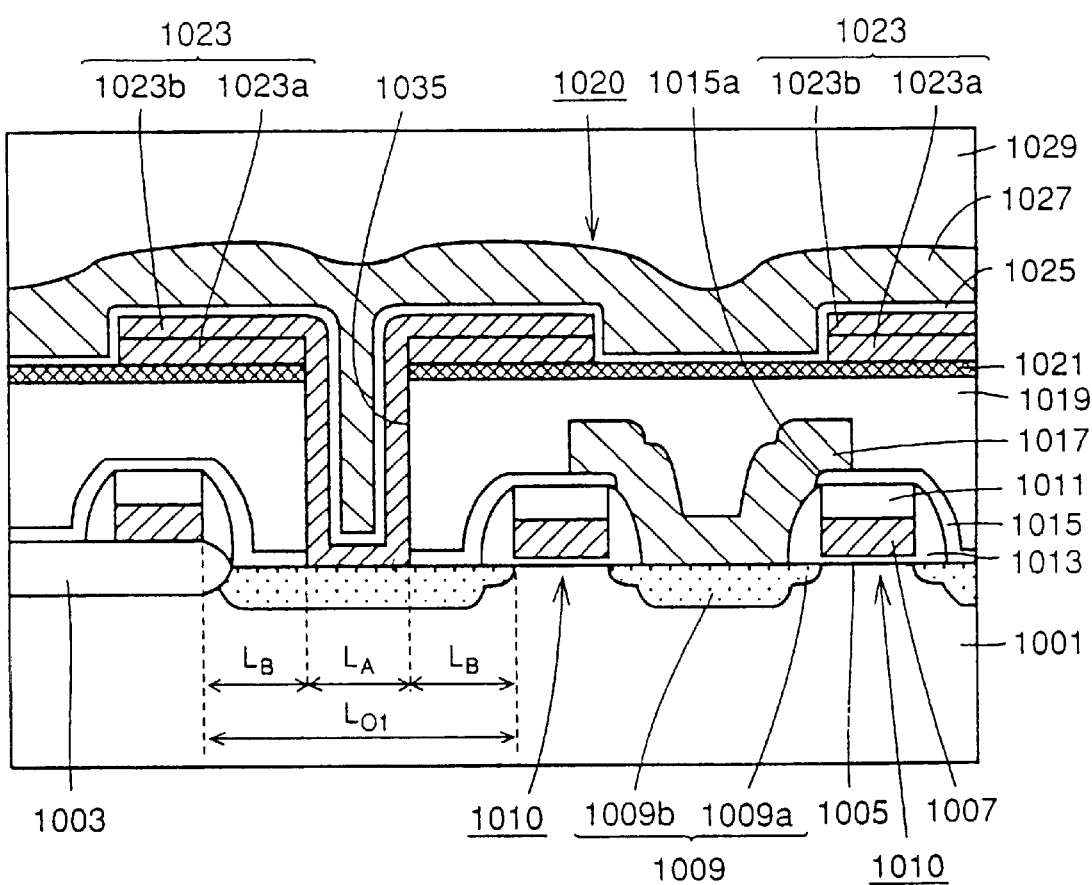
FIG. 60 is a sectional view of a semiconductor memory device according to a fifth embodiment of the present invention.

A semiconductor memory device according to a fifth embodiment of the present invention will be described hereinafter with reference to FIG. 60. Referring to FIG. 60, a memory cell is formed in a region isolated by an isolation oxide film 1003 on a silicon substrate 1001. This memory cell includes a transfer gate transistor 1010 and a capacitor 1020.

Transfer gate transistor 1010 includes a pair of source/drain diffusion regions 1009, a gate oxide film 1005, and a gate electrode (word line) 1007. The pair of source/drain diffusion regions 1009 are formed at the surface of silicon substrate 1001 with a predetermined distance therebetween. The source/drain diffusion regions 1009 have a LDD structure of a double layer of an impurity region 1009*a* of a relatively low concentration and an impurity region 1009*b* of a relatively high concentration. A gate electrode 1007 is formed on the region sandwiched by the pair of source/drain diffusion regions 1009 with a gate oxide film 1005 thereunder.

A word line 1007 which becomes the gate electrode is formed on the surface of isolation oxide film 1003. An insulating film 1011 is formed on the surface of each word line 1007 which becomes the gate electrode. A sidewall 1013 is formed to cover the sidewall of word line 1007 and insulating film 1011. A thin silicon oxide film ($SiO_2$) 1015 is formed all over the surface of silicon substrate 1001 to cover transfer gate transistor 1010. A contact hole 1015*a* is formed in silicon oxide film 1015.

A partial surface of one of source/drain diffusion regions 1009 is exposed in contact hole 1015*a*. A buried bit line 1017 is formed at the surface of sidewall 1013 and silicon oxide film 1015 to contact source/drain diffusion region 1009 via contact hole 1015*a*. An interlayer insulating film 1019 of approximately 8000 Å in thickness having its surface planarized is formed so as to cover buried bit line 1017 and transfer gate transistor 1010. A silicon nitride film ($Si_3N_4$) 1021 of approximately 1000 Å in thickness is formed all over the surface of interlayer insulating film 1019. A contact hole 1035 is formed penetrating the three layers of silicon nitride film 1021, interlayer insulating film 1019, and silicon oxide film 1015. A partial surface of the other of source/drain diffusion regions 1009 is exposed in contact hole 1035. A capacitor 1020 is formed so as to establish electrical connection with source/drain diffusion region 1009 via contact hole 1035.

Capacitor 1020 includes a lower electrode layer 1023, a capacitor dielectric film 1025, and an upper electrode layer 1027. Lower electrode layer 1023 includes a first portion 1023*a* and a second portion 1023*b*. The first portion 1023*a* is formed in a predetermined thickness on silicon nitride film 1021 so as to surround the proximity of the opening of contact hole 1035. The second portion 1023*b* of approximately 1500–2000 Å in thickness is formed on the surface of the first portion 1023*a* to contact source/drain diffusion region 1009 via contact hole 1035. A capacitor dielectric film 1025 is formed to cover the surface of lower electrode layer 1023. An upper electrode layer 1027 is formed to cover lower electrode layer 1023 with capacitor dielectric film 1025 therebetween. An insulating film 1029 is formed to cover capacitor 1020.

A method of manufacturing the semiconductor memory device according to the fifth embodiment of the present invention will be described hereinafter.

Figure 61:
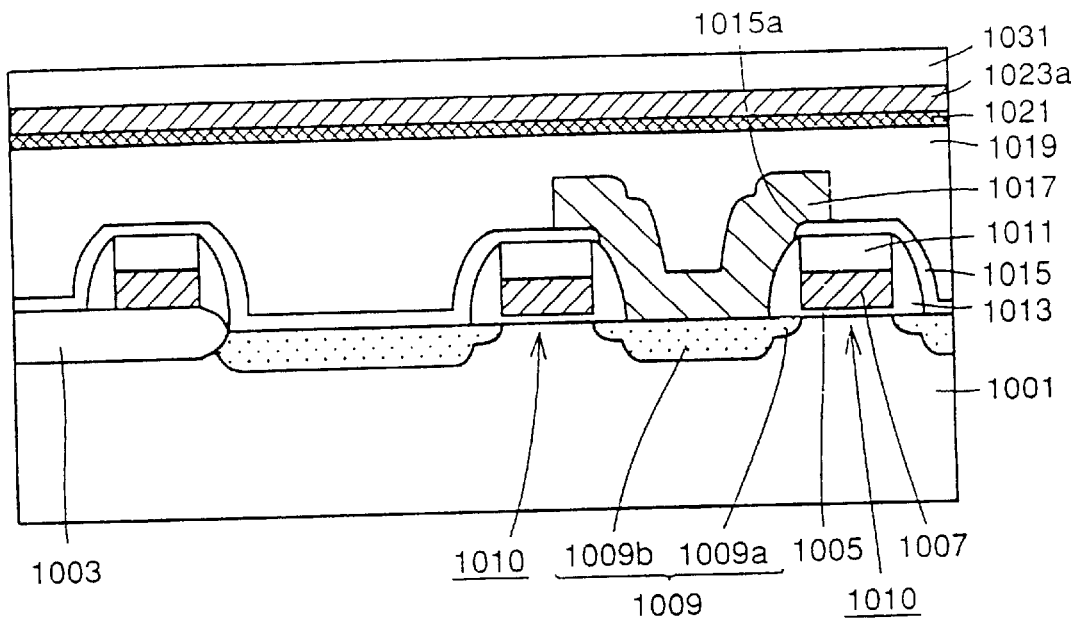
FIGS. 61–70 are sectional views of a semiconductor memory device according to the fifth embodiment of the present invention for describing the manufacturing steps thereof in order.
Figure 178:
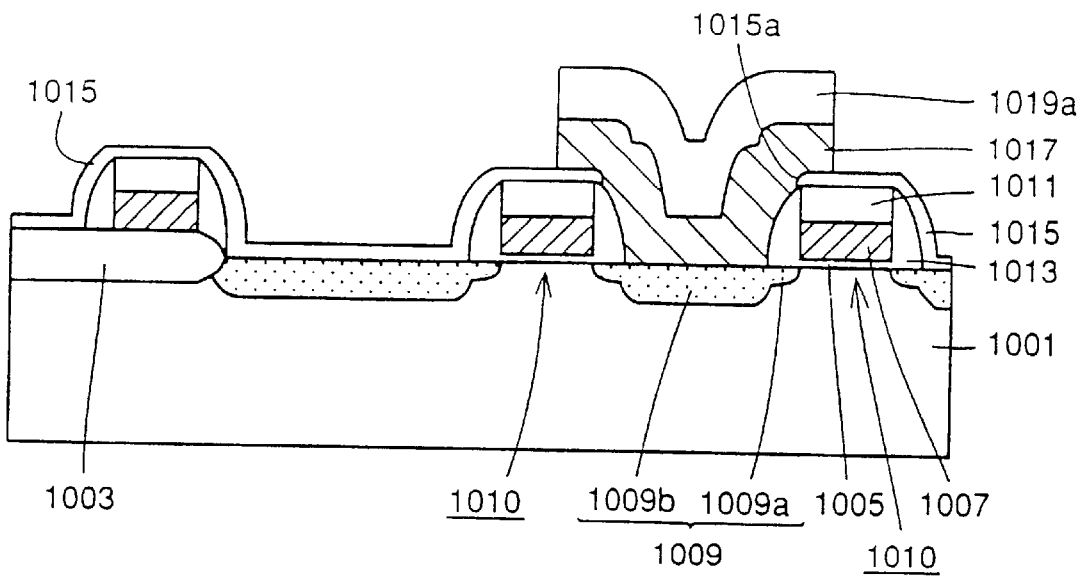

The process preceding the step shown in FIG. 61 of this semiconductor memory device of the first embodiment is substantially similar to the manufacturing process of the first conventional semiconductor memory device described with reference to FIG. 178, and their description will not be repeated. Referring to FIG. 61, a first polycrystalline silicon film 1023*a* and a first silicon oxide film 1031 are sequentially formed in a predetermined thickness all over the surface of silicon nitride film 1021.

Figure 62:
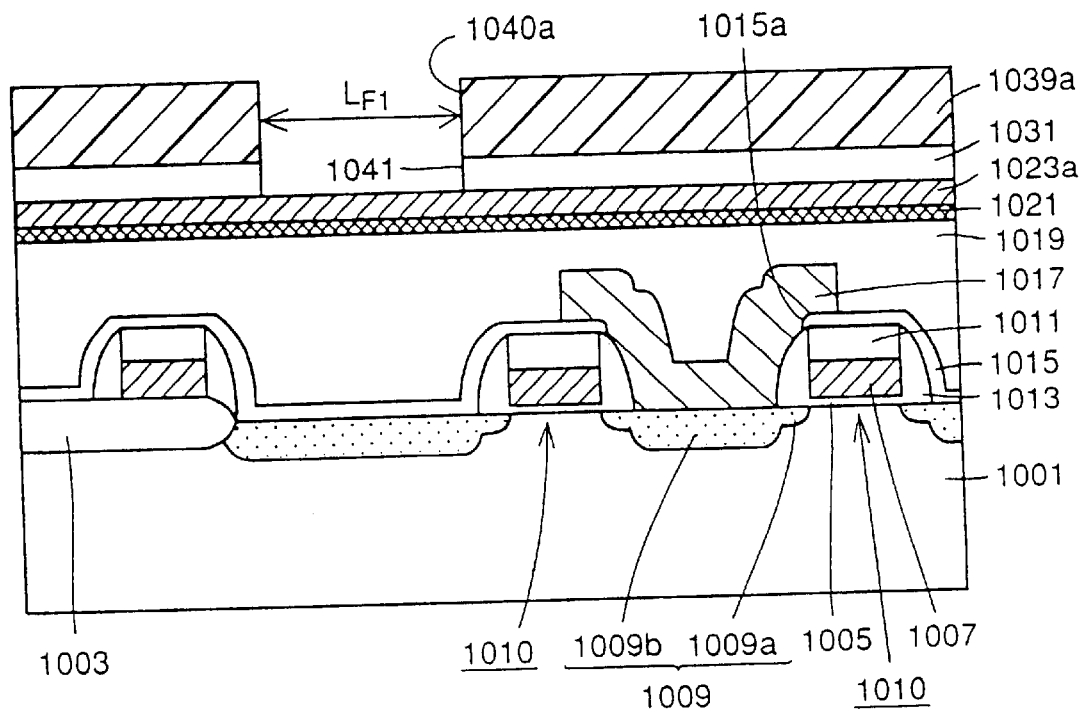

Referring to FIG. 62, a photoresist is applied all over the surface of first silicon oxide film 1031 to be patterned to a desired configuration by an exposure process and the like. This results in resist pattern 1039*a*. Resist pattern 1039*a* has a hole pattern 1040*a* of an opening diameter of $L_{F1}$. Using resist pattern 1039*a* as a mask, first silicon oxide film 1031 is subjected to anisotropic etching. By this etching process, an opening 1041 exposing a partial surface of the first polycrystalline silicon film 1023*a* is formed in first silicon oxide film 1031. Then, resist pattern 1039*a* is removed.

Figure 63:
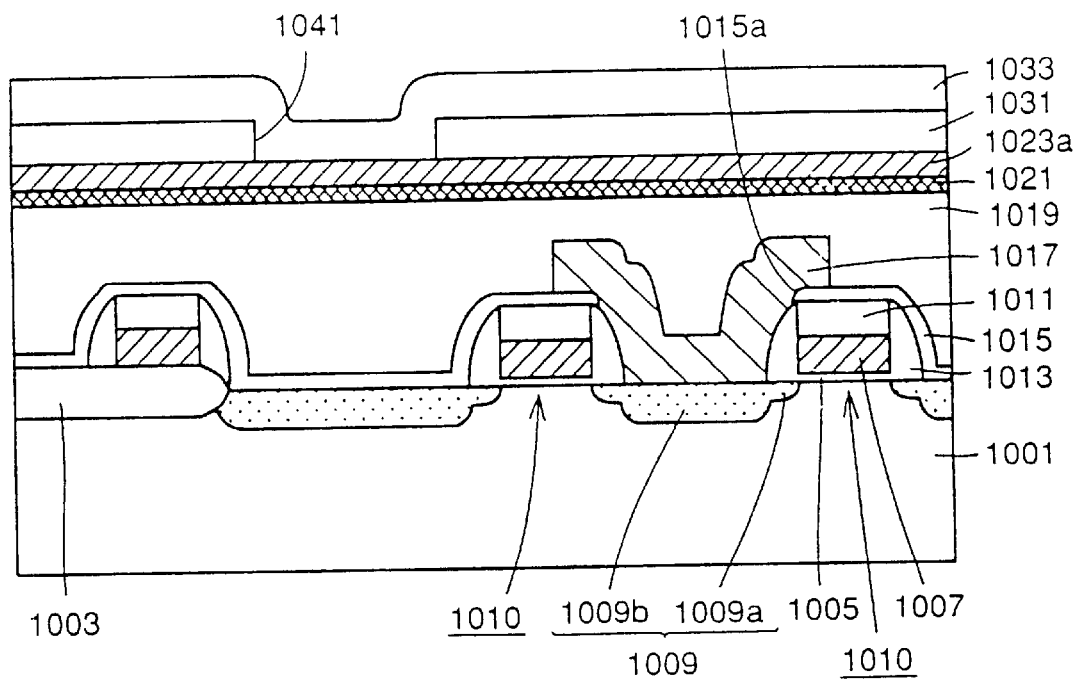

Referring to FIG. 63, a second silicon oxide film 1033 is formed in the inner sidewall of opening 1041 and all over the surface of the first silicon oxide film 1031. The second silicon oxide film 1033 is subjected to anisotropic etching.

Figure 64:
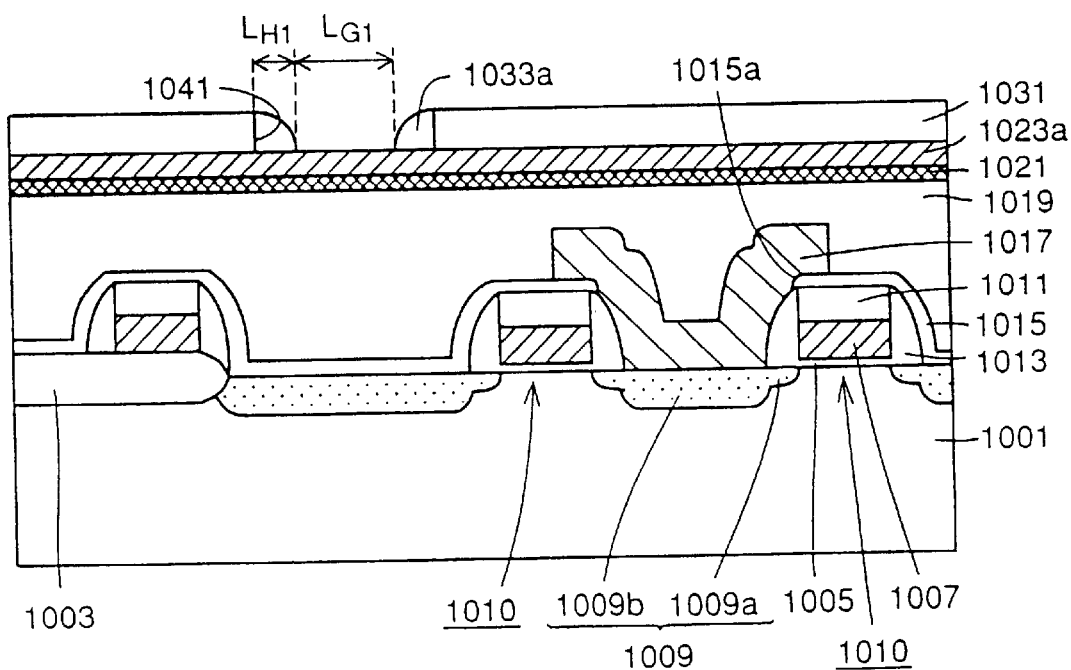

Referring to FIG. 64, a sidewall spacer-like frame portion 1033*a* is formed to cover the sidewall of opening 1041 by this anisotropic etching process. The opening diameter $L_{G1}$ of frame portion 1033*a* has the dimension of (opening diameter $L_{F1}$ of opening 1041)−2×(width $L_{H1}$ of frame portion 1033*a*). Then, using the first silicon oxide film 1031 and the frame portion 1033*a* as a mask, polycrystalline silicon film 1023*a* is etched.

Figure 65:
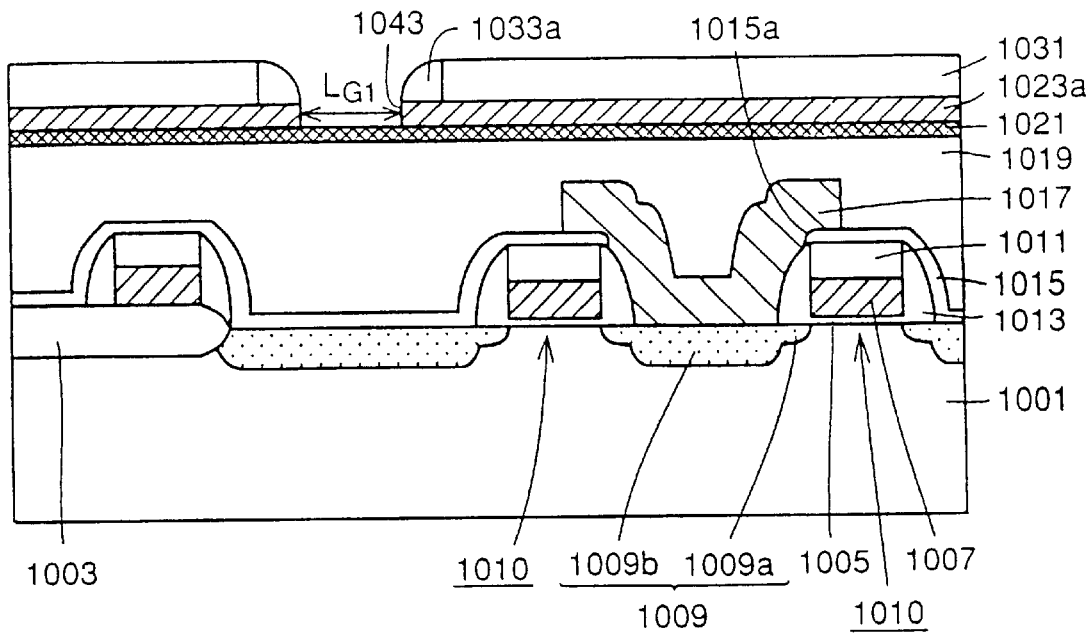

Referring to FIG. 65, this etching process causes a partial surface of silicon nitride film 1021 to be exposed, and an opening 1043 having an opening diameter of $L_{G1}$ is formed in first polycrystalline silicon film 1023*a*.

Figure 66:
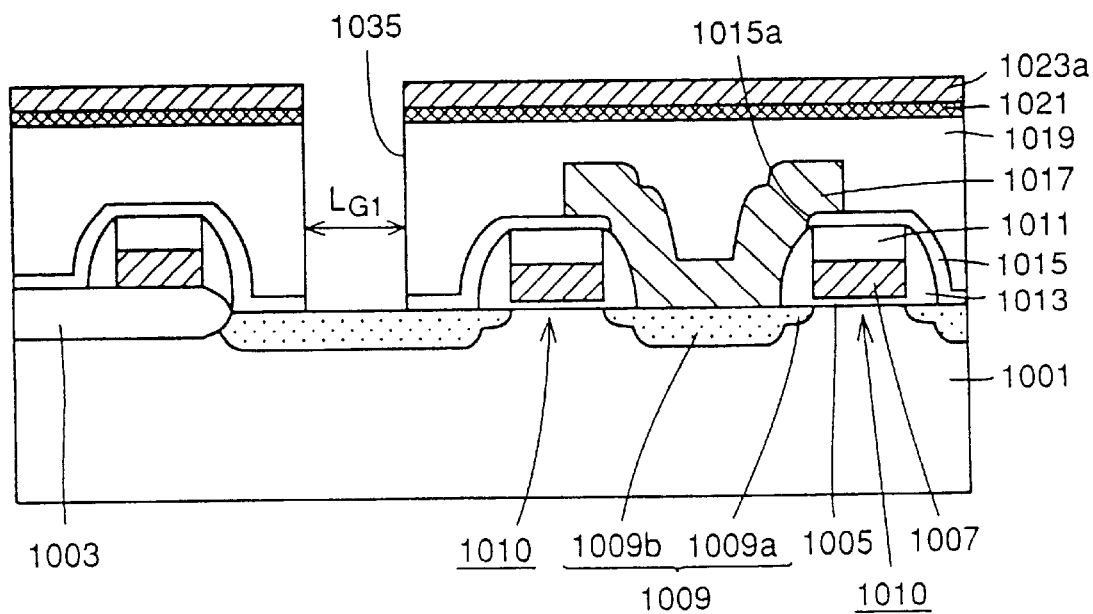

Referring to FIG. 66, using polycrystalline silicon film 1023a including opening 1043 as a mask, the underlying layer is subjected to anisotropic etching, whereby silicon nitride film 1021, interlayer insulating film 1019, silicon oxide film 1015 are sequentially etched away. Thus, a contact hole 1035 reaching to the surface of silicon substrate 1 and having an opening diameter of $L_{G1}$ is formed. At the time of etching of interlayer insulating film 1019 and silicon oxide film 1015, silicon oxide film 1031 having an etching characteristic equal to these two layers is etched away at the same time.

Figure 67:
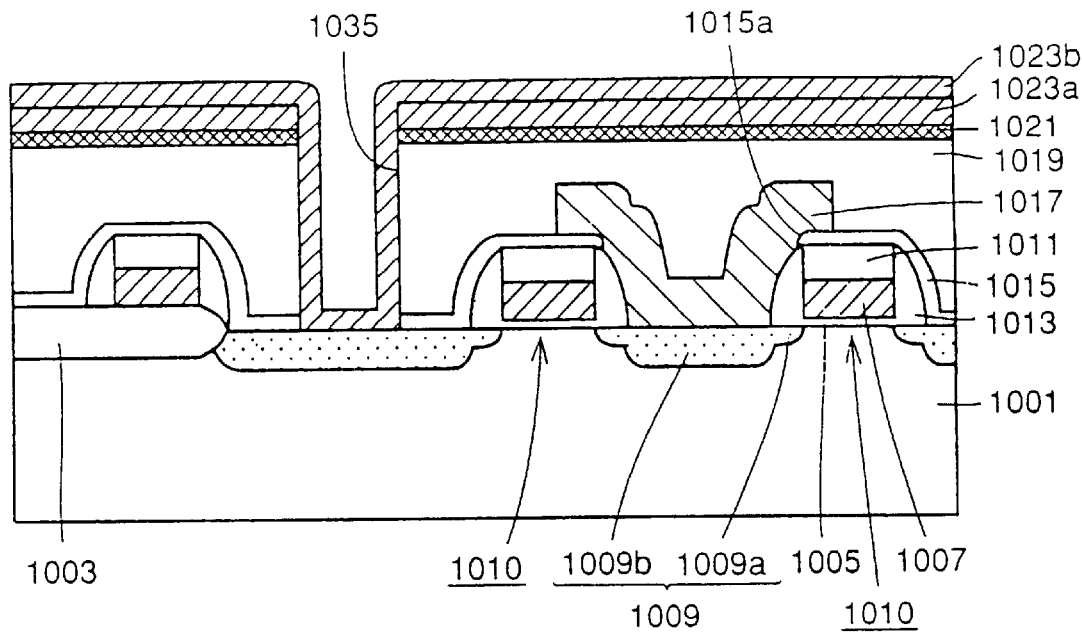

Referring to FIG. 67, a second polycrystalline silicon film 1023b of approximately 1500–2000 Å in thickness is formed on the surface of first polycrystalline silicon film 1023a by introducing impurities so as to contact source/drain diffusion region 1009 via contact hole 1035.

Figure 68:
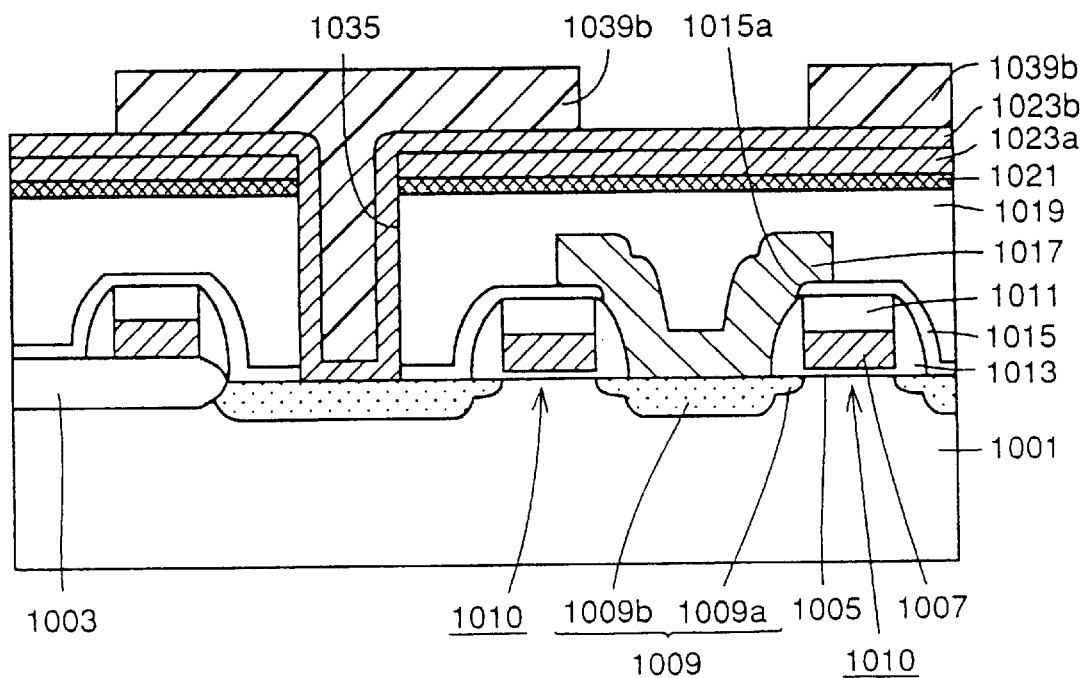

Referring to FIG. 68, a photoresist is applied all over the surface of second polycrystalline silicon film 1023b to be patterned by an exposure process and the like. This results in a resist pattern 1039b. Using resist pattern 1039b as a mask, second polycrystalline silicon film 1023b, and then first polycrystalline silicon film 1023a are etched away.

Figure 69:
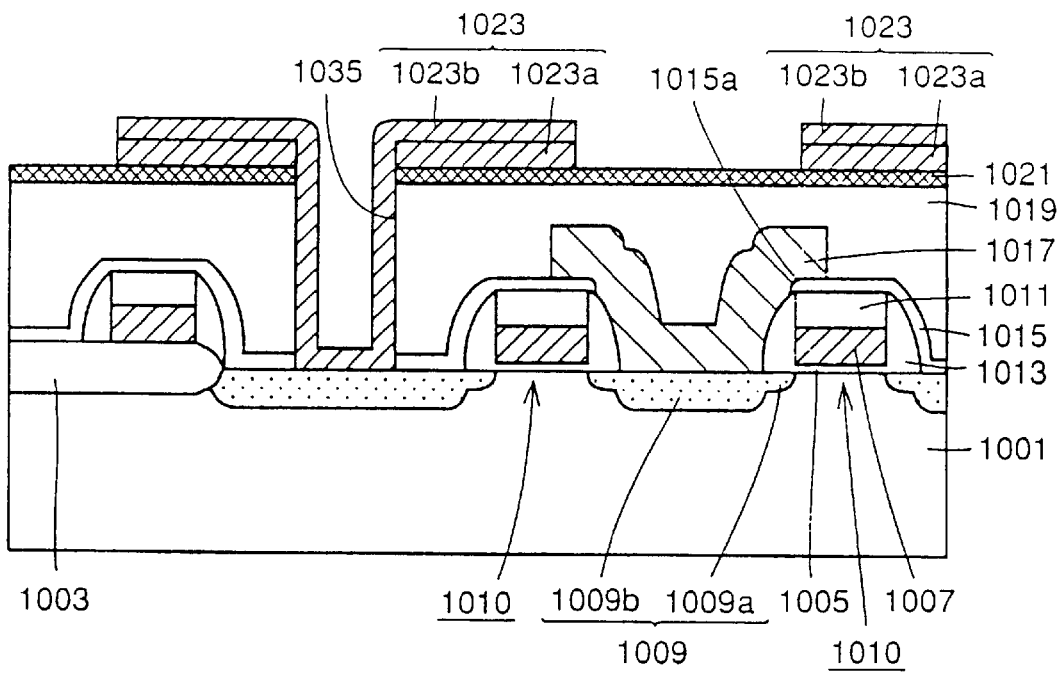

Referring to FIG. 69, a lower electrode layer 1023 of first and second polycrystalline silicon films 1023a and 1023b are formed by this etching process. Then, resist pattern 1039b is removed.

Figure 70:
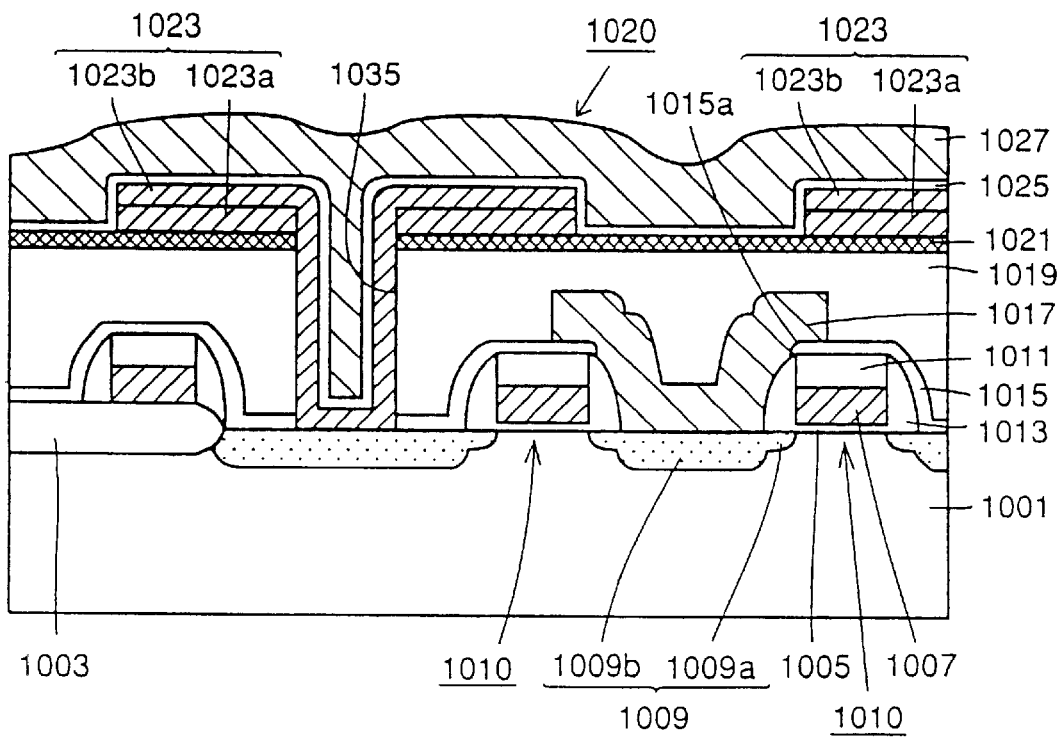

Referring to FIG. 70, a capacitor dielectric film 1025 is formed to cover lower electrode layer 1023. An upper electrode layer 1027 of polycrystalline silicon film is formed to cover lower electrode layer 1023 with capacitor dielectric film 1025 therebetween. Lower electrode layer 1023, capacitor dielectric film 1025, and upper electrode layer 1027 form a capacitor 1020. Then, an insulating film 1029 is formed to cover the surface of capacitor 1020 to result in the circuit shown in FIG. 60.

Although the semiconductor memory device according to the fourth and fifth embodiments of the present invention was described employing the structure of a memory cell having a stacked capacitor, the present invention may be applied to a memory cell having a cylindrical type stacked capacitor. The structure of a memory cell having a cylindrical stacked capacitor will be described hereinafter as sixth-eighth embodiments.

Sixth Embodiment

Figure 71:
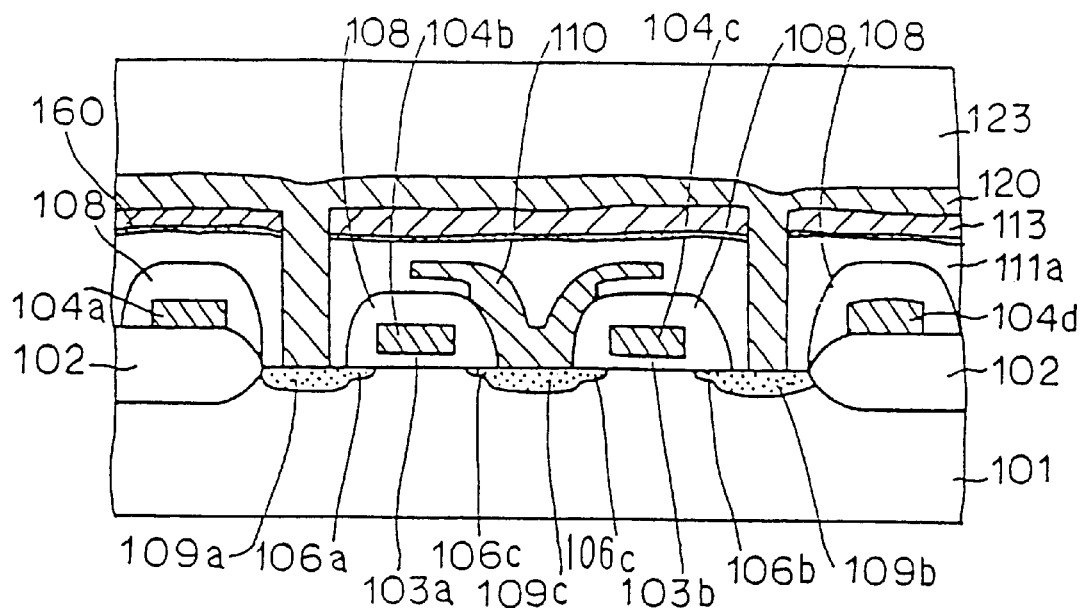
FIGS. 71–81 are sectional views of a semiconductor memory device according to a sixth embodiment of the present invention for describing the manufacturing steps thereof.

FIGS. 71–81 are sectional views of a semiconductor device for describing a sixth embodiment of a manufacturing method of the present invention. The manufacturing steps of the 6th embodiment includes the steps of FIGS. 40–56 similar to those in the 4th embodiment. Following the formation step of a conductive layer 120 shown in FIG. 56, the present embodiment proceeds by forming a thick insulating layer 123 such as of silicon oxide on the surface of conductive layer 120 as shown in FIG. 71.

Figure 72:
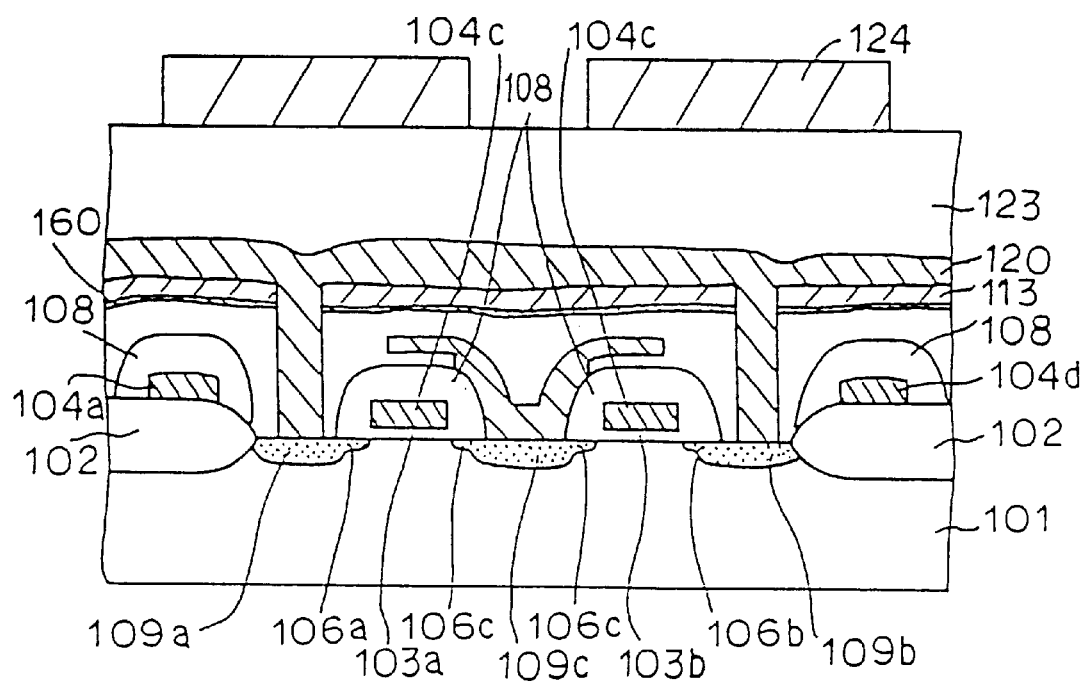

Referring to FIG. 72, a resist is applied on the surface of insulating layer 123. Then, a resist film 124 of a predetermined configuration is patterned by photolithography and the like.

Figure 73:
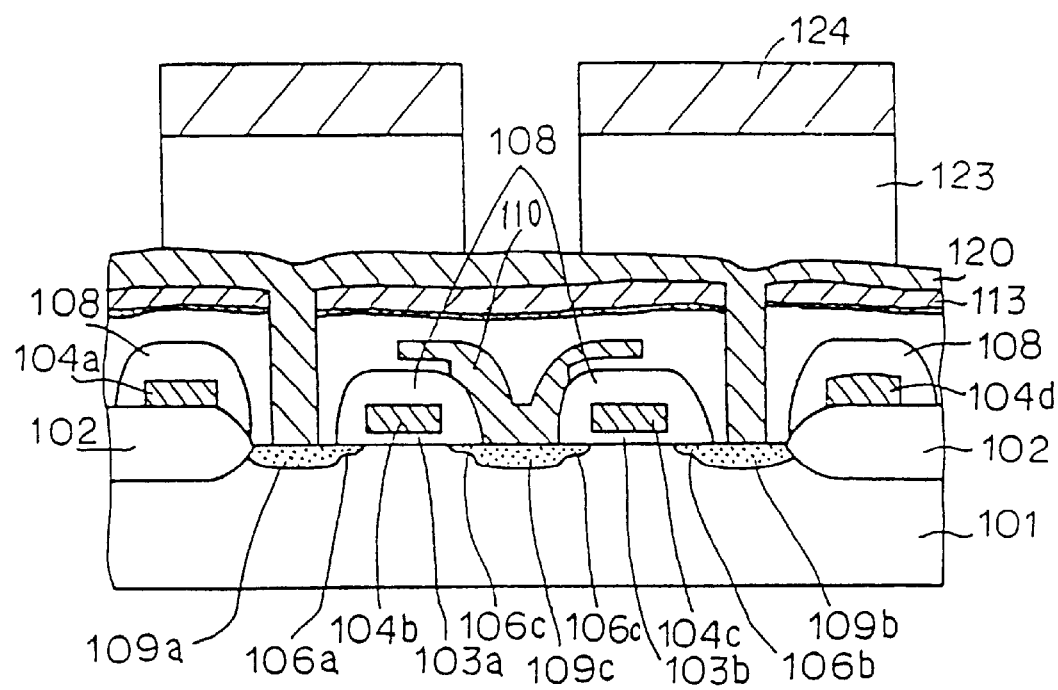

Referring to FIG. 73, insulating layer 123 is etched anisotropically using resist film 124 as a mask to selectively remove insulating film 123. Then, resist film 124 is removed.

Figure 74:
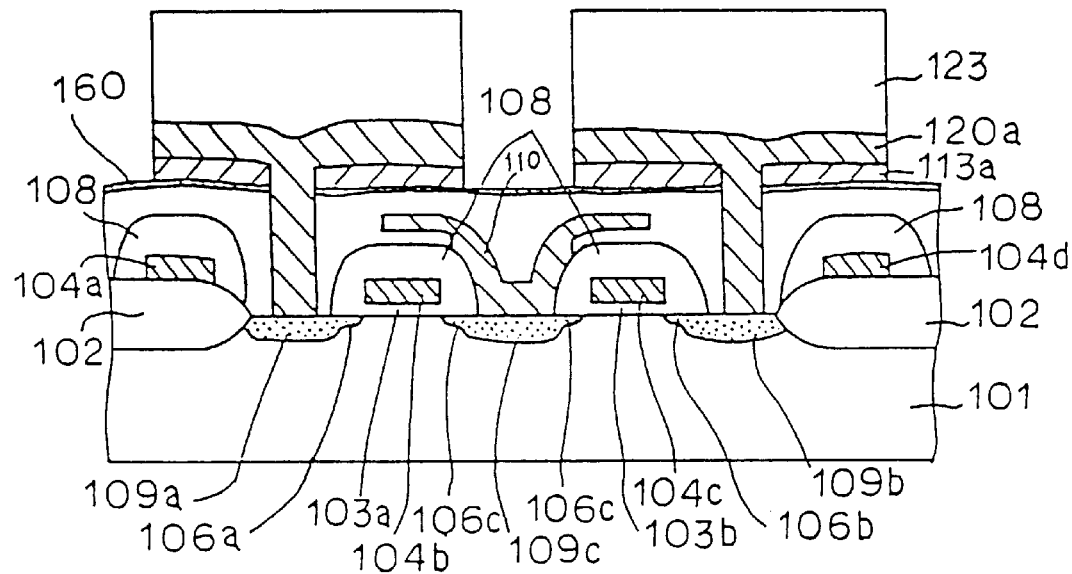

Referring to FIG. 74, conductive layer 120 and polycrystalline silicon film 113 (refer to FIG. 73) are selectively removed by anisotropic etching using insulating layer 123 as a mask. Thus, capacitor lower electrode 120a and polycrystalline silicon film 113a are patterned.

Figure 75:
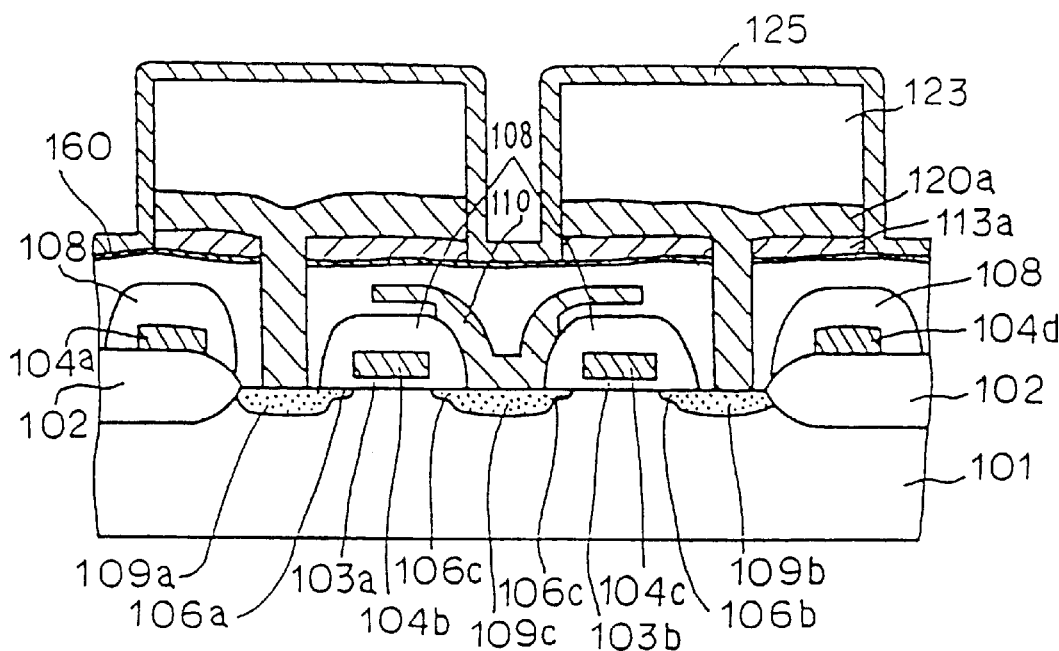
Figure 76:
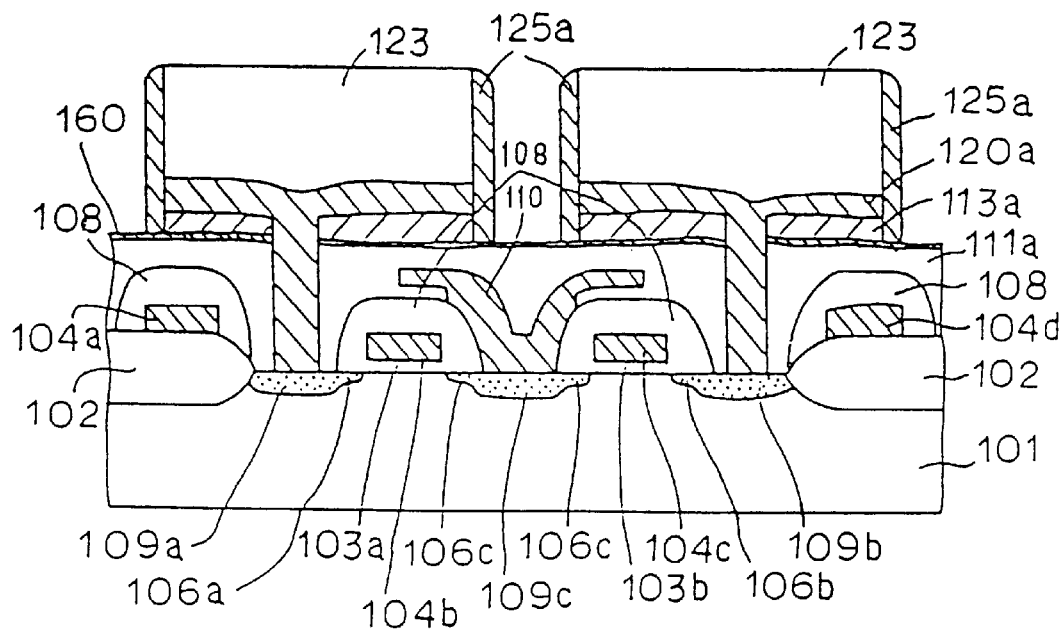

Referring to FIG. 75, a polycrystalline silicon film 125 having impurities introduced is deposited by CVD all over semiconductor substrate 101 including insulating layer 123, the sidewall of lower electrode 120a, and the surface of the exposed semiconductor substrate 101. Polycrystalline silicon film 125 is formed thinner than lower electrode 120a of the capacitor and polycrystalline silicon film 113a. Then, the whole surface is etched anisotropically to remove polycrystalline silicon film 125 formed on the surface of insulating layer 123 and the surface of interlayer insulating film 111a as shown in FIG. 76. Then, insulating layer 123 is removed by etching.

Figure 77:
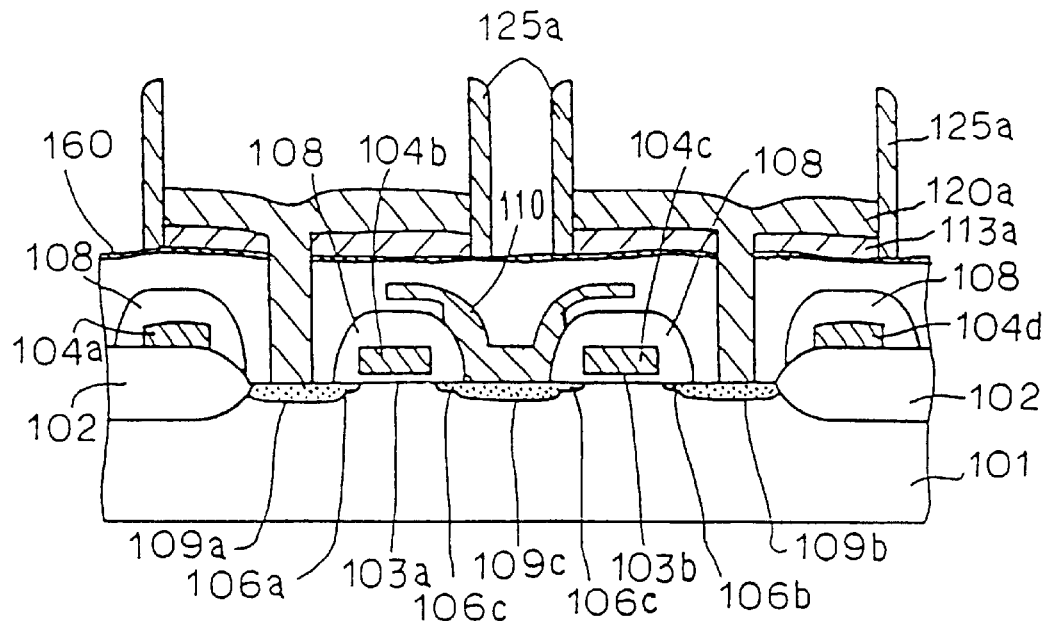

Referring to FIG. 77, a cylindrical portion 125a of the lower electrode of the capacitor is formed.

Figure 78:
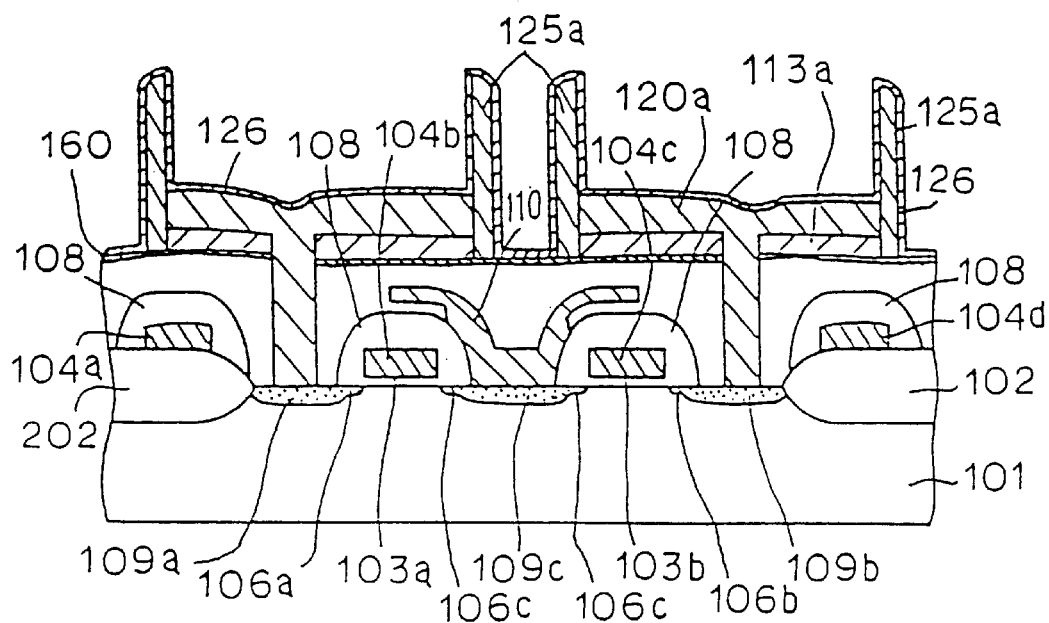

Referring to FIG. 78, after a nitride film is formed all over semiconductor substrate 101 including the sidewall of cylindrical portion 125a of the lower electrode of the capacitor, the nitride film is oxidized in an oxide ambient to form a dielectric film 126 of the capacitor.

Figure 79:
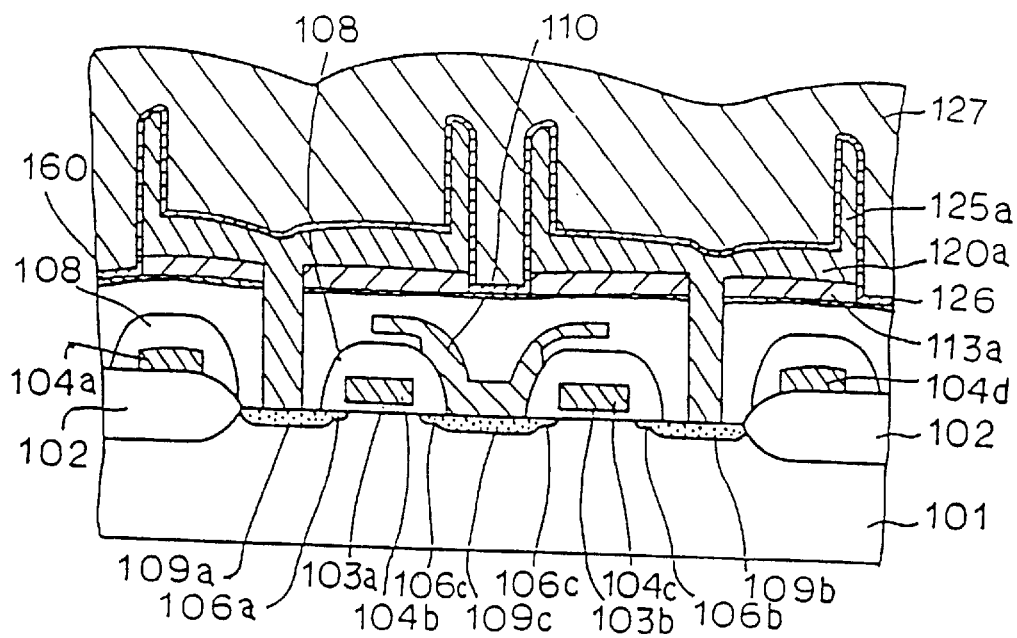

Referring to FIG. 79, an upper electrode 127 of the capacitor of polycrystalline silicon having impurities introduced is formed by CVD on semiconductor substrate 101.

Figure 80:
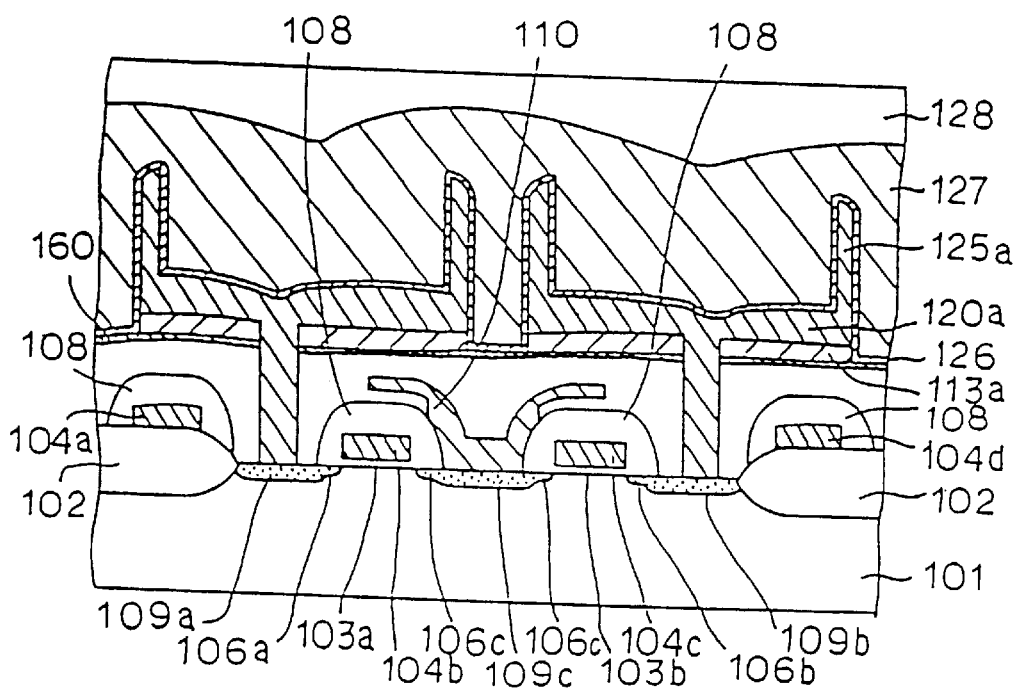

Referring FIG. 80, an interlayer insulating film 128 is formed on upper electrode 127 of the capacitor.

Figure 81:
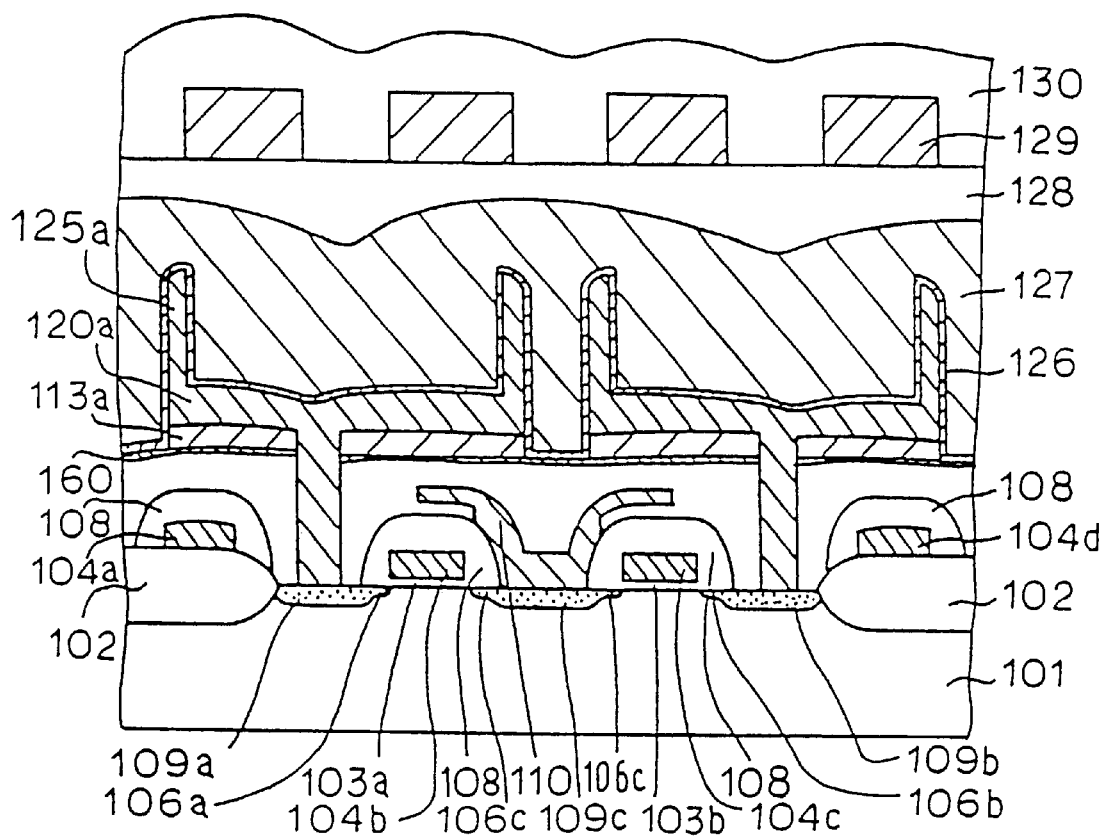
Figure 82:
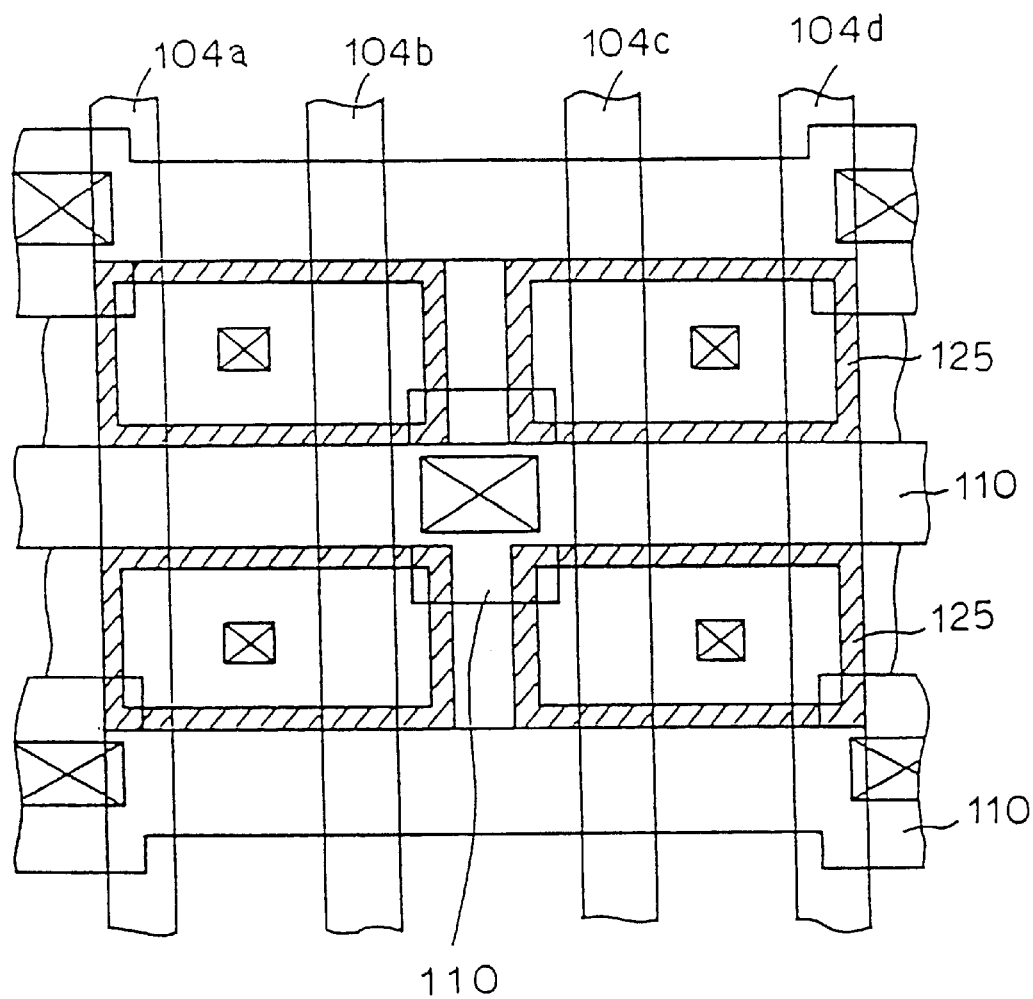
FIG. 82 is a plan layout diagram of a memory cell of a DRAM having the structure shown in FIG. 81.

Referring to FIG. 81, a conductive interconnection 129 of aluminum alloy is formed at the surface of interlayer insulating film 128. A passivation film 130 is formed on conductive interconnection 129. FIG. 82 is a plan layout diagram of the memory cell of a DRAM having the sectional structure shown in FIG. 81.

In contrast to the structure of the present embodiment in which conductive layer 120a forming the lower electrode layer fills contact hole 119, a structure may be implemented in which the lower electrode layer and the upper electrode layer are opposed to each other in contact hole 119. Such a structure will be described hereinafter as the seventh embodiment.

Seventh Embodiment

Figure 83:
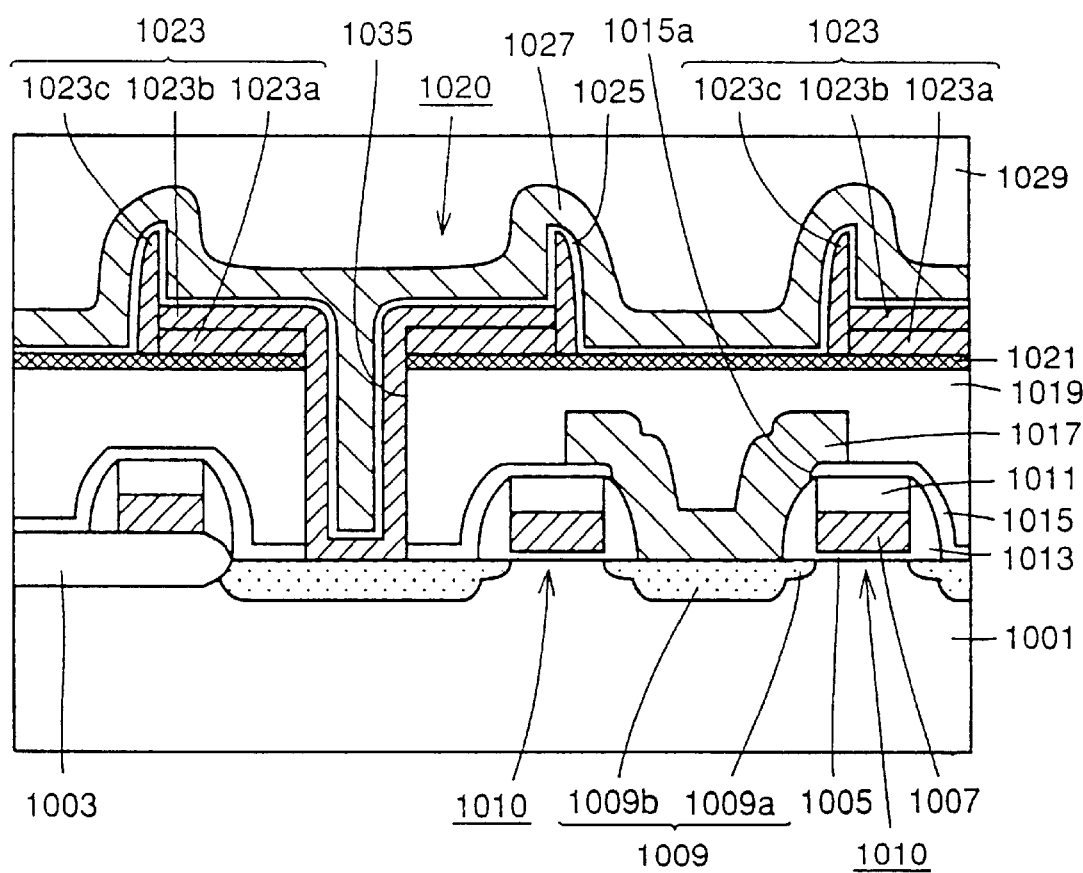
FIG. 83 is a sectional view schematically showing a structure of a semiconductor memory device according to a seventh embodiment of the present invention.

FIG. 83 is a sectional view of the structure of a semiconductor memory device according to a seventh embodiment of the present invention. Referring to FIG. 83, the semiconductor memory device of the seventh embodiment differs from the semiconductor memory device of the fifth embodiment in the structure of its capacitor.

A capacitor 1020 includes a lower electrode layer 1023, a capacitor dielectric film 1025, and an upper electrode layer 1027. Lower electrode layer 1023 includes a first portion 1023a, a second portion 1023b, and a third portion 1023c. The first portion 1023a is formed in a predetermined thickness on the surface of silicon nitride film 1021 so as to surround the opening of contact hole 1035. The second portion 1023b is formed on the surface of the first portion 1023a to contact source/drain diffusion region 1009 via contact hole 1035. The third portion 1023c is in contact with the perimeter of the first and second portions 1023a and 1023b, and has a cylindrical shape extending upwards perpendicular to the surface of silicon substrate 1001. Capacitor dielectric film 1025 is formed to cover lower electrode layer 1023. Upper electrode layer 1027 is formed to cover lower electrode layer 1023 with capacitor dielectric film 1025 therebetween.

The elements other than capacitor 1020 are similar to those of the semiconductor memory device of the fifth embodiment, and their description will not be repeated.

A method of manufacturing the semiconductor memory device according to the seventh embodiment of the present invention shown in FIG. 83 will be described hereinafter.

Figure 84:
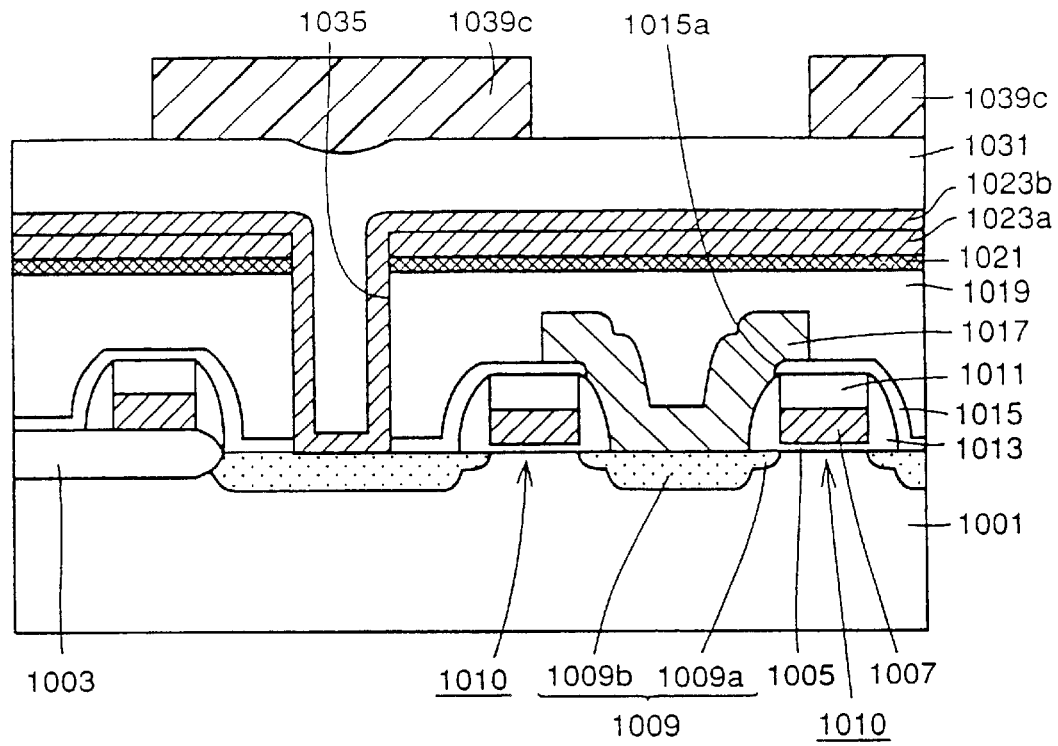
FIGS. 84–89 are sectional views of a semiconductor memory device according to the seventh embodiment of the FIGS. 90–92 are sectional views of a semiconductor memory device according to an eighth embodiment of the present invention for describing the manufacturing steps thereof in order.

The process preceding the step shown in FIG. 84 is similar to the manufacturing step of the fifth embodiment, and their description will not be repeated. Following the manufacturing step of FIG. 84, an insulating film 1031 of silicon oxide is formed all over the surface of second polycrystalline silicon film 1023b. A photoresist is applied all over the surface of insulating film 1031 to be patterned to a desired configuration by an exposure process and the like. This results in a resist pattern 1039c. Using resist pattern 1039c as a mask, insulating film 1031 is subjected to anisotropic etching.

Figure 85:
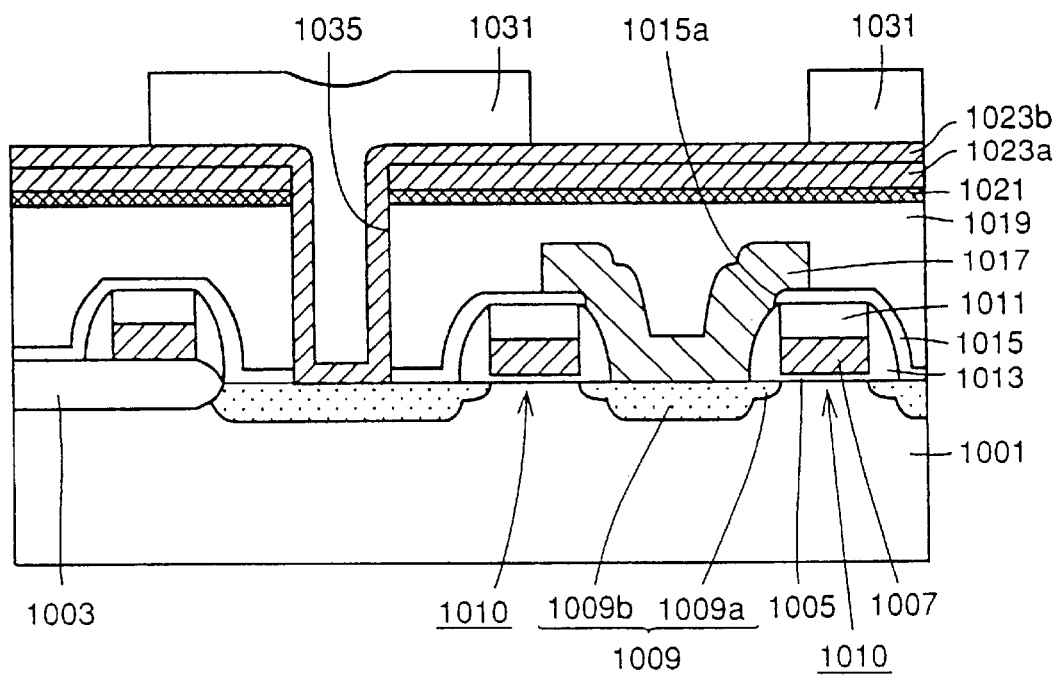

Referring to FIG. 85, insulating film 1031 is patterned to a desired configuration by this etching process. Then, resist pattern 1039c is removed.

Figure 86:
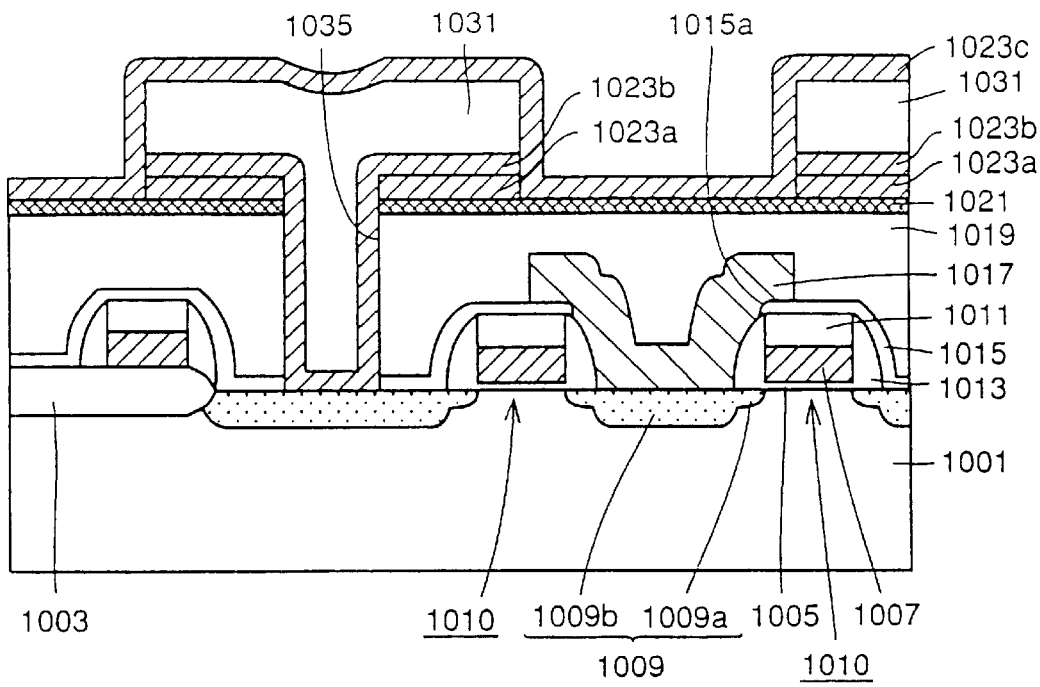

Referring to FIG. 86, using insulating film 1031 patterned to a desired configuration as a mask, second polycrystalline silicon film 1023b and then first polycrystalline silicon film 1023a are sequentially etched away. Then, a third polycrystalline silicon film 1023c is formed to cover all the surface of insulating film 1031 with insulating film 1031 still remaining. Then, third polycrystalline silicon film 1023c is subjected to anisotropic etching.

Figure 87:
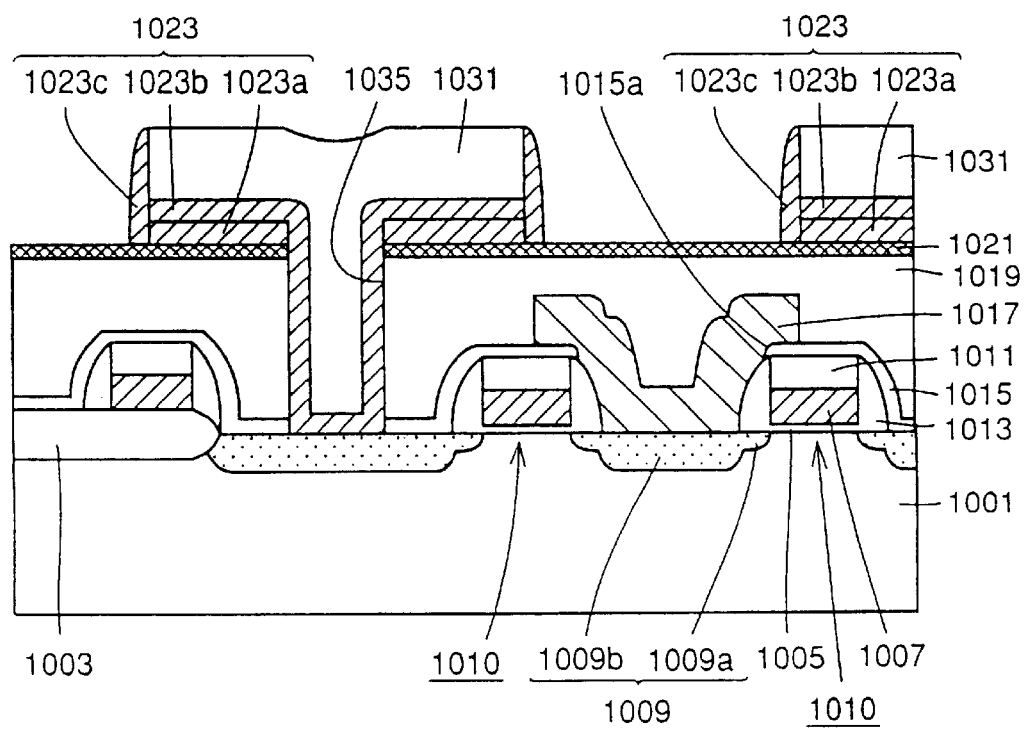
Figure 88:
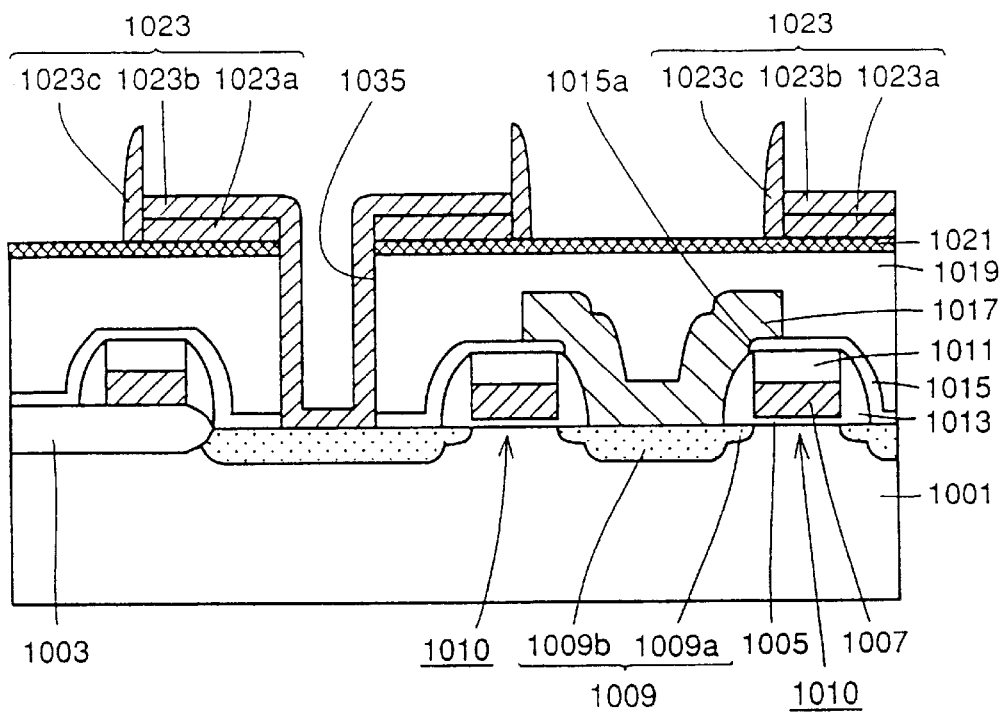

Referring to FIG. 87, a sidewall spacer-like cylindrical third portion 1023c is formed to cover the sidewall of insulating film 1031 by this etching process. The first, second, and third portions 1023a, 1023b, and 1023c form lower electrode layer 1023. Then, insulating film 1031 filled in the inside region of lower electrode layer 1023 is removed by etching to result in the structure shown in FIG. 88.

Figure 89:
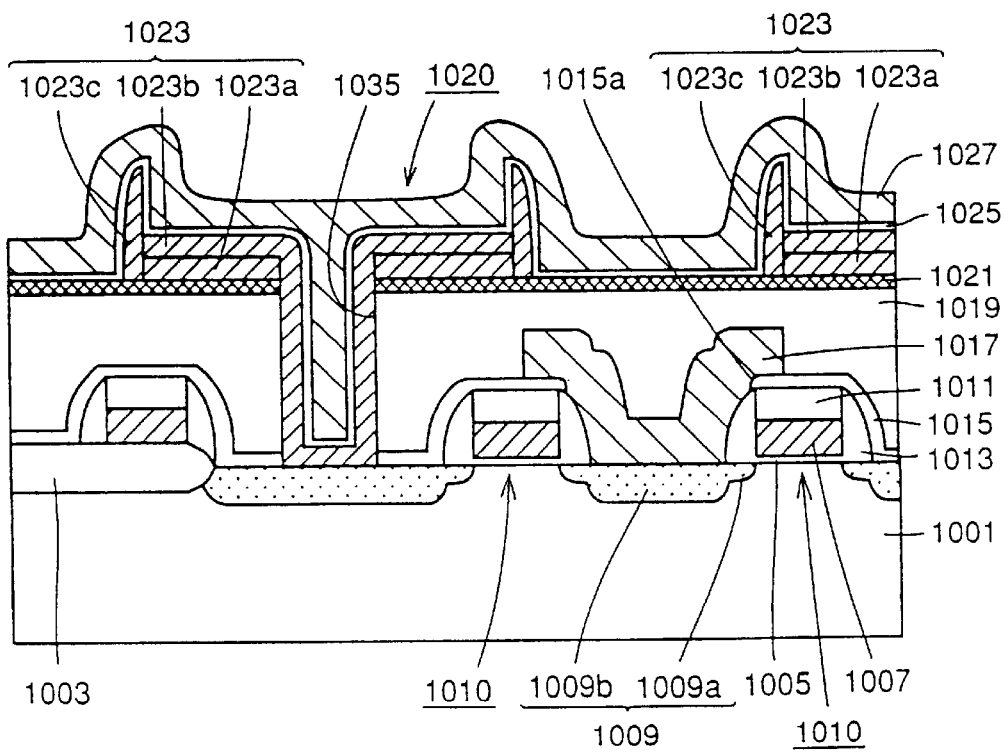

Referring to FIG. 89, a capacitor dielectric film 1025 is formed to cover the surface of lower electrode layer 1023. Upper electrode layer 1027 is formed to cover the surface of lower electrode layer 1023 with capacitor dielectric film 1025 therebetween. Lower electrode layer 1023, capacitor dielectric film 1025, and upper electrode layer 1027 form capacitor 1020. Then, an insulating film 1029 is formed to cover capacitor 1020, resulting in the structure shown in FIG. 83.

According to the manufacturing methods of the semiconductor memory devices of the fifth and seventh embodiments of the present invention, an opening 1041 is formed in the first silicon oxide film 1031 by photolithography as shown in the step of FIG. 62. The opening diameter $L_{F1}$ of opening 1041 can not be made smaller than the minimum opening diameter that can be formed by photolithography technique. In other words, the opening diameter $L_{F1}$ of opening 1041 can not be made smaller than 0.4 $\mu$m.

However, by providing a sidewall spacer-like frame portion 1033a at the sidewall of opening 1041 as shown in FIG. 64, the opening diameter can be reduced by the width $L_{H1}$ of frame portion 1033a. Thus, opening diameter $L_{G1}$ can be made smaller than the minimum dimension that can be formed by photolithography (i.e. below 0.4 $\mu$m). By sequentially applying an etching process using frame portion 1033a having an opening diameter of $L_{G1}$ and first silicon oxide film 1031 as a mask, a contact hole 1035 can be formed having an opening diameter substantially equal to the opening diameter $L_{G1}$ shown in FIG. 66.

The semiconductor memory device formed by the above-described manufacturing process has a contact hole 1035 of a diameter smaller than the minimum dimension that can be formed by photolithography. Therefore, the overlay margin between a contact hole 1035 and a word line 1007 is increased even when a contact hole 1035 is formed between word lines 1007 as shown in FIG. 60. This means that the opening diameter $L_A$ of contact hole 1035 can be set to approximately 0.2 $\mu$m, for example. When the dimension $L_O$ between word lines 1007 is 0.6 $\mu$m, the dimension $L_B$ between contact hole 1035 and word line 1007 becomes 0.2 $\mu$m.

As mentioned in the foregoing, the overlay accuracy of a mask in photolithography is approximately 0.18 $\mu$m in mass production. Therefore, if the dimension $L_B$ between contact hole 1035 and word line 1007 is 0.2 $\mu$m, shorting will not occur between lower electrode layer 1023 and word line 1007 even if there is an offset in the mask overlay. The enlargement of the overlay margin between contact hole 1035 and word line 1007 allows reduction of dimension $L_O$ between word lines 1007. Therefore, increase in integration density of memory cells and the like can be achieved.

Eighth Embodiment

Figure 90:
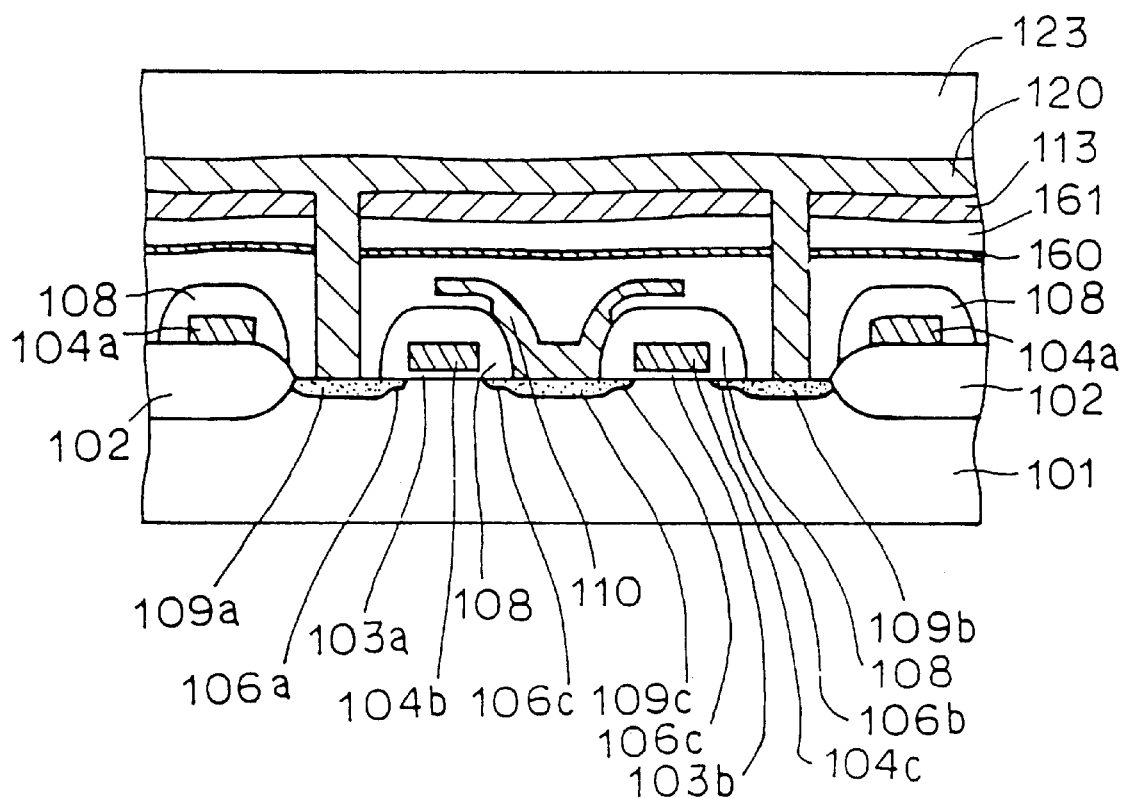
Figure 91:
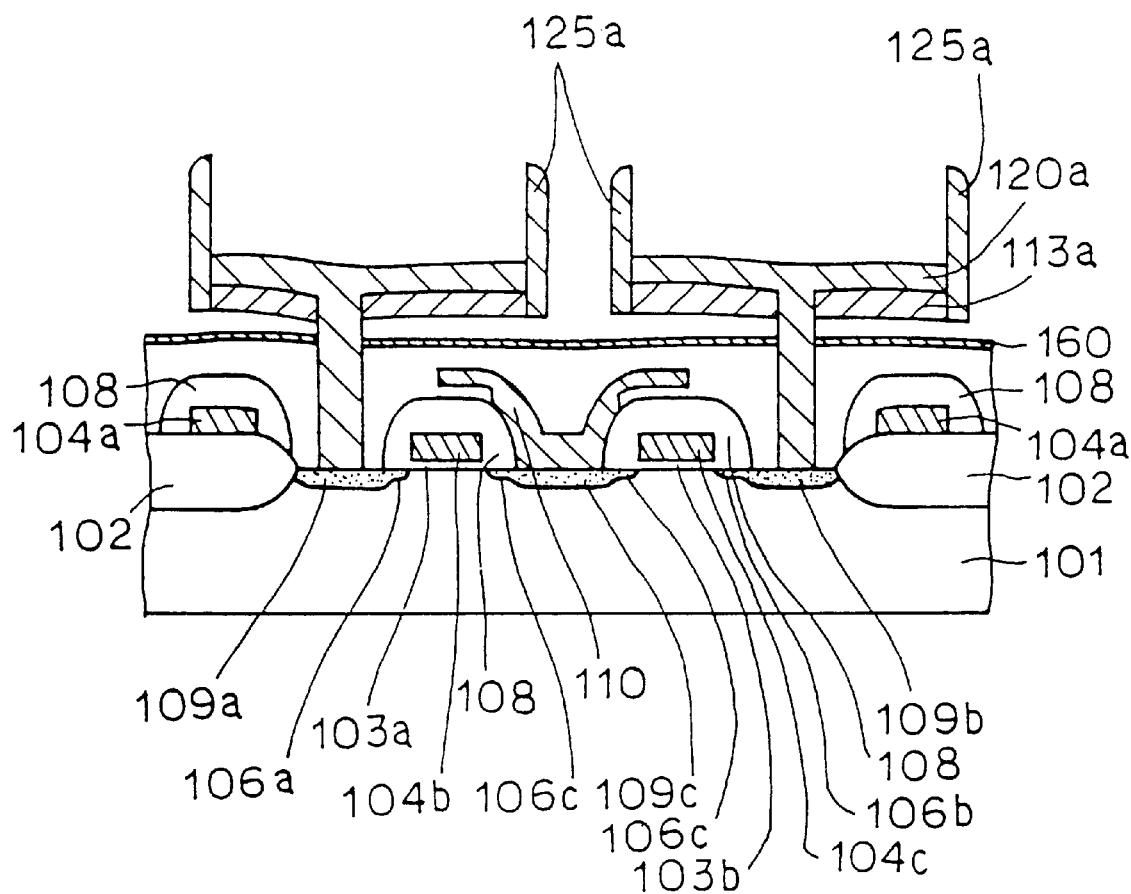
Figure 92:
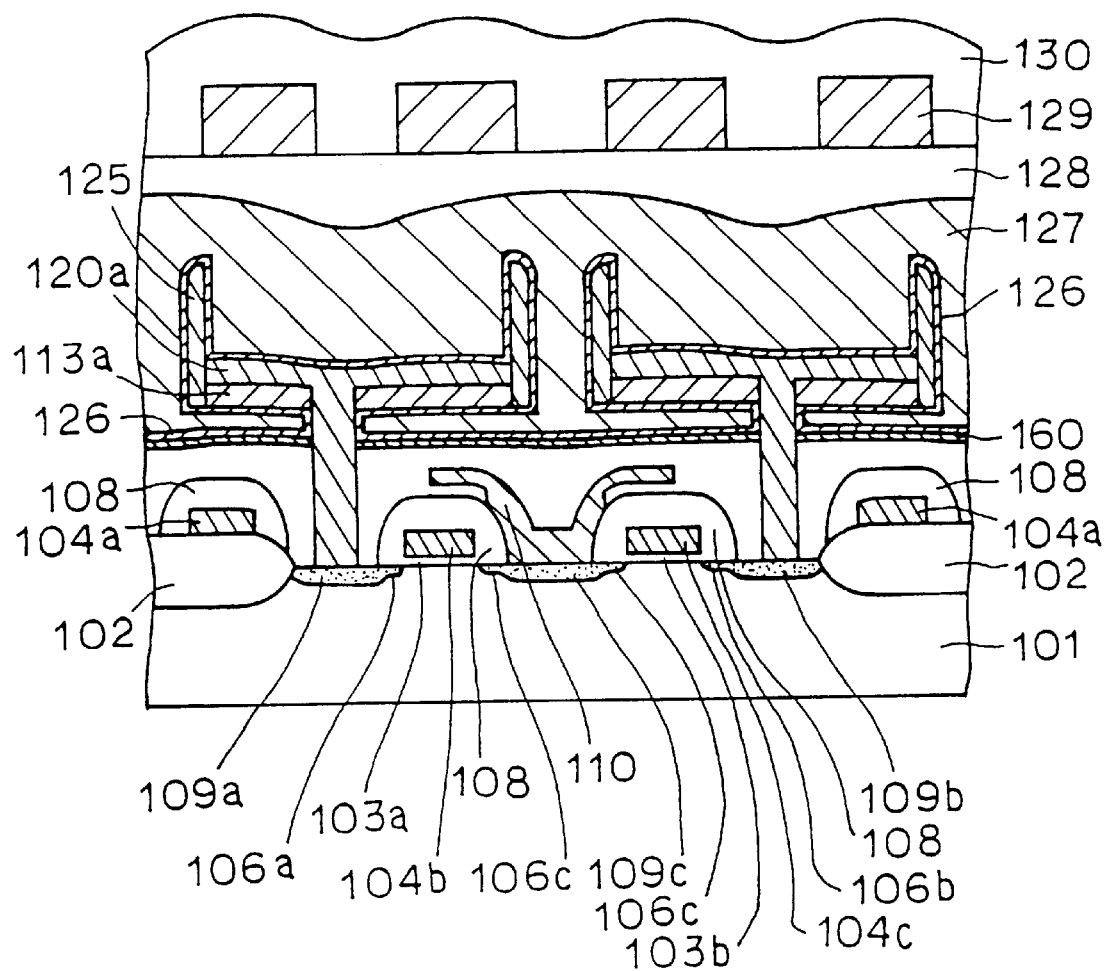

FIGS. 90–92 are sectional views of a semiconductor device for describing an eighth embodiment of the manufacturing method of the present invention. In the eighth embodiment, following the step shown in FIG. 49 of the sixth embodiment, a nitride film 160 is formed on the surface of interlayer insulating film 111a. Then an oxide film 161 of a predetermined thickness is formed thereon. Carrying out the processing steps similar those shown in FIGS. 50–56 and FIG. 71, the structure shown in FIG. 90 is obtained. Next, following a step similar to those shown in FIGS. 72–77, the structure shown in FIG. 91 is obtained. Then, following a process similar to those shown in FIGS. 78–81, the structure shown in FIG. 92 is obtained.

According to the structure shown in FIG. 92 completed by the manufacturing steps of the eighth embodiment, a DRAM is obtained that can use the bottom of a cylindrical cell plate also as a capacitor. Thus, a DRAM can be provided having an increased capacity of the capacitor.

Ninth Embodiment

A semiconductor memory device according to a ninth embodiment of the present invention will be described hereinafter with reference to a sectional view of the structure thereof shown in FIG. 93.

Figure 93:
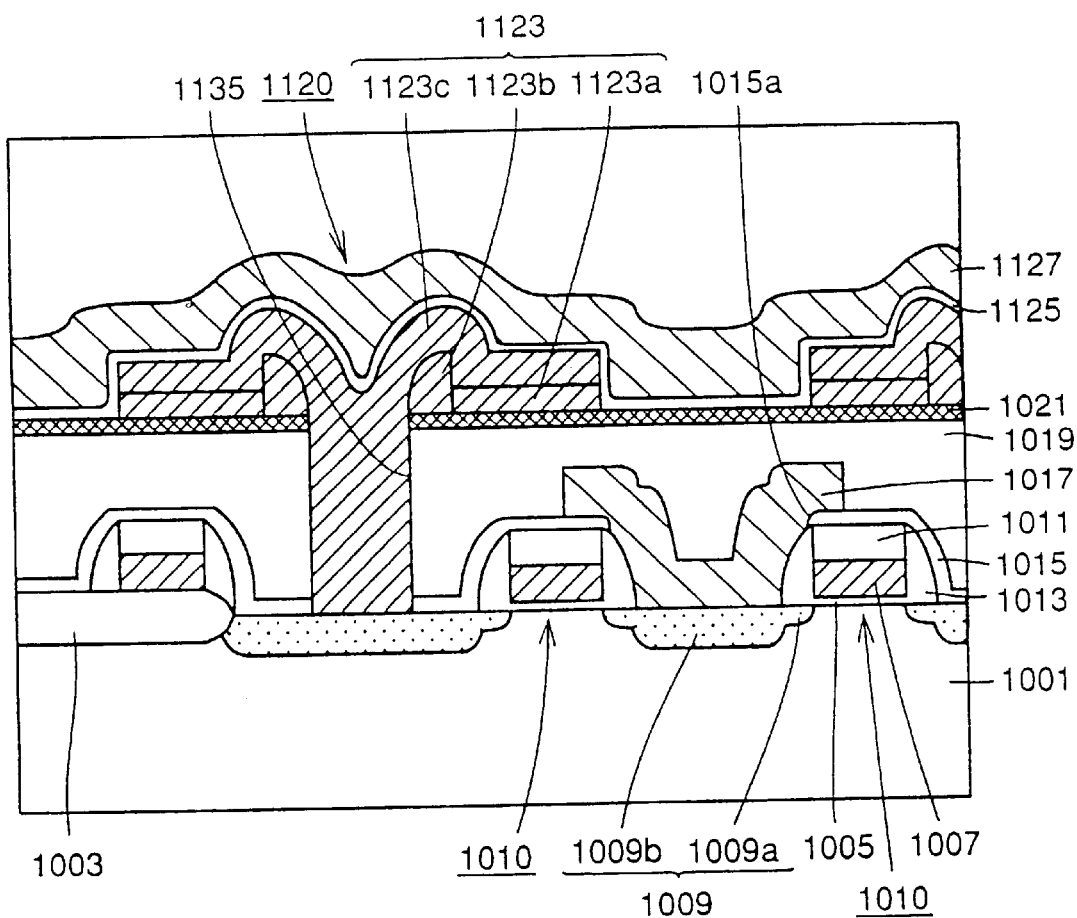
FIG. 93 is a sectional view schematically showing a structure of a semiconductor memory device according to a ninth embodiment of the present invention.

Referring to FIG. 93, the semiconductor memory device according to the ninth embodiment differs from the semiconductor memory device of the fifth embodiment in the structure of its capacitor.

A capacitor 1120 includes a lower electrode layer 1123, a capacitor dielectric film 1125, and an upper electrode layer 1127. Lower electrode layer 1123 includes a first portion 1123a, a second portion 1123b, and a third portion 1123c. The second portion 1123b is formed to surround the opening of contact hole 1135, and to have a surface flush with the inner sidewall of contact hole 1135. The second portion 1123b has a sidewall spacer-like configuration. The first portion 1123a is formed on the surface of silicon nitride film 1021 in contact with the lower end of the perimeter of the second portion 1123b and extending outwards of the perimeter. The third portion 1123c contacts source/drain diffusion region 1009 via contact hole 1135, and is formed on the surface of the first and second portions 1123a, 1123b. Lower electrode layer 1123 of the above-described structure includes a portion projecting upwards perpendicular to the surface of silicon substrate 1001 in the inside region of lower electrode layer 1123. A capacitor dielectric film 1125 is formed to cover the surface of lower electrode layer 1123. An upper electrode layer 1127 is formed to cover the surface of lower electrode layer 1123 with a capacitor dielectric film 1125 therebetween.

The components other than capacitor 1120 are substantially similar to those of the semiconductor memory device of the fifth embodiment, and their description will not be repeated.

A method of manufacturing the semiconductor memory device according to the ninth embodiment of the present invention will be described hereinafter with reference to FIGS. 94–100.

Figure 94:
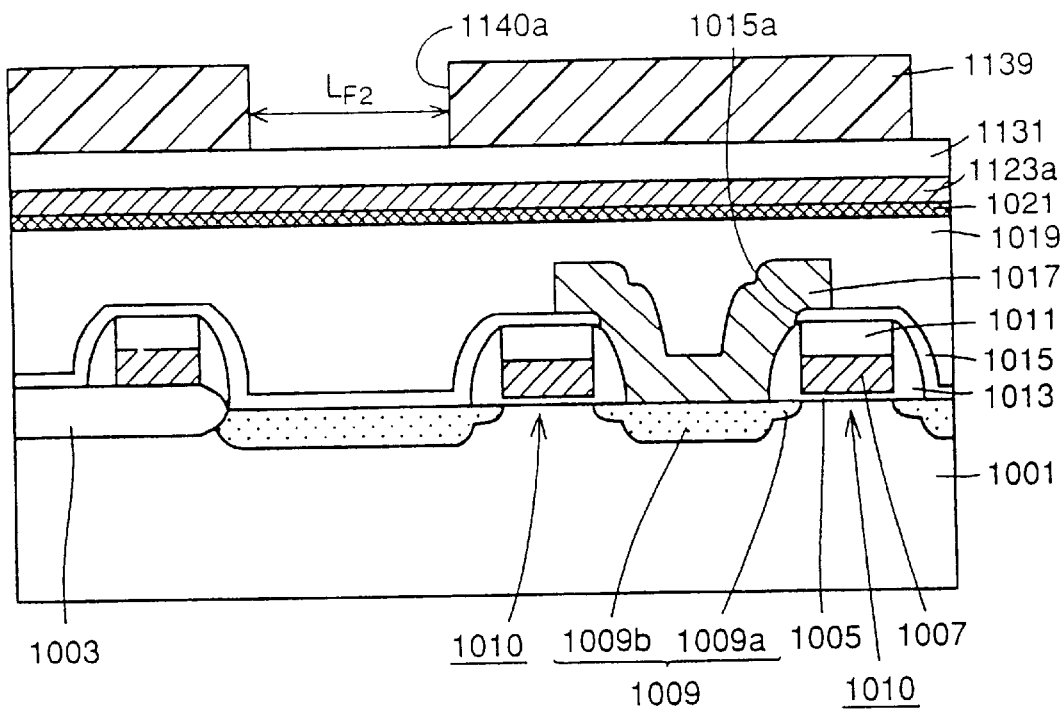
FIGS. 94–100 are sectional views of a semiconductor memory device according to the ninth embodiment of the present invention for describing the manufacturing steps thereof in order.
Figure 180:
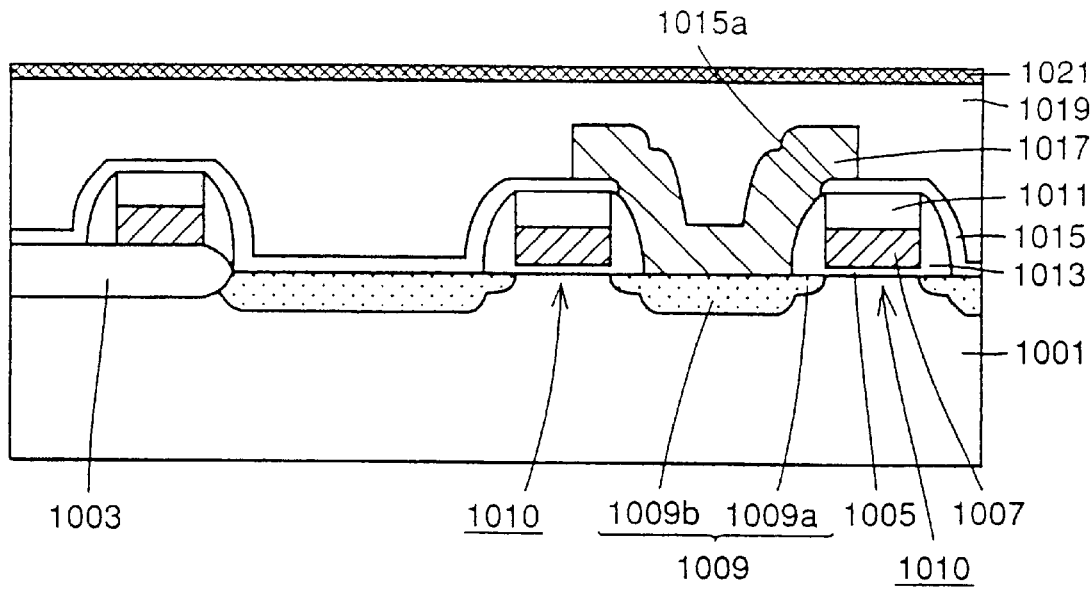
Figure 181:
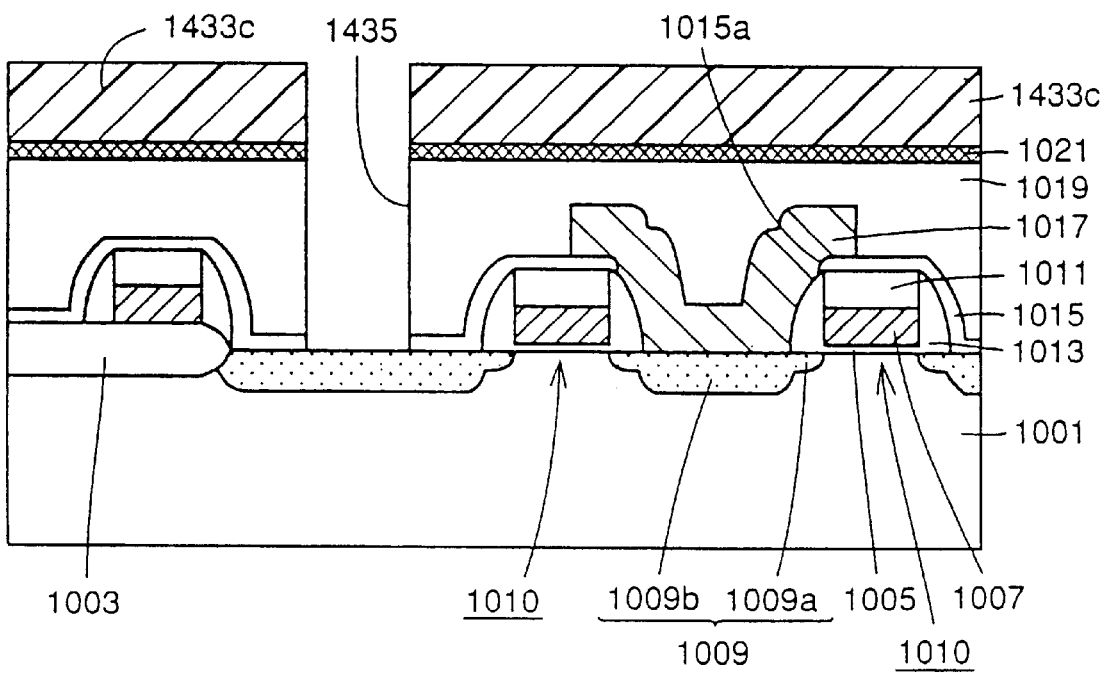
Figure 182:
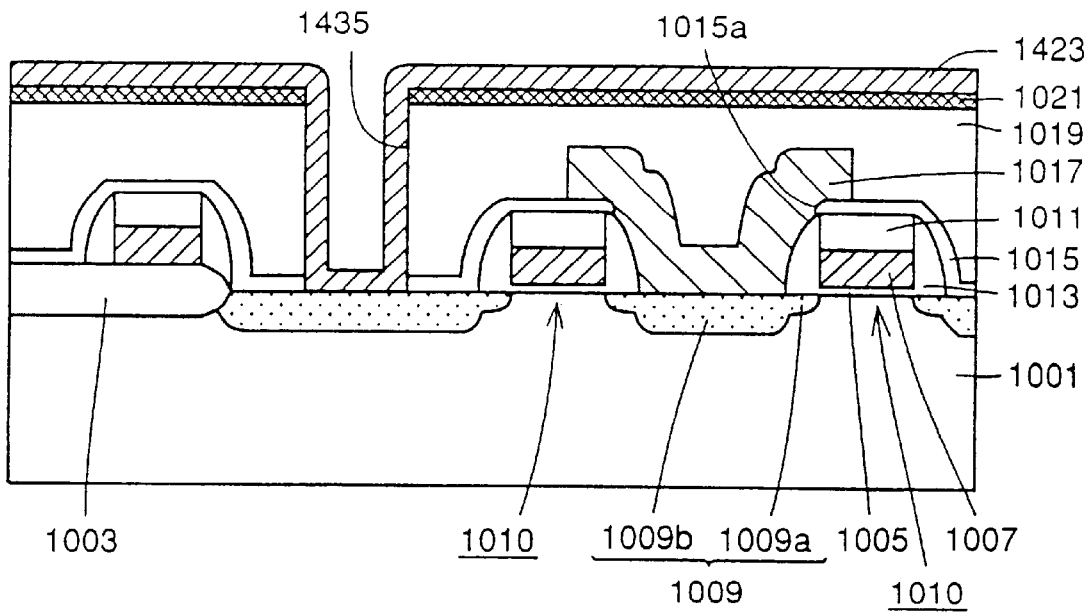
Figure 183:
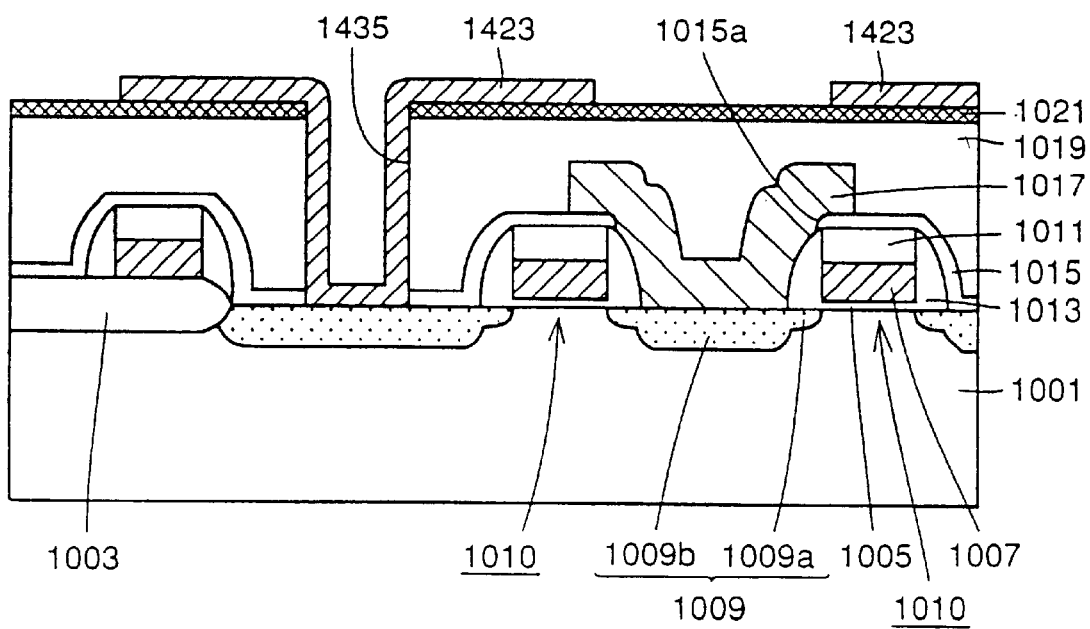
Figure 184:
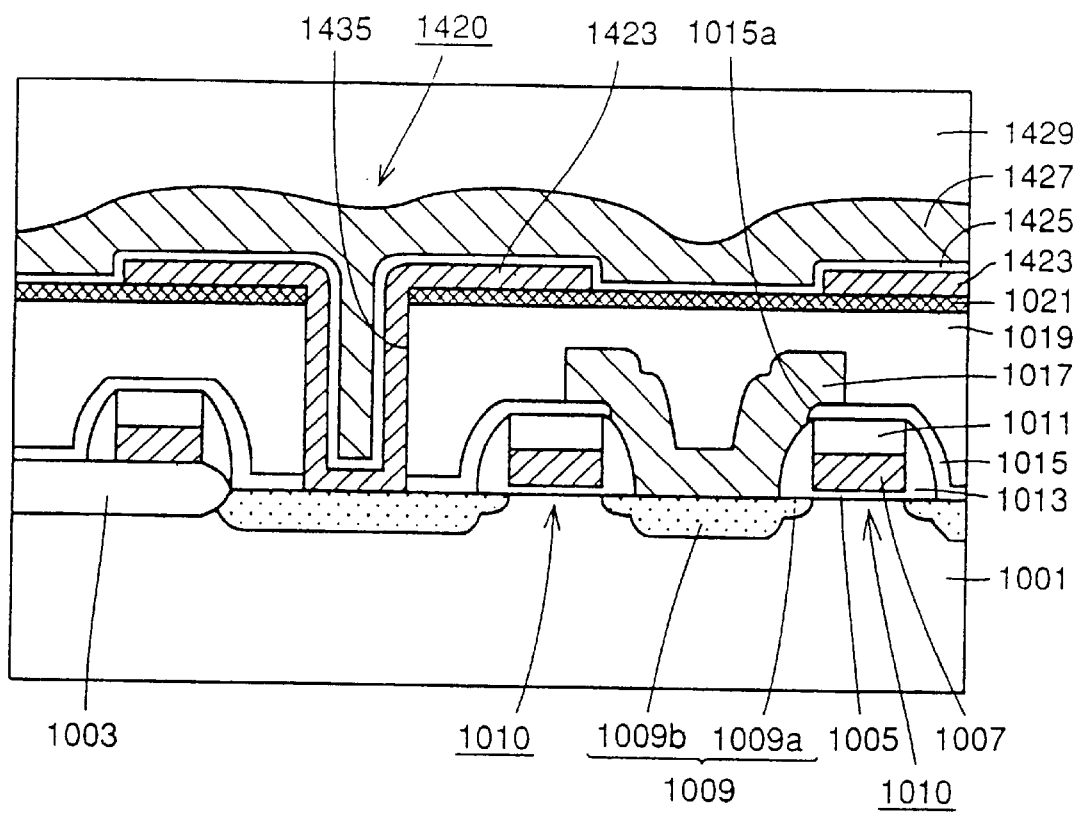
Figure 185:
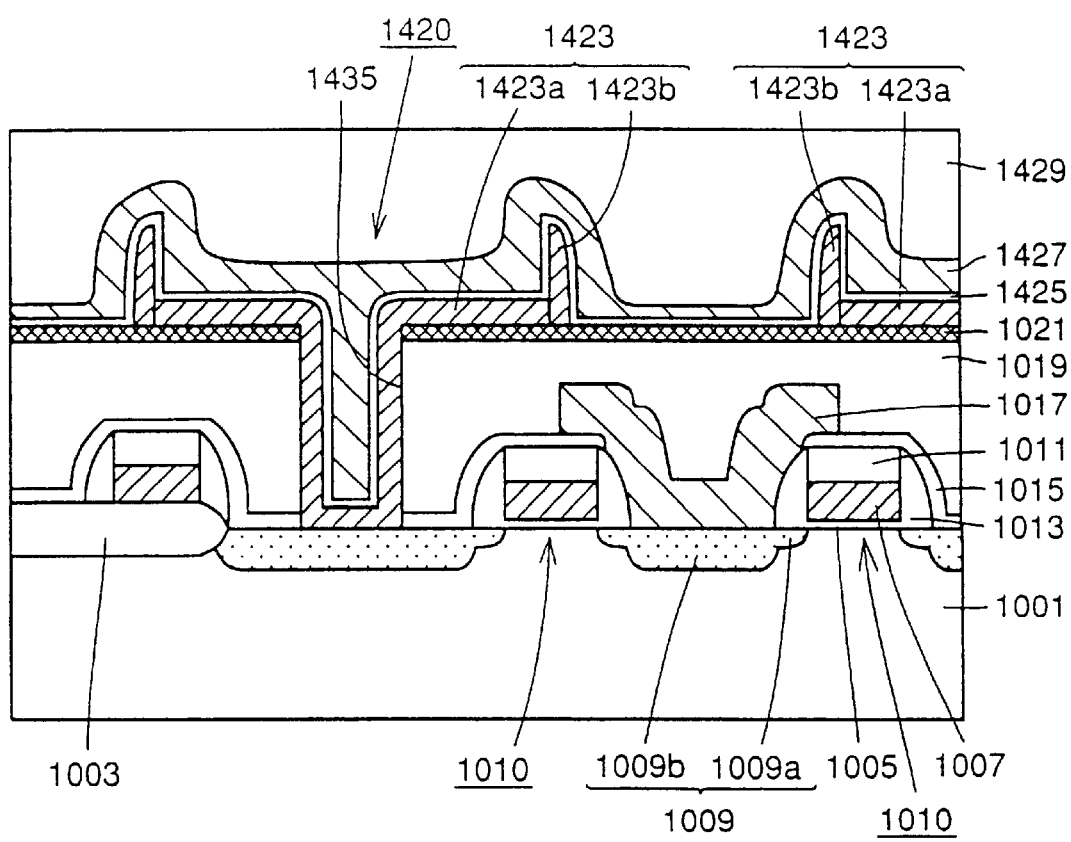
FIG. 185 is a sectional view schematically showing the structure of a second conventional semiconductor memory device.
Figure 186:
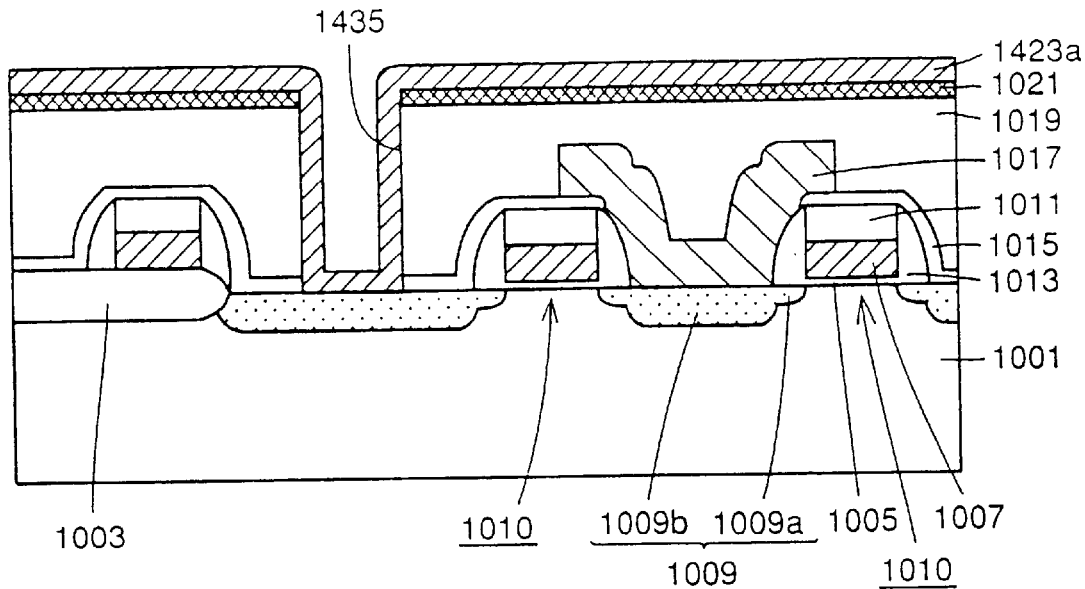
FIGS. 186–191 are sectional views of the second conventional semiconductor memory device for describing the manufacturing steps thereof in order.
Figure 187:
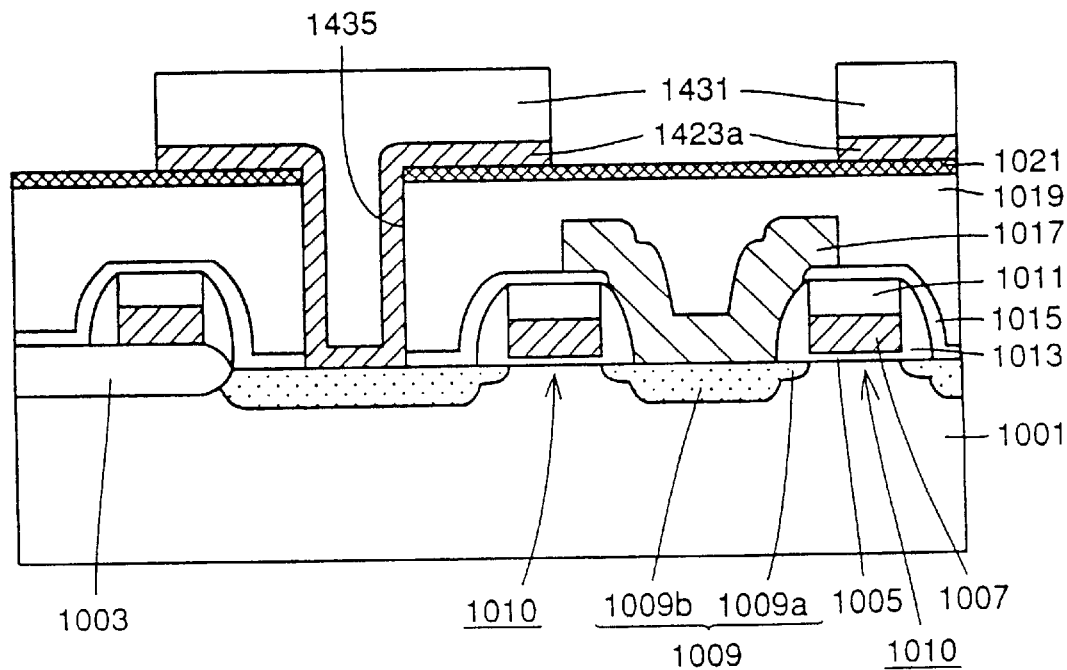
Figure 188:
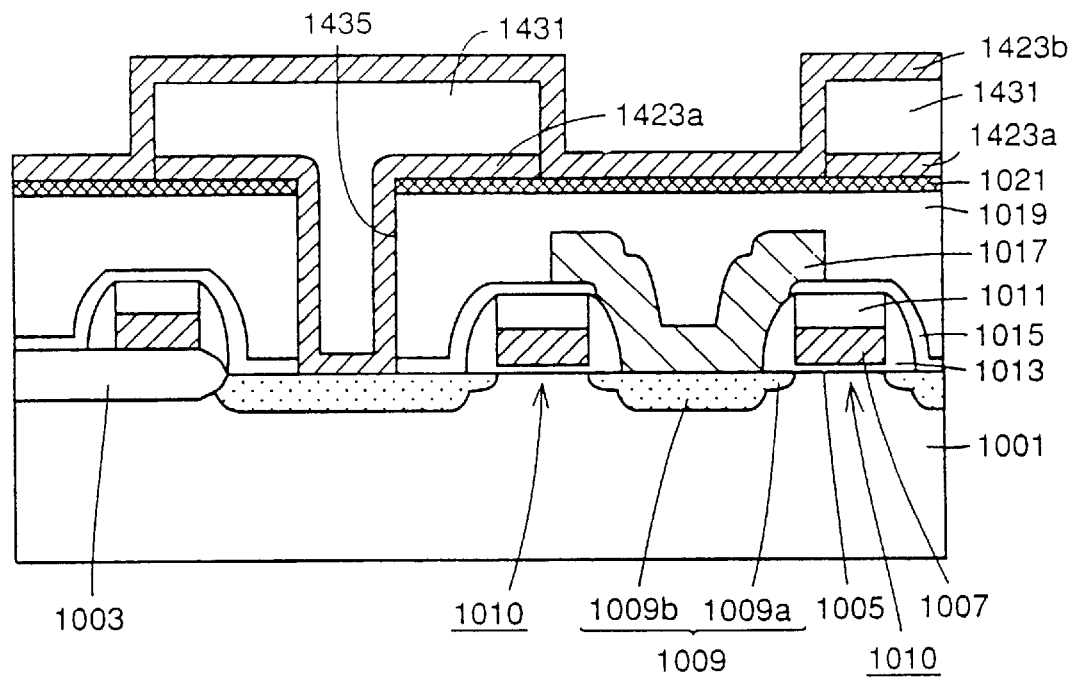
Figure 189:
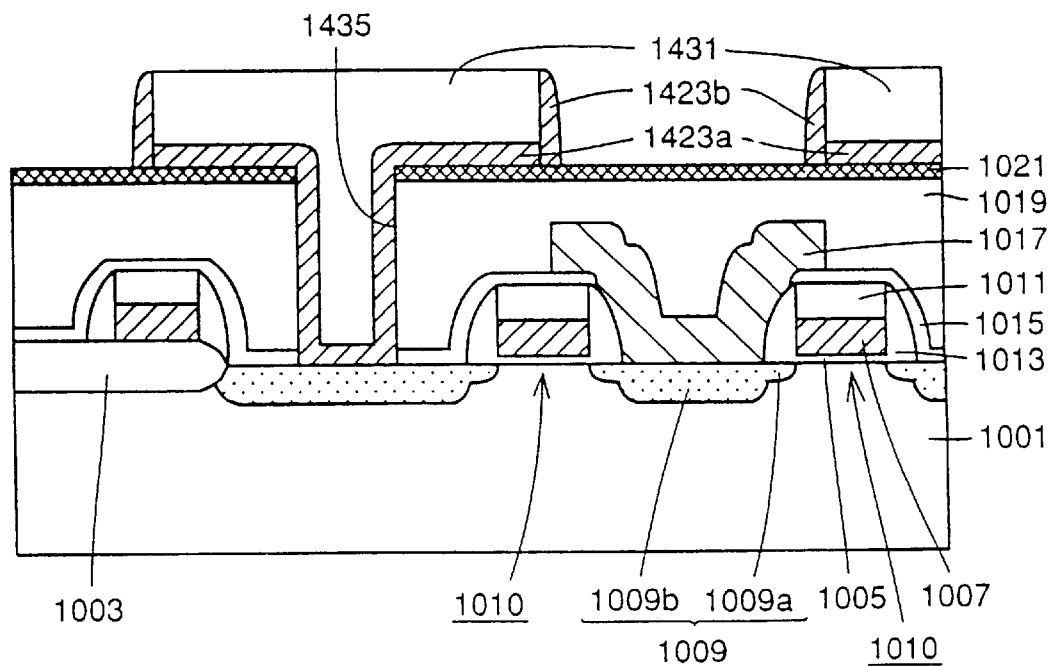
Figure 190:
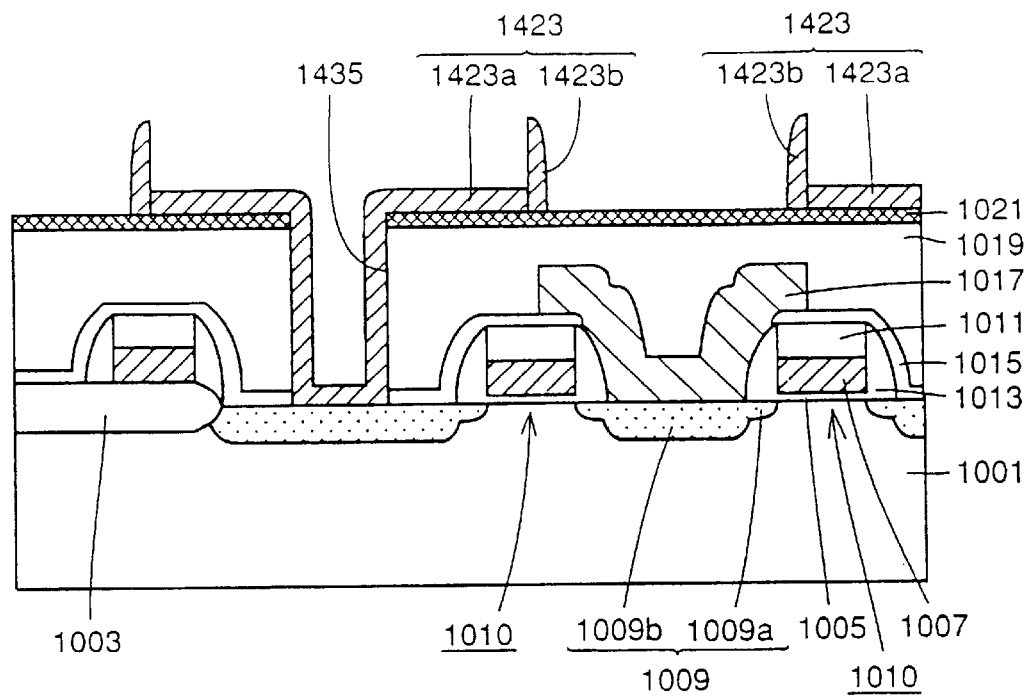
Figure 191:
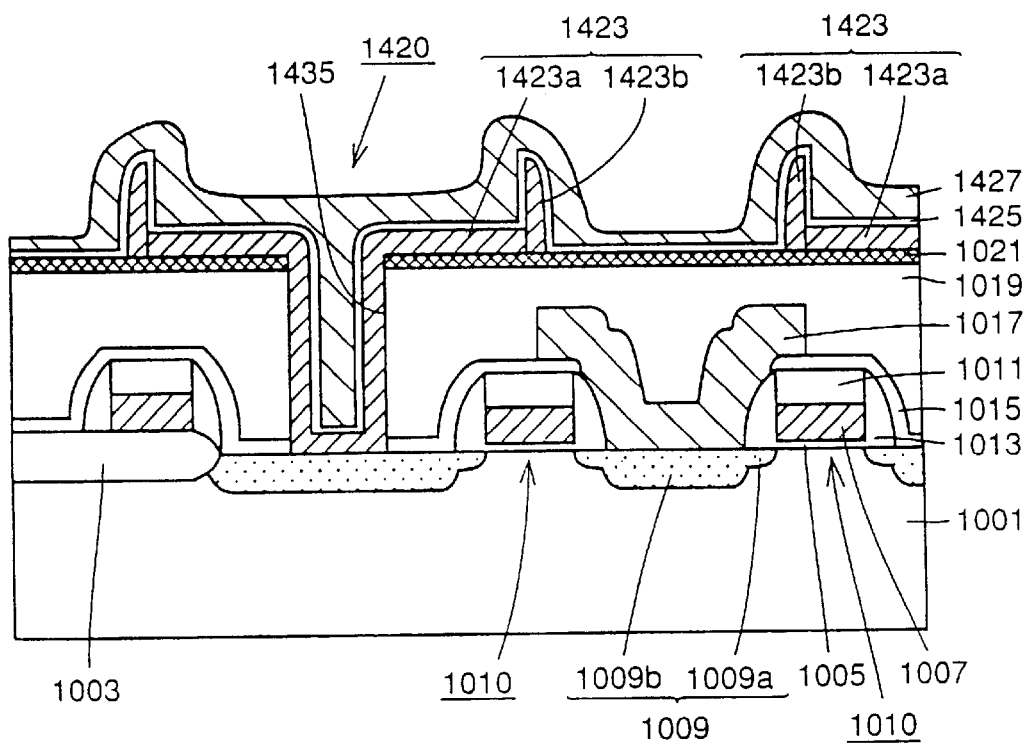
Figure 192:
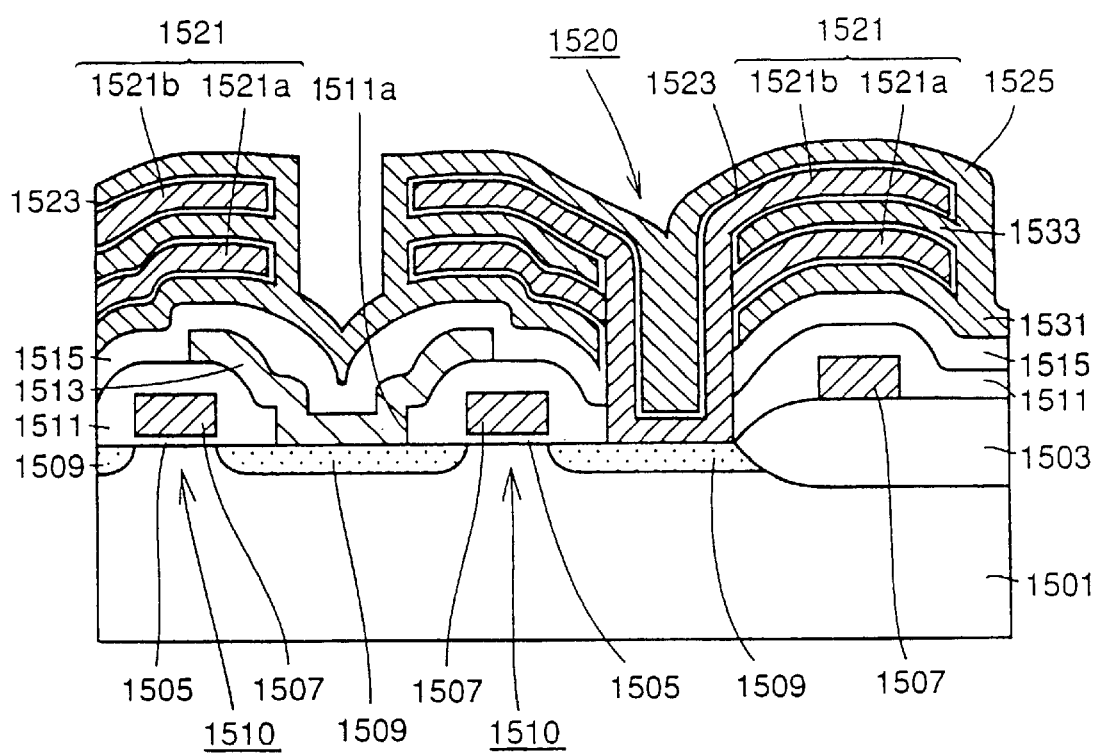
FIG. 192 is a sectional view schematically showing a structure of a third conventional semiconductor memory device.
Figure 193:
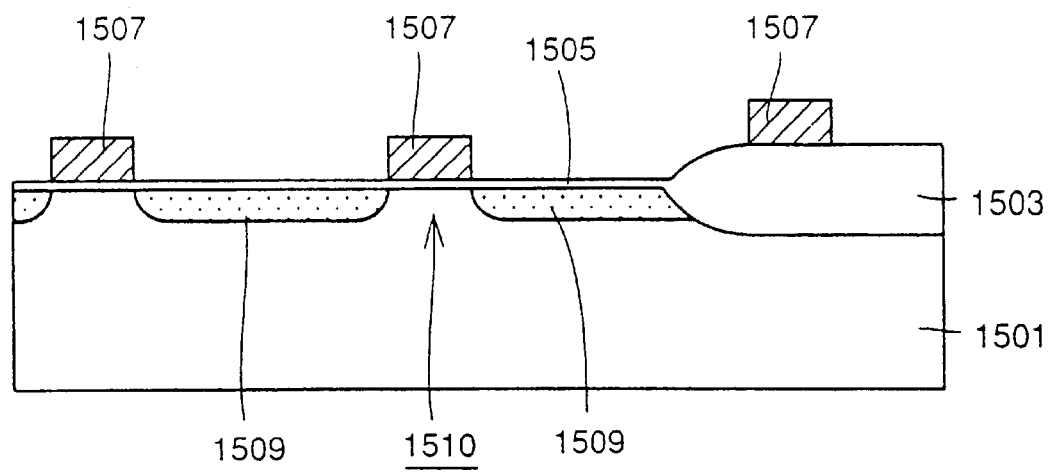
FIGS. 193–198 are sectional views of the third conventional semiconductor memory device for describing the manufacturing steps thereof in order.
Figure 194:
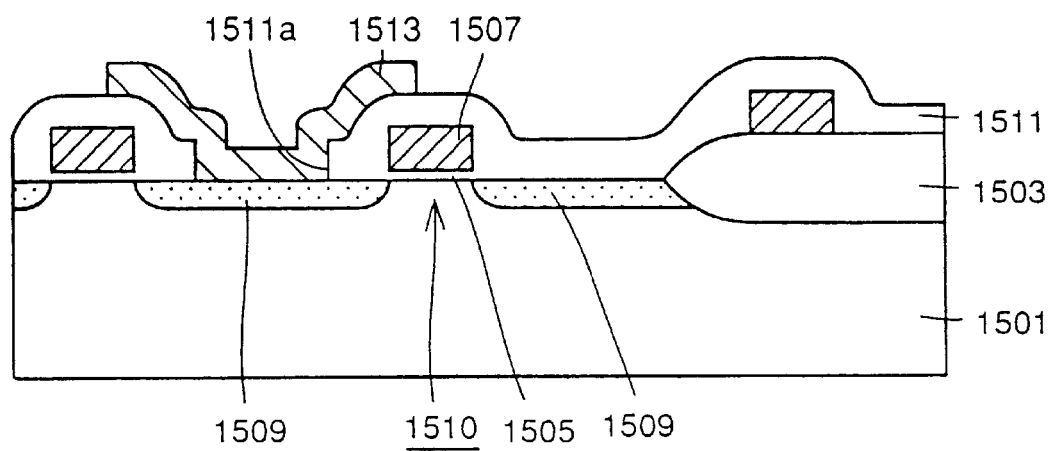
Figure 195:
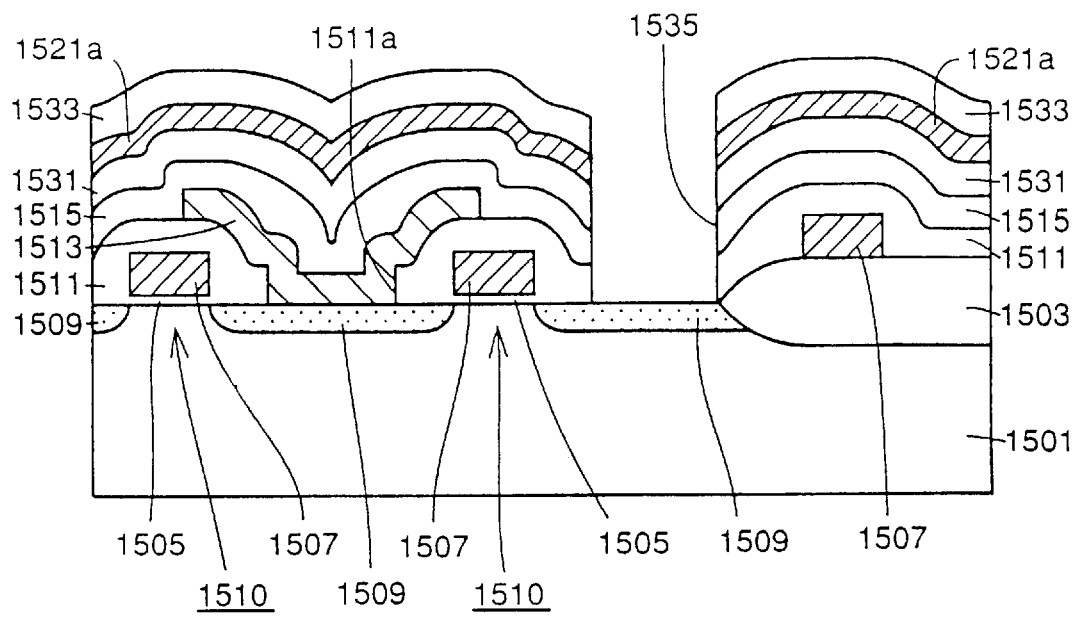
Figure 196:
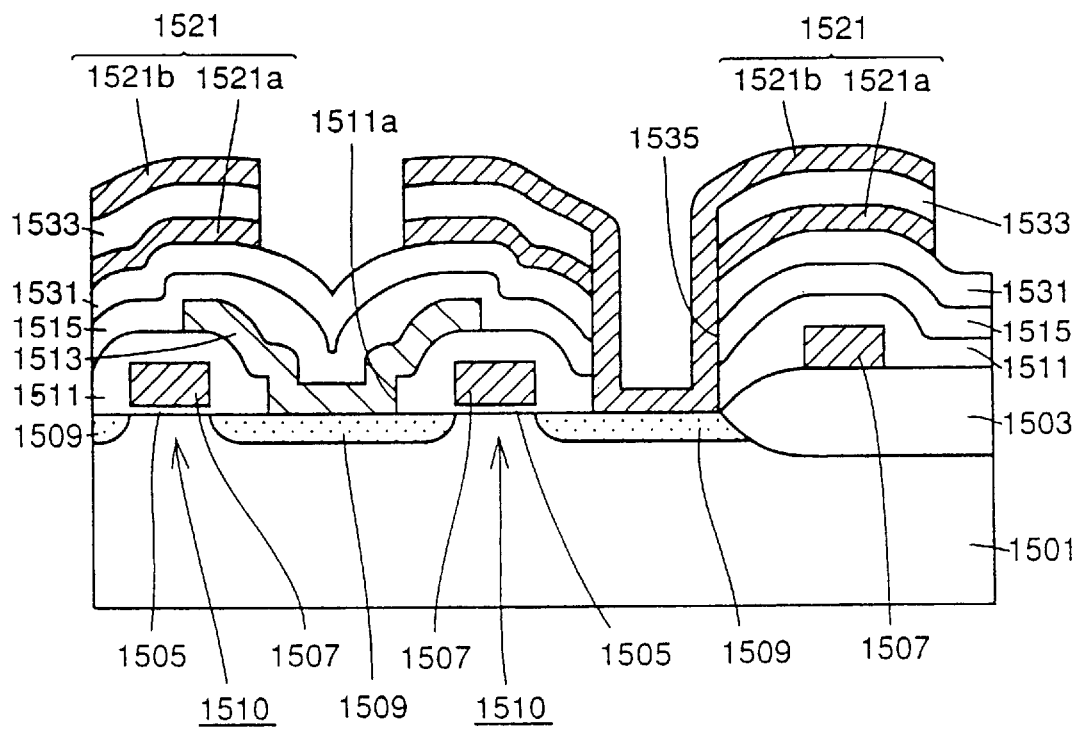
Figure 197:
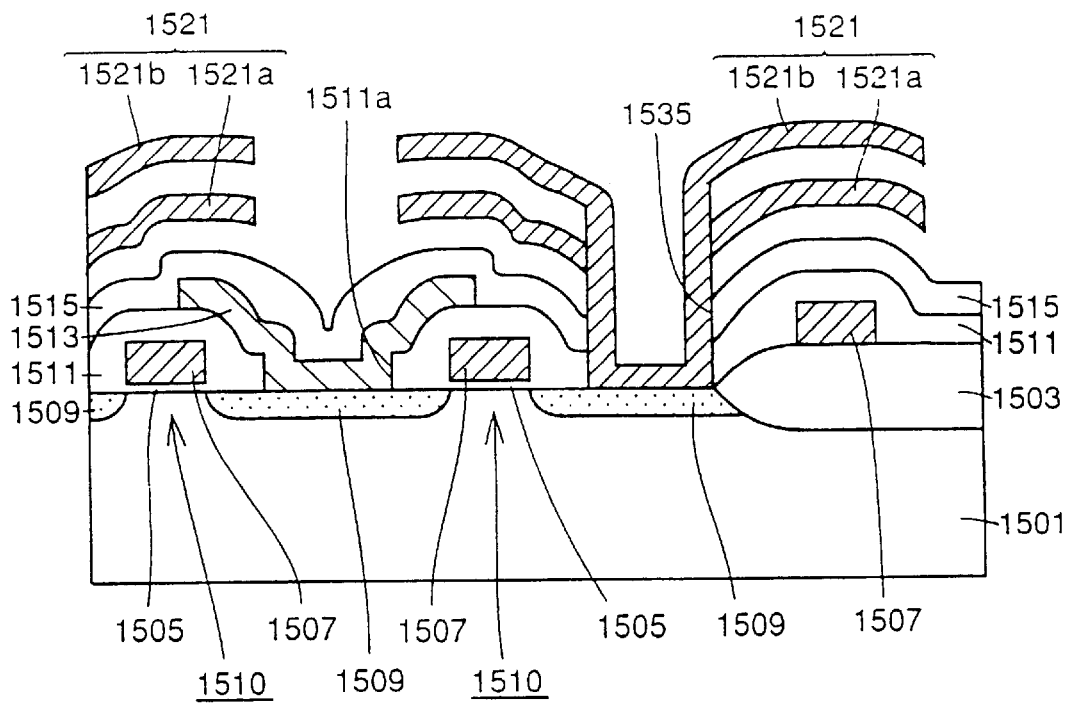
Figure 198:
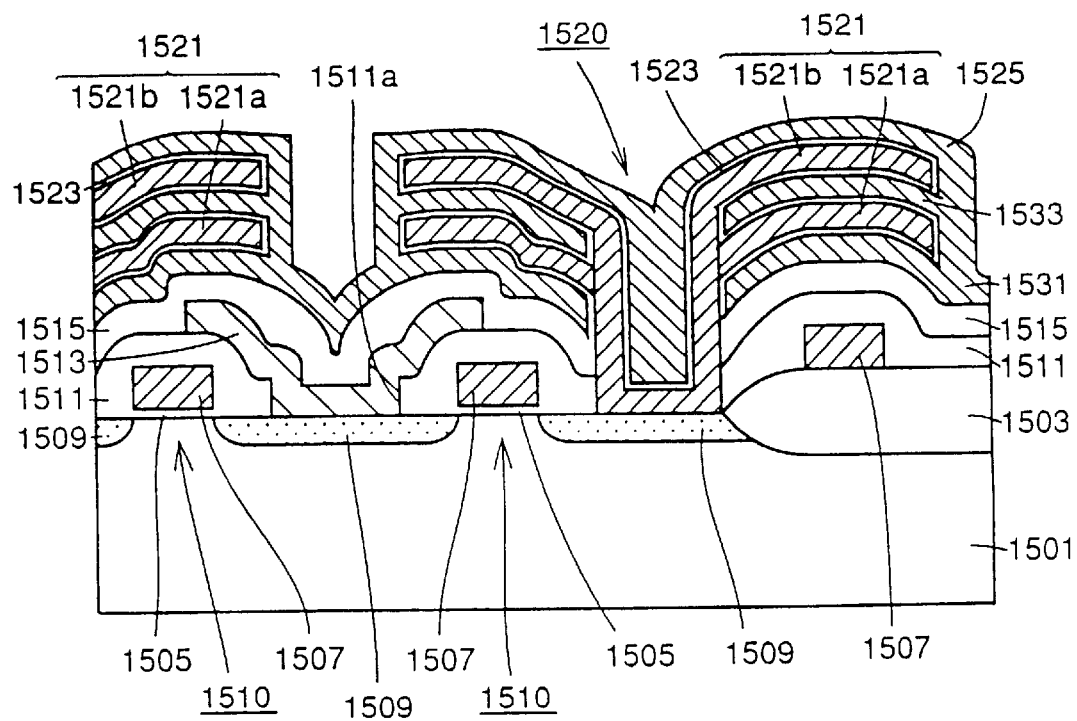
Figure 199:
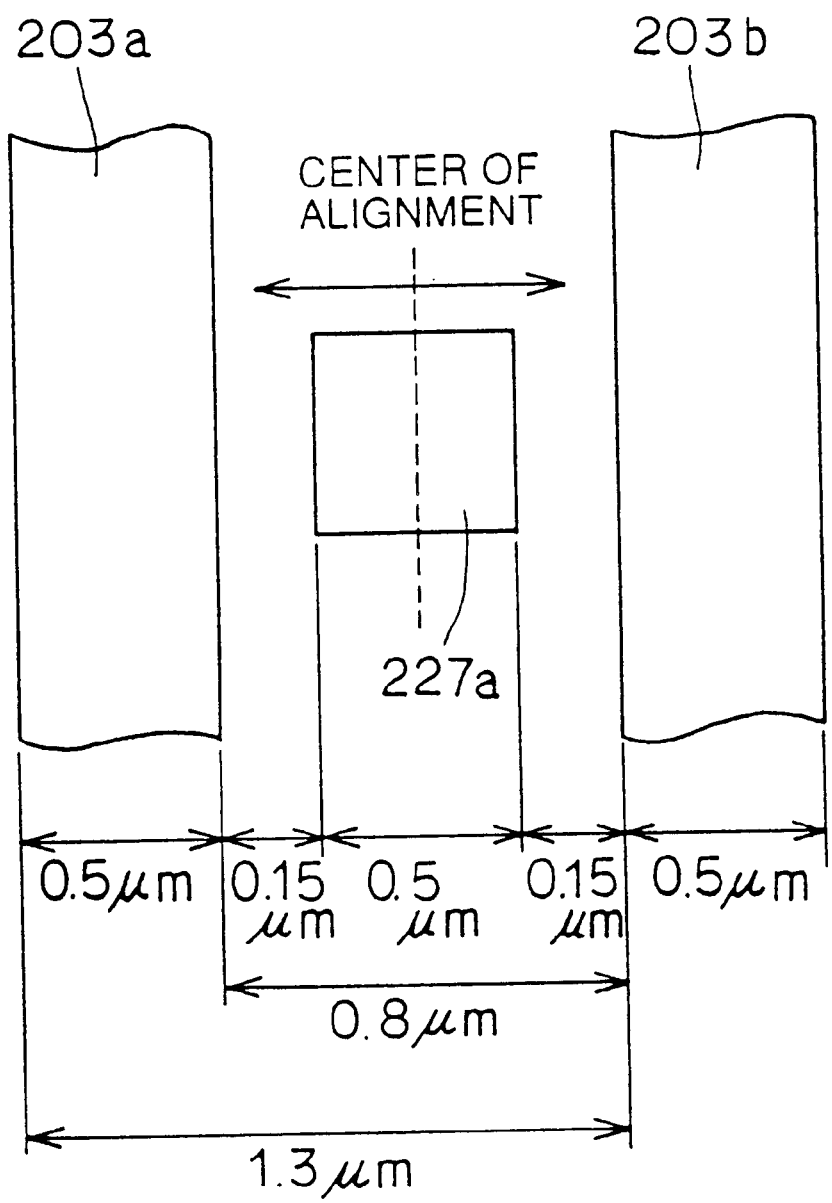
FIG. 199 is a plan view showing the relationship between the word line and the opening in the resist of the structure shown in FIG. 169.
Figure 200:
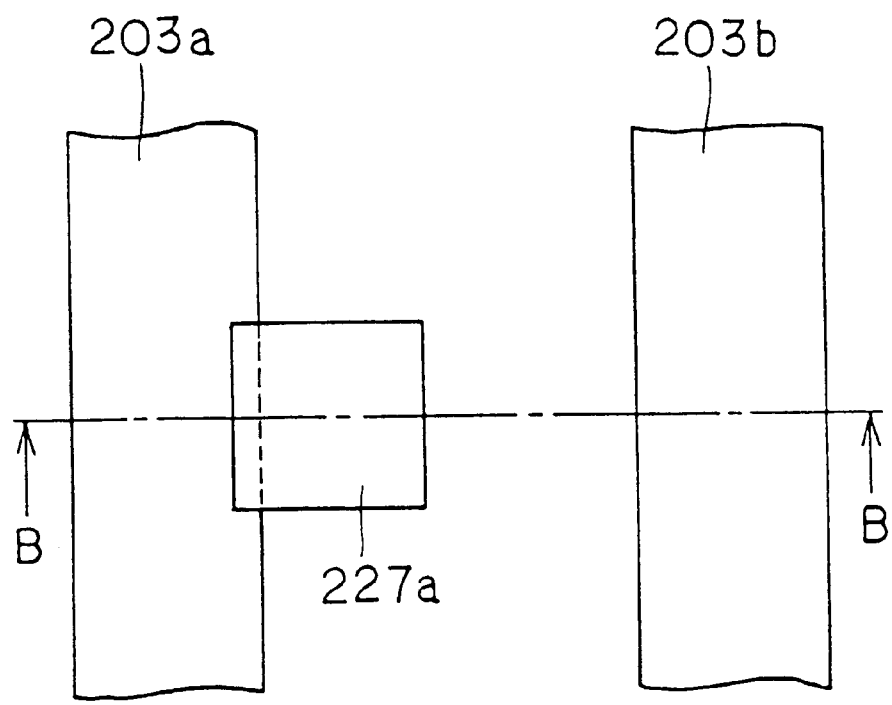
FIG. 200 is a plan view showing the state where the word line and the opening of the resist are partially overlapped.
Figure 201:
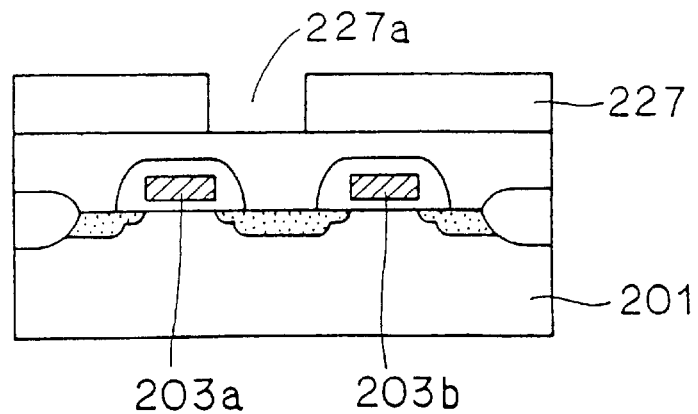
FIGS. 201–203 are sectional views of a semiconductor device of the state shown in FIG. 200 for describing the manufacturing steps thereof in order.
Figure 202:
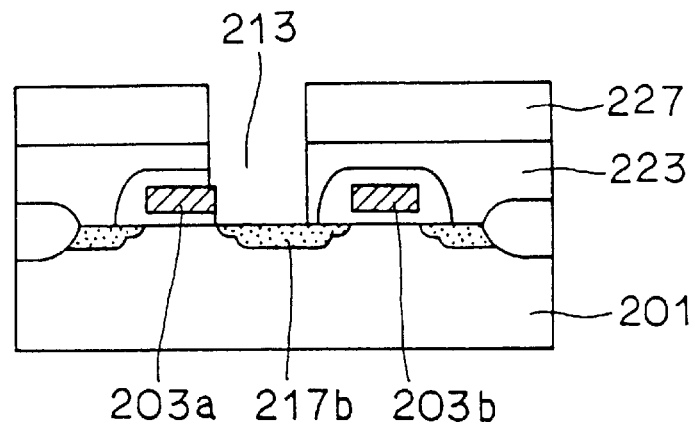
Figure 203:
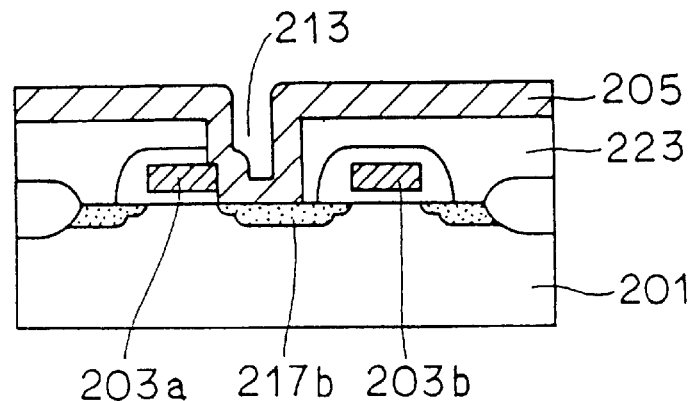
Figure 204:
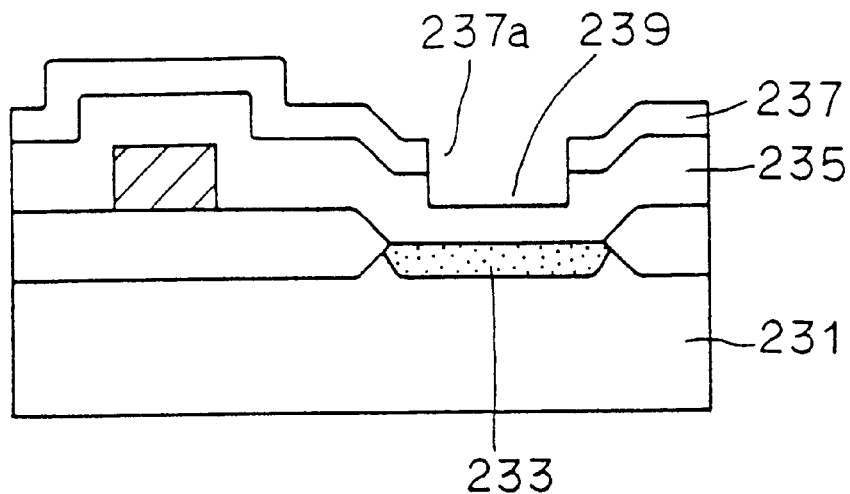
FIGS. 204–207 are structural diagrams of a semiconductor device disclosed in the Japanese Patent Laid-Open Application for describing the manufacturing steps thereof in order.
Figure 205:
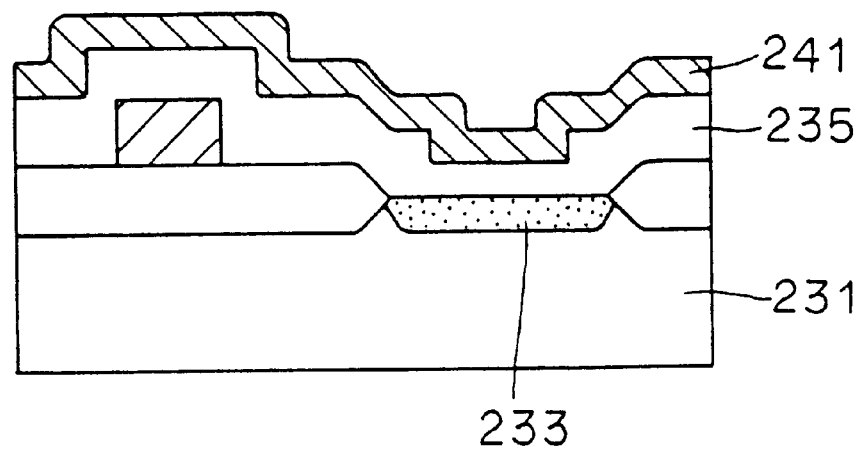
Figure 206:
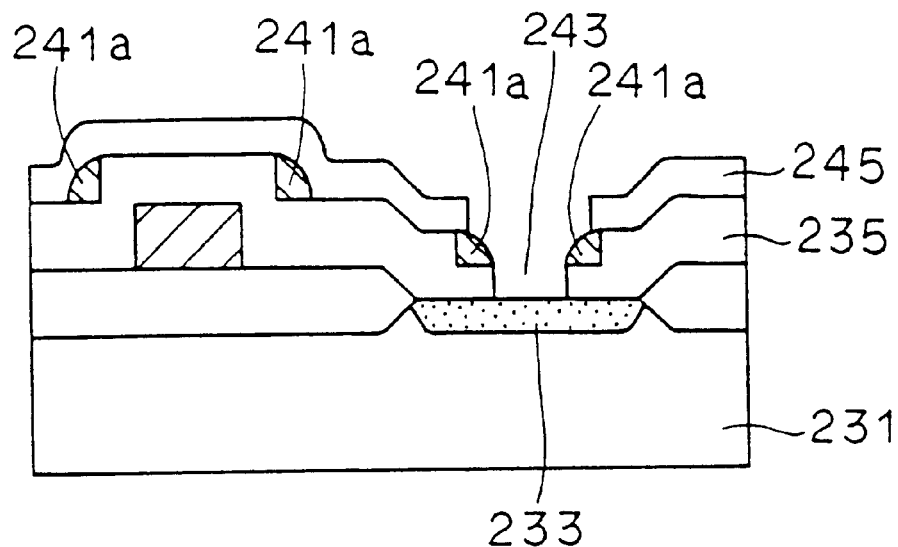
Figure 207:
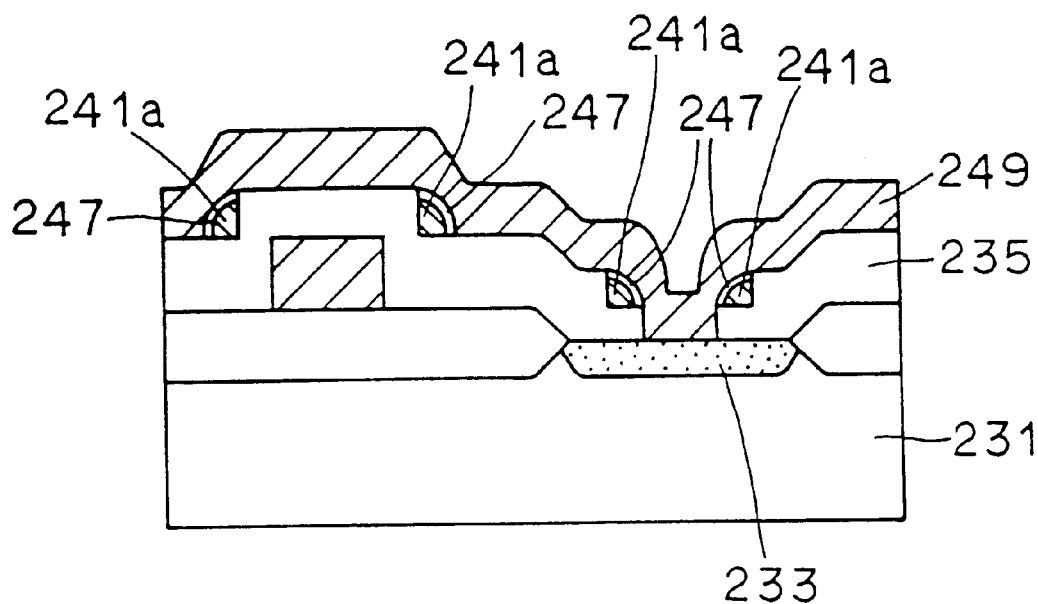

The process preceding the step shown in FIG. 94 is similar to the manufacturing steps of the conventional first embodiment shown with reference to FIG. 180, and their description will not be repeated. Referring to FIG. 94, a first polycrystalline silicon film 1123a, and then an insulating film 1131 of silicon oxide are sequentially formed on the surface of silicon nitride film 1021. A photoresist is applied all over the surface of insulating film 1131 to be patterned to a predetermined configuration by an exposure process and the like. This results in a resist pattern 1139. Resist pattern 1139 has a hole pattern 1140a of an opening diameter of $L_{F2}$. Using resist pattern 1139 as a mask, insulating film 1131 and first polycrystalline silicon film 1123a are subsequently subjected to anisotropic etching.

Figure 95:
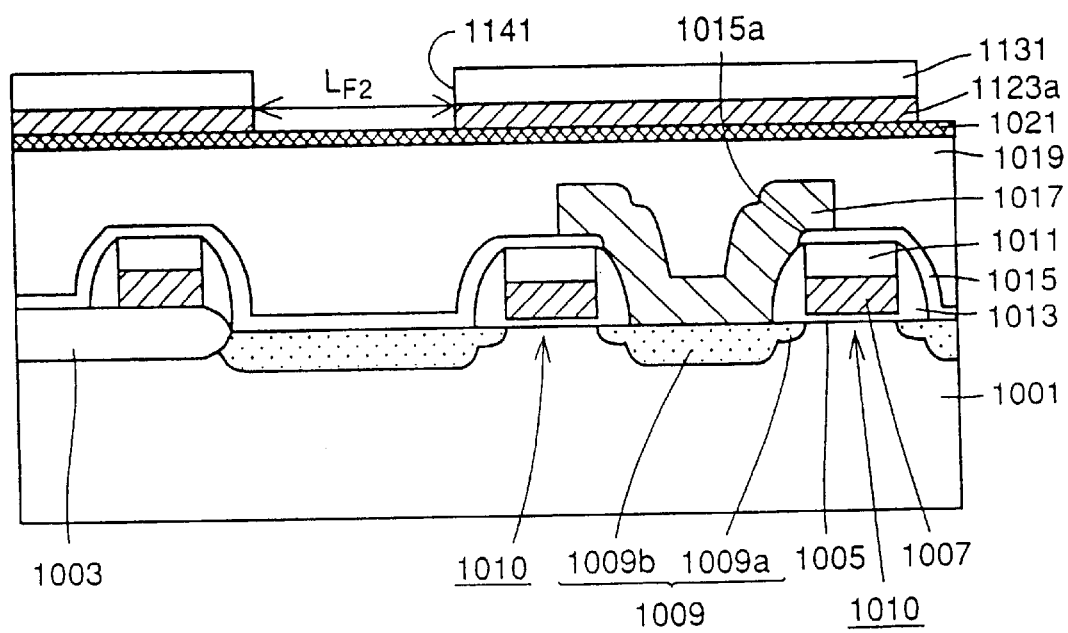

Referring to FIG. 95, an opening 1141 having an opening diameter of $L_{F2}$ is formed in insulating film 1131 and first polycrystalline silicon film 1123a by this anisotropic etching process. Then, resist pattern 1139 is removed.

Figure 96:
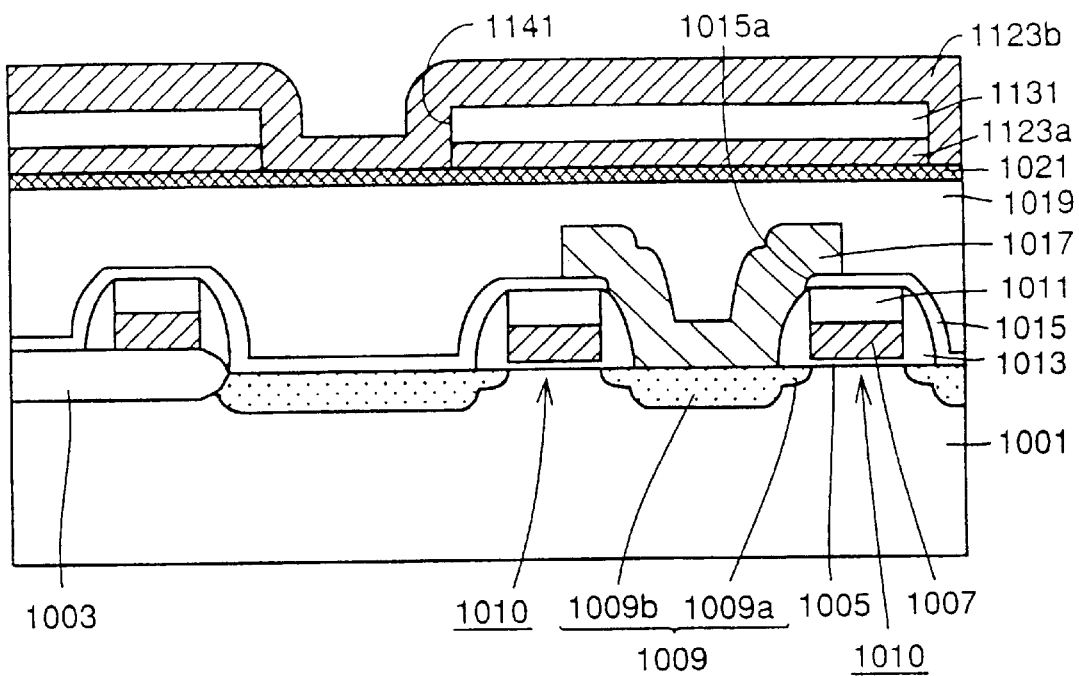

Referring to FIG. 96, a second polycrystalline silicon film 1123b having impurities introduced is formed on the inner sidewall of opening 1141 and all over the surface of insulating film 1131. Second polycrystalline silicon film 1123b is subjected to anisotropic etching.

Figure 97:
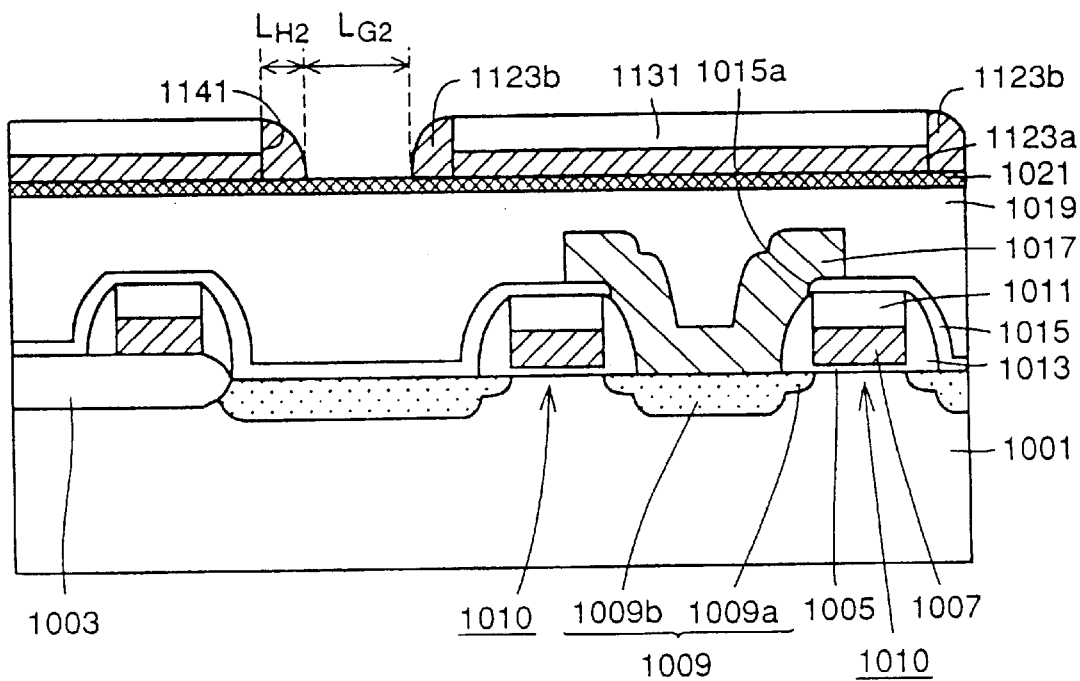

Referring to FIG. 97, a sidewall spacer-like frame portion 1123b is formed to cover the sidewall of opening 1141 by this etching process. The opening diameter $L_{G2}$ of frame portion 1123b is (opening diameter $L_{F2}$ of opening 1141)–2×(width $L_{H2}$ of frame portion 1123b). By applying an etching process using frame portion 1123b as a mask, silicon nitride film 1021, interlayer insulating film 1019, and then silicon oxide film 1015 are etched away sequentially.

Figure 98:
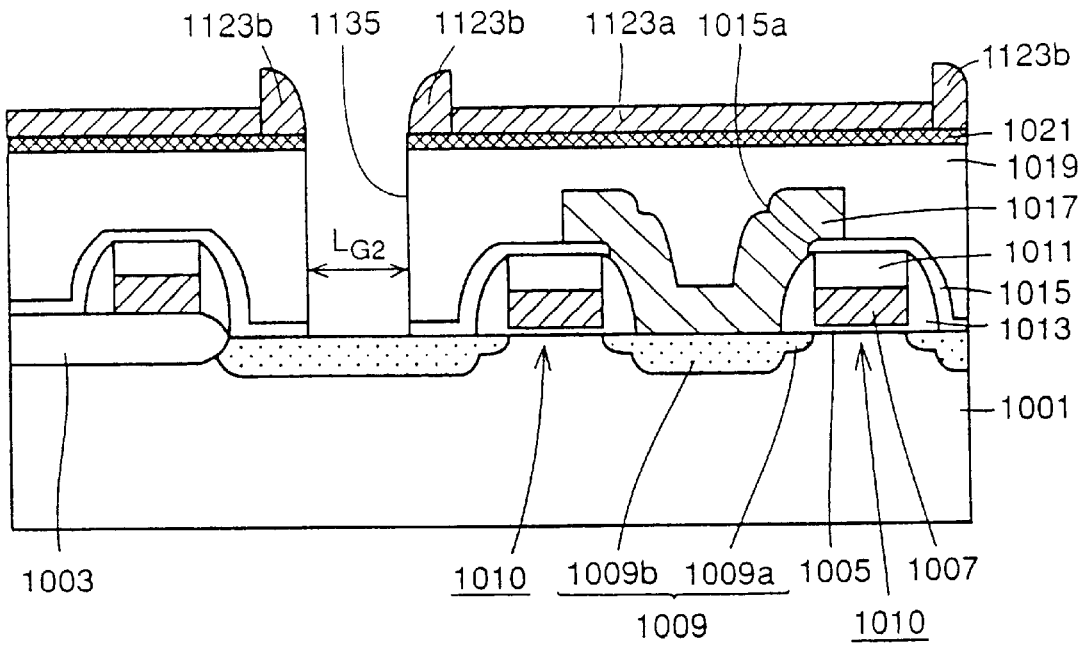

Referring to FIG. 98, a contact hole 1135 is formed penetrating the three layers of silicon nitride film 1021, interlayer insulating film 1019, and silicon oxide film 1015 reaching to the surface of silicon substrate 1001 by this etching process. When the interlayer insulating film 1019 and silicon oxide film 1015 are etched, silicon oxide film 1131 on first polycrystalline silicon film 1123a is also etched away. The opening diameter of contact hole 1135 is substantially equal to the opening diameter $L_{G2}$ of frame portion 1123b.

Figure 99:
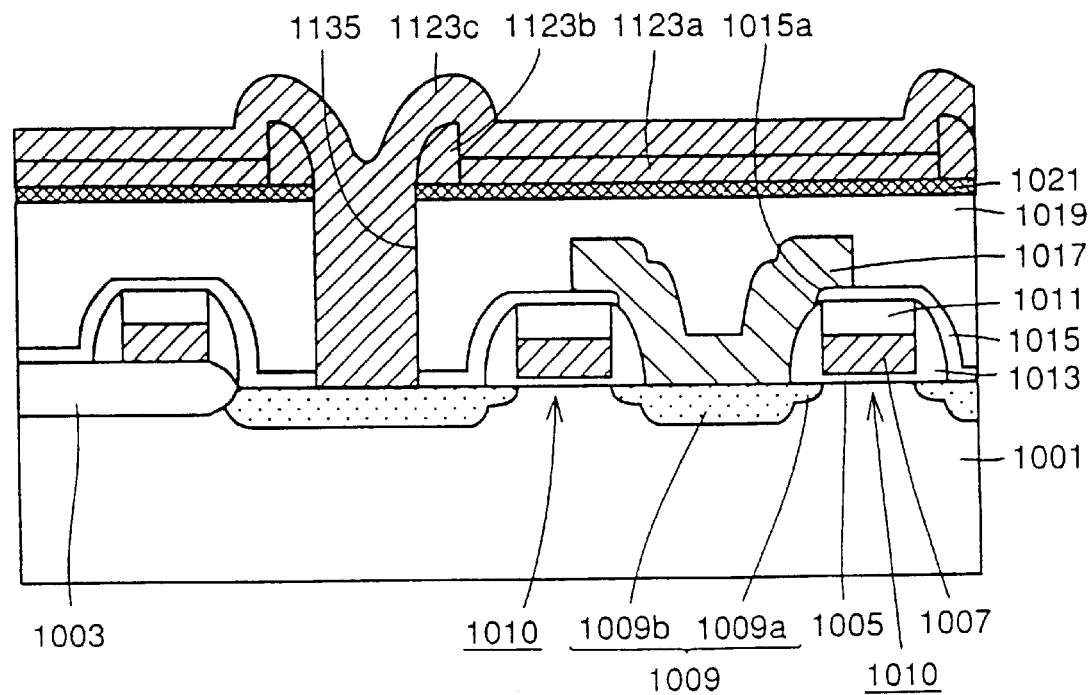

Referring to FIG. 99, a third polycrystalline silicon film 1123c having impurities introduced is formed on the surface of the first and second polycrystalline silicon films 1123a and 1123b so as to contact source/drain diffusion regions 1009 via contact hole 1135. Then, first and third polycrystalline silicon films 1123a and 1123c are patterned to a desired configuration by photolithography, RIE, or the like.

Figure 100:
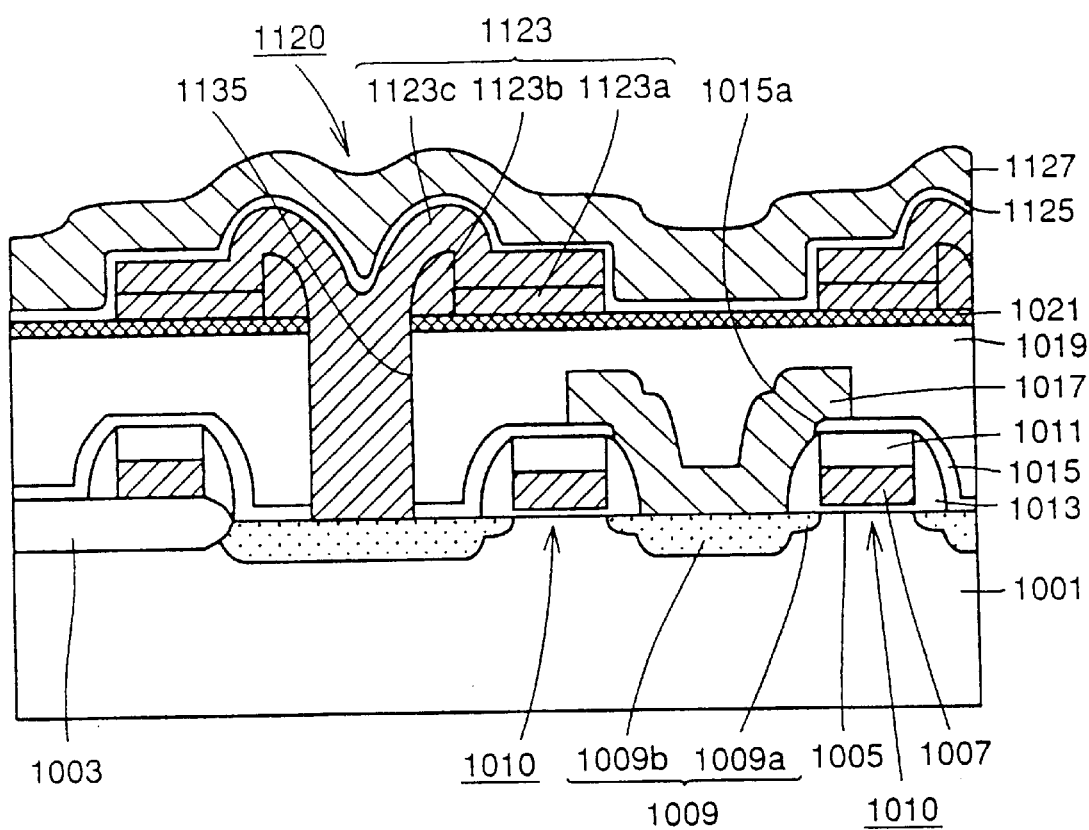

Referring to FIG. 100, a lower electrode layer 1123 of first, second and third polycrystalline silicon films 1123a, 1123b, and 1123c is formed. A capacitor dielectric film 1125 is formed to cover the surface of lower electrode layer 1123. Upper electrode layer 1127 is formed to cover lower electrode layer 1123 with capacitor dielectric film 1125 therebetween. Lower electrode layer 1123, capacitor dielectric film 1125, and upper electrode layer 1127 form capacitor 1120. An insulating film 1129 is formed to cover capacitor 1120 to result in the structure shown in FIG. 93.

According to the method of manufacturing a semiconductor memory device of the ninth embodiment of the present invention, an opening 1141 is formed in polycrystalline silicon film 1123a and insulating film 1131 by photolithography at the manufacturing step of FIG. 95. Therefore, the diameter $L_{F2}$ of opening 1141 can not be made smaller than the minimum dimension that can be formed by photolithography. This means that the opening diameter $L_{F2}$ of opening 1141 is at least 0.4 $\mu$m.

However, a second portion 1123b which is a sidewall spacer-like frame portion is provided at the sidewall of opening 1141 as shown in FIG. 97. Therefore, the opening diameter can be made smaller by the width $L_{H2}$ of the second portion 1123b which is the frame portion. Therefore, the opening diameter $L_{G2}$ can be set to a opening diameter (0.4 $\mu$m) that is smaller than the minimum dimension that can be formed by photolithography. By sequentially applying etching using the second portion 1123b having an opening diameter of $L_{G2}$ as a mask, a contact hole 1135 having an opening diameter substantially equal to opening diameter $L_{G2}$ can be formed.

The semiconductor memory device formed according to the manufacturing method of the ninth embodiment of the present invention has a sidewall spacer-like second portion 1123b projecting upwards perpendicular to the surface of silicon substrate 1001 from the surface of the first portion 1123a. Therefore, lower electrode layer 1123 includes a portion projecting upwards perpendicular to the surface of silicon substrate 1001 in the inside region of lower electrode layer 1123. This means that the lower electrode layer 1123 has a larger surface layer that is increased by the portion projecting upwards in comparison with a conventional capacitor that has a relatively planar configuration. Therefore, the opposing area between electrodes of lower electrode layer 1123 and upper electrode layer 1127 can be increased to achieve increase in the capacity. The surface area of the portion projecting upwards shows substantially no reduction even when the planar occupying area of capacitor 1120 is reduced. Therefore, the capacitance of a capacitor can be ensured by controlling the surface area of the portion projecting upwards even when the integration density is to be increased.

Because the capacitance of the capacitance is increased or can be ensured, unsteady operation of a DRAM and reduction in reliability caused by increase in integration density can be improved.

Figure 101:
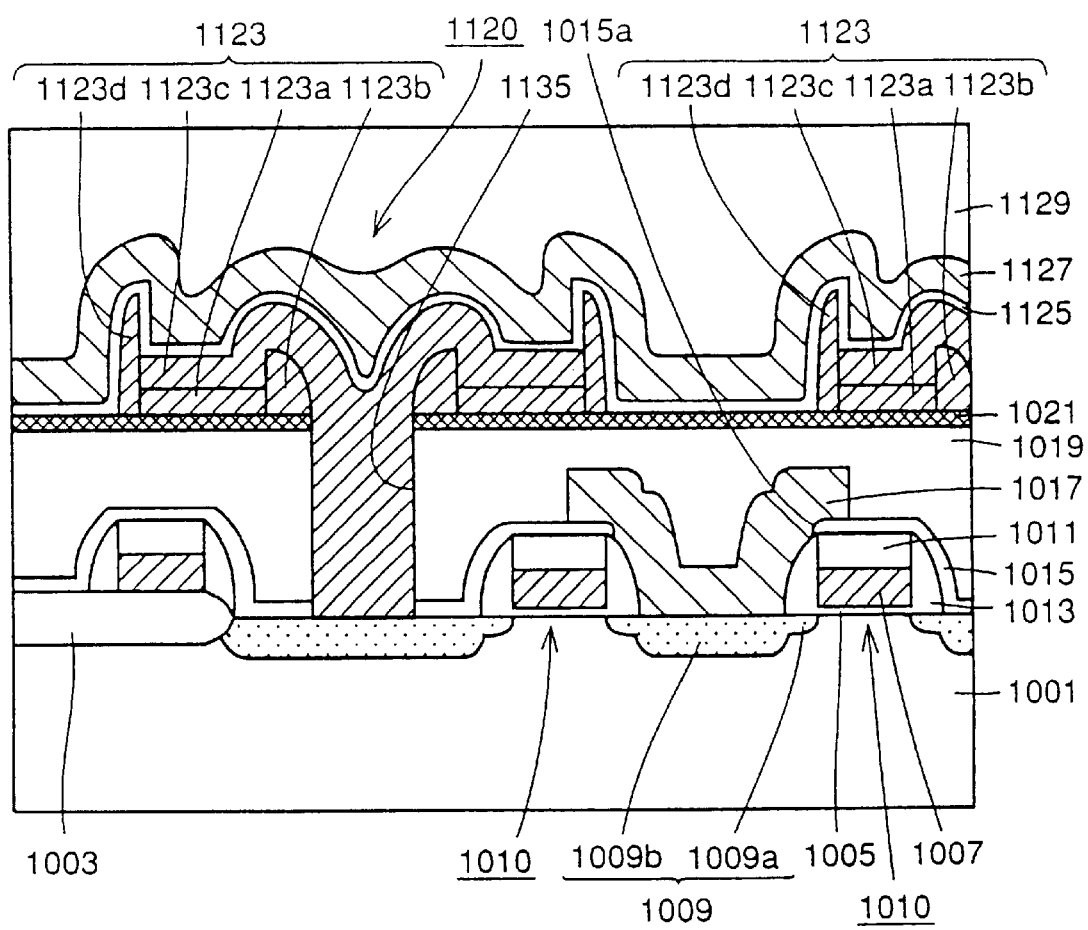
FIG. 101 is a sectional view of a semiconductor memory device of the ninth embodiment of the present invention applied to a cylindrical stacked capacitor.

The structure of the ninth embodiment of the present invention can be applied, not only to a general stacked capacitor, but also to a cylindrical type stacked capacitor shown in FIG. 101.

Referring to FIG. 101 showing a cylindrical type stacked capacitor 1120, a cylindrical fourth portion 1123d is provided in addition to first, second, and third portions 1123a–1123c. The fourth portion 1123d is formed of, for example, a polycrystalline silicon to which impurities are introduced. The fourth portion 1123d is in contact with the perimeter of first and third portions 1123a and 1123c, and has a sidewall spacer configuration extending upwards perpendicular to the surface of silicon substrate 1001. Thus, the capacitor capacitance can further be increased by employing a cylindrical type stacked capacitor.

When the ninth embodiment of the present invention is applied to a general cylindrical capacitor shown in FIG. 101, a portion 1123b projecting upwards perpendicular to the surface of silicon substrate 1001 is additionally provided in the inner circumferential portion of capacitor 1120. Therefore, the surface area of lower electrode layer 1123 is increased by the portion extending upwards. It is therefore possible to ensure the opposing area between electrodes in capacitor 1120 within a limited range of height. Therefore, unsteady operation of a DRAM and reduction in reliability can be prevented when the integration density is further increased.

The present invention is not limited to the present embodiment where a second polycrystalline silicon film 1123b is formed in FIG. 96. Any layer having conductivity is allowed. More specifically, an amorphous silicon layer or a conductive layer having the grain controlled may be formed instead of second polycrystalline silicon film 1123b. An amorphous silicon layer has an advantage set forth in the following in comparison with a polycrystalline silicon film.

Figure 102:
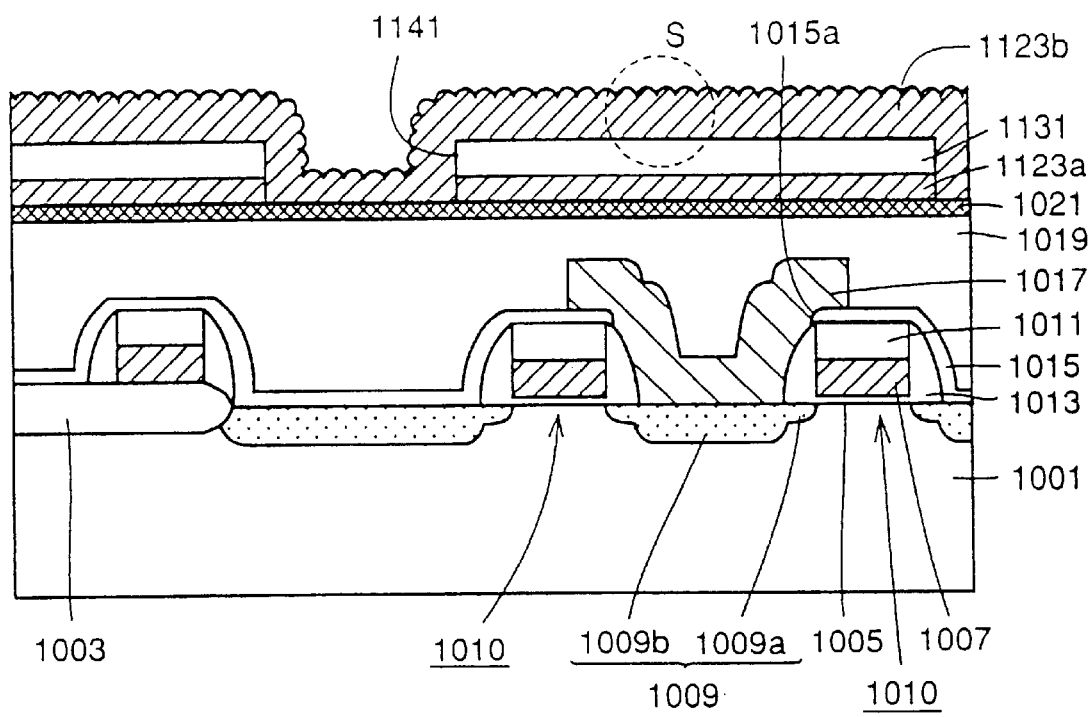
FIG. 102 is a sectional view of a semiconductor memory device according to the ninth embodiment of the present invention for describing a problem encountered in forming a polycrystalline silicon film which becomes the frame portion.

FIG. 102 is a sectional view of a semiconductor device for describing a problem encountered when a polycrystalline silicon film is formed. Referring to FIG. 102 where a second polycrystalline silicon film 1123b is formed, unevenness at the surface thereof is seen due to crystalline grain.

Figure 103:
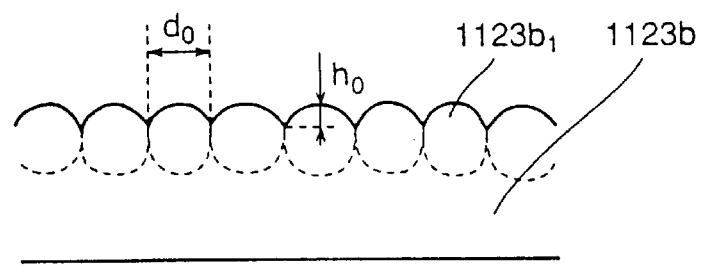
FIG. 103 is a sectional view of FIG. 102 where the S portion, i.e. the unevenness of the surface of the polycrystalline silicon film, is enlarged.

FIG. 103 is a partial sectional view of the S portion of FIG. 102. Unevenness of the surface of second polycrystalline silicon film 1123b is shown. Referring to FIG. 103, the surface of second polycrystalline silicon film 1123b is uneven reflecting the shape of each crystalline grain 1123b, of polycrystalline silicon. The size (diameter $d_0$) of each crystalline grain $1123b_1$ is generally 0.01–0.03 $\mu$m. Therefore, the difference in height level $H_0$ between adjacent concave portion and convex portion is less than 0.01 $\mu$m and less than 0.03 $\mu$m when the size of each grain $1123b_1$ is 0.01 $\mu$m and 0.03 $\mu$m, respectively.

A frame of a sidewall configuration formed by etching second polycrystalline silicon film 1123b having such an uneven surface will also have an uneven surface due to the crystalline grain.

Figure 104:
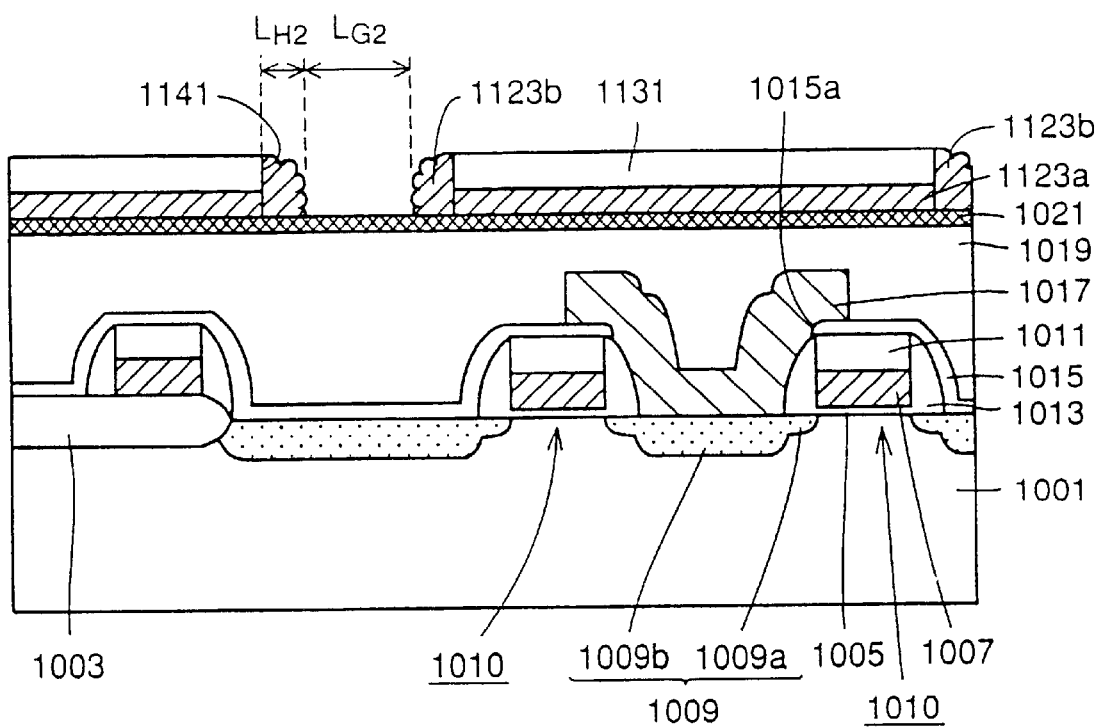
FIG. 104 is a sectional view of a semiconductor memory device according to the ninth embodiment of the present invention where unevenness is generated at the surface of the frame portion.

FIG. 104 is a sectional view showing an uneven surface of the frame portion. It can be seen from FIG. 104 that the surface of frame portion 1123b of sidewall configuration is uneven due the above-described difference in height. If a contact hole 1135 of FIG. 98 is formed using such a frame portion 1123b having an uneven surface, precise control of opening diameter $L_{G2}$ of contact hole 1135 cannot be obtained easily. In other words, there will be variation in the opening diameter $L_{G2}$ within the range of difference in height level by a concave portion and a convex portion of the uneven surface.

In contrast, amorphous silicon does not have crystalline grains. Therefore, unevenness due to crystalline grains will not be seen at the surface of an amorphous silicon layer. By forming a frame portion 1123b of a sidewall configuration by amorphous silicon, and forming a contact hole 1135 using frame portion 1123b as a mask, a contact hole 1135 of a desired opening diameter $L_{G2}$ can be obtained.

In a conductive layer with controlled grain, the uneven surface on the frame portion of sidewall configuration can be controlled to a desired configuration. Therefore, the opening diameter of a contact hole formed using such a frame portion as a mask can be easily controlled.

The frame portion 1123b of sidewall configuration may be formed of a silicide other than amorphous silicon.

When frame portion 1123b is formed by amorphous silicon, the portion of frame 1123b may maintain the amorphous state in the final product shown in FIG. 93 depending upon thermal treatment of a subsequent process. Otherwise, the amorphous silicon is crystallized by thermal treatment to become polycrystalline silicon.

Tenth Embodiment

A semiconductor memory device according to a tenth embodiment of the present invention will be described hereinafter with reference to a sectional view of the structure thereof shown in FIG. 105.

Figure 105:
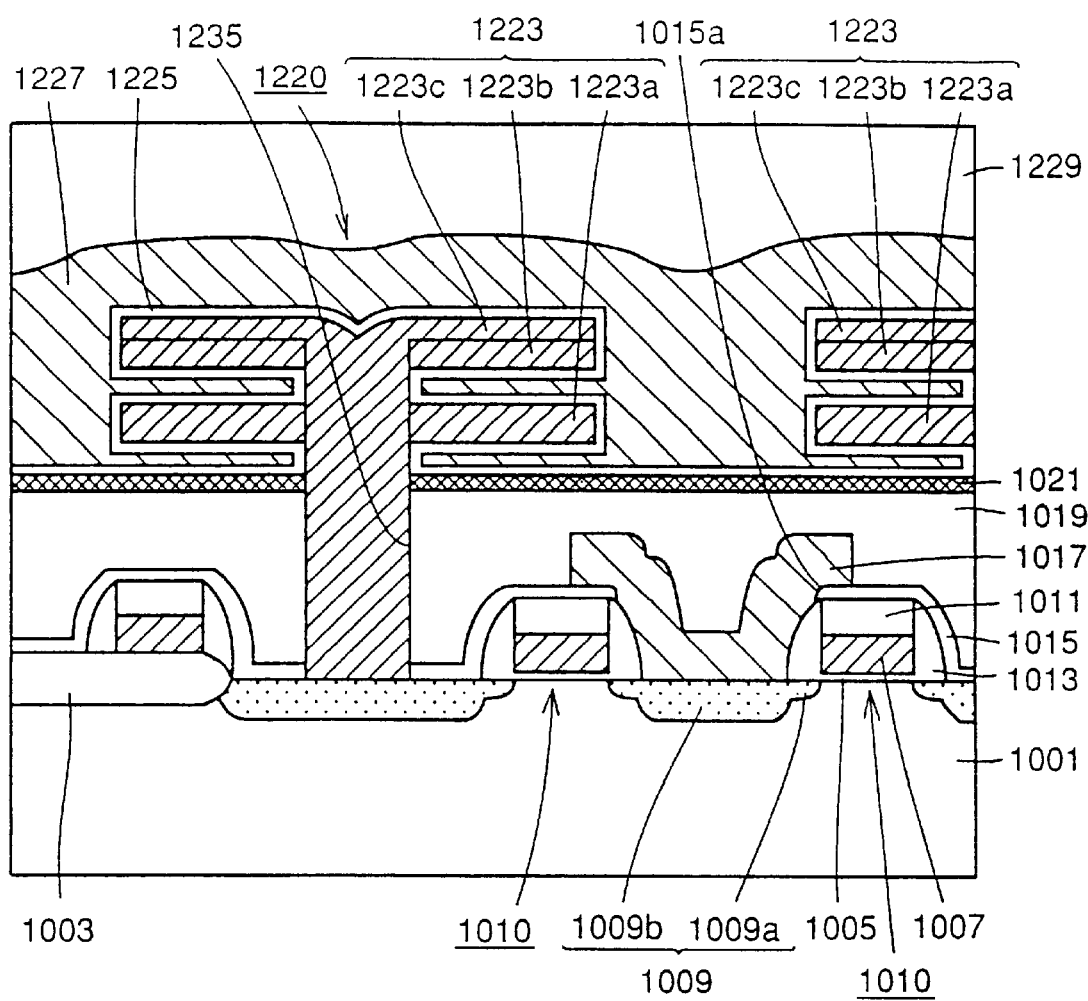
FIG. 105 is a sectional view of a semiconductor memory device according to a tenth embodiment of the present invention.

Referring to FIG. 105, the semiconductor memory device of the tenth embodiment differs from the semiconductor memory device of the fifth embodiment in the structure of their capacitors.

A capacitor 1220 includes a lower electrode 1223, a capacitor dielectric film 1225, and an upper electrode layer 1227. Lower electrode layer 1223 includes a first portion 1223a, a second portion 1223b, and a third portion 1223c. Lower electrode layer 1223 of this capacitor has a fin structure in which the capacity portion are layered with a predetermined distance therebetween. More specifically, the first portion 1223a is formed above silicon nitride film 1021 with a predetermined distance therebetween and substantially parallel to silicon nitride film 1021 which has a substantially planarized surface. Also, the second portion 1223b is formed above the first portion 1223a substantially parallel to the surface of silicon nitride film 1021 with a predetermined distance therebetween. The third portion 1223c is formed on the surface of the second portion 1223b so as to contact source/drain diffusion region 1009 via a contact hole 1235 and to contact first and second portions 1223a and 1223b. A capacitor dielectric film 1225 is formed to cover the surface of lower electrode layer 1223. An upper electrode layer 1227 is formed to cover the surface of lower electrode layer 1223 with capacitor dielectric film 1225 therebetween. An insulating film 1229 is formed to cover capacitor 1220.

The components other than capacitor 1220 are similar to those of the semiconductor memory device of the fifth embodiment, and their description will not be repeated.

Figure 106:
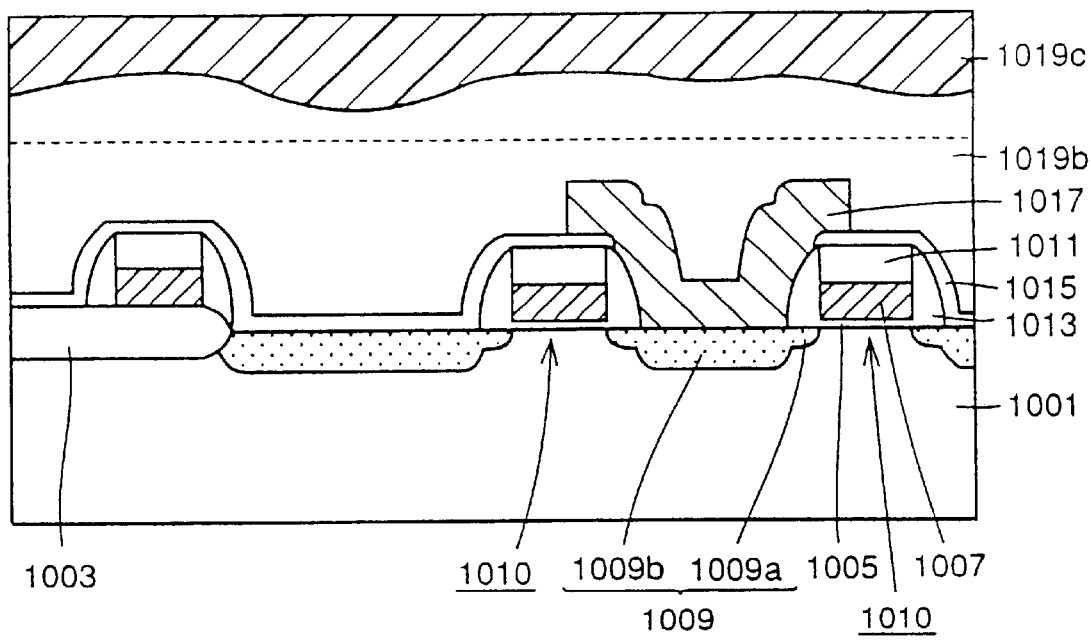
FIGS. 106–116 are sectional views of a semiconductor memory device according to the tenth embodiment of the present invention for describing the manufacturing steps thereof in order.
Figure 179:
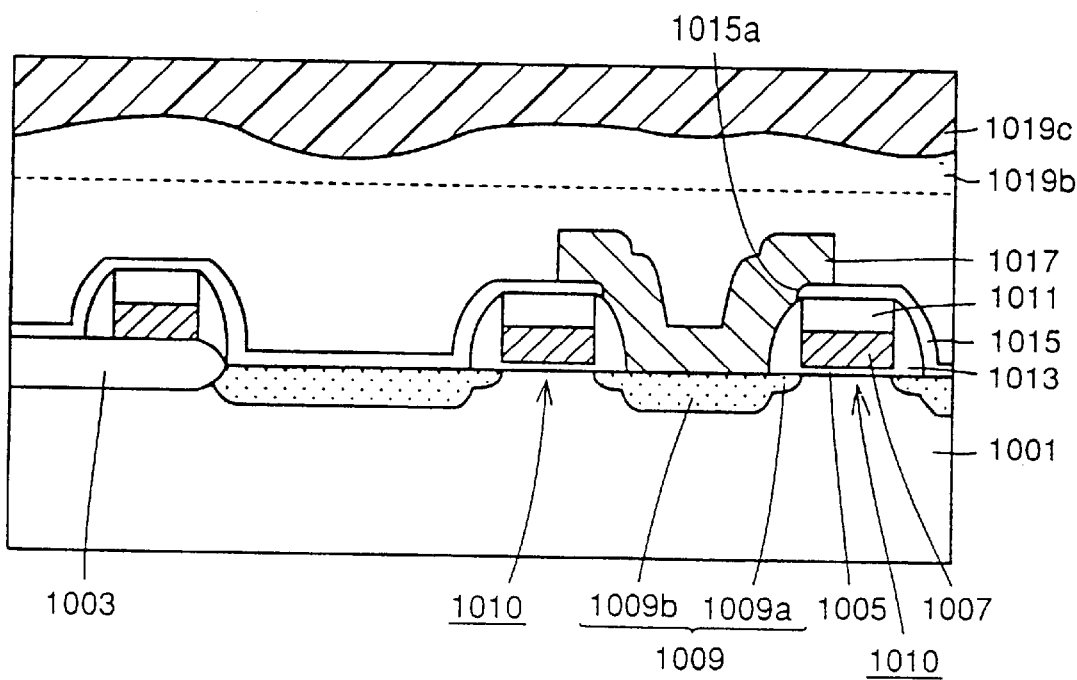

A method of manufacturing a semiconductor memory device according to the tenth embodiment of the present invention will be described hereinafter with reference to FIGS. 106–116. Because the process preceding the step shown in FIG. 106 is similar to the manufacturing step of the first conventional semiconductor memory device shown in FIG. 179, their description will not be repeated. Following the manufacturing step of FIG. 106, resist film 1019c and oxide film 1019b are etched back to the level indicated by the dotted line.

Figure 107:
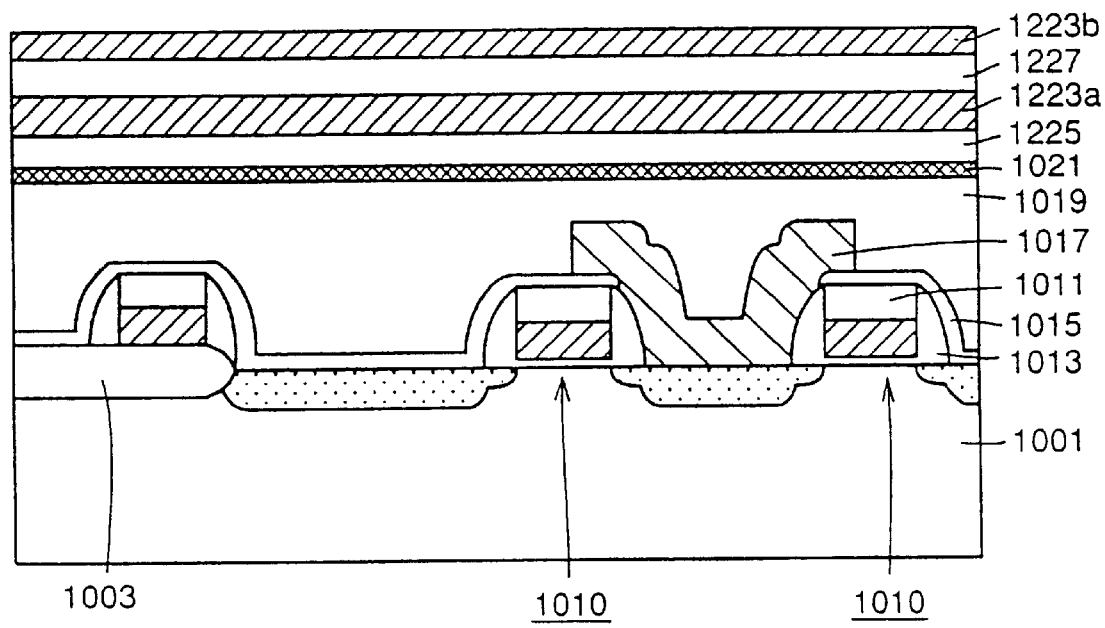

Referring to FIG. 107, an interlayer insulating film 1019 having its surface planarized is obtained by this etchback process. A silicon nitride film 1021 of approximately 100 Å in thickness, a first silicon oxide film 1225 of approximately 700–1000 Å in thickness, a first polycrystalline silicon film 1223a of approximately 1000 Å in thickness, a second silicon oxide film 1227 of approximately 700–1000 Å in thickness, and a second polycrystalline silicon film 1223b of approximately 1000–2000 Å in thickness are formed on the surface of interlayer insulating film 1019.

Figure 108:
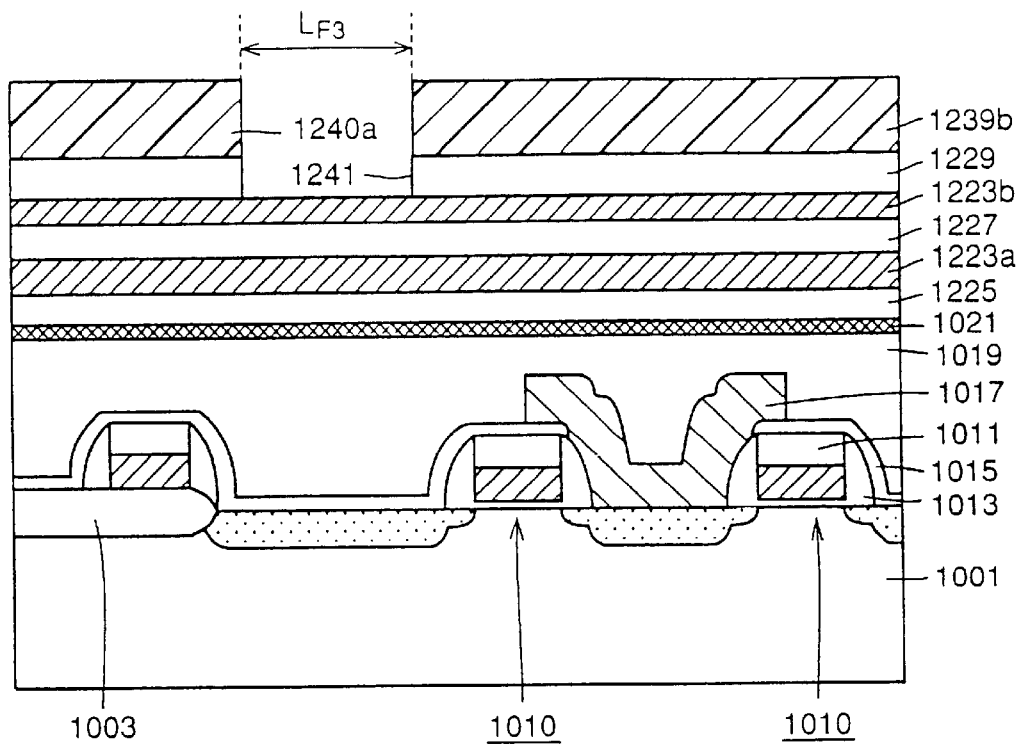

Referring to FIG. 108, a first insulating film 1229 of silicon oxide is formed in the thickness of approximately 4000 Å all over the surface of second polycrystalline silicon film 1223b. A photoresist is applied all over the surface of the first insulating film 1229 to be patterned to a desired configuration by an exposure process and the like to result in resist pattern 1239b. Resist pattern 1239b has a hole pattern 1240a of an opening diameter of $L_{F3}$. Using resist pattern 1239b as a mask, the first insulating film 1229 is subjected to anisotropic etching. By this etching process, an opening 1241 exposing a partial surface of second polycrystalline silicon film 1223b is formed. Then, a photoresist 1239b is removed.

Figure 109:
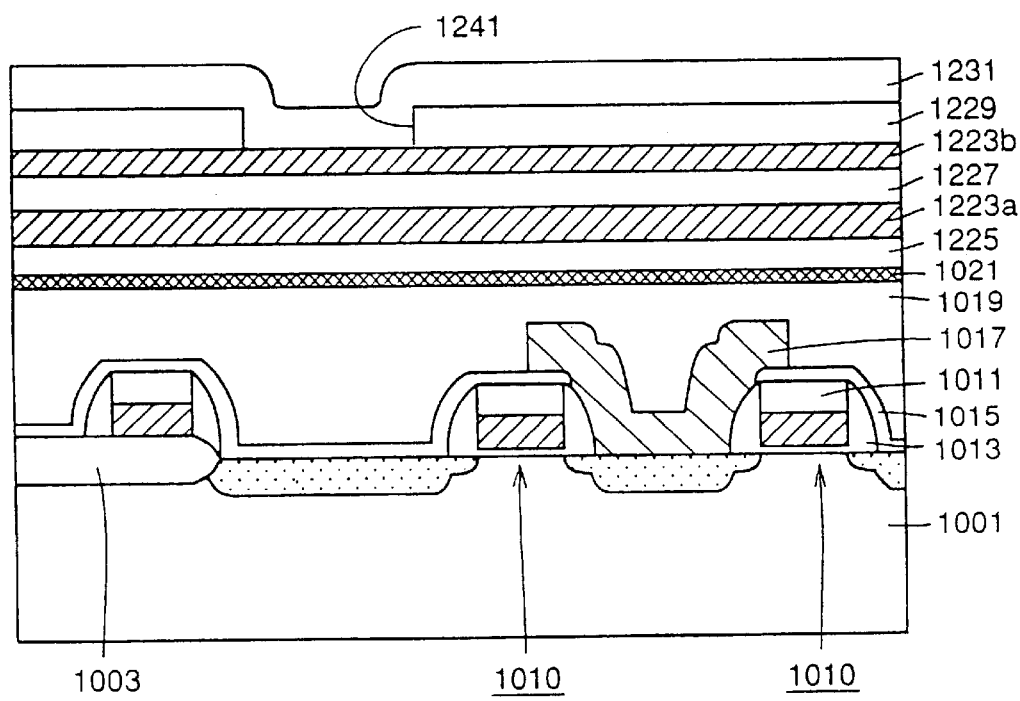

Referring to FIG. 109, a second insulating film 1231 of silicon oxide is formed at the inner wall of opening 1241 and on the surface of the first insulating film 1229. The second insulating film 1231 is subjected to anisotropic etching.

Figure 110:
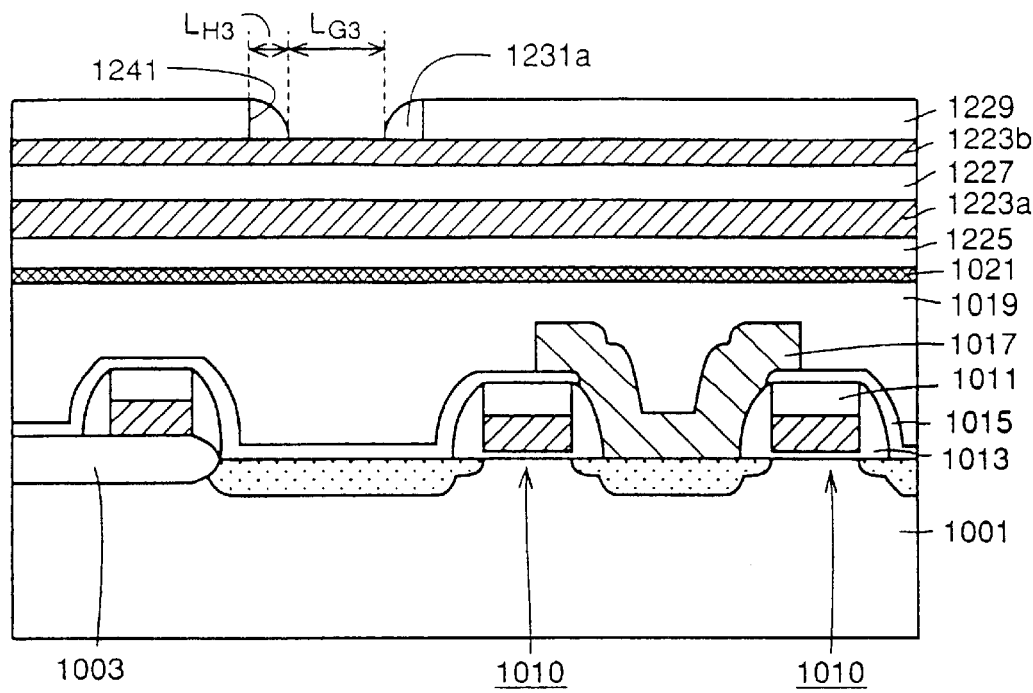

Referring to FIG. 110, a sidewall spacer-like frame portion 1231a is formed to cover the sidewall of opening 1241. The opening diameter $L_{G3}$ of frame portion 1231a is (opening diameter $L_{F3}$ of opening 1241)–2×(width $L_{H3}$ of frame portion 1231a). Using the first insulating film 1229 and frame portion 1231a as a mask, an etching process is applied. More specifically, using frame portion 1231a and the first insulating film 1229 as a mask, second polycrystalline silicon film 1223b is subjected to etching.

Figure 111:
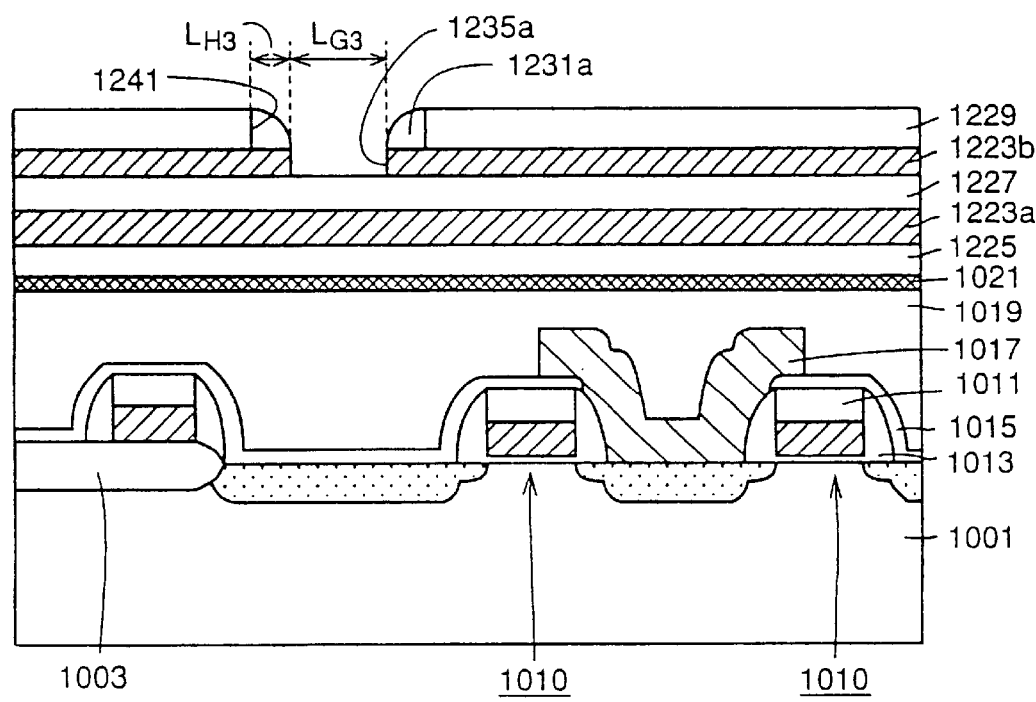

Referring to FIG. 111, a first hole 1235a is formed in second polycrystalline film 1223b. Then, using second polycrystalline silicon film 1223b as a mask, second silicon oxide film 1227 is subjected to etching. Using second silicon oxide film 1227 as a mask, first polycrystalline silicon film 1223a is subjected to etching. Using first polycrystalline silicon film 1223a as a mask, first silicon oxide film 1225 is subjected to etching. Using first silicon oxide film 1225 as a mask, silicon nitride film 1021 is subjected to etching. Using silicon nitride film 1021 as a mask, interlayer insulating film 1019 and silicon oxide film 1015 are subjected to etching. Frame portion 1231a and first insulating film 1229 are removed when second silicon oxide film 1227, first silicon oxide film 1225, and interlayer insulating film 1019 identical in etching property are removed.

Figure 112:
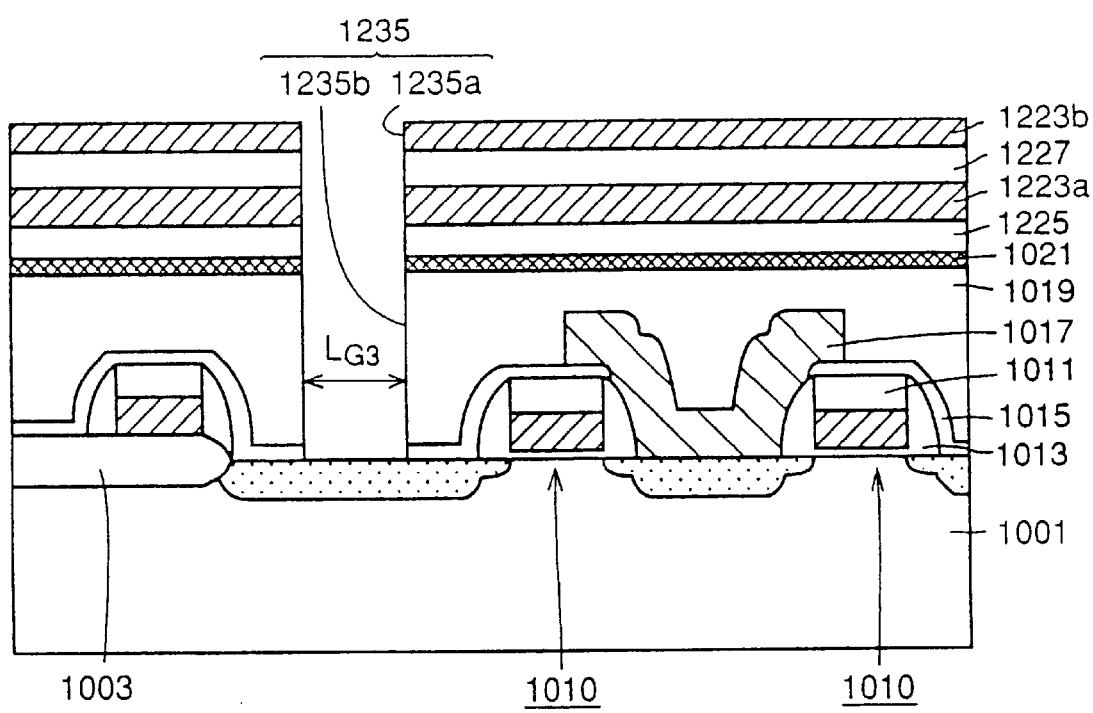

Referring to FIG. 112, by sequentially etching an underlying layer using an etched upper layer as a mask, a contact hole 1235 (including first and second holes 1235a and 1235b) reaching to the surface of silicon substrate 1001 and penetrating each layer is formed. The opening diameter of contact hole 1235 is substantially equal to the opening diameter $L_{G3}$ of frame portion 1231a.

Figure 113:
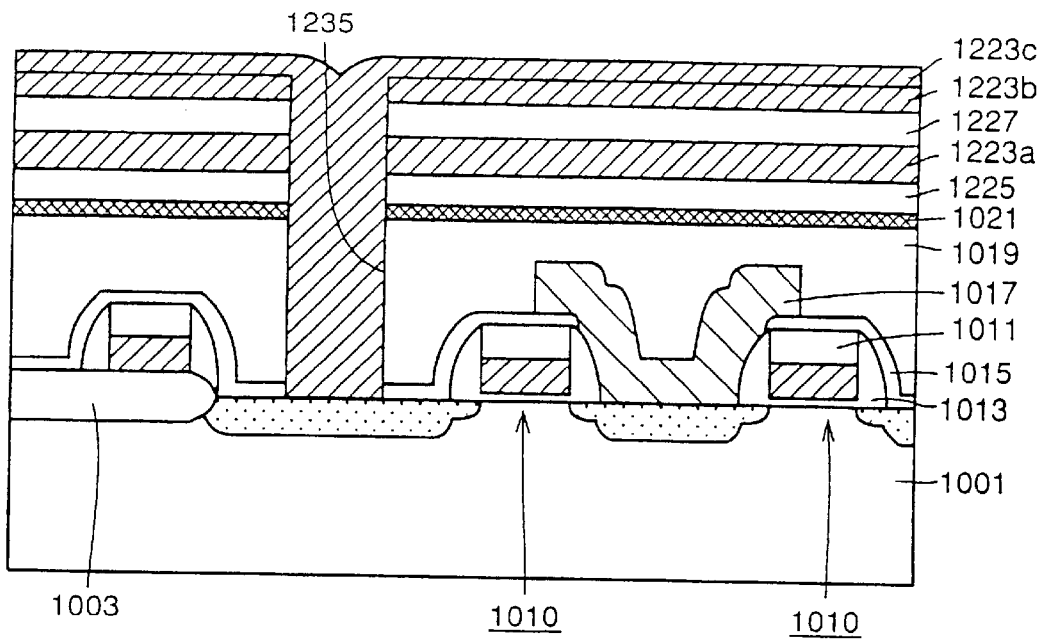

Referring to FIG. 113, a third polycrystalline silicon film 1223c is formed with impurities introduced to contact source/drain diffusion region 1009 via contact hole 1235 and to contact the surface of second polycrystalline silicon film 1223b.

Figure 114:
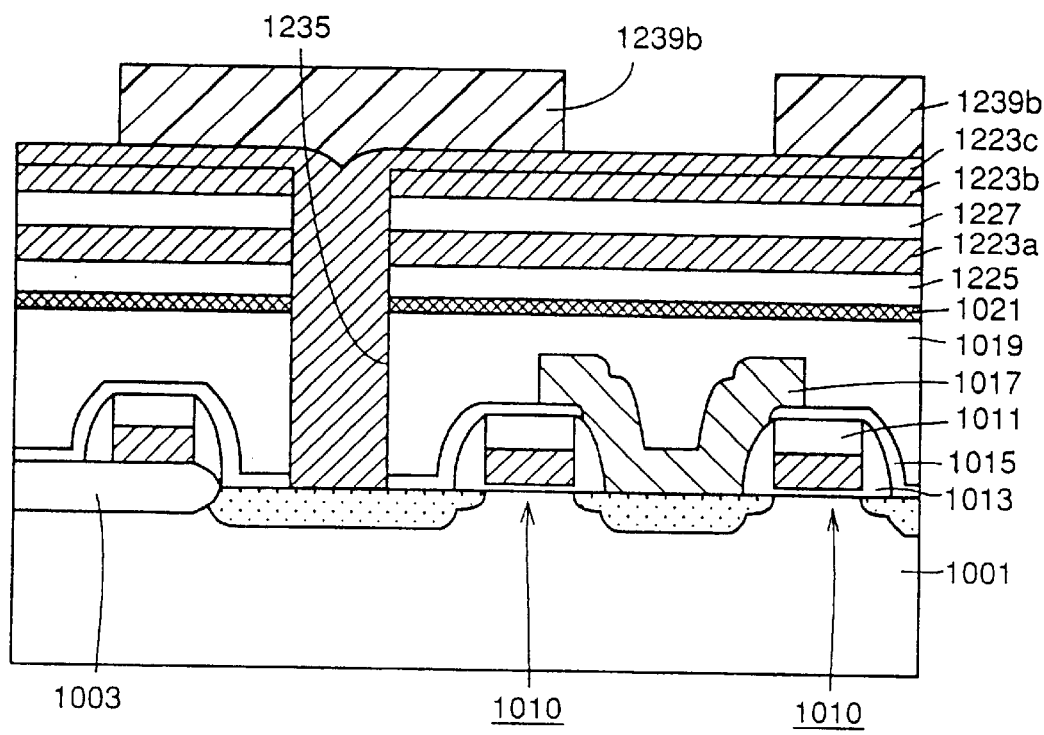

Referring to FIG. 114, a photoresist is applied all over the whole surface of third polycrystalline silicon film 1223c to be patterned to a desired configuration by an exposure process and the like to result in a resist pattern 1239b. Using resist pattern 1239b as a mask, third polycrystalline silicon film 1223c, second polycrystalline silicon film 1223b, second silicon oxide film 1227, first polycrystalline silicon film 1223a, and first silicon oxide film 1225 are etched away.

Figure 115:
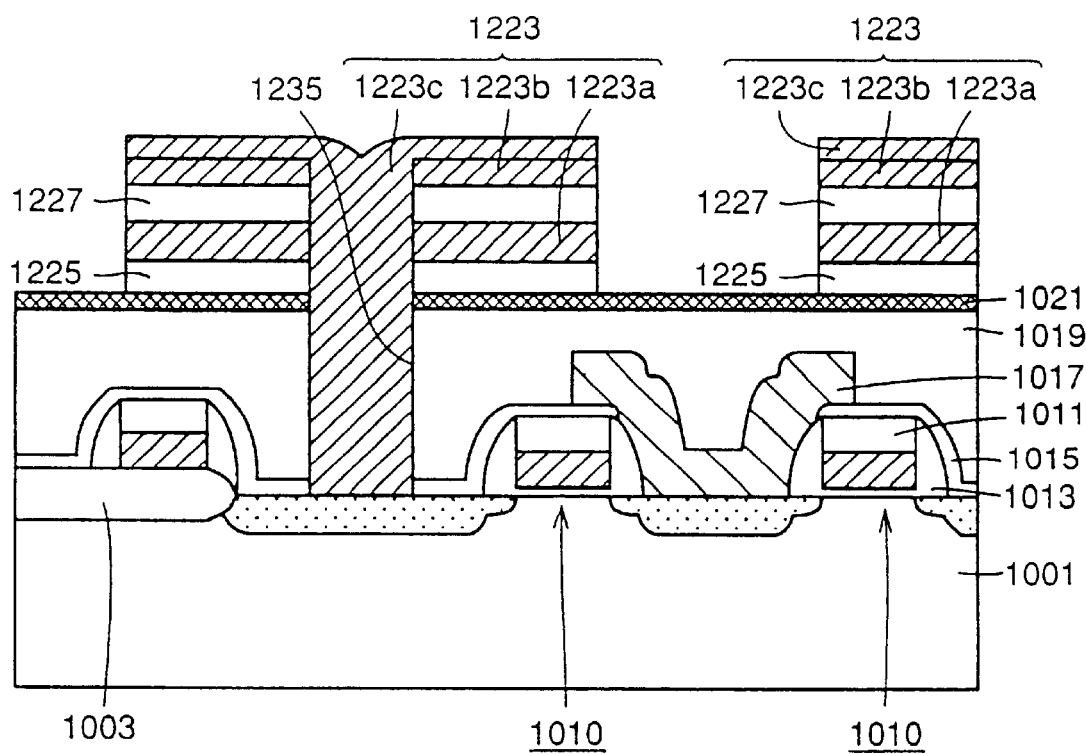

Referring to FIG. 115, the first, the second, and the third portions 1223a–1223c forming lower electrode layer 1223 are formed by this etching process. Then, a fluoric acid treatment is applied, whereby first and second silicon oxide films 1225 and 1227 are removed.

Figure 116:
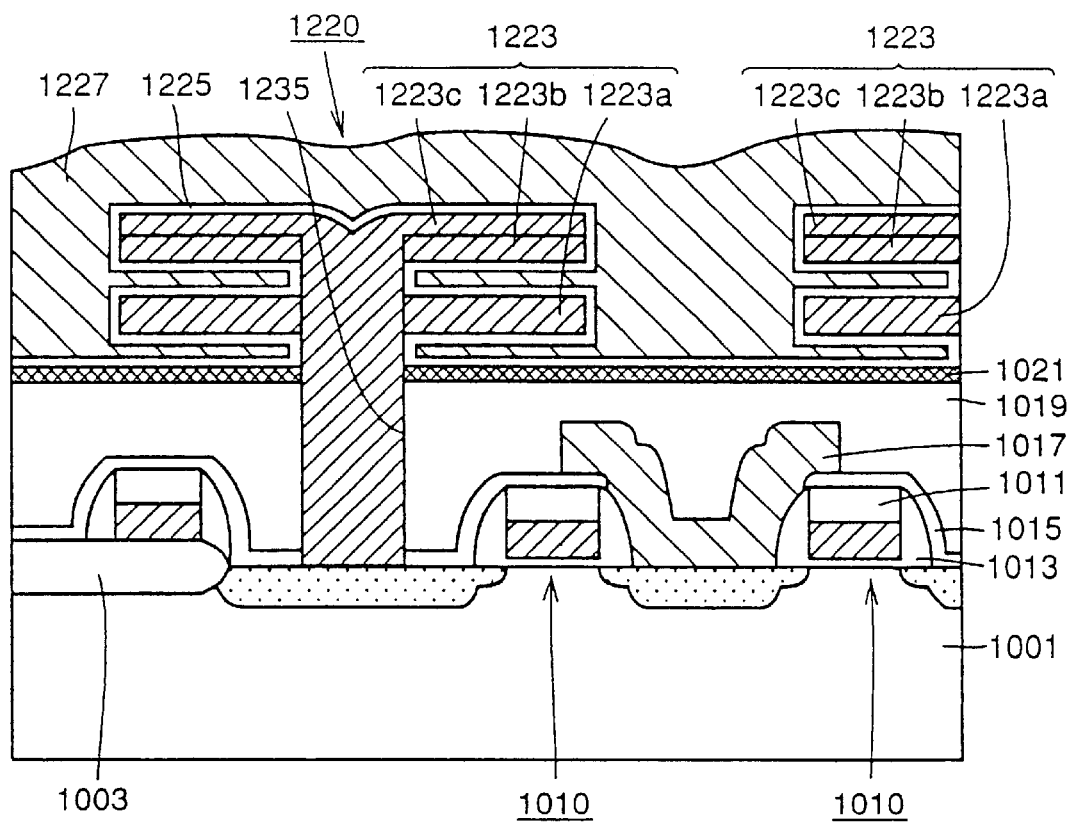

Referring to FIG. 116, a capacitor dielectric film 1225 is formed to cover the surface of lower electrode layer 1223. An upper electrode layer 1227 is formed to cover the surface of lower electrode layer 1223 with capacitor dielectric film 1225 therebetween. Then, an insulating film 1229 is formed to cover capacitor 1220 to result in the structure shown in FIG. 105.

According to the method of manufacturing a semiconductor memory device according to the tenth embodiment of the present invention, an opening 1241 is formed in first insulating film 1229 by photolithography at the step of FIG. 108. Therefore, the diameter $L_{F3}$ of opening 1241 can not be made smaller than the minimum dimension that can be formed by photolithography. That is to say, the diameter $L_{F3}$ of opening 1241 can not be made smaller than 0.4 μm.

However, the provision of a frame portion 1231a at the sidewall of opening 1241 as shown in FIG. 110 allows reduction of the opening diameter by the width $L_{H3}$ of frame portion 1231a. The opening diameter $L_{G3}$ can be made smaller than the minimum diameter that can be formed by photolithography (i.e. below 0.4 μm). By carrying out an etching process using frame portion 1231a having opening diameter $L_{G3}$ and first insulating film 1229 as a mask, a contact hole 1235 having an opening diameter substantially equal to opening diameter $L_{G3}$ can be formed.

According to the steps shown in FIGS. 106 and 107, an interlayer insulating film 1019 is formed having a substantially planarized surface. On the surface of this interlayer insulating film 1019, first polycrystalline silicon film 1223a is formed with silicon nitride film 1021 and first silicon oxide film 1225 having uniform thickness therebetween. Therefore, the underlying layer of first polycrystalline silicon film 1223a does not have a stepped portion on the surface thereof. On the surface of this first polycrystalline silicon film 1223a, second polycrystalline silicon film 1223b is formed with second silicon oxide film 1227 having uniform thickness therebetween. Therefore, the underlying layer of second polycrystalline silicon film 1223b also does not have a stepped portion.

Thus, the lower layers of the first and second polycrystalline silicon films 1223a and 1223b are substantially planarized. Therefore, even if anisotropic etching is applied to the first and second polycrystalline silicon films 1223a and 1223b according to the manufacturing step shown in FIG. 115, no residue of the first and second polycrystalline silicon films 1223a and 1223b will be seen at the sidewall portion of the stepped portion of the underlying silicon oxide films 1225 and 1227. Therefore, connection of the lower electrode layers 1223 to each other between the plurality of capacitors due to the existence of these residues will not occur.

The present invention is not limited to the embodiments of the above-described fourth–tenth embodiments where a storage node (lower electrode) is formed mainly of a polycrystalline silicon layer. A storage node (lower electrode) may be formed of amorphous silicon (a-Si), TiN, silicide such as $TiSi_2$, and $WSi_2$, refractory metal such as Ti, W, and Mo, or a layered film thereof instead of polycrystalline silicon.

In the above-described fourth–tenth embodiments, the lower electrode layer (storage node) is formed of a plurality of layers. Even if the plurality of layers are of the same material, a boundary will exist between each of the plurality of layers. This boundary is defined by a natural oxide film partially residing in the case where polycrystalline silicon is used. The boundary may be defined by mis-alignment of crystalline grain.

[Embodiments 11–18]

In the third embodiment, a conductive layer connected to impurity region 36 via a contact hole 47 as shown in FIG. 36 has a 2-layered structure on interlayer insulating layer 37a. Therefore, the thickness (height) $K_0$ of conductive layers 42a and 49a above interlayer insulating film 37a becomes the sum of the thickness of the two layers. The thickness of polycrystalline silicon layer 42a is approximately 3000 Å, and cannot easily be reduced considering increase of integration density. This will be described in detail in the following.

Figure 117:
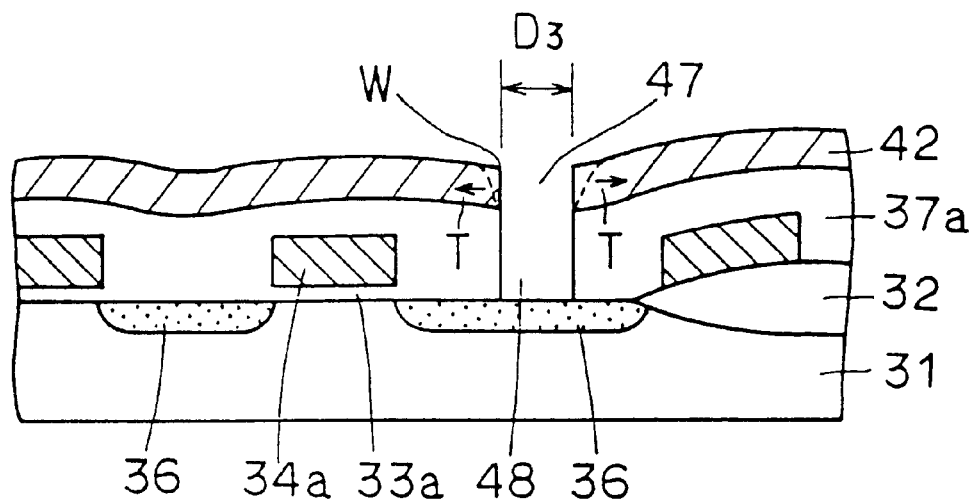
FIG. 117 schematically shows a sectional view of a semiconductor memory device according to the third embodiment of the present invention for describing the case where sputtering effect is great.

In general, a contact hole 47 formed by the steps of FIGS. 33 and 34 is preferably formed perpendicular to the main surface of silicon substrate 31. If contact hole 47 is formed in a forward tapered configuration, there will be a possibility of the lower edge portion of contact hole 47 ending before reaching the main surface of silicon substrate 31 to result in defective opening. In order to form contact hole 47 perpendicularly, the gas pressure at the time of etching must be lowered. However reduction in the gas pressure will increase the sputtering effect during etching. An increase in sputtering effect will remove the corner portion W of polycrystalline silicon film 42 as shown by the dotted line of FIG. 117. As a result, the opening of polycrystalline silicon film 42 is enlarged in the direction of arrow T. An etching step continued under such a state will result in the structure shown in FIG. 118.

Figure 118:
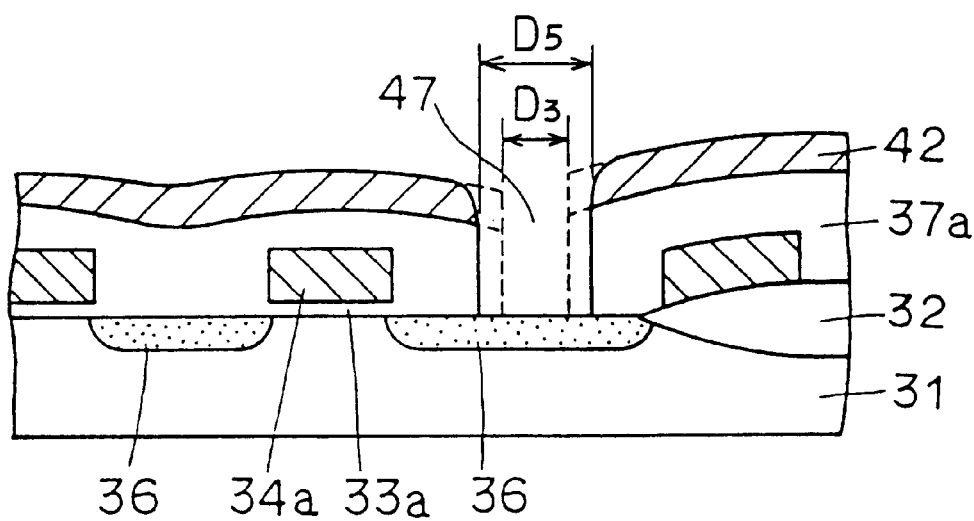
FIG. 118 is a sectional view of a semiconductor memory device according to the third embodiment of the present invention for describing the case where the opening diameter of the contact hole is increased.

Referring to FIG. 118, an enlarged opening of polycrystalline silicon film 42 will result in the opening diameter of contact hole 47 formed in interlayer insulating film 37a being increased from $D_3$ to $D_5$. An enlarged opening diameter of contact hole 47 will induce the above-described problem of shorting between a bit line or a capacitor and a word line. In order to prevent the opening diameter of contact hole 47 from being increased, the thickness of polycrystalline silicon film 42 must be increased. By increasing the thickness of polycrystalline silicon film 42, the opening diameter of a polycrystalline silicon film 42 will not easily be increased even if the corner of polycrystalline silicon film 42 is removed. Therefore, the thickness of polycrystalline silicon film 42 is approximately the above-described 3000 Å.

When etching is carried out to remove polycrystalline silicon film 42 under the state shown in FIG. 34, the surface of impurity region 36 exposed in contact hole 47 may be damaged by the etching process.

Thus, if the thickness $K_0$ of conductive layers 42a and 49a is great, desired patterning of an interconnection layer at the upper layer will not be easily achieved.

An improvement of the third embodiment will be described hereinafter with reference to eleventh–eighteenth embodiments.

Eleventh Embodiment

Figure 119:
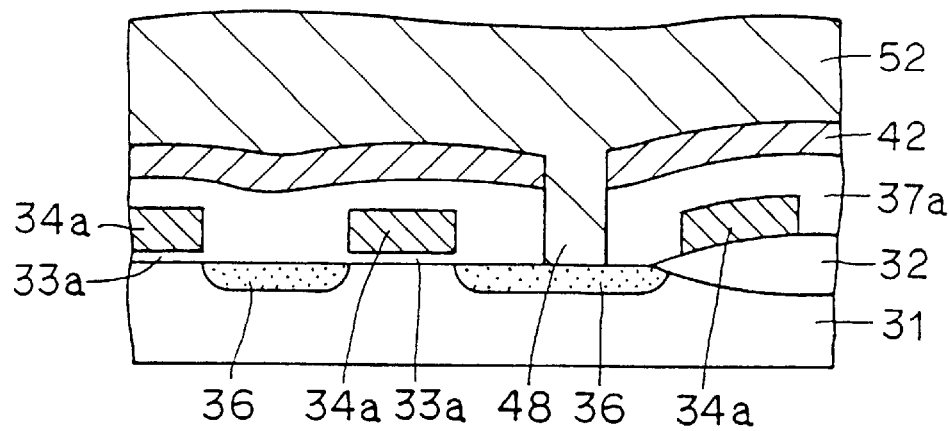
FIGS. 119–125 are sectional views of a semiconductor device according to an eleventh embodiment of the present invention for describing the manufacturing steps thereof in order.

FIGS. 119–125 are sectional views of a semiconductor device for describing an eleventh embodiment of the manufacturing method of the present invention. In the present embodiment, the steps shown in FIGS. 29–34 of the third embodiment are carried out. Then, a resist 52 is formed all over the surface of semiconductor substrate 31 as shown in FIG. 119. A contact hole 48 is filled with resist 52.

Figure 120:
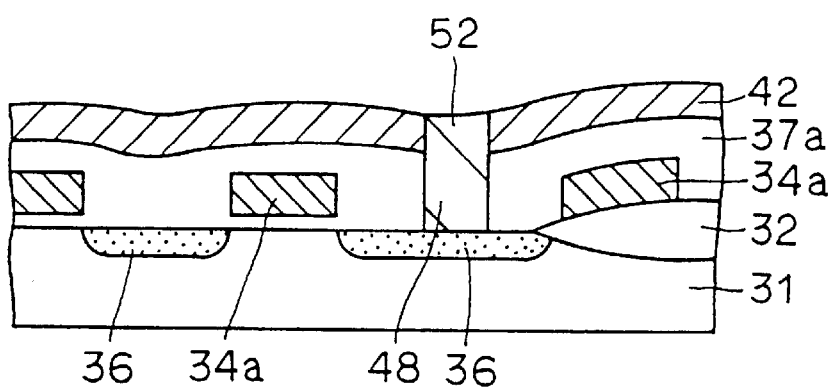

Referring to FIG. 120, resist 52 is etched to expose the surface of polycrystalline silicon film 42.

Figure 121:
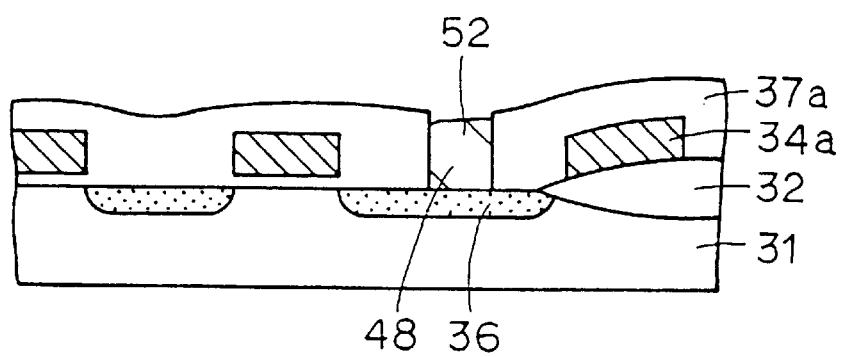

Referring to FIG. 121, anisotropic etching is carried out to remove polycrystalline silicon film 42. Contact hole 48 is filled with resist 52. Therefore, impurity region 36 will not be subjected to damage by anisotropic etching.

Figure 122:
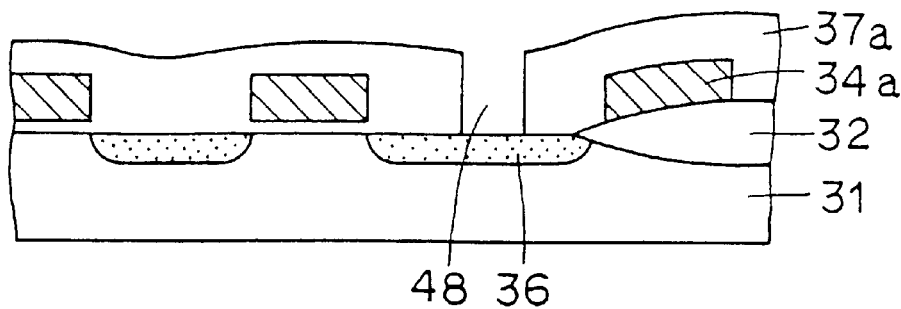

Referring to FIG. 122, resist 52 filling contact hole 48 is removed by ashing.

Figure 123:
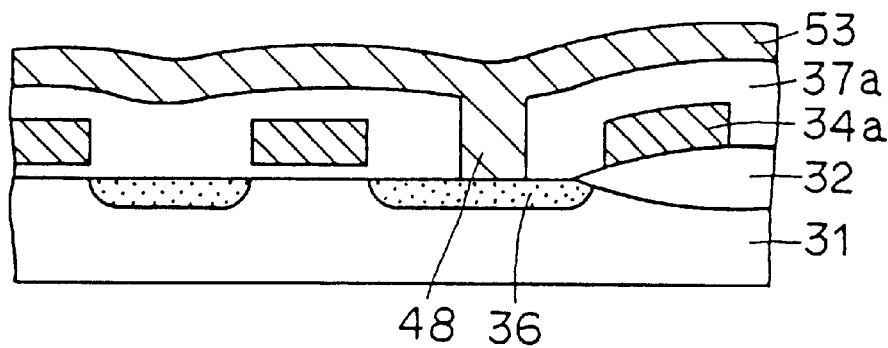

Referring to FIG. 123, a polycrystalline silicon film 53 is formed by CVD all over the surface of semiconductor substrate 31.

Figure 124:
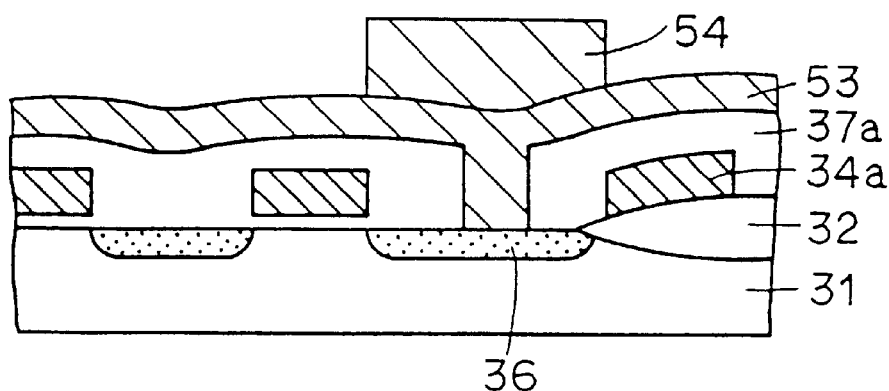

Referring to FIG. 124, a resist 54 is formed on polycrystalline silicon film 53. Resist 54 is subjected to a predetermined patterning.

Figure 125:
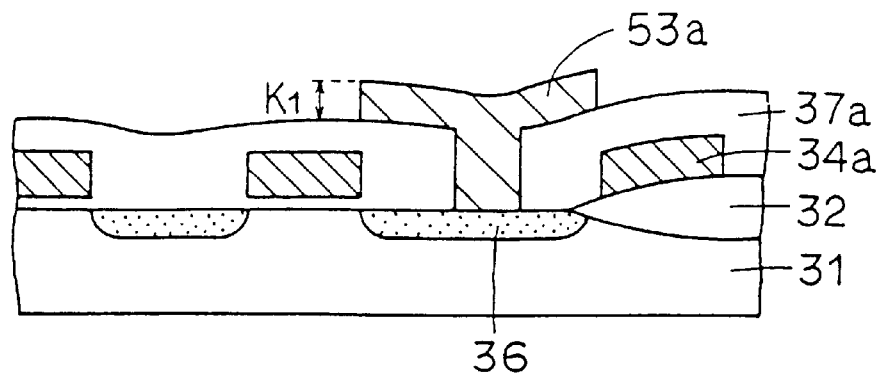

Referring to FIG. 125, polycrystalline silicon film 53 is selectively etched using resist 54 as a mask to form a conductive interconnection film 53a. Conductive interconnection film 53a is electrically connected to impurity region 36. In the third embodiment, polycrystalline silicon film 42a remains beneath conductive interconnection film 49a as shown in FIG. 36. This will become the cause to increase the stepped portion in interlayer insulating film which will subsequently be formed.

This stepped portion can be reduced by removing polycrystalline silicon film 42 by anisotropic etching at the stage shown in FIG. 34 in the third embodiment. However, impurity region 36 will be damaged by etching. In the present eleventh embodiment, polycrystalline silicon film 42 can be removed without damaging the impurity region.

Twelfth Embodiment

Figure 126:
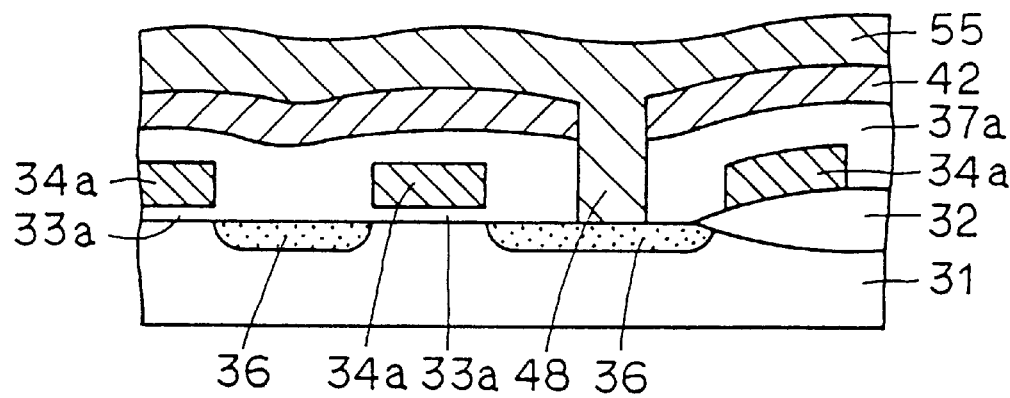
FIGS. 126–131 are sectional views of a semiconductor memory device according to a twelfth embodiment of the present invention for describing the manufacturing steps thereof in order.

FIGS. 126–131 are sectional views of a semiconductor device for describing the twelfth embodiment of the manufacturing method of the present invention. First, the steps shown in FIGS. 29–34 of the third embodiment are carried out. Referring to FIG. 126, a polycrystalline silicon film 55 is formed by CVD all over the surface of semiconductor substrate 31. A contact hole 48 is filled with polycrystalline silicon film 55.

Figure 127:
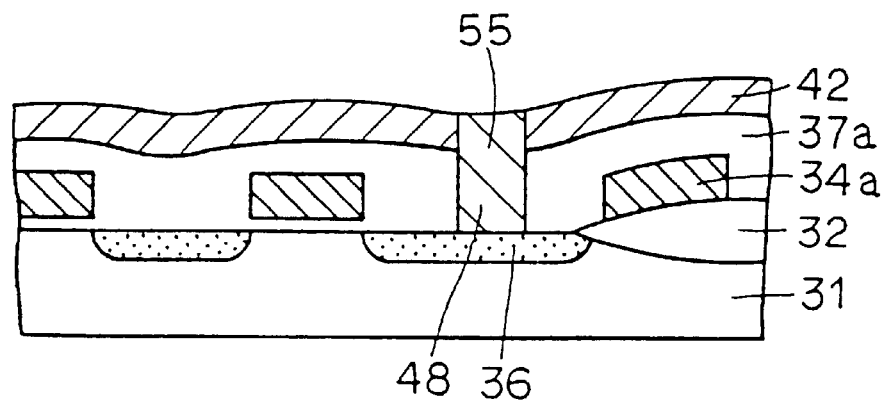

Referring to FIG. 127, polycrystalline silicon film 55 is etched all over by anisotropic etching.

Figure 128:
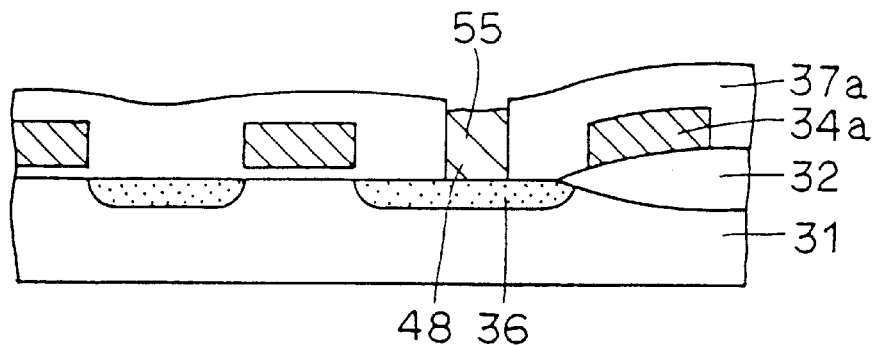

Referring to FIG. 128, the etching is further continued to completely removed the underlying polycrystalline silicon film 42.

Figure 129:
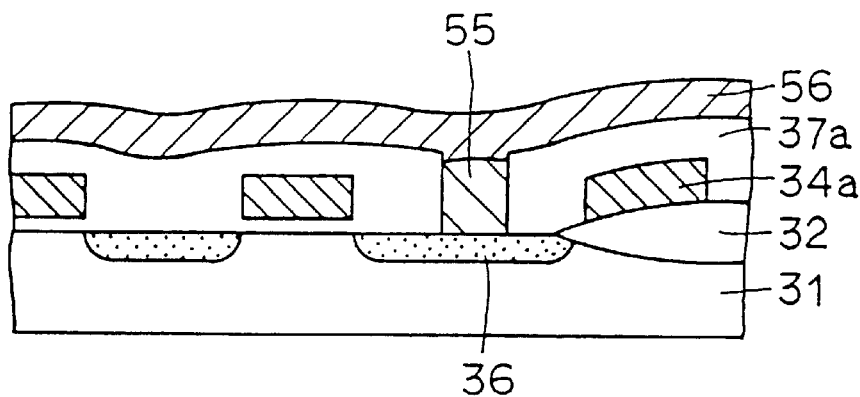

Referring to FIG. 129, polycrystalline silicon film 56 is formed by CVD on interlayer insulating film 37a.

Figure 130:
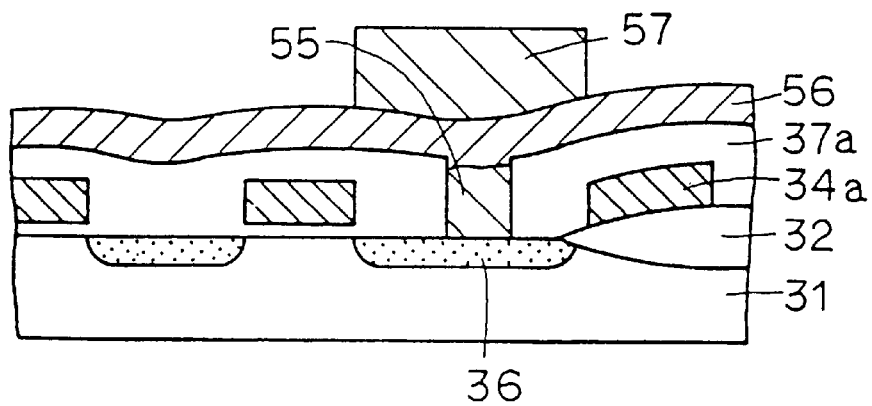

Referring to FIG. 130, a resist 57 is formed on polycrystalline silicon film 56. Then, resist 57 is subjected to a predetermined patterning.

Figure 131:
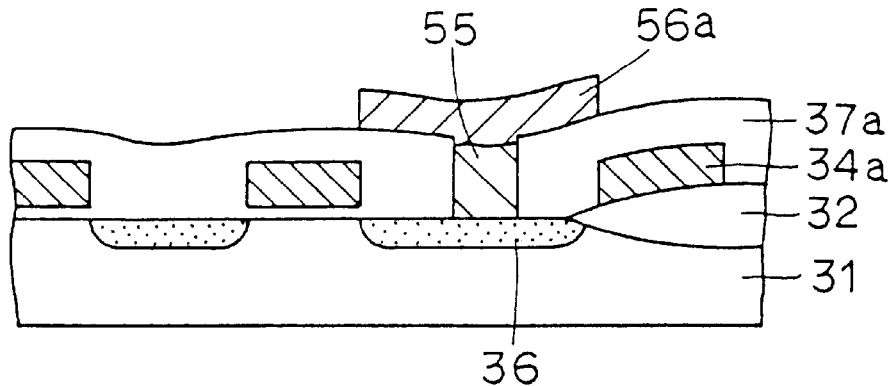
Figure 132:
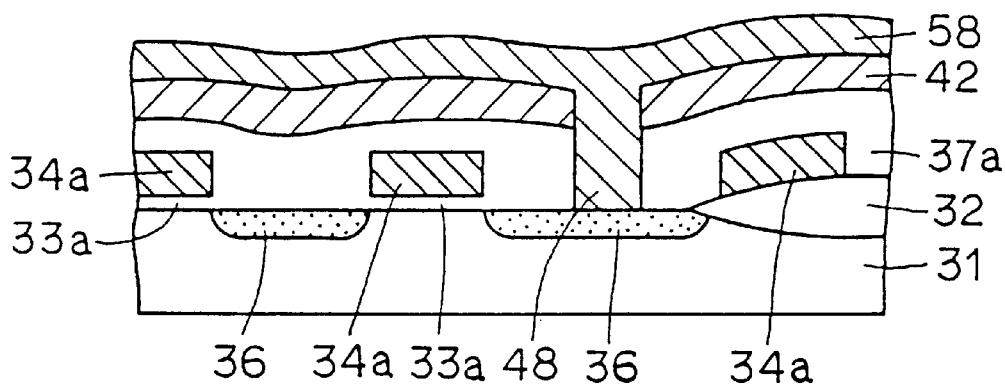
FIGS. 132–135 are sectional views of a semiconductor device according to a thirteenth embodiment of the present invention for describing the manufacturing steps thereof in order.

Referring to FIG. 131, polycrystalline silicon film 56 is selectively etched using resist 57 as a mask to form a conductive interconnection film 56a.

Similar to the eleventh embodiment, the twelfth embodiment can have polycrystalline silicon film 42 removed without damaging impurity region 36. Because polycrystalline silicon film 42 can be removed, reduction in the stepped portion can be achieved.

Thirteenth Embodiment

FIGS. 132–135 are sectional views of a semiconductor device for describing the thirteenth embodiment of the manufacturing method of the present invention. First, the steps shown in FIGS. 29–34 of the third embodiment are carried out. Then, referring to FIG. 132, a polycrystalline silicon film 58 is formed by CVD all over the surface of semiconductor substrate 31. A contact hole 48 is formed in polycrystalline silicon film 58.

Figure 133:
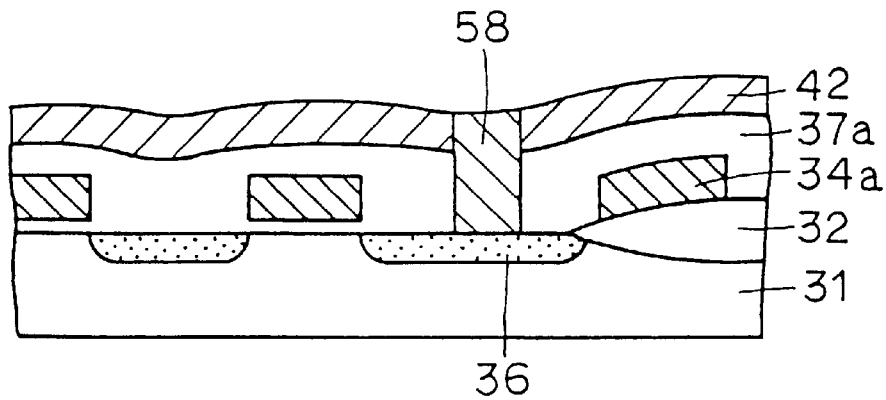

Referring to FIG. 133, polycrystalline silicon film 58 is etched by anisotropic etching. This etching process is stopped when polycrystalline silicon film 42 is exposed.

Figure 134:
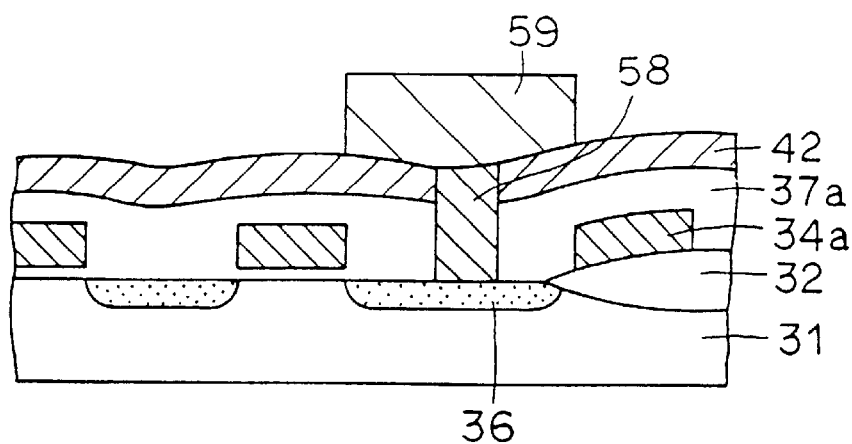

Referring to FIG. 134, a resist 59 is formed which is subjected to a predetermined patterning.

Figure 135:
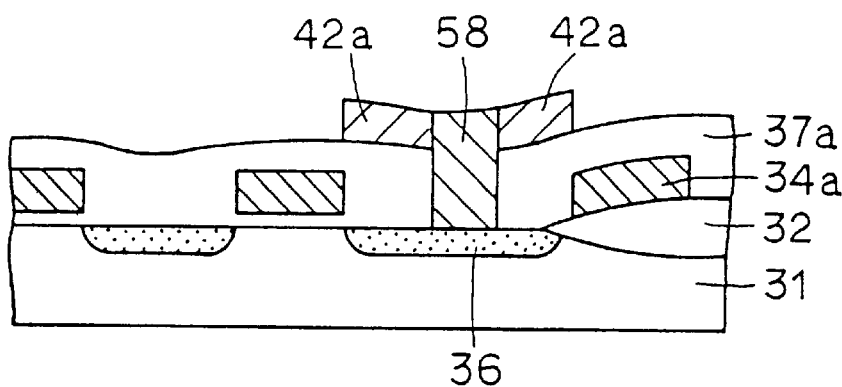
Figure 136:
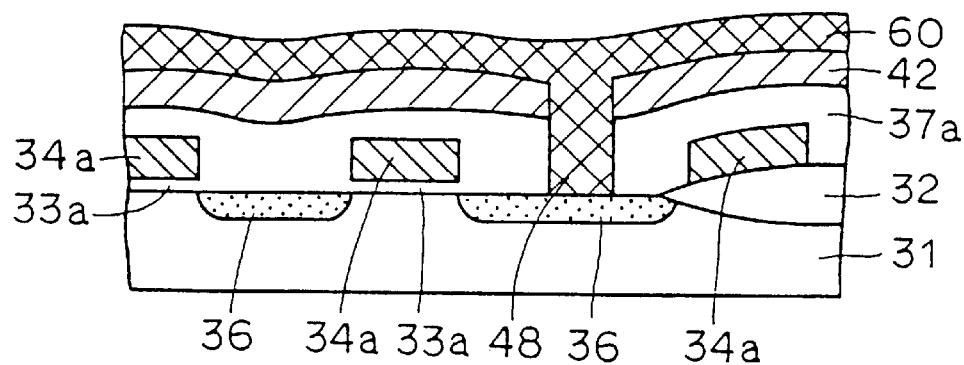
FIGS. 136–140 are sectional views of a semiconductor device according to a fourteenth embodiment of the present invention for describing the manufacturing steps thereof in order.

Referring to FIG. 135, polycrystalline silicon film 42 is selectively etched using resist 59 as a mask to form a conductive interconnection film 42a.

The stepped portion can be reduced in the present embodiment because polycrystalline silicon film 42 is used as a conductive interconnection film. In patterning polycrystalline silicon film 42 as a conductive interconnection film, impurity region 36 will not be damaged because contact hole 48 is filled with polycrystalline silicon film 58.

Fourteenth Embodiment

FIGS. 136–140 are sectional views of a semiconductor device for describing the fourteenth embodiment of the manufacturing method of the present invention. First, the steps shown in FIGS. 29–34 of the third embodiment are carried out. Then, referring to FIG. 136, an amorphous silicon film 60 is formed by CVD all over the surface of semiconductor substrate 31. Contact hole 48 is filled with amorphous silicon film 60.

Figure 137:
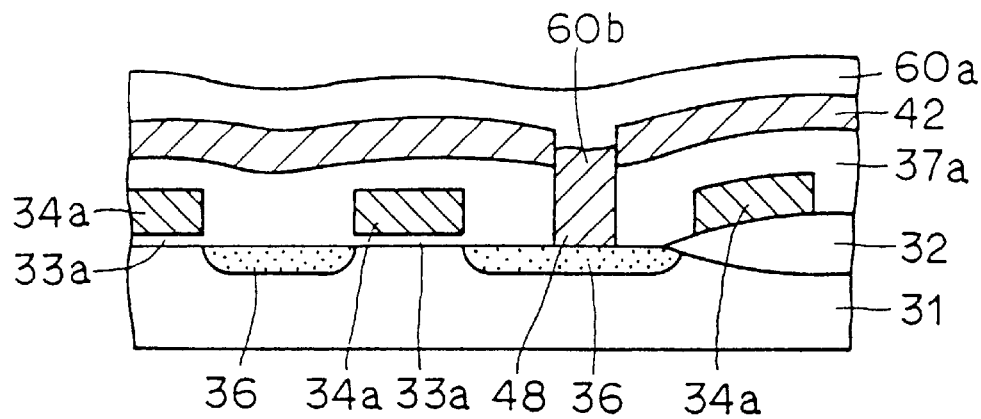

Referring to FIG. 137, amorphous silicon film 60 is subjected to thermal oxidation under the temperature of 800° C.–900° C. for 15–300 minutes. Oxidation is facilitated in the upper portion of amorphous silicon film 60, whereby amorphous silicon film 60 on polycrystalline silicon film 42 becomes a silicon oxide film 60a. The lower portion of the amorphous silicon film within contact hole 48 becomes polycrystalline silicon film 60b because it is not subjected to the atmosphere. Impurities may be doped into amorphous silicon film 60 to activate oxidation.

Figure 138:
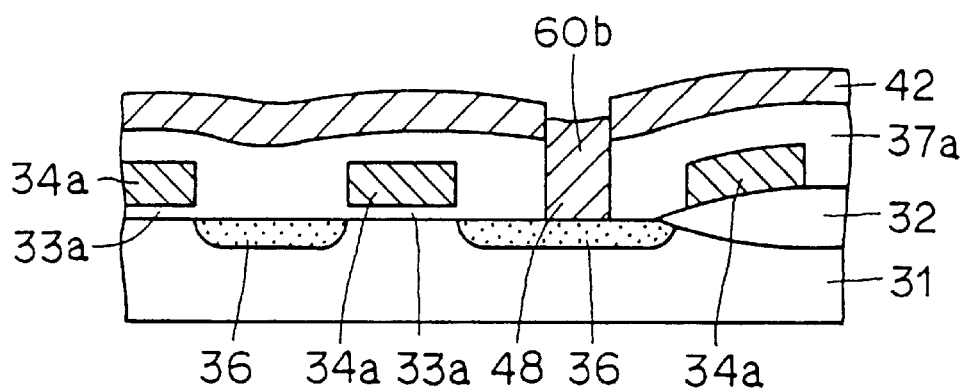

Referring to FIG. 138, silicon oxide film 60a is etched all over anisotropically or isotropically.

Figure 139:
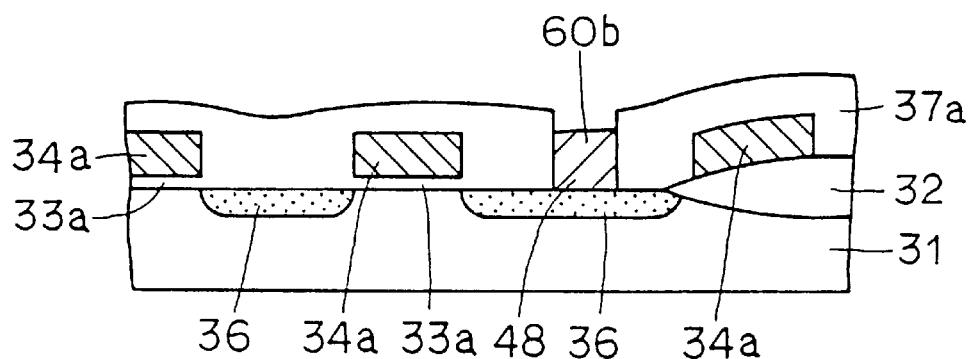

Referring to FIG. 139, polycrystalline silicon film 42 is removed by anisotropic etching.

Figure 140:
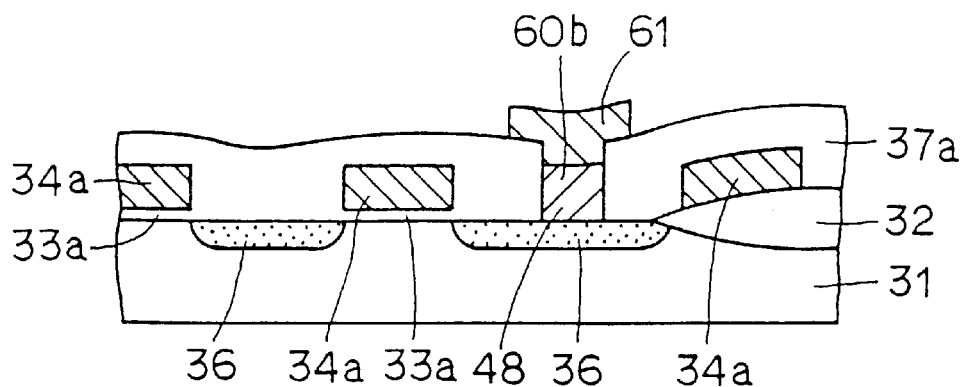

Referring to FIG. 140, a polycrystalline silicon film is formed on interlayer insulating film 37a. This polycrystalline silicon film is subjected to a predetermined patterning to result in conductive interconnection film 61.

Similar to the eleventh embodiment, polycrystalline silicon film 42 can be removed without damaging impurity region 36 in the present embodiment. Because polycrystalline silicon film 42 can be removed, the stepped portion can be reduced.

Fifteenth Embodiment

FIGS. 141–146 are sectional views of a semiconductor memory device for describing the fifteenth embodiment of the manufacturing method of the present invention. First, the steps of FIGS. 40–55 of the fourth embodiment are carried out.

Figure 141:
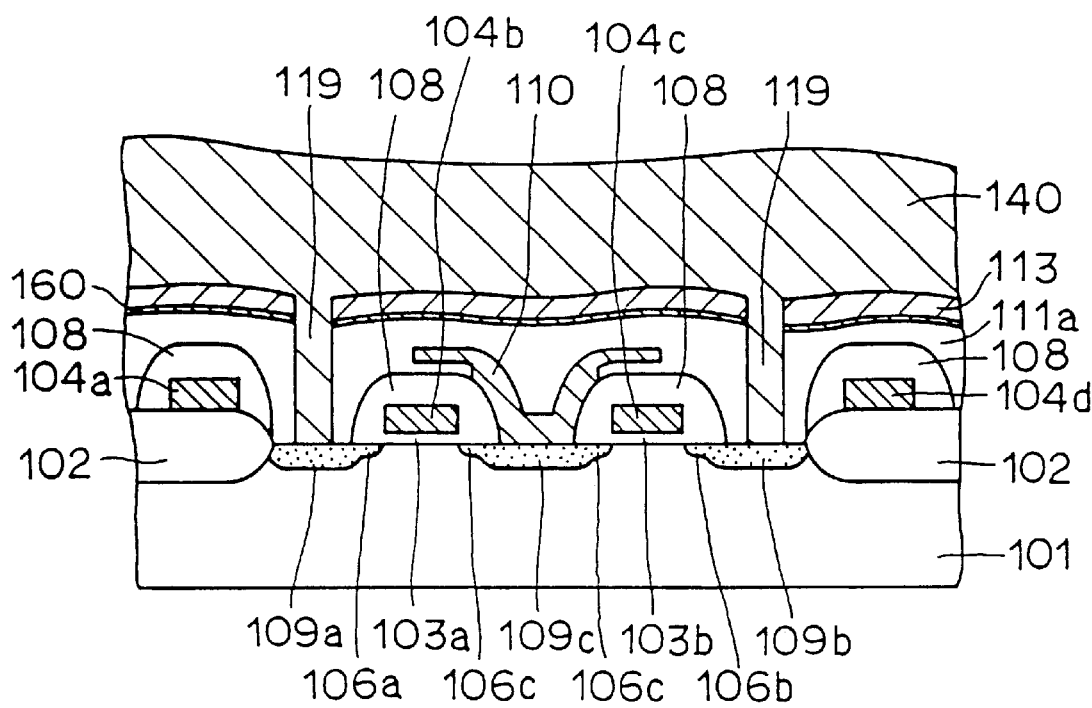
FIGS. 141–146 are sectional views of a semiconductor memory device according to a fifteenth embodiment of the present invention for describing the manufacturing steps thereof in order.

Referring to FIG. 141, a resist 140 is formed all over the surface of semiconductor substrate 101. Contact hole 119 is filled with resist 140.

Figure 142:
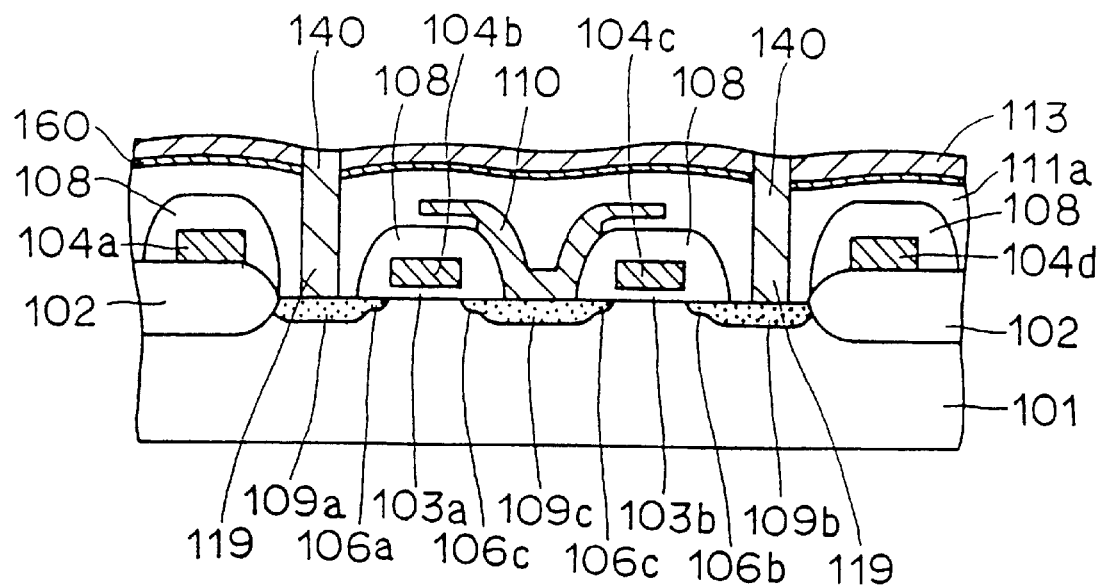

Referring to FIG. 142, resist 140 is etched all over to expose polycrystalline silicon film 113.

Figure 143:
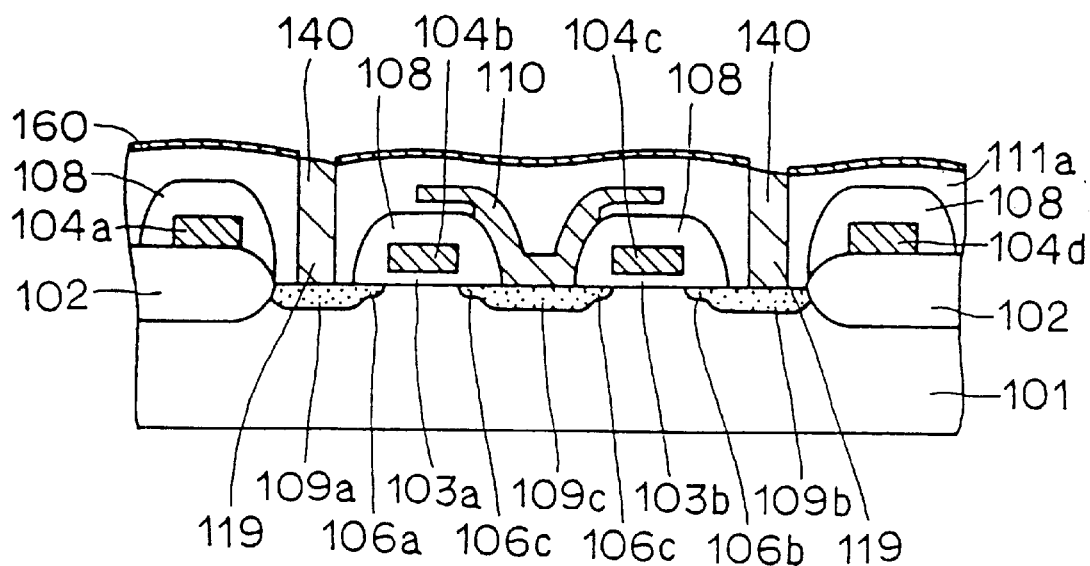

Referring to FIG. 143, the etching process is further carried out to remove polycrystalline silicon film 113.

Figure 144:
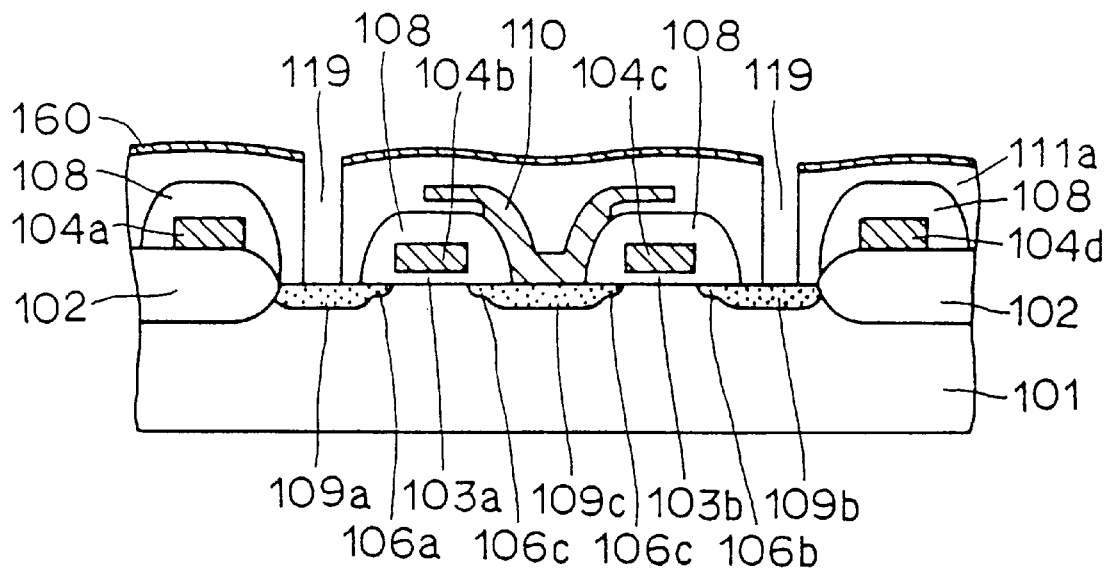

Referring to FIG. 144, resist 140 in contact hole 119 is removed.

Figure 145:
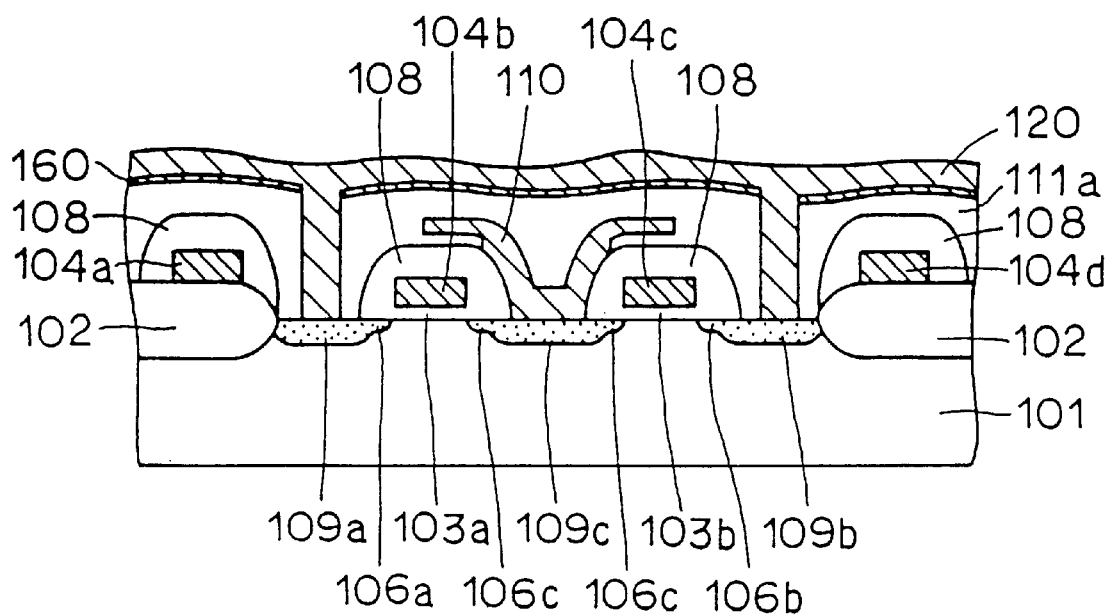
Figure 146:
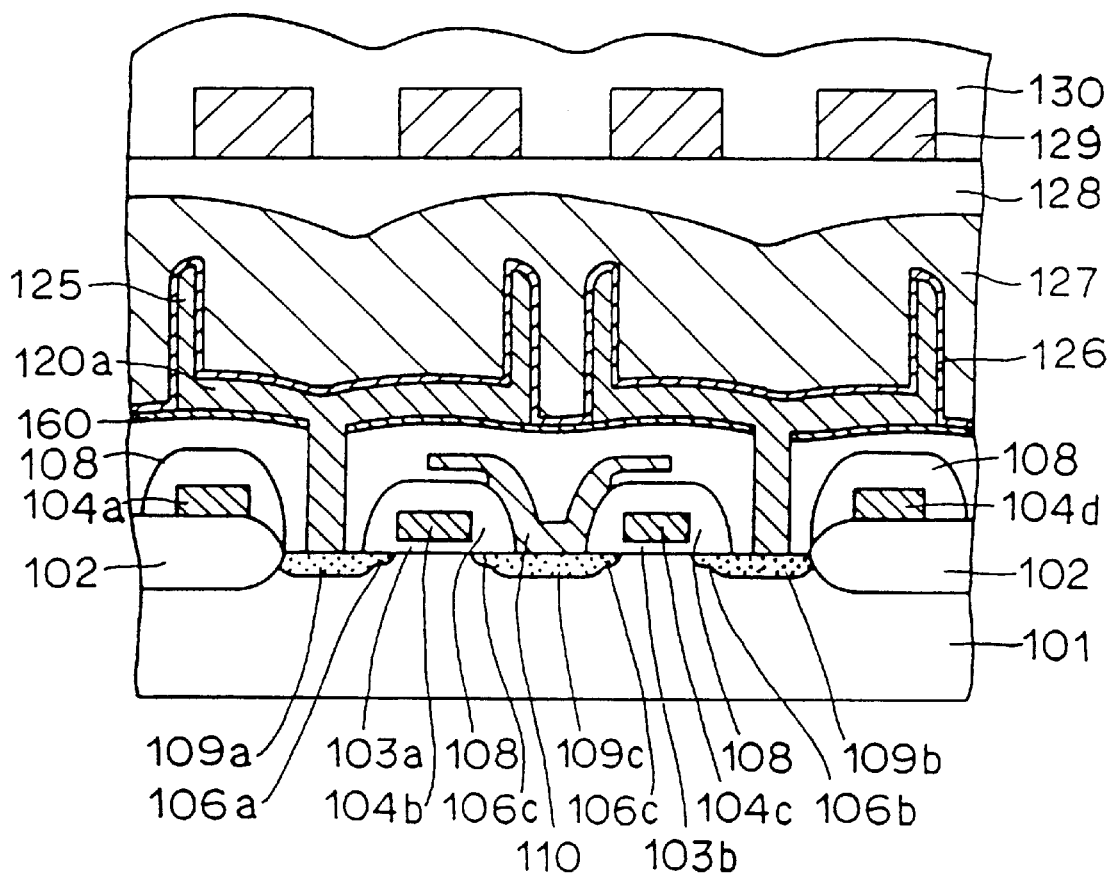

Referring to FIG. 145, a polycrystalline silicon film 120 is formed all over the surface of semiconductor substrate 101 by CVD. Then, the steps of FIGS. 71–80 of the sixth embodiment are carried out to result in the state shown in FIG. 146.

In the seventh embodiment, a polycrystalline silicon film 113a remains beneath lower electrode 120a of the capacitor as shown in FIG. 81. In contrast, polycrystalline silicon film 113a does not remain beneath lower electrode 120a of the capacitor in the thirteenth embodiment. Thus, the stepped portion can be reduced. Contact hole 119 is filled with resist 140 to remove polycrystalline silicon film 113 as shown in FIG. 143. Therefore, impurity regions 109a and 109b will not be subjected to damage.

Sixteenth Embodiment

FIGS. 147–151 are sectional views of a semiconductor memory device for describing the sixteenth embodiment of the manufacturing method of the present invention. First, the steps of FIGS. 40–55 of the fourth embodiment are carried out.

Figure 147:
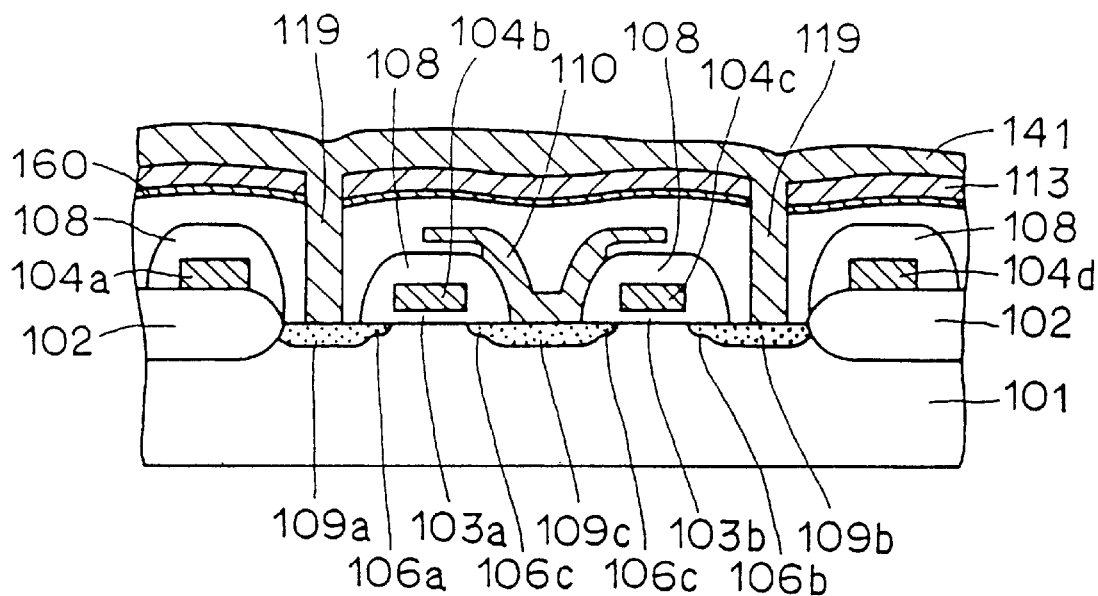
FIGS. 147–151 are sectional views of a semiconductor memory device according to a sixteenth embodiment of the present invention for describing the manufacturing steps thereof in order.

Then, referring to FIG. 147, a polycrystalline silicon film 141 is formed all over the surface of semiconductor substrate 101 by CVD. Contact hole 119 is filled with polycrystalline silicon film 141.

Figure 148:
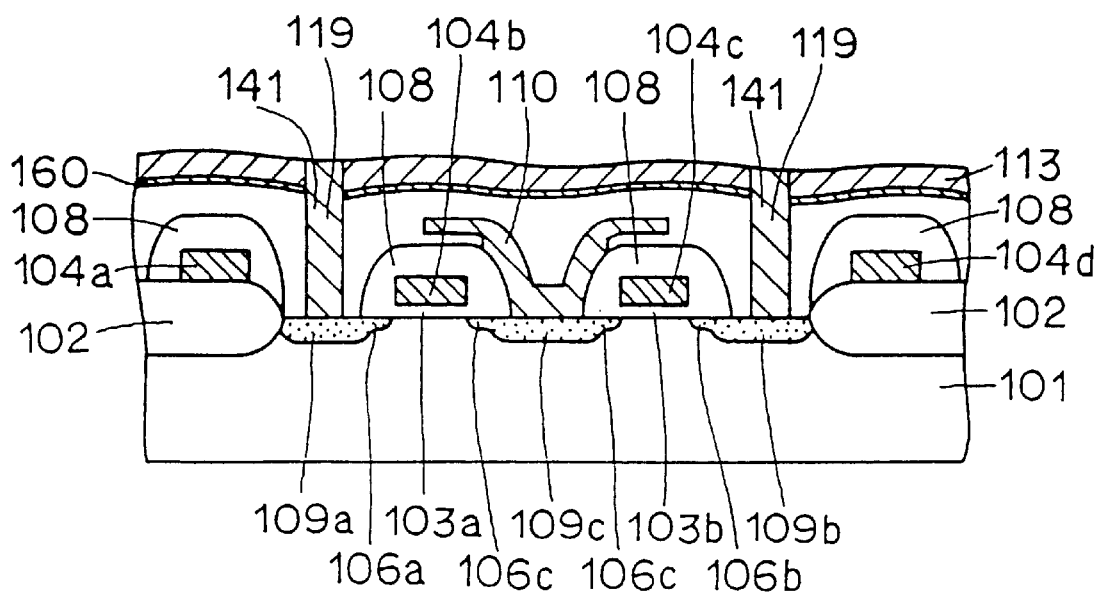

Referring to FIG. 148, polycrystalline silicon film 141 is etched all over by anisotropic etching.

Figure 149:
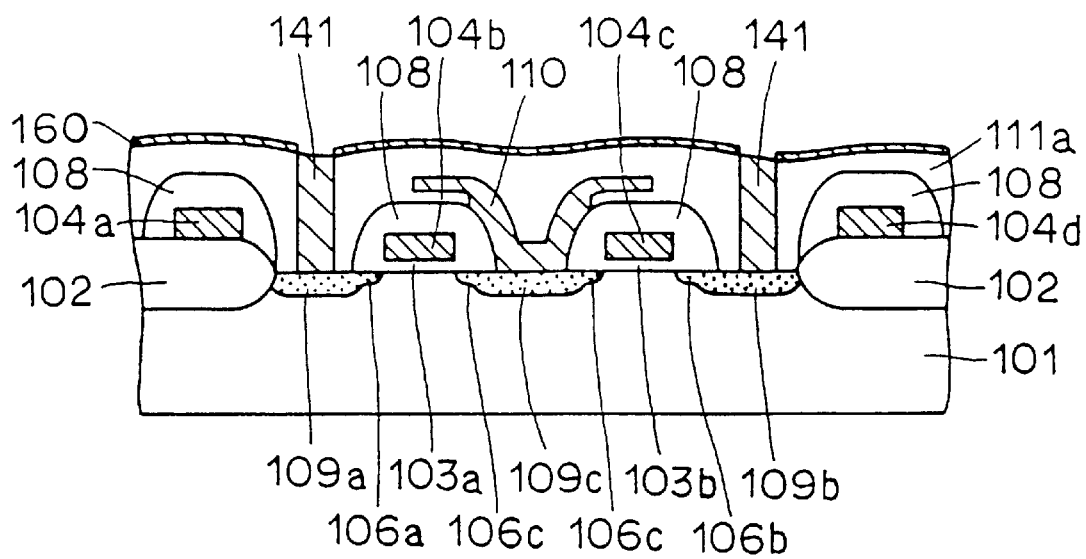

Referring to FIG. 149, this etching process is continued to etch polycrystalline silicon film 113.

Figure 150:
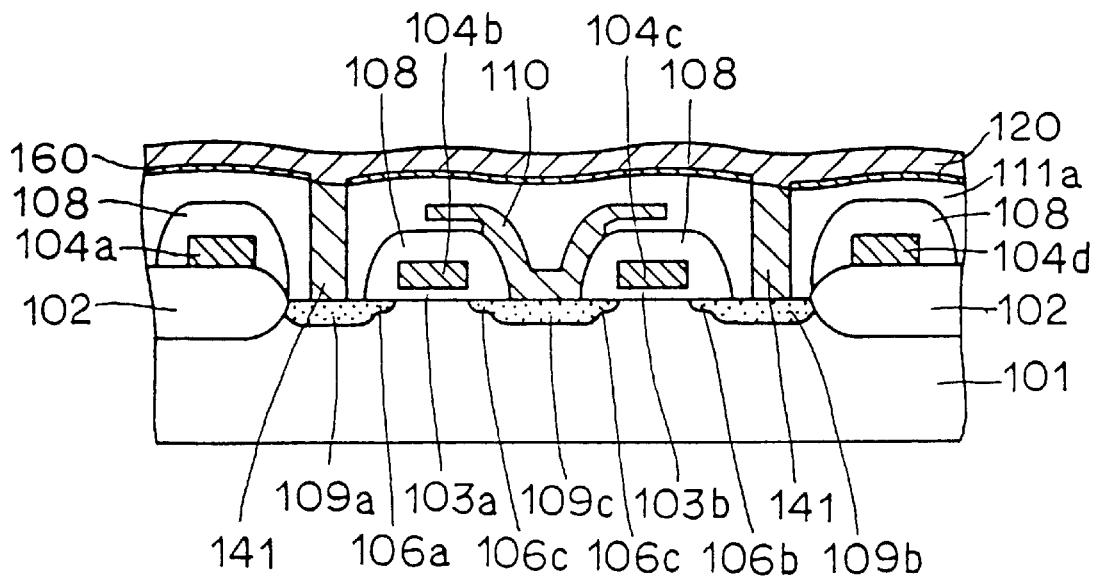

Referring to FIG. 150, a polycrystalline silicon film 120 is formed by CVD on the surface of semiconductor substrate 101. Then, the steps of FIGS. 71–80 of the sixth embodiment are carried out to result in the state shown in FIG. 151.

Figure 151:
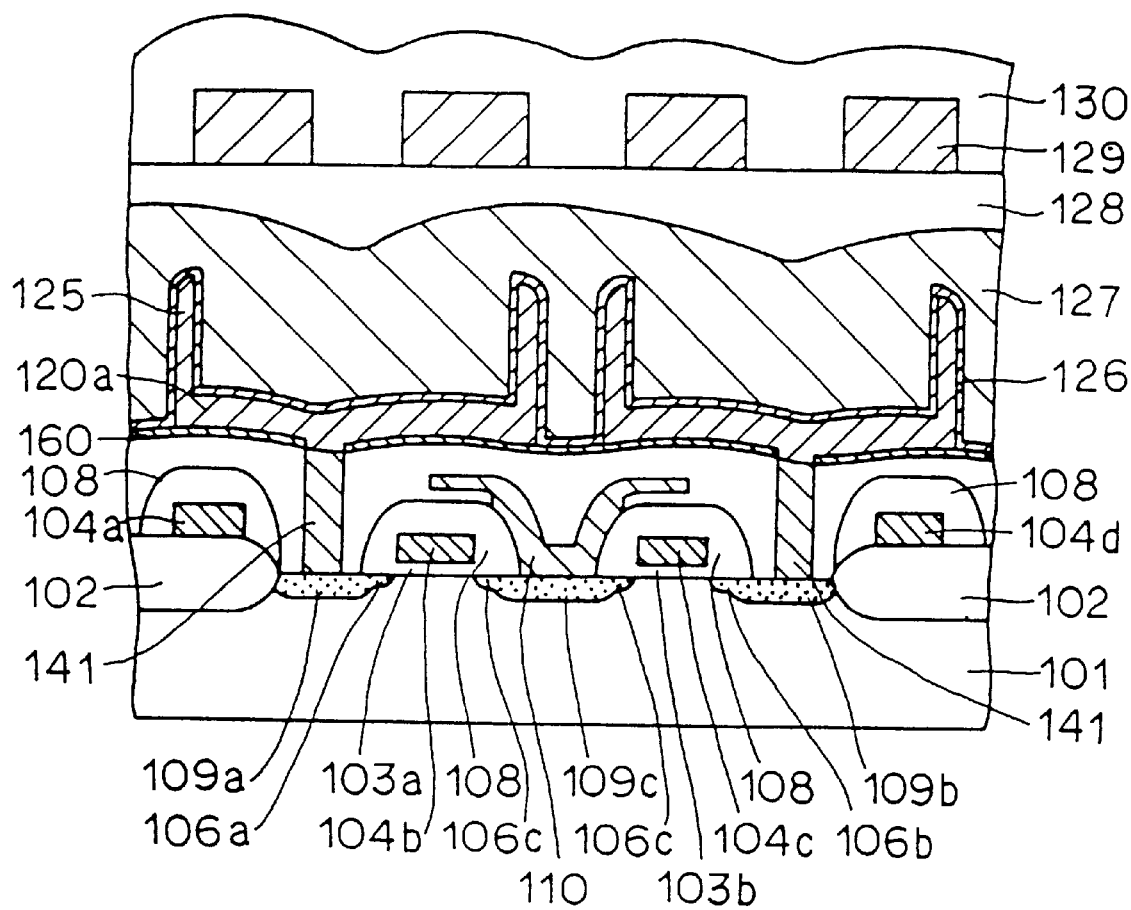

In the sixth embodiment, polycrystalline silicon film 113a exists beneath lower electrode 120a of the capacitor as shown in FIG. 81. In comparison, polycrystalline silicon film 113a does not exists beneath lower electrode 120a of the capacitor in the sixteenth embodiment as shown in FIG. 151. Furthermore, contact hole 119 is filled with polycrystalline silicon film 141 when polycrystalline silicon film 113 is removed, as shown in FIG. 149. Therefore, impurity regions 109a and 109b are not subjected to damage.

Seventeenth Embodiment

Figure 152:
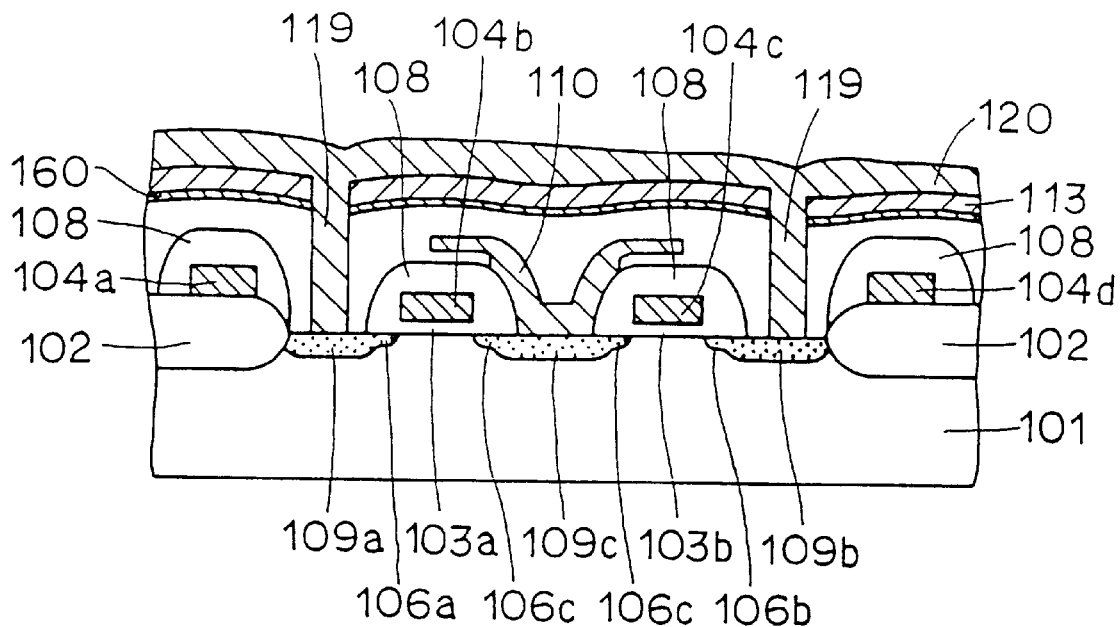
FIGS. 152–154 are sectional views of a semiconductor memory device according to a seventeenth embodiment of the present invention for describing the manufacturing steps thereof in order.
Figure 153:
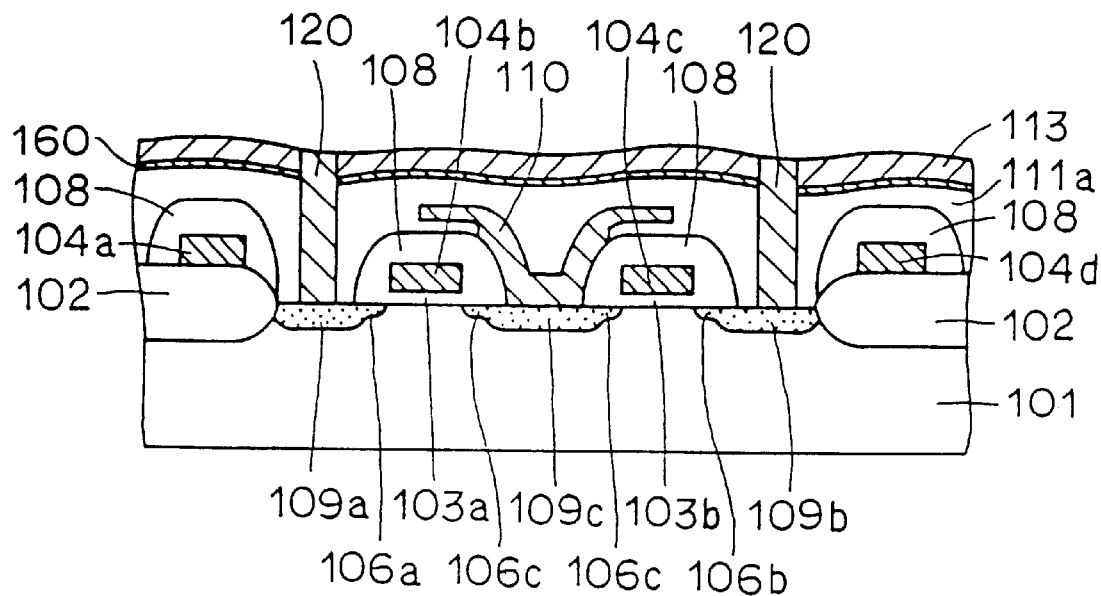
Figure 154:
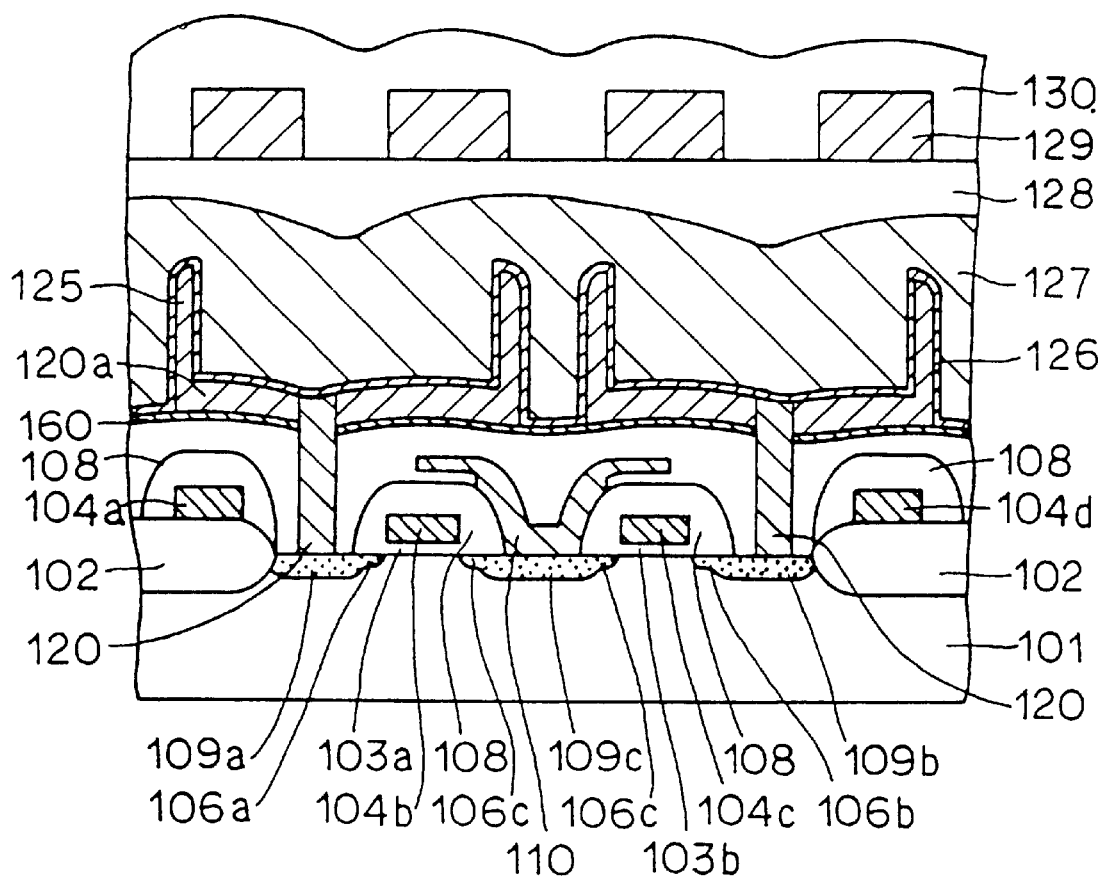

FIGS. 152–154 are sectional views of a semiconductor memory device for describing a seventeenth embodiment of the manufacturing method of the present invention. First, the steps of FIGS. 40–55 of the fourth embodiment are carried out.

Then, referring to FIG. 152, a polycrystalline silicon film 120 is formed all over the surface of semiconductor substrate 101 by CVD. Contact hole 119 is filled with polycrystalline silicon film 120.

Referring to FIG. 153, polycrystalline silicon film 120 is etched all over by anisotropic etching to expose polycrystalline silicon film 113. Then, the steps of FIGS. 71–80 of the sixth embodiment are carried out to result in the state shown in FIG. 154.

In the present embodiment, polycrystalline silicon film 113 (refer to FIG. 153) serves as the low electrode 120a of the capacitor as shown in FIG. 154, whereby the stepped portion can be reduced. Furthermore, because the contact hole is filled with polycrystalline silicon film 120 as shown in FIG. 153, impurity regions 109a and 109b are not subjected to damage in the patterning process of polycrystalline silicon film 113 as the lower electrode of a capacitor.

Eighteenth Embodiment

FIGS. 155–160 are sectional views of a semiconductor memory device for describing an eighteenth embodiment of the manufacturing method of the present invention. First, the steps of FIGS. 40–55 of the fourth embodiment are carried out.

Figure 155:
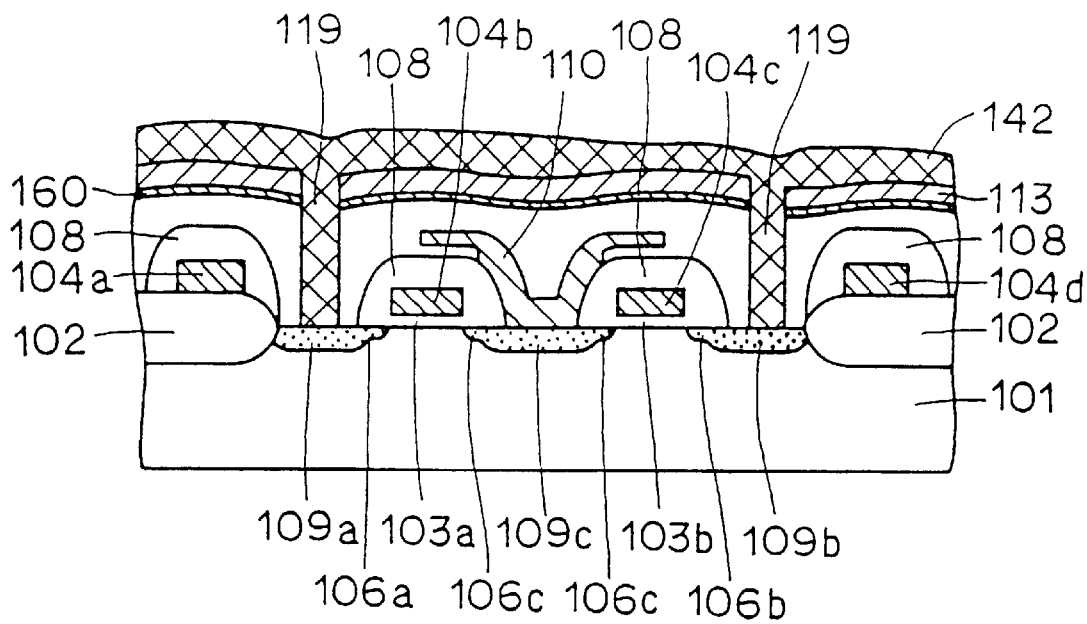
FIGS. 155–160 are sectional views of a semiconductor memory device according to an eighteenth embodiment of the present invention for describing the manufacturing steps thereof in order.

Then, referring to FIG. 155, an amorphous silicon film 142 is formed all over the surface of semiconductor substrate 101. Contact hole 119 is filled with amorphous silicon film 142.

Figure 156:
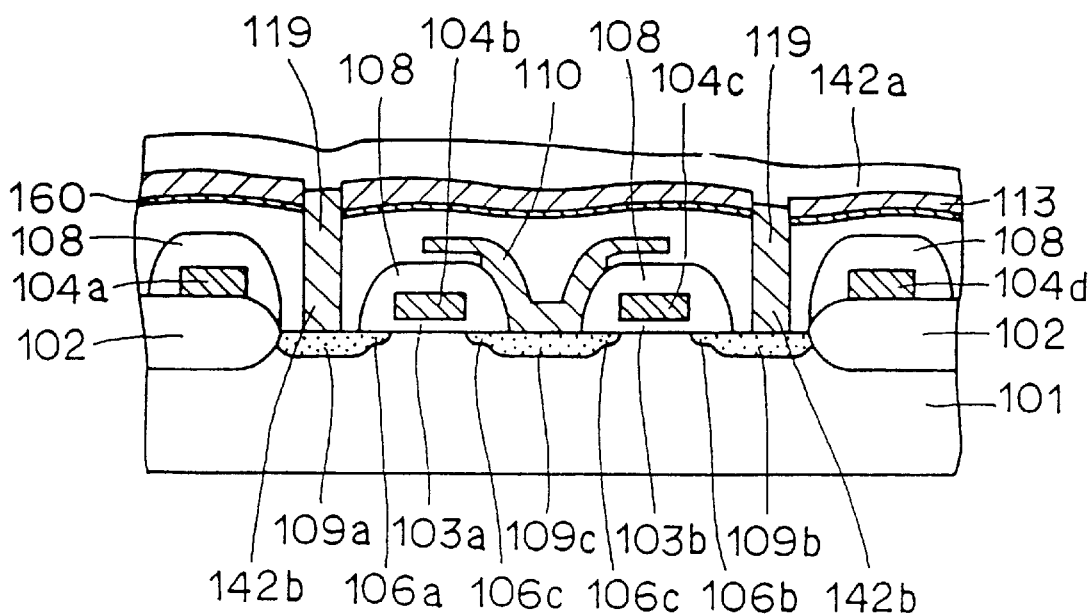

Referring to FIG. 156, amorphous silicon film 142 is subjected to thermal oxidation at the temperature of 800° C.–900° C. for 15–300 minutes. The portion of amorphous silicon film 142 near the atmosphere becomes a silicon oxide film 142a. The amorphous silicon film in contact hole 119 becomes a polycrystalline silicon film 142b.

Figure 157:
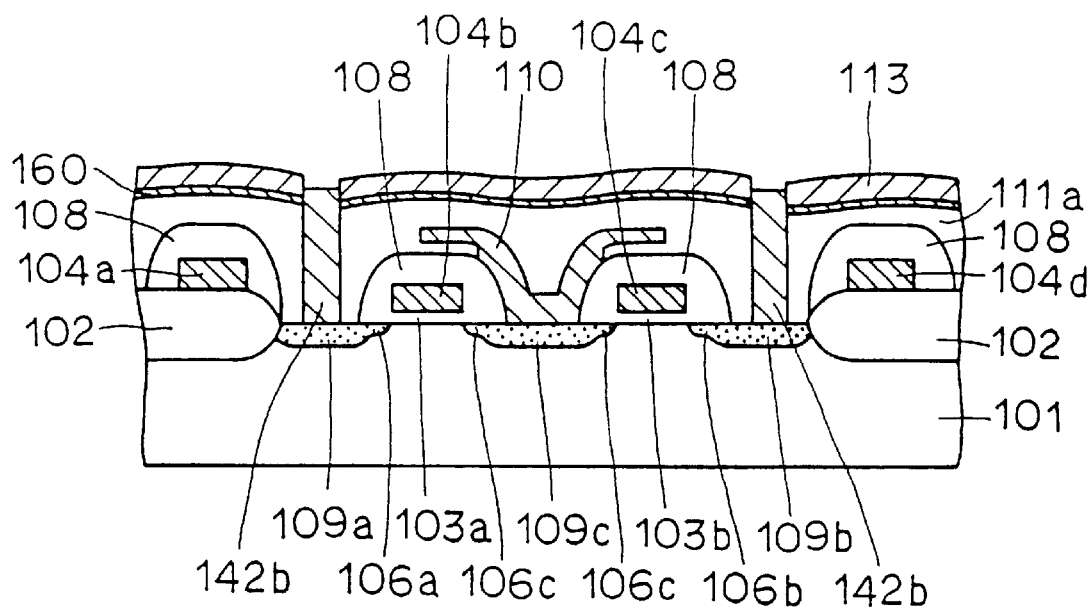

Referring to FIG. 157, silicon oxide film 142a is removed by anisotropic or isotropic etching.

Figure 158:
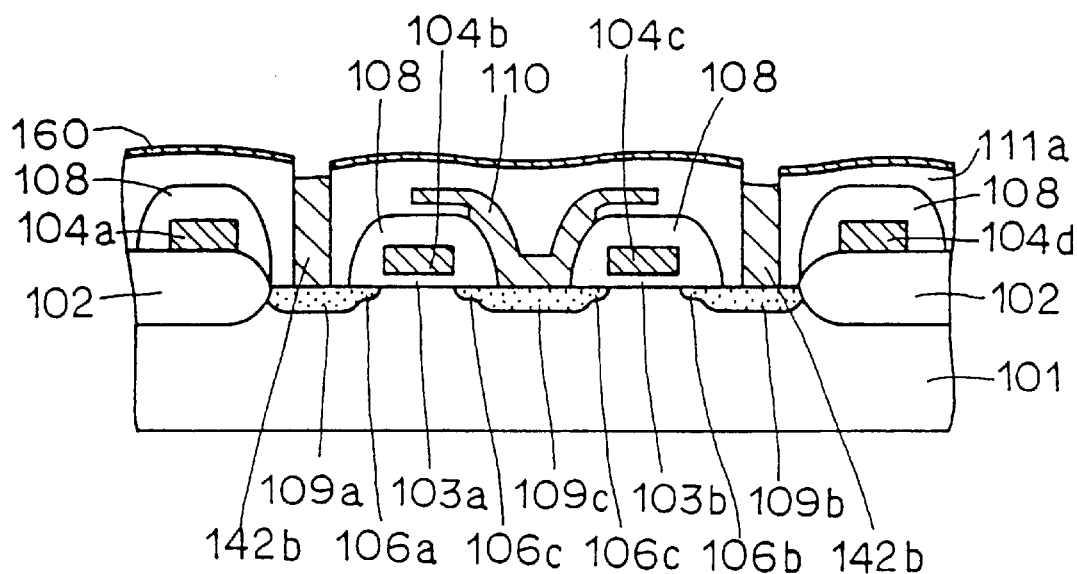

Referring to FIG. 158, polycrystalline silicon film 113 is removed by anisotropic etching.

Figure 159:
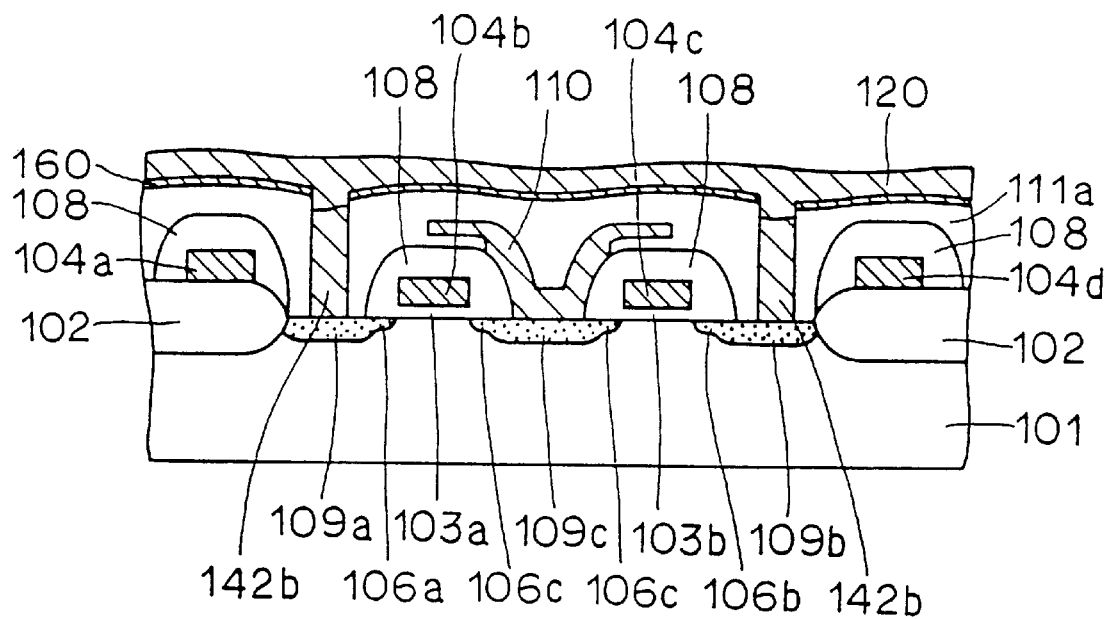

Referring to FIG. 159, a polycrystalline silicon film 120 is formed all over the surface of semiconductor substrate 101. Then, the steps of FIGS. 71–80 of the sixth embodiment are carried out to result in the state shown in FIG. 160.

Figure 160:
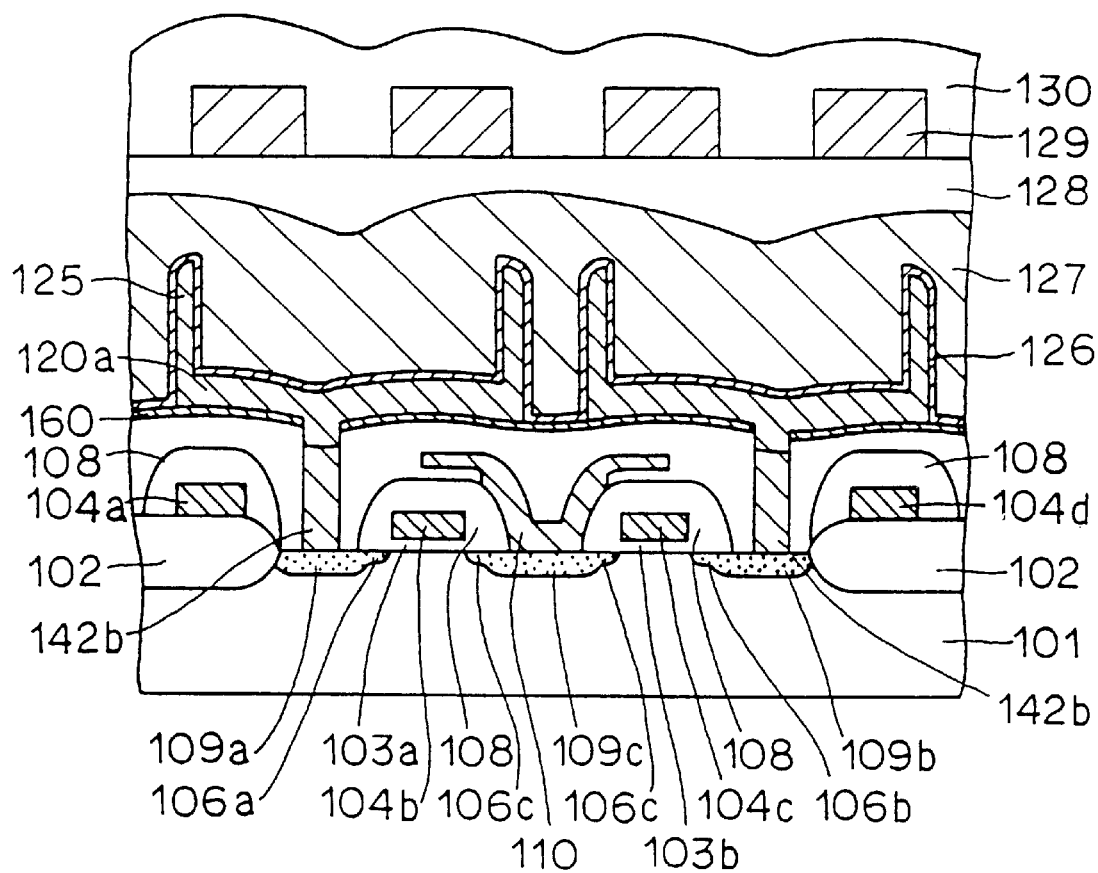
Figure 161:
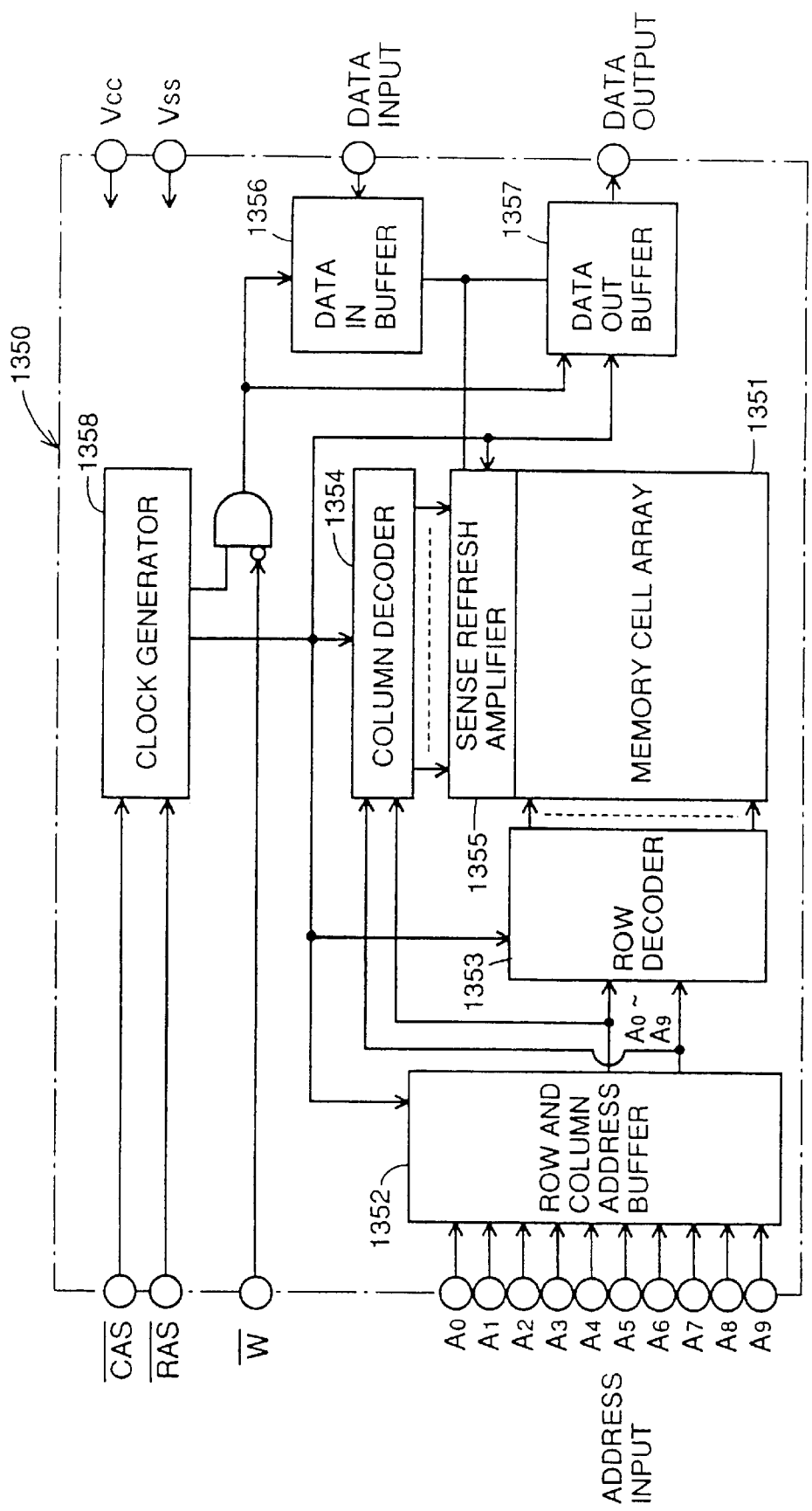
FIG. 161 is a block diagram schematically showing a structure of a general DRAM.
Figure 162:
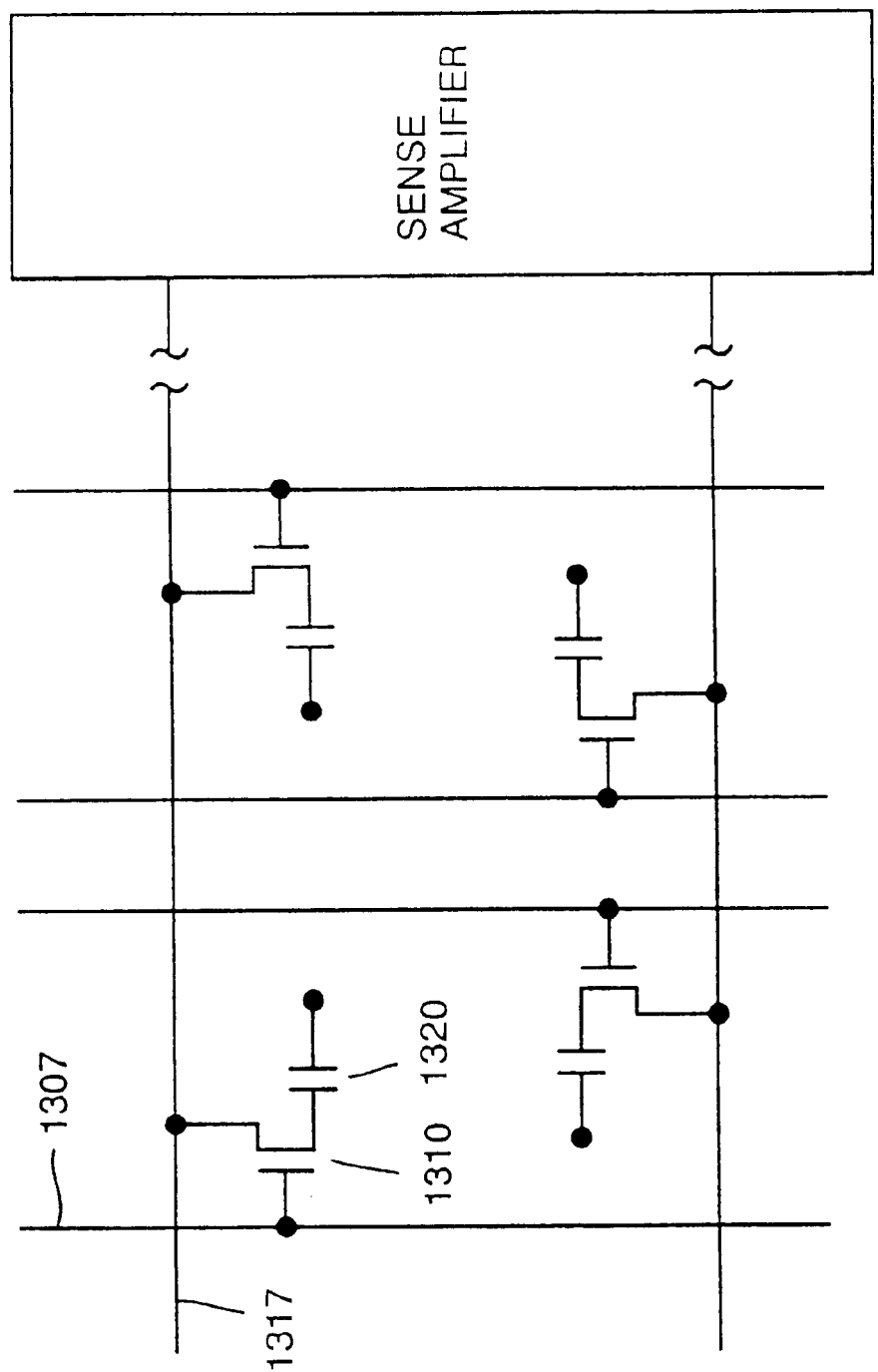
FIG. 162 is an equivalent circuit diagram of memory cells of 4 bits forming a memory cell array.

In the sixth embodiment, polycrystalline silicon film 113a exists below lower electrode 120a of the capacitor as shown in FIG. 81. In comparison, polycrystalline silicon film 113a does not exists beneath lower electrode 120a of the capacitor in the present embodiment as shown in FIG. 160, resulting in reduction of a stepped portion. Furthermore, because the contact hole is filled with polycrystalline silicon film 142b in removing polycrystalline silicon film 113 as shown in FIG. 158, impurity regions 109a and 109b will not be subjected to damage.

Although the above eleventh–eighteenth embodiments are described in which a contact hole is formed in interlayer insulating layer 37a or 111a using polycrystalline silicon film 42 or 113 as a mask, the material of the mask is not limited to polycrystalline silicon. Amorphous silicon (a-Si), TiN, silicide such as $TiSi_2$, and $WSi_2$, refractory metal such as Ti, W, and Mo, or a layered film thereof may be used instead of polycrystalline silicon.

When silicide is used instead of polycrystalline silicon film 42 as a mask, a wetting process of $H_2SO_4+H_2O_2$, $NH_4OH+H_2O_2$ is applied to remove the silicide.

Although an oxide film is used as the material of the first film, a polycrystalline silicon film is used as the material of the second film, and silicon oxide film is used as the material of the third and fourth films of the present invention in the above third, fourth, eighth and eleventh–eighteenth embodiments, the present invention is not limited to these, and materials of the first to fourth films may be selected so that the second film can be etched anisotropically using the third and fourth films as a mask, and that the first film can be etched anisotropically using the second film as a mask by setting appropriate etching conditions.

According to an aspect of manufacturing a semiconductor device of the present invention, a first film is selectively etched using an etching mask, whereby a first hole having a sidewall of the first film and a bottom wall is formed. On the first film including the sidewall of the first hole and the bottom wall, a second film of a material having an under-etching characteristic identical to that of the first film is formed, whereby a second hole having a sidewall and a bottom wall of the second film and a diameter smaller than that of the first hole is formed. By etching anisotropically the first and second films, a third hole having a sidewall matching the sidewall of the second hole is formed. Therefore, the diameter of the third hole is smaller than that of the first hole. Therefore, if the diameter of the first hole is the minimum dimension that can be formed by photolithographic technique, the diameter of the third hole can be made smaller than the minimum dimension that can be formed by photolithographic technique. Therefore, in forming an interconnection layer in the third hole, the overlay margin between the interconnection layer and another interconnection layer can be increased. As a result, a semiconductor device increased in integration density can be easily provided. Furthermore, because an etching mask is not used in forming the third hole, the upper portion of the sidewall of the third hole has a smooth inclination. Therefore, the coverage of the interconnection layer formed inside the third hole is improved.

According to another aspect of manufacturing a semiconductor device of the present invention, a first hole is formed having a sidewall and a bottom wall of the first film and that is reduced in diameter towards the semiconductor substrate by etching selectively the first film using an etching mask. Following the formation of the first hole, the etching mask is removed. Then, the first film is etched anisotropically to form a second hole having a sidewall in alignment with the sidewall of the first hole. Because the diameter of the lower portion of the first hole can be made smaller than the minimum dimension that can be formed by photolithographic technique, the diameter of the second hole can be made smaller than the minimum dimension that can be formed by photolithographic technique. Therefore, in forming an interconnection layer in the second hole, the overlay margin between this interconnection layer and another interconnection layer can be increased. As a result, a semiconductor device increased in integration density can be easily obtained. Because an etching mask is not used in forming the second hole, the upper portion of the sidewall of the second hole has a smooth inclination. Therefore, the coverage of the interconnection layer formed within the second hole is improved.

According to a further aspect of manufacturing a semiconductor device of the present invention, a second hole is formed in a first film using a sidewall layer formed at the sidewall of the first hole as a mask. Using the first film as a mask, an insulating film is etched anisotropically to form a third hole. Therefore, a contact hole can be formed in self-alignment having an opening diameter smaller than the minimum dimension that can be formed according to design rules. Therefore, a contact hole can be easily formed in a limited space between adjacent elements such as a memory cell of a DRAM. This provides the advantage of increasing the integration density in a manufacturing method of a semiconductor device according to a constant design rule.

According to an aspect of a semiconductor device of the present invention formed according to the above-described manufacturing method, the hole formed in the insulating film has an opening diameter smaller than the minimum dimension that can be formed by photolithographic technique. Therefore, even when a hole is formed between interconnection layers formed in the same layer, the overlay margin between the hole and the interconnection can be increased by the dimension of the reduction in the opening diameter. Therefore, the pitch between interconnection layers can be reduced to improve the integration density.

According to another aspect of a method of manufacturing a semiconductor memory device of the present invention, a second film having a first hole is formed on a first film. By forming a sidewall layer at the sidewall of the first hole, the opening diameter of the sidewall layer can be made smaller than the minimum dimension that can be formed by photolithographic technique by the width of the sidewall layer. Therefore, by applying an etching step using the second film and the sidewall layer as a mask, second and third holes can be formed in self-alignment in the first film and the insulating film having an opening diameter smaller than the minimum dimension that can be formed by photolithographic technique. Therefore, the overlay margin in patterning by photolithographic technique can be increased.

According to a preferable aspect of a semiconductor memory device of the present invention formed by the above-described manufacturing method, the hole formed in the insulating film has an opening diameter smaller than the minimum dimension that can be formed by photolithographic technique. Therefore, the pitch between word lines can be reduced to improve the integration density of memory cells or the like.

According to a further aspect of manufacturing the semiconductor memory device of the present invention, a first hole is formed in a first conductive film and a first covering film. By forming a sidewall layer at the sidewall of the first hole, the opening diameter of the sidewall layer can be reduced by the width of the sidewall layer in comparison with the minimum dimension that can be formed by photolithographic technique. Therefore, by carrying out an etching step using the sidewall layer as a mask, a second hole can be formed in self-alignment in the insulating layer having an opening diameter that is smaller than the minimum dimension that can be formed by photolithographic technique. Therefore, in patterning by photolithography, the overlay margin can be increased.

According to a preferable aspect of a semiconductor memory device of the present invention formed by the above manufacturing method, the first portion of the lower electrode layer is formed inside the second portion, and is formed upwards and perpendicular to the main surface of the semiconductor device and higher than the surface of the second portion. Therefore, the surface area is increased by the portion protruding vertically upwards in comparison with a conventional capacitor. Therefore, the capacitor capacitance can be increased and ensured. Unstable operation or unreliable operation of a DRAM associated with increase in the integration density can be prevented.

According to another aspect of manufacturing a semiconductor memory device of the present invention, a first covering layer having a first hole is formed on a second conductive film. By forming a sidewall layer at the sidewall of the first hole, the opening diameter of the sidewall layer can be reduced by the width of the sidewall layer in comparison with the minimum dimension that can be formed by photolithographic technique. By carrying out an etching step using the sidewall layer and the first covering film as a mask, a second hole can be formed in self-alignment having an opening diameter smaller than the minimum dimension that can be formed by photolithographic technique. Therefore, in patterning by photolithography, the overlay margin can be increased.

The first conductive film is formed on a first insulating film having substantially a planarized surface with a second insulating film of a predetermined thickness therebetween. Therefore, a stepped portion in the underlying layer of the first conductive film will not be generated. Therefore, the lower electrode layers between a plurality of capacitors will not be connected to each other.

According to a method of manufacturing a semiconductor memory device summarizing the above three aspects, a first film having a second hole is formed on an insulating film. By forming a sidewall layer at the sidewall of the second hole, the opening diameter of the sidewall layer can be reduced by the width of the sidewall layer than the minimum dimension that can formed by photolithographic technique. By carrying out an etching step using the sidewall layer and the first film as a mask, a first hole can be formed in self-alignment in the insulating layer and having an opening diameter smaller than the minimum dimension that can be formed by photolithographic technique. Therefore, in patterning by photolithography, the overlay margin can be increased.

According to an aspect of a semiconductor device of the present invention formed by the above manufacturing method, the hole formed in the insulating film has an opening diameter smaller than the minimum dimension that can be formed by photolithographic technique. Therefore, even when a hole is formed between word lines, the overlay margin between the hole and the word line can be increased by the dimension of reduction of the opening diameter.

Therefore, the pitch between word lines can be reduced to improve the integration density such as in a memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming a first film on a semiconductor substrate, forming on said first film an etching mask having an opening exposing partially a surface of said first film, forming a first hole having a sidewall and a bottom wall of said first film by selectively etching said first film using said etching mask, removing said etching mask, forming a second hole having a sidewall and a bottom wall of a second film and a diameter smaller than that of said first hole by forming on said first film including the sidewall and the bottom wall of said first hole said second film of a material having an under-etching characteristic equivalent to said first film, and forming a third hole having a sidewall matching the sidewall of said second hole by etching anisotropically said first and second films.

2. The method of manufacturing a semiconductor device according to claim 1, wherein said anisotropic etching of said first and second films are carried out with a gas having CO gas added to a CF type gas.

3. The method of manufacturing a semiconductor device according to claim 1, wherein said first film and said second film are of the same material.

4. The method of manufacturing a semiconductor device according to claim 1, wherein said first film and said second film include an insulating film.

5. The method of manufacturing a semiconductor device according to claim 1, wherein said first film and said second film include a silicon oxide film.

6. The method of manufacturing a semiconductor device according to claim 1, wherein said etching mask includes a resist patterned by photolithography.

7. The method of manufacturing a semiconductor device according to claim 6, wherein the opening diameter of said opening in said etching mask is of the minimum dimension that can be formed by said photolithography.

8. The method of manufacturing a semiconductor device according to claim 1, wherein said third hole exposes an impurity region formed at said semiconductor substrate.

9. A method of manufacturing a semiconductor device comprising the steps of:

forming a first film on a semiconductor substrate, forming on said first film an etching mask having an opening exposing partially the surface of said first film, forming a first hole having a sidewall and a bottom wall of said first film and a diameter reduced in the direction towards said semiconductor substrate by selectively and anisotropically etching said first film using said etching mask, removing said etching mask, and forming a second hole having a sidewall matching the sidewall of said first hole by etching anisotropically said first film.

10. The method of manufacturing a semiconductor device according to claim 9, wherein said second hole has an diameter decreasing towards the direction of said semiconductor substrate.

11. The method of manufacturing a semiconductor device according to claim 9, wherein said anisotropic etching in forming said second hole is carried out by a gas having CO gas added to a CF type gas.

12. The method of manufacturing a semiconductor device according to claim 9, wherein said first film includes an insulating film.

13. The method of manufacturing a semiconductor device according to claim 9, wherein said etching mask includes a resist patterned by photolithography.

14. The method of manufacturing a semiconductor device according to claim 13, wherein the opening diameter of said opening of said etching mask is of the minimum dimension that can be formed said photolithography.

15. The method of manufacturing a semiconductor device according to claim 9, wherein said second hole exposes an impurity region formed on said semiconductor substrate.

16. A method of manufacturing a semiconductor device comprising the steps of:
forming an insulating film so as to be in contact with a main surface of a semiconductor substrate,
forming on said insulating film a first film of a material having an under-etching characteristic different from that of said insulating film,
forming on said first film a second film of a material having an under-etching characteristic different from that of said first film,
forming a first hole exposing the surface of said first film and having a sidewall of said second film by selectively etching said second film,
forming on said second film including the sidewall of said first hole a third film of a material having an under-etching characteristic equal to that of said second film,
forming a sidewall layer on the sidewall of said first hole by etching anisotropically said third film,
forming a second hole exposing the surface of said insulating film-and having a diameter smaller than that of said first hole by etching anisotropically said first film with said second film and said sidewall layer as a mask, and
forming a third hole in said insulating film communicating with said second hole and reaching to the main surface of said semiconductor substrate by etching anisotropically said insulating film using said first film as a mask.

17. The method of manufacturing a semiconductor device according to clam 16, following said step of forming said third hole, further comprising the steps of:
forming a resist on said first film to fill said third hole with said resist,
etching said resist to expose said first film leaving said resist filled in said third hole,
removing said first film by etching using said resist filled in said third hole as a mask, and
removing said resist.

18. The method of manufacturing a semiconductor device according to claim 16, following said step of forming said third hole, further comprising the steps of:
forming a conductive film on said first film to fill said third hole with said conductive film,
etching said conductive film and said first film to expose said insulating film leaving said conductive film filled in said third hole, and
forming an interconnection film on said insulating film and in connection with said conductive film filled in said third hole.

19. The method of manufacturing a semiconductor device according to claim 16, wherein said first film comprises a conductive member, and, after the step of forming said third hole, further comprising the steps of:
forming a conductive film on said first film so that said third hole is filled with said conductive film,
etching said conductive film to expose said first film leaving said conductive film filled in said third hole, and
forming an interconnection film by patterning said exposed first film.

20. The method of manufacturing a semiconductor device according to claim 16, following said step of forming said third hole, further comprising the steps of:
forming an amorphous silicon film on said first film so that said third hole is filled with said amorphous silicon film,
subjecting said amorphous silicon film to thermal oxidation to change said amorphous silicon film on said first film to a silicon oxide film and to change said amorphous silicon film filled in said third hole to a polycrystalline silicon film,
removing said silicon oxide film and then said first film by etching using said polycrystalline silicon film filled in said third hole as a mask, and
forming an interconnection film on said insulating film and connected to said polycrystalline silicon film filled in said third hole.

21. The method of manufacturing a semiconductor device according to claim 16, wherein said second film and said sidewall layer are removed in the anisotropic etching of said insulating film to form said third hole.

22. The method of manufacturing a semiconductor device according to claim 16, wherein said insulating film, said second film and said third film comprise silicon oxide films, and
wherein said first film comprises a polycrystalline silicon film.

23. The method of manufacturing a semiconductor device according to claim 16, wherein said first film comprises a conductive member,
and following said step of forming said third hole, comprising the steps of:
forming a conductive film on said first film and in said third hole, and
forming an interconnection film having a layered structure of said first film and said conductive film by patterning said first film and said conductive film.

24. The method of manufacturing a semiconductor device according to claim 16, wherein the opening diameter of said first hole is of the minimum dimension that can be formed by photolithography.

25. The method of manufacturing a semiconductor device according to claim 16, wherein said first film is selected from the group consisting of polycrystalline silicon, silicide, and refractory metal.

26. A method of manufacturing a DRAM comprising the steps of:
forming a MOS transistor having a pair of impurity regions serving as a source/drain region at the main surface of a semiconductor substrate,
forming an insulating film on said semiconductor substrate to cover said MOS transistor, forming on said insulating film a first film of a material having an under-etching characteristic different from that of said insulating film, forming on said first film a second film having a first hole at the upper portion of one of the impurity regions of said pair, and of a material having an under-etching characteristic different from that of said first film, forming a third film on said second film including the sidewall of said first hole, and of a material having an under-etching characteristic equivalent to that of said second film, forming a sidewall layer at the sidewall of said first hole by etching anisotropically said third film, forming a second hole exposing the surface of said insulating film and having a diameter smaller than that of said first hole by etching anisotropically said first film using said second film and said sidewall layer as a mask, forming a third hole in said insulating film in communication with said second hole and exposing said impurity region by etching anisotropically said insulating film using said first film as a mask, forming a storage node on said insulating film and connected to said impurity region via said third hole, forming a dielectric film on said storage node, and forming a cell plate on said dielectric film.

27. The method of manufacturing a DRAM according to claim 26, wherein said first film comprises a conductive member, and wherein said step of forming a storage node comprises the steps of forming a conductive film on said first film and connected to said impurity region via said third hole, and forming said storage node of a layered structure of said first film and said conductive film by patterning said first film and said conductive film.

28. The method of manufacturing a DRAM according to claim 26, wherein said step of forming a storage node comprises the steps of forming a resist on said first film so that said third hole is filled with said resist, etching said resist to expose said first film, leaving said resist in said third hole, removing said first film by etching using said resist filled in said third hole as a mask, removing said resist, and forming said storage node on said insulating film and connected to said impurity region via said third hole.

29. The method of manufacturing a DRAM according to claim 26, wherein said step of forming a storage node comprises the steps of forming a conductive film on said first film and connected to said impurity region via said third hole so that said third hole is filled with said conductive film, etching said conductive film and said first film leaving said conductive film formed in said third hole, and forming said storage node on said insulating film and connected to said conductive film formed in said third hole.

30. The method of manufacturing a DRAM according to claim 26, wherein said first film comprises a conductive member, and wherein said step of forming a storage node comprises the steps of forming a conductive film on said first film and connected to said impurity region via said third hole so that said third hole is filled with said conductive film, etching said conductive film to expose said first film while leaving said conductive film formed in said third hole, and forming said storage node by patterning said first film.

31. The method of manufacturing a DRAM according to claim 26, wherein said step of forming a storage node comprises the steps of forming an amorphous silicon film on said first film and connected to said impurity region via said third hole so that said third hole is filled with said amorphous silicon film, subjecting said amorphous silicon film to thermal oxidation to change said amorphous silicon film on said first film to a silicon oxide and to change said amorphous silicon film formed in said third hole to a polycrystalline silicon film, etching said silicon oxide film and then said first film using said polycrystalline silicon film filled in said third hole as a mask, and forming said storage node on said insulating film and connected to said polycrystalline silicon film filled in said third hole.

32. The method of manufacturing a DRAM according to claim 26, wherein said storage node comprises a bottom wall conductive film and a sidewall conductive film, and said step of forming a storage node comprises the steps of forming said bottom wall conductive film on said insulting film and connected to said impurity region via said third hole, and forming said sidewall conductive film connected to said bottom wall conductive film and extending upwards.

33. A method of manufacturing a semiconductor memory device comprising the steps of:

forming a MOS transistor having a pair of impurity regions which become the source/drain region at the main surface of a semiconductor substrate, forming an insulating film on the main surface of said semiconductor substrate so as to cover said MOS transistor, forming in a stacked layer a first conductive film of a material having an under-etching characteristic different from that of said insulating film, and then a first covering film having an under-etching characteristic different from that of said first conductive film, and forming a first hole in said first conductive film and said first covering film, forming a second conductive film of a material having an under-etching characteristic different from that of said first covering film, on the sidewall of said first hole and on said first covering film, etching an anisotropically said second conductive film to form a sidewall layer on the sidewall of said first hole so as to come into contact with said first conductive film, etching anisotropically said insulating film using said sidewall layer as a mask to form a second hole in said insulating film and removing said first covering film, forming a third conductive film so as to come into contact with the surface of said first conductive film and said sidewall layer, and so as to be connected with said impurity region via said second hole, forming a capacitor dielectric film so as to cover the surface of a storage node having said first conductive film, said sidewall layer, and said third conductive film, and forming a cell plate on said capacitor dielectric film.

34. The method of manufacturing the semiconductor memory device according to claim 33, wherein said sidewall layer is formed of amorphous silicon.

35. The method of manufacturing the semiconductor memory device according to claim 33, wherein said sidewall layer is formed of silicide.

36. The method of manufacturing the semiconductor memory device according to claim 33, wherein said sidewall layer is formed of a conductive layer having the crystalline grain size controlled.

37. A method of manufacturing a semiconductor memory device comprising the steps of:

forming a MOS transistor having a pair of impurity regions serving as the source/drain regions at the main surface of a semiconductor substrate, forming a first insulating film having a planar upper face on the main surface of said semiconductor substrate so as to cover said MOS transistor, forming a first conductive film on the upper face of said first insulating film with a second insulating film having a predetermined thickness therebetween, forming a second conductive film on said first conductive film with a third insulating film having a predetermined thickness therebetween, forming on said second conductive film a first covering film having a first hole above said impurity region, forming a second covering film on the sidewall of said first hole and said first covering film, etching anisotropically said second covering film for forming a sidewall layer on the sidewall of said first hole, etching anisotropically said second conductive film using said first covering film and said sidewall layer as a mask to expose the surface of said third insulating film, and forming a second hole having a diameter smaller than that of said first hole, etching anisotropically in order said third insulating film, said first conductive film, said second insulating film and said first insulating film for forming a third hole communicating with said second hole and exposing said impurity region, and removing said first covering film and said sidewall layer, forming a third conductive layer so as to come into contact the surface of said second conductive film and so as to be connected to said impurity region via said second and third holes, patterning said first, second and third conductive films for forming a storage node, removing said second and third insulating films, forming a capacitor dielectric film so as to cover the surface of said storage node, and forming a cell plate on said capacitor electric film.

38. The method of manufacturing a semiconductor memory device according to claim 37, wherein said sidewall layer said first covering film and said first, second and third insulating films are equal in under-etching characteristic.

39. The method of manufacturing a semiconductor memory device according to claim 38, wherein said sidewall layer, said first covering film, and said first, second and third insulating films include silicon oxide.

40. A method of manufacturing a semiconductor memory device including a MOS transistor having a pair of impurity regions forming source/drain regions, and a capacitor having a storage node, wherein said impurity region and said storage node are electrically connected via a first hole formed in an insulating film covering said MOS transistor, said manufacturing method comprising the steps of:

forming on said insulating film a first film having a second hole above said impurity region, forming a second film on the inside wall face of said second hole and all over the surface of said first film, detection signal detect means for detecting light transmitted through said spatial frequency filter as a detection signal corresponding to detection in the pattern of said specimen, forming a sidewall layer on the sidewall of said second hole by etching anisotropically said second film, and etching anisotropically said insulating film using said first film and said sidewall layer as a mask to expose partially a surface of said impurity region for forming in said insulating film said first hole having a diameter smaller than that of said second hole.

41. The method of manufacturing a semiconductor memory device according to claim 40, wherein said first hole is formed to have an opening diameter smaller than the minimum dimension that can be formed by photolithographic technique.

* * * * *

UNITED STATES PATENT AND TRADEMARK OFFICE
CERTIFICATE OF CORRECTION

PATENT NO.    : 6,586,329 B1
DATED         : July 1, 2003
INVENTOR(S)   : Yoshinori Tanaka et al.

It is certified that error appears in the above-identified patent and that said Letters Patent is hereby corrected as shown below:

<u>Title page,</u>
Item [73], Assignee, change the Assignee's name from "Kabshiki" to -- Kabushiki --.

Signed and Sealed this

Twenty-third Day of December, 2003

JAMES E. ROGAN
*Director of the United States Patent and Trademark Office*